US008574811B2

(12) United States Patent
Masuyama et al.

(10) Patent No.: US 8,574,811 B2
(45) Date of Patent: Nov. 5, 2013

(54) RESIST COMPOSITION AND METHOD FOR PRODUCING RESIST PATTERN

(75) Inventors: Tatsuro Masuyama, Osaka (JP); Satoshi Yamamoto, Osaka (JP); Koji Ichikawa, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 6 days.

(21) Appl. No.: 13/221,597

(22) Filed: Aug. 30, 2011

(65) Prior Publication Data

US 2012/0052443 A1 Mar. 1, 2012

(30) Foreign Application Priority Data

Aug. 30, 2010 (JP) ................................ 2010-191868
Nov. 24, 2010 (JP) ................................ 2010-260921
Feb. 25, 2011 (JP) ................................ 2011-039451
May 13, 2011 (JP) ................................ 2011-107973

(51) Int. Cl.
*G03F 7/004* (2006.01)
*G03F 7/30* (2006.01)
*G03F 7/38* (2006.01)
*G03F 7/039* (2006.01)

(52) U.S. Cl.
CPC ................ *G03F 7/0392* (2013.01); *G03F 7/30* (2013.01); *G03F 7/38* (2013.01); *Y10S 430/111* (2013.01); *Y10S 430/126* (2013.01)
USPC ........ 430/270.1; 430/326; 430/330; 430/910; 430/925

(58) Field of Classification Search
CPC ............ G03F 7/0392; G03F 7/30; G03F 7/38
USPC ...................... 430/270.1, 326, 330, 910, 925
See application file for complete search history.

(56) References Cited

U.S. PATENT DOCUMENTS 3,779,778 A 12/1973 Smith et al.
3,849,137 A 11/1974 Barzynski et al.
3,859,099 A * 1/1975 Petropoulos et al. ......... 430/190
4,556,737 A 12/1985 Koda et al.
4,576,902 A 3/1986 Saenger et al.
4,822,716 A 4/1989 Onishi et al.
4,857,437 A 8/1989 Banks et al.
5,017,453 A 5/1991 Onishi et al.
5,073,476 A 12/1991 Meier et al.
5,198,520 A 3/1993 Onishi et al.
5,260,410 A 11/1993 Schwalm
5,453,341 A 9/1995 Schwalm
5,663,035 A 9/1997 Masuda et al.
5,928,818 A 7/1999 Mertesdorf et al.
6,800,422 B2 10/2004 Thackeray et al.
7,122,542 B2 10/2006 Singh et al.
7,452,879 B2 11/2008 Singh et al.
7,511,137 B2 3/2009 Li
7,560,466 B2 7/2009 Singh et al.
7,582,648 B2 9/2009 Singh et al.
7,754,714 B2 7/2010 Li et al.
7,981,989 B2 7/2011 Yan et al.
2002/0058201 A1 5/2002 Miyaji et al.
2005/0113398 A1 5/2005 Argade et al.
2005/0192301 A1 9/2005 Li
2005/0209224 A1 9/2005 Singh et al.
2005/0234049 A1 10/2005 Singh et al.
2006/0035891 A1 2/2006 Li et al.
2006/0167249 A1 7/2006 Argade et al.
2006/0194982 A1 8/2006 Harada et al.
2006/0199100 A1 9/2006 Kanda (Continued)

FOREIGN PATENT DOCUMENTS

DE 39 14 407 A1 10/1990
EP 0 126 712 A1 11/1984

(Continued)

OTHER PUBLICATIONS

U.S. Appl. No. 13/404,123, filed Feb. 24, 2012.

(Continued)

*Primary Examiner* — John Chu
(74) *Attorney, Agent, or Firm* — Birch, Stewart, Kolasch & Birch, LLP

(57) ABSTRACT

A resist composition contains; a resin having a structural unit derived from a compound represented by the formula (a); and an acid generator.

(a)

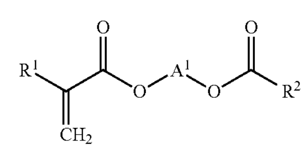

wherein $R^1$ represents a hydrogen atom or a methyl group; $R^2$ represents an optionally substituted $C_1$ to $C_{18}$ aliphatic hydrocarbon group; $A^1$ represents an optionally substituted $C_1$ to $C_6$ alkanediyl group or a group represented by the formula (a-g1);

$$—A^{10}—\left(X^{10}—A^{11}\right)_s—X^{11}—A^{12}— \quad \text{(a-g1)}$$

wherein s represents 0 or 1; $A^{10}$ and $A^{12}$ independently represent an optionally substituted $C_1$ to $C_5$ aliphatic hydrocarbon group; $A^{11}$ represents a single bond or an optionally substituted $C_1$ to $C_5$ aliphatic hydrocarbon group; $X^{10}$ and $X^{11}$ independently represents an oxygen atom, a carbonyl group, a carbonyloxy group or an oxycarbonyl group; provided that a total number of the carbon atom of $A^{10}$, $A^{11}$, $A^{12}$, $X^{10}$ and $X^{11}$ is 6 or less.

3 Claims, No Drawings

(56) References Cited

U.S. PATENT DOCUMENTS

| | | | |
|---|---|---|---|
| 2007/0167439 | A1 | 7/2007 | Singh et al. |
| 2007/0179140 | A1 | 8/2007 | Argade et al. |
| 2007/0225495 | A1 | 9/2007 | Singh et al. |
| 2007/0299060 | A1 | 12/2007 | Li et al. |
| 2008/0009484 | A1 | 1/2008 | Argade et al. |
| 2008/0009494 | A1 | 1/2008 | Li et al. |
| 2008/0021020 | A1 | 1/2008 | Argade et al. |
| 2008/0027045 | A1 | 1/2008 | Argade et al. |
| 2008/0051412 | A1 | 2/2008 | Argade et al. |
| 2008/0193874 | A1 | 8/2008 | Takata et al. |
| 2008/0312438 | A1 | 12/2008 | Singh et al. |
| 2009/0137589 | A1 | 5/2009 | Argade et al. |
| 2009/0178981 | A1 | 7/2009 | Argade et al. |
| 2009/0202945 | A1 | 8/2009 | Nakagawa et al. |
| 2009/0318687 | A1 | 12/2009 | Singh et al. |
| 2010/0136480 | A1 | 6/2010 | Motoike et al. |
| 2010/0203446 | A1 | 8/2010 | Ichikawa et al. |
| 2011/0053082 | A1 | 3/2011 | Ichikawa et al. |
| 2011/0266534 | A1 | 11/2011 | Yan et al. |
| 2012/0028188 | A1 | 2/2012 | Ichikawa et al. |
| 2012/0052443 | A1 | 3/2012 | Masuyama et al. |
| 2012/0070778 | A1 | 3/2012 | Ichikawa et al. |
| 2012/0148954 | A1 | 6/2012 | Fukumoto et al. |
| 2012/0219899 | A1 | 8/2012 | Ichikawa et al. |
| 2012/0219907 | A1 | 8/2012 | Ichikawa et al. |
| 2012/0219909 | A1 | 8/2012 | Ichikawa et al. |
| 2012/0219912 | A1 | 8/2012 | Ichikawa et al. |
| 2012/0258405 | A1 | 10/2012 | Ichikawa et al. |
| 2012/0264059 | A1 | 10/2012 | Ichikawa et al. |

FOREIGN PATENT DOCUMENTS

| | | | |
|---|---|---|---|
| JP | 55-164824 | A1 | 12/1980 |
| JP | 62-069263 | A | 3/1987 |
| JP | 62-153853 | A | 7/1987 |
| JP | 63-026653 | A | 2/1988 |
| JP | 63-146029 | A | 6/1988 |
| JP | 63-146038 | A | 6/1988 |
| JP | 63-163452 | A | 7/1988 |
| JP | 11-052575 | A | 2/1999 |
| JP | 2002-131917 | A | 5/2002 |
| JP | 2002-226436 | A | 8/2002 |
| JP | 2006-257078 | A | 9/2006 |
| JP | 2006-276851 | A | 10/2006 |
| JP | 2007-119696 | A | 5/2007 |
| JP | 2007-514775 | A | 6/2007 |
| JP | 2009-19146 | A | 1/2009 |
| JP | 2009-86358 | A | 4/2009 |
| JP | 2010-152341 | A | 7/2010 |
| JP | 2010-197413 | A | 9/2010 |
| JP | 2010-204048 | A | 9/2010 |
| WO | WO 2007/116664 | A1 | 10/2007 |
| WO | WO 2011/024953 | A1 | 3/2011 |

OTHER PUBLICATIONS

U.S. Appl. No. 13/404,871, filed Feb. 24, 2012.
U.S. Appl. No. 13/404,054, filed Feb. 24, 2012.
Luis et al., "Non Concerted Pathways in the Generation of Dehydroarenes by Thermal Decomposition of Diaryliodonium Carboxylates1," Tetrahedron, vol. 45, No. 19, pp. 6281-6296, 1989.

* cited by examiner

RESIST COMPOSITION AND METHOD FOR PRODUCING RESIST PATTERN

CROSS-REFERENCE TO RELATED APPLICATIONS

This application claims priority to Japanese Applications No. 2010-191868 filed on Aug. 30, 2010, No. 2010-260921 filed on Nov. 24, 2010, No. 2011-39451 filed on Feb. 25, 2011 and No. 2011-107973 filed on May 13, 2011. The entire disclosures of Japanese Applications No. 2010-191868, No. 2010-260921, No. 2011-39451 and No. 2011-107973 are incorporated hereinto by reference.

BACKGROUND OF THE INVENTION

1. Field of the Invention

The present invention relates to a resist composition and a method for producing a resist pattern.

2. Background Information

Various kinds of photolithographic technique in which short wavelength light such as ArF excimer laser (193 nm of wavelength) is a exposure light source have been actively studied in the past as the semiconductor microfabrication. A resist composition used for such photolithographic technique contains a polymer polymerized a compound represented by the formula (A), a compound represented by the formula (B) and a compound represented by the formula (C); a polymer polymerized a compound represented by the formula (B) and a compound represented by the formula (D); p-cyclohexylphenyl diphenylsulfonium perfluorobutanesulfonate as an acid generator; and a solvent, is described in Patent document, pamphlet of WO 2007/116664.

(A)

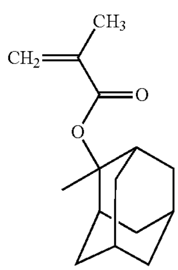

(B)

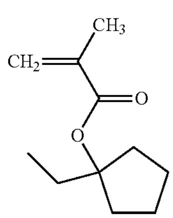

(C)

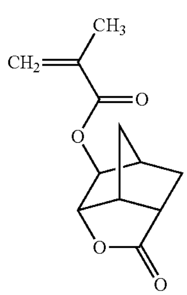

-continued (D)

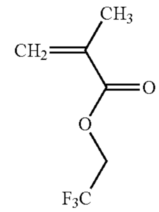

However, with the conventional resist composition, the focus margin (DOE) at producing a resist pattern may be not always satisfied with, the mask error factor (MEF) of the obtained resist pattern may be not always satisfied with, and number of the defect of the resist pattern to be produced from the resist composition may quite increase.

SUMMARY OF THE INVENTION

The present invention provides following inventions.

<1> A resist composition contains a resin having a structural unit derived from a compound represented by the formula (a); and an acid generator.

(a)

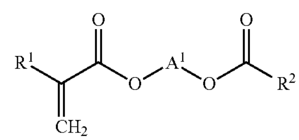

wherein $R^1$ represents a hydrogen atom or a methyl group;

$R^2$ represents an optionally substituted $C_1$ to $C_{18}$ aliphatic hydrocarbon group;

$A^1$ represents an optionally substituted $C_1$ to $C_6$ alkanediyl group or a group represented by the formula (a-g1);

$$—A^{10}—\!\left(X^{10}—A^{11}\right)_s—X^{11}—A^{12}— \tag{a-g1}$$

wherein s represents 0 or 1;

$A^{10}$ and $A^{12}$ independently represent an optionally substituted $C_1$ to $C_5$ aliphatic hydrocarbon group;

$A^{11}$ represents a single bond or an optionally substituted $C_1$ to $C_5$ aliphatic hydrocarbon group;

$X^{10}$ and $X^{11}$ independently represents an oxygen atom, a carbonyl group, a carbonyloxy group or an oxycarbonyl group;

provided that a total number of the carbon atom of $A^{10}$, $A^{11}$, $A^{12}$, $X^{10}$ and $X^{11}$ is 6 or less.

<2> The resist composition according to <1> further contains a solvent.

<3> A method for producing a resist pattern has steps of;

(1) applying the resist composition according to <1> onto a substrate;

(2) drying the applied composition to form a composition layer;

(3) exposing the composition layer using an exposure apparatus;

(4) heating the exposed composition layer; and (5) developing the heated composition layer using a developing apparatus.

Also, the present invention provides following inventions.

<4> The resist composition according to <1> or <2>, wherein the acid generator is a salt represented by the formula (B1).

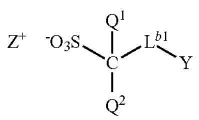

(B1)

wherein $Q^1$ and $Q^2$ independently represent a fluorine atom or a $C_1$ to $C_6$ perfluoroalkyl group;

$L^{b1}$ represents an optionally substituted $C_1$ to $C_{17}$ divalent aliphatic hydrocarbon group, and a —$CH_2$— contained in the aliphatic hydrocarbon group may be replaced by —O— or —CO—;

Y represents an optionally substituted $C_1$ to $C_{18}$ aliphatic hydrocarbon group and a —$CH_2$— contained in the aliphatic hydrocarbon group may be replaced by —O—, —CO— or —$SO_2$—; and $Z^+$ represents an organic cation.

<5> The resist composition according to <1>, <2> or <4>, wherein $A^1$ of the compound (a) is a $C_1$ to $C_6$ alkanediyl group.

<6> The resist composition according to any one of <1>, <2>, <4> and <5>, wherein $A^1$ of the compound (a) is ethylene group.

<7> The resist composition according to any one of <1>, <2>, <4> to <6>, wherein $R^2$ of the compound (a) is an aliphatic hydrocarbon group that has a halogen atom.

<8> The resist composition according to any one of <1>, <2>, <4> to <6>, wherein $R^2$ of the compound (a) is a $C_1$ to $C_3$ perfluoroalkyl group.

<9> The resist composition according to any one of <1>, <2>, <4> to <7>, wherein $R^2$ of the compound (a) is a group represented by the formula (a-g2).

$$-A^{13}-X^{12}-A^{14} \quad \text{(a-g2)}$$

wherein $A^{13}$ represents a $C_3$ to $C_{17}$ aliphatic hydrocarbon group that optionally has a halogen atom;

$X^{12}$ represents a carbonyloxy group or an oxycarbonyl group;

$A^{14}$ represents a $C_3$ to $C_{17}$ aliphatic hydrocarbon group that optionally has a halogen atom;

provided that a total number of the carbon atom of $A^{13}$, $A^{14}$ and $X^{12}$ is 18 or less.

<10> The resist composition according to <9>, wherein $A^{13}$ is an aliphatic hydrocarbon group having a halogen atom or $A^{14}$ is a aliphatic hydrocarbon group having a halogen atom, in the formula (a-g2).

<11> The resist composition according to <9> or <10>, wherein $A^{14}$ is a alicyclic hydrocarbon group that optionally has a halogen atom in the formula (a-g2).

<12> The resist composition according to any one of <1>, <2>, <4> to <11>, wherein $R^2$ of the compound (a) is a group as below;

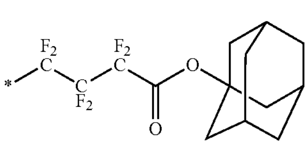

-continued

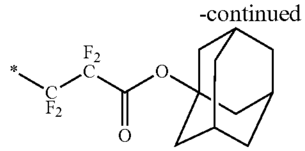

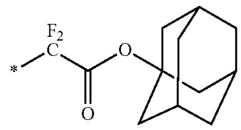

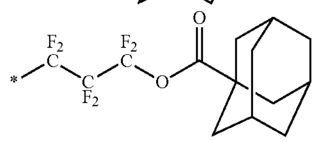

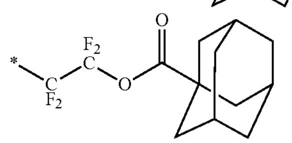

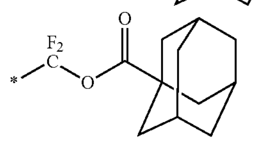

<13> The resist composition according to any one of <1>, <2>, <4> to <12>, wherein Y is an optionally substituted $C_1$ to $C_{18}$ alicyclic hydrocarbon group.

<14> A compound represented by the formula (a').

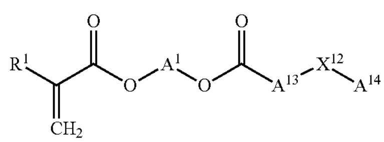

(a')

wherein $R^1$ represents a hydrogen atom or a methyl group;

$A^1$ represents an optionally substituted $C_1$ to $C_6$ alkanediyl group or a group represented by the formula (a-g1)

$$-A^{10}-(X^{10}-A^{11})_s-X^{11}-A^{12}- \quad \text{(a-g1)}$$

wherein s represents 0 or 1;

$A^{10}$ and $A^{12}$ independently represent an optionally substituted $C_1$ to $C_5$ aliphatic hydrocarbon group;

$A^{11}$ represents a single bond or an optionally substituted $C_1$ to $C_5$ aliphatic hydrocarbon group;

$X^{10}$ and $X^{11}$ independently represent an oxygen atom, a carbonyl group, a carbonyloxy group or an oxycarbonyl group;

provided that a total number of the carbon atom of $A^{10}$, $A^{11}$, $A^{12}$, $X^{10}$ and $X^{11}$ is 6 or less;

$A^{13}$ represents a $C_3$ to $C_{17}$ aliphatic hydrocarbon group that optionally has a halogen atom;

$X^{12}$ represents a carbonyloxy group or an oxycarbonyl group;

$A^{14}$ represents a $C_3$ to $C_{17}$ aliphatic hydrocarbon group that optionally has a halogen atom;

provided that a total number of the carbon atom of $A^{13}$ and $A^{14}$ is 17 or less.

<15> The compound according to <14>, wherein $A^{13}$ is an aliphatic hydrocarbon group having a halogen atom in the formula (a').

<16> The compound according to <14> or <15>, wherein $A^{14}$ is an alicyclic hydrocarbon group that optionally has a halogen atom in the formula (a').

<17> The compound according to <14>, wherein a structure represented by the formula *-$A^{13}$-$X^{12}$-$A^{14}$ in the formula (a') is a group as below (* represents a bond to a carbonyl group);

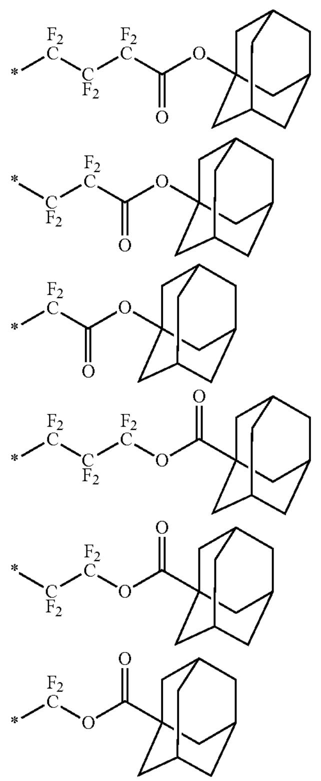

<18> A resin having a structural unit derived from a compound according to <14> to <17>.

According to a resist composition of the present invention, it is possible to produce a resist pattern with excellent DOF (wide DOF) and with excellent MEF at producing the resist pattern, and with few defects in the pattern.

DETAILED DESCRIPTION OF THE PREFERRED EMBODIMENTS

<Resist Composition>

A resist composition of the present invention contains;

a resin (hereinafter may be referred to as "resin (A)"), and an acid generator (hereinafter may be referred to as "acid generator (B)").

Further, the resist composition may contain a solvent and an additive such as a basic compound which is known as a quencher in this technical field, as needed.

<Resin (A)>

The resin (A) has a structural unit derived from a compound represented by the formula (a) (hereinafter may be referred to as "compound (a)").

<Compound (a)>

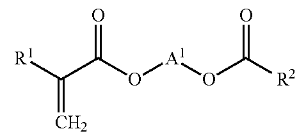

(a)

wherein $R^1$ represents a hydrogen atom or a methyl group;

$R^2$ represents an optionally substituted $C_1$ to $C_{18}$ aliphatic hydrocarbon group;

$A^1$ represents an optionally substituted $C_1$ to $C_6$ alkanediyl group or a group represented by the formula (a-g1) (hereinafter may be referred to as "group (a-g1)");

$$-A^{10}-\left(X^{10}-A^{11}\right)_s-X^{11}-A^{12}- \quad \text{(a-g1)}$$

wherein s represents 0 or 1;

$A^{10}$ and $A^{12}$ independently represent an optionally substituted $C_1$ to $C_5$ aliphatic hydrocarbon group;

$A^{11}$ represents a single bond or an optionally substituted $C_1$ to $C_5$ aliphatic hydrocarbon group;

$X^{10}$ and $X^{11}$ independently represent an oxygen atom, a carbonyl group, a carbonyloxy group or an oxycarbonyl group;

provided that a total number of the carbon atom of $A^{10}$, $A^{11}$, $A^{12}$, $X^{10}$ and $X^{11}$ is 6 or less.

The alkanediyl group of the $A^1$ may be either a linear or a branched chain alkanediyl group. Examples of the alkanediyl group include a linear alkanediyl group such as methylene, ethylene, propane-1,3-diyl, propane-1,2-diyl, butane-1,4-diyl, pentane-1,5-diyl, pentane-1,4-diyl, hexane-1,6-diyl and hexane-1,5-diyl; a branched chain alkanediyl group such as 1-methyl-1,3-propylene, 2-methyl-1,3-propylene, 2-methyl-1,2-propylene, 1-methyl-1,4-butylene and 2-methyl-1,4-butylen groups.

Examples of the substituent of the alkanediyl group include a hydroxy group and a $C_1$ to $C_6$ alkoxy group.

Examples of the group (a-g1) containing an oxygen atom include as below. In the formula as below, the group is represented so as to correspond with two sides of the formula (a), that is, the left side of the group bonds to —O— of $R^1$ side and the right side of the group bonds to —O— of $R^2$ side, * represents a bond.

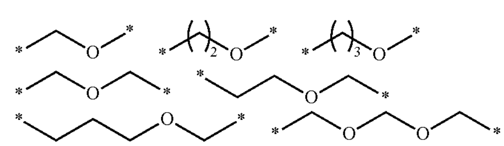

Examples of the group (a-g1) containing a carbonyl group include as below.

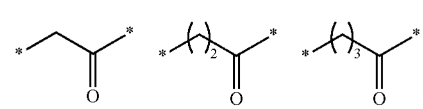

-continued

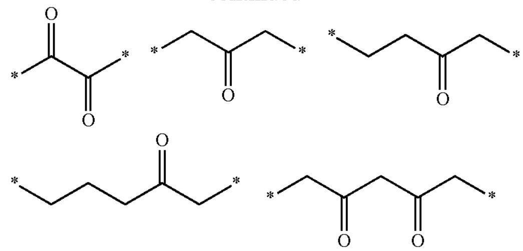

Examples of the group (a-g1) containing a carbonyloxy group include as below.

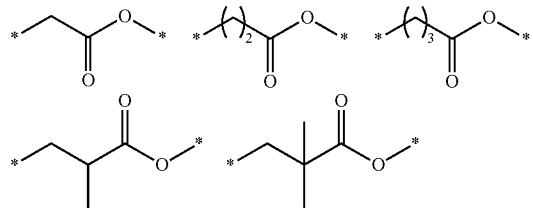

Examples of the group (a-g1) containing an oxycarbonyl group include as below.

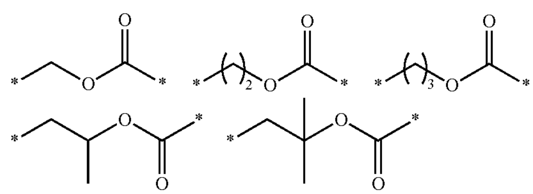

Among theses, $A^1$ is preferably an alkanediyl group, more preferably non-substituted alkanediyl group, still more preferably a $C_1$ to $C_4$ alkanediyl group, and further more preferably ethylene group.

The aliphatic hydrocarbon group of $R^2$ may include a carbon-carbon double bond, but a saturated aliphatic hydrocarbon group is preferable. The saturated aliphatic hydrocarbon group of $R^2$ may be either a linear or a branched chain alkyl group, an alicyclic hydrocarbon group, and a group in combination thereof.

Examples of an alkyl group include methyl, ethyl, propyl, butyl, pentyl, hexyl, heptyl and octyl groups.

Examples of an alicyclic hydrocarbon group include a monocyclic hydrocarbon group, i.e., a cycloalkyl group, such as cyclopentyl, cyclohexyl, methyl cyclohexyl, dimethyl cyclohexyl, cycloheptyl and cyclooctyl groups; and polycyclic hydrocarbon groups such as decahydronaphtyl, adamantyl, norbornyl (i.e., bicyclo[2.2.1]hexyl), and methyl norbornyl groups as well as groups as below.

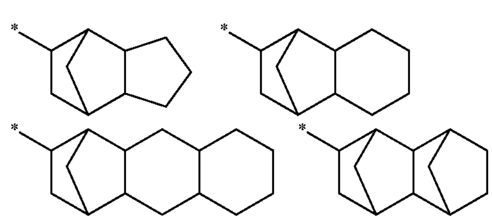

-continued

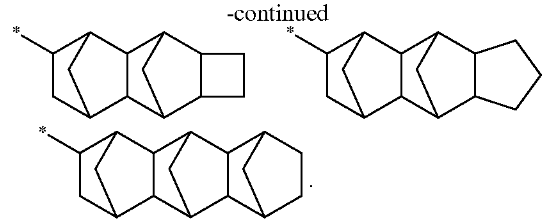

$R^2$ may be either a substituted or non-substituted aliphatic hydrocarbon group, and preferably a substituted aliphatic hydrocarbon group.

Examples of the substituent of $R^2$ preferably include a halogen atom or a group represented by the formula (a-g3) (hereinafter may be referred to as "group (a-g3)").

$$-X^{12\prime}-A^{14} \qquad \text{(a-g3)}$$

wherein $X^{12\prime}$ represents an oxygen atom, a carbonyl group, a carbonyloxy group or an oxycarbonyl group;

$A^{14}$ represents a $C_3$ to $C_{17}$ aliphatic hydrocarbon group that optionally has a halogen atom.

Examples of the aliphatic hydrocarbon group that has a halogen atom of $R^2$ include an alkyl group substituted with a halogen atom and an alicyclic hydrocarbon group substituted with a halogen atom (preferably a cycloalkyl group substituted with a halogen atom).

Examples of the halogen atom include fluorine, chlorine, bromine and iodine atoms. Among these, fluorine atom is preferable.

A perfluoroalkyl group in which all hydrogen atoms constituting the alkyl group are substituted with halogen atom, and a perfluorocycloalkyl group in which all hydrogen atoms constituting the cycloalkyl group are substituted with halogen atom are preferable as the aliphatic hydrocarbon group that has a halogen atom of $R^2$. Among these, it is more preferably a perfluoroalkyl group, and still more preferably a $C_1$ to $C_6$ perfluoroalkyl group, and further still more preferably a $C_1$ to $C_3$ perfluoroalkyl group.

Examples of the perfluoroalkyl group include trifluoromethyl, perfluoroethyl, perfluoropropyl, perfluorobutyl, perfluoropentyl, perfluorohexyl, perfluoroheptyl and perfluorooctyl groups.)

$X^{12\prime}$ is preferably a carbonyloxy group or an oxycarbonyl group.

Examples of the compound (a) in which $R^2$ is an aliphatic hydrocarbon group substituted with a fluorine atom and $A^1$ is ethylene group include compounds represented by the formula (a1) to the formula (a22) below.

(a1)

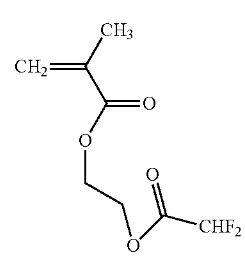

-continued
(a2)
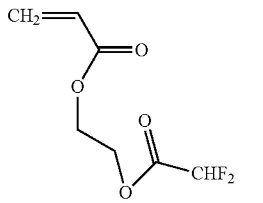
(a3)
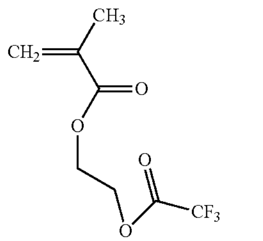
(a4)
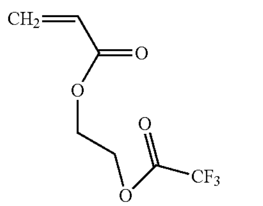
(a5)
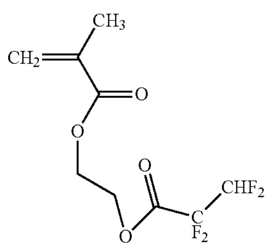
(a6)
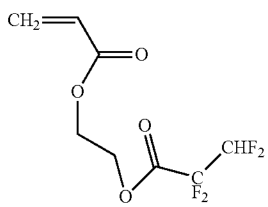
(a7)
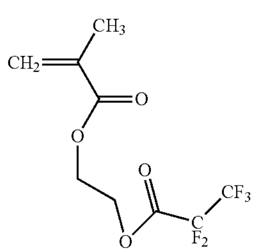
(a8)
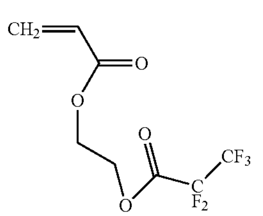
-continued
(a9)
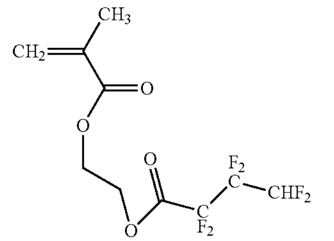
(a10)
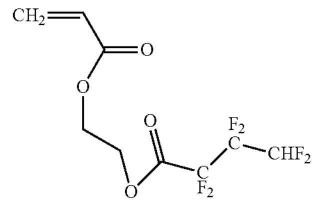
(a11)
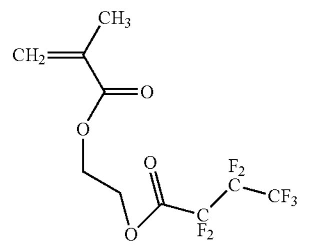
(a12)
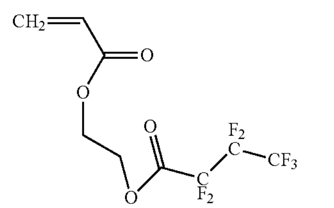
(a13)
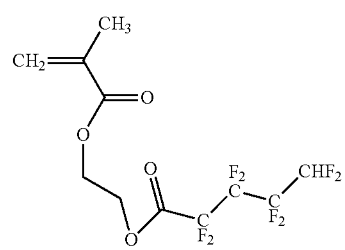
(a14)
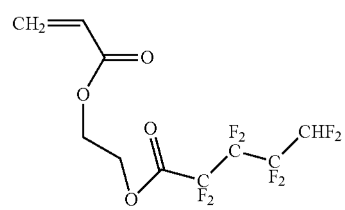
(a15)
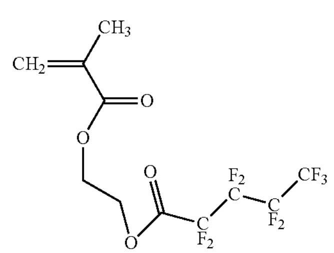

-continued

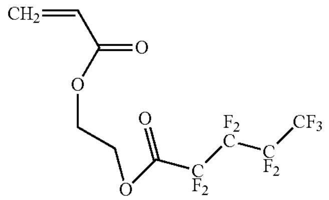

(a16)

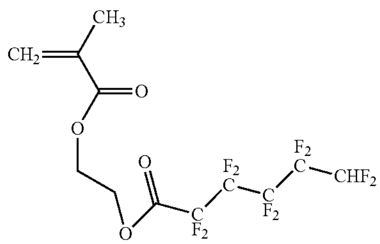

(a17)

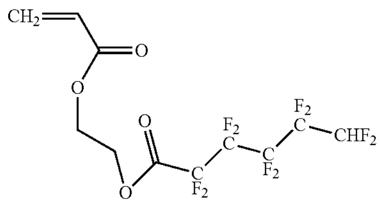

(a18)

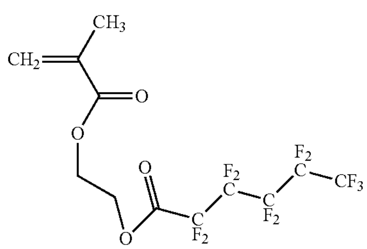

(a19)

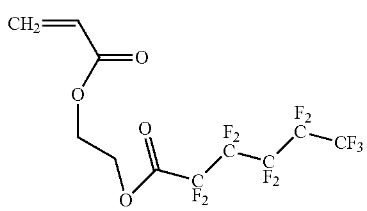

(a20)

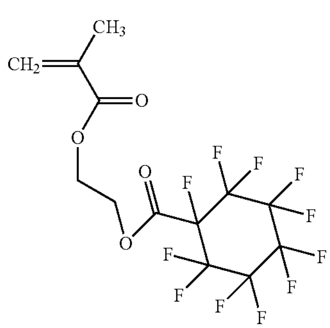

(a21)

-continued (a22)

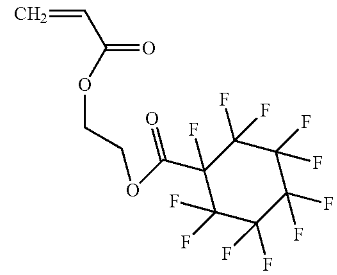

The compounds (a) in which $R^2$ is a perfluoroalkyl group or a perfluorocycloalkyl group correspond to compounds represented by the formula (a3), (a4), (a7), (a8), (a11), (a12), (a15), (a16), (a19), (a20), (a21) and (a22).

When the aliphatic hydrocarbon group of $R^2$ is substituted with group (a-g3), the number of the group (a-g3) may be one or more. In any case, the total number of the carbon atom of the $R^2$ substituted with group(s) (a-g3) is preferably 15 or less, and more preferably 12 or less. Thus, $R^2$ substituted with one group (a-g3) is preferable.

Therefore, $R^2$ is preferably a group represented by the formula (a-g2) below (hereinafter may be referred to as "group (a-g2)").

$$-A^{13}-X^{12}-A^{14} \quad \text{(a-g2)}$$

wherein $A^{13}$ represents a $C_3$ to $C_{17}$ aliphatic hydrocarbon group that optionally has a halogen atom;

$X^{12}$ represents a carbonyloxy group or an oxycarbonyl group;

$A^{14}$ represents a $C_3$ to $C_{17}$ aliphatic hydrocarbon group that optionally has a halogen atom;

provided that a total number of the carbon atom of $A^{13}$, $A^{14}$ and $X^{12}$ is 18 or less.

Preferable examples of the group (a-g2) include groups as below. * represents a bond to a carbonyl group.

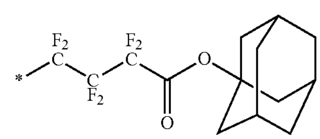

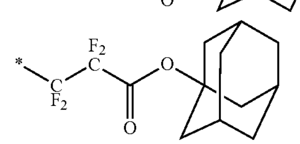

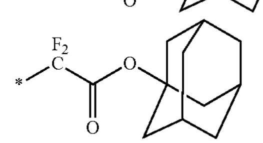

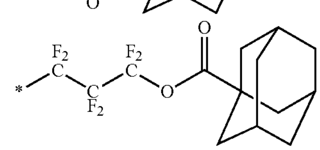

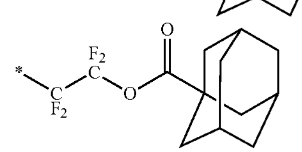

-continued

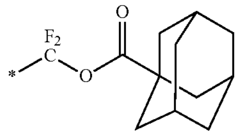

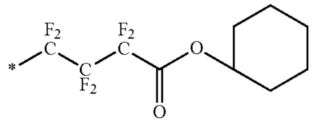

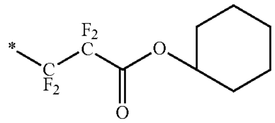

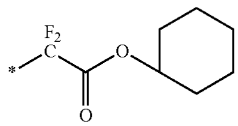

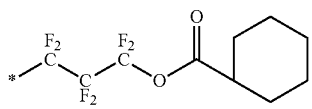

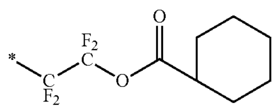

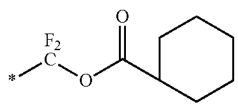

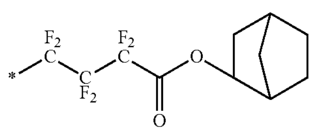

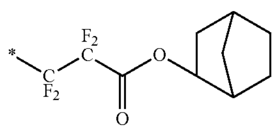

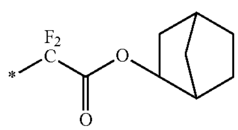

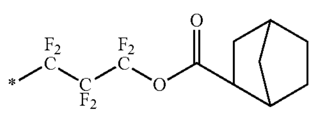

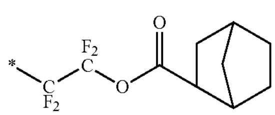

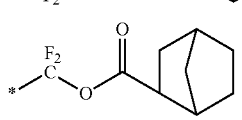

The compound (a) in which $R^2$ is an aliphatic hydrocarbon group substituted with one group (a-g3), that is $R^2$ is the group (a-g2), is represented by the formula (a'), hereinafter may be referred to as "compound (a')".

(a')

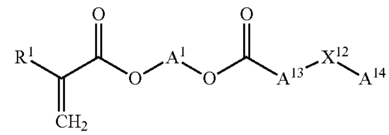

wherein $A^{13}$ represents a $C_3$ to $C_{17}$ aliphatic hydrocarbon group that optionally has a halogen atom;

$X^{12}$ represents a carbonyloxy group or an oxycarbonyl group;

$A^{14}$ represents a $C_3$ to $C_{17}$ aliphatic hydrocarbon group that optionally has a halogen atom;

provided that a total number of the carbon atom of $A^{13}$ and $A^{14}$ is 17 or less;

$A^1$ and $R^1$ are the same definition of the above.

The compound (a') is effective and new for the producing material of the resin (A) of the present resist composition. Thus, the present invention include a invention according to the compound (a').

In the compound (a'), both of $A^{13}$ and $A^{14}$ may be group that has a halogen atom, but only either group is preferably an aliphatic hydrocarbon group that has a halogen atom. Among these, it is preferably that only $A^{13}$ is a group having a halogen atom, particularly, more preferably that $A^{13}$ is an alkanediyl group having a fluorine atom, and still more preferably that $A^{13}$ is a perfluoroalkanediyl group.

Examples of the compound (a') in which $R^2$ is a perfluoroalkanediyl group and $A^1$ is ethylene group include compounds represented by the formula (a'1) to the formula (a'46) below.

(a'1)

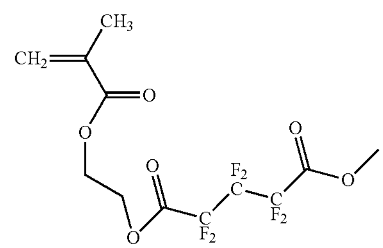

(a'2)

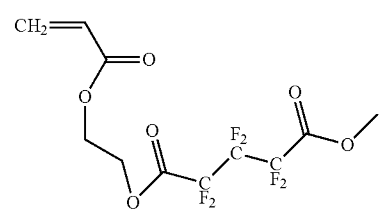

(a'3)

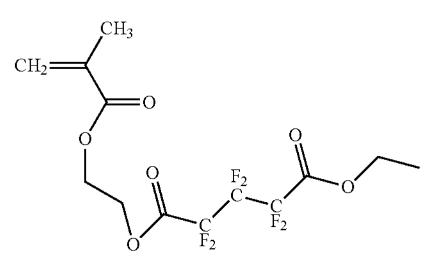

-continued
(a'4)
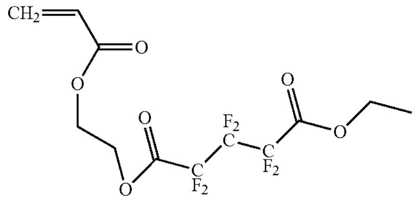
(a'5)
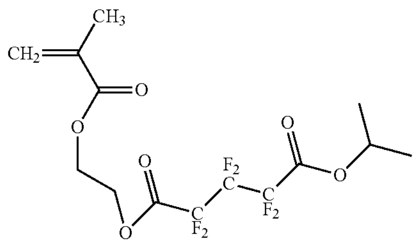
(a'6)
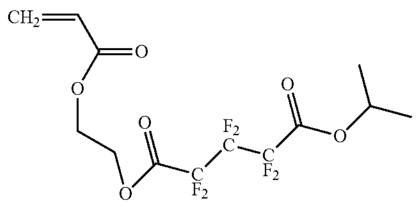
(a'7)
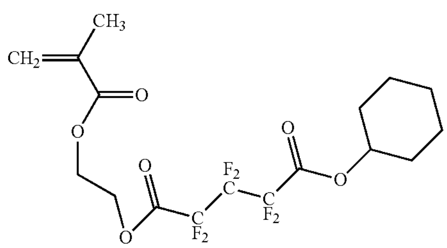
(a'8)
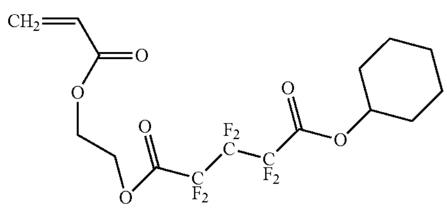
(a'9)
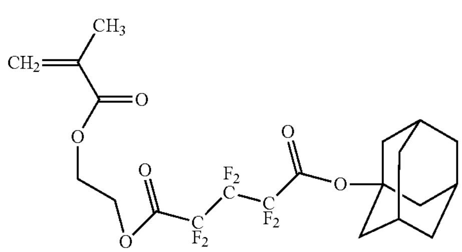
(a'10)
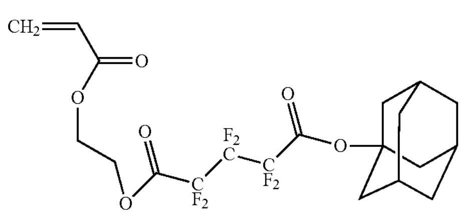
-continued
(a'11)
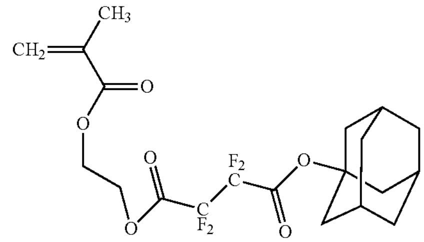
(a'12)
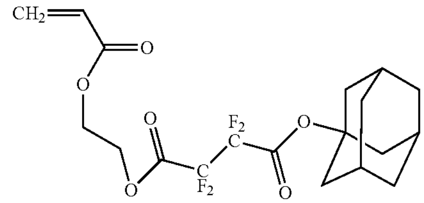
(a'13)
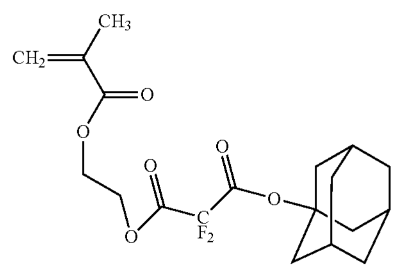
(a'14)
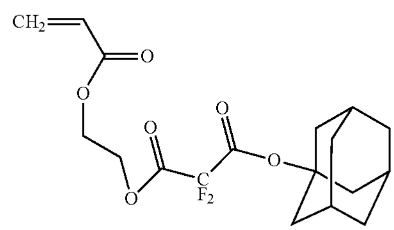
(a'15)
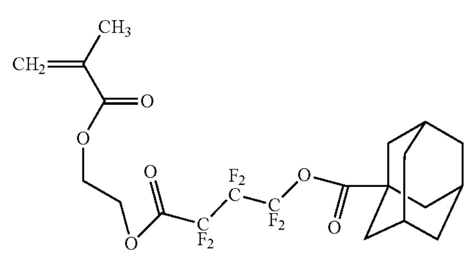
(a'16)
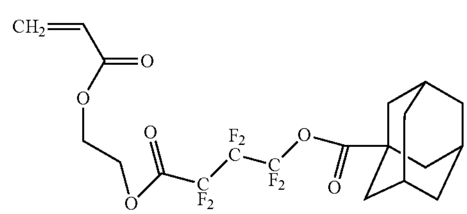

-continued
(a'17)
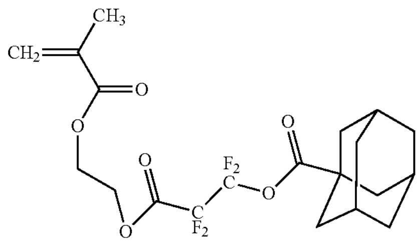
(a'18)
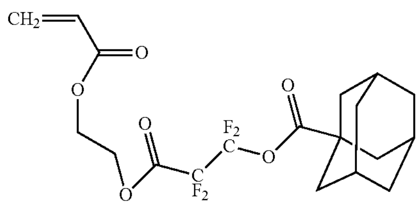
(a'19)
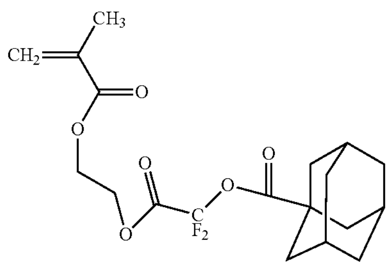
(a'20)
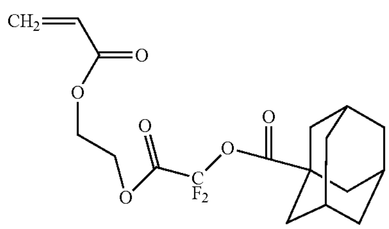
(a'21)
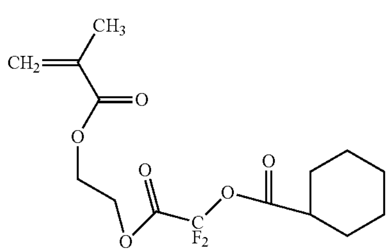
(a'22)
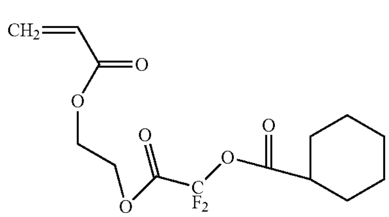
-continued
(a'23)
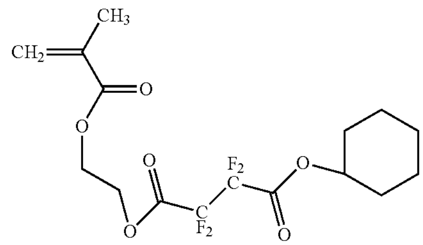
(a'24)
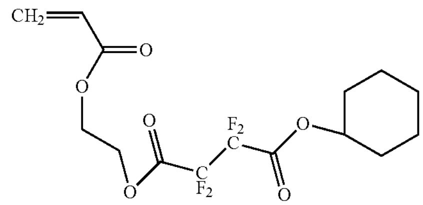
(a'25)
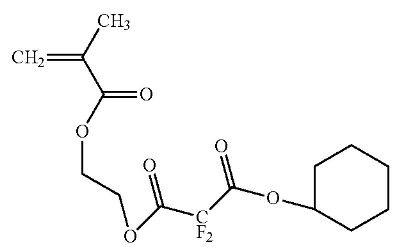
(a'26)
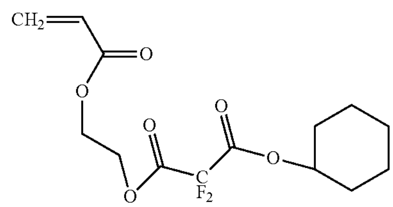
(a'27)
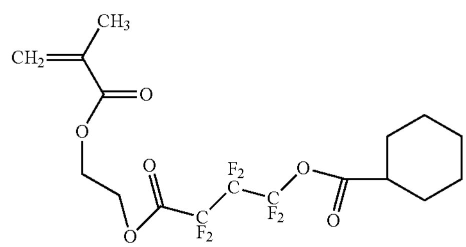
(a'28)
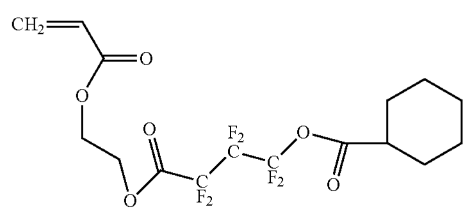
(a'29)
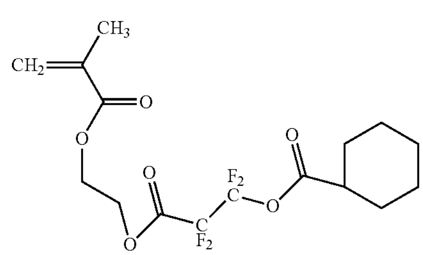

-continued
(a'30)
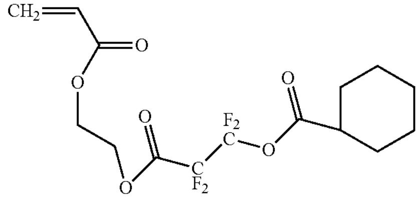
(a'31)
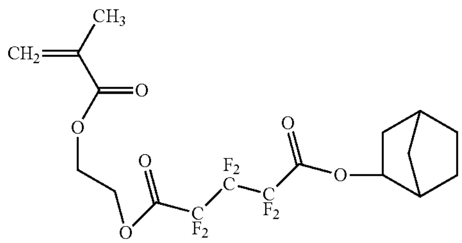
(a'32)
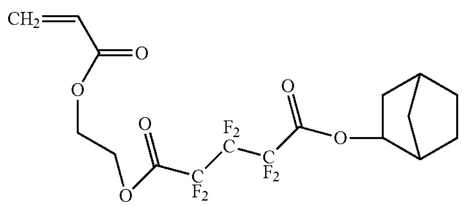
(a'33)
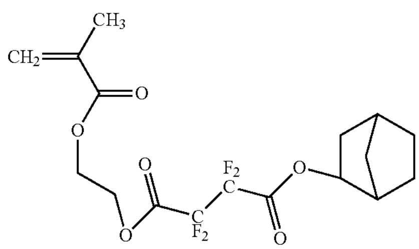
(a'34)
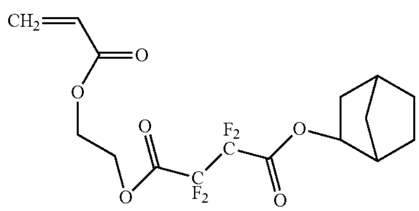
(a'35)
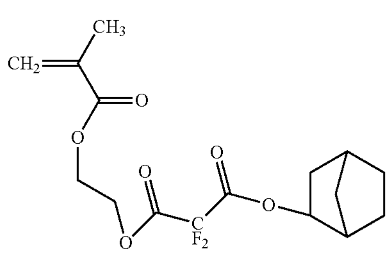
(a'36)
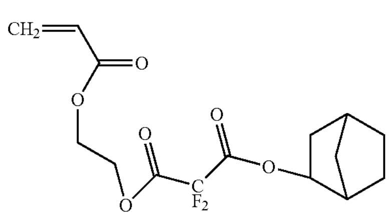
-continued
(a'37)
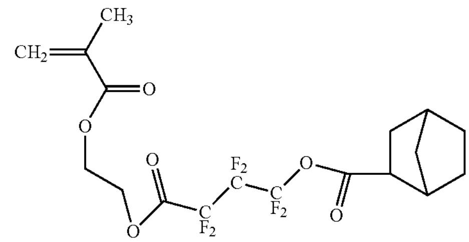
(a'38)
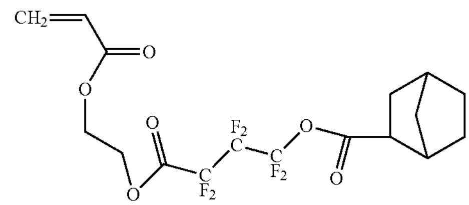
(a'39)
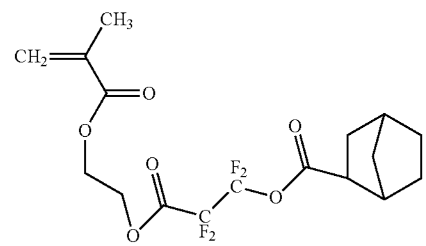
(a'40)
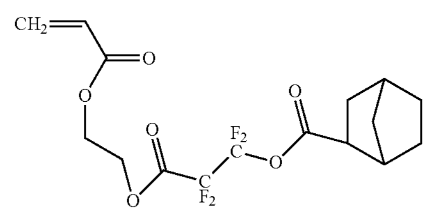
(a'41)
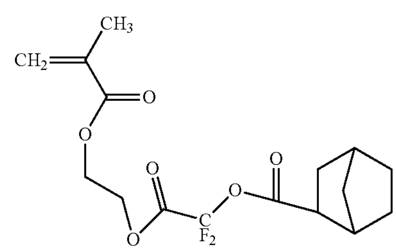
(a'42)
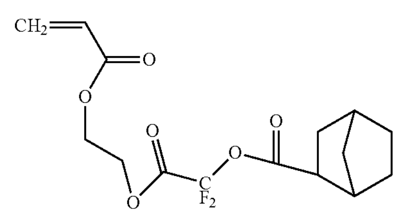
(a'43)
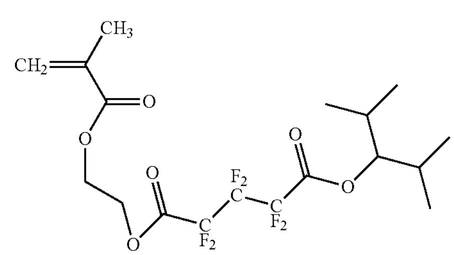

-continued (a'44)

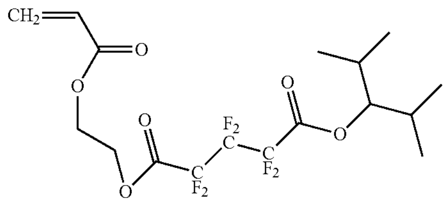

(a'45)

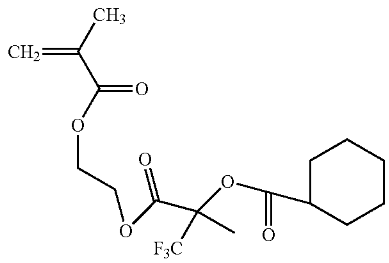

(a'46)

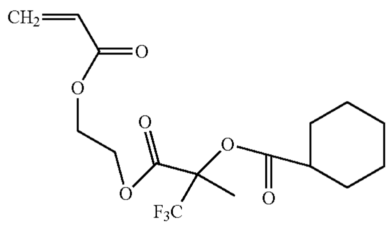

Among these, the compounds represented by the formula (a'7) to the formula (a'42) are preferable.

The total carbon number of $A^{13}$ and $A^{14}$ may optionally selected from 17 or less, the carbon number of $A^{13}$ is preferably 1 to 6, and more preferably 1 to 3, the carbon number of $A^{14}$ is preferably 4 to 15, and more preferably 5 to 12. Among these, $A^{14}$ is preferably a $C_6$ to $C_{12}$ alicyclic hydrocarbon group, and more preferably a cyclohexyl or an adamantyl group.

The compound (a) can be produced by methods described as below (1) to (3).

(1) A compound represented by the formula (a) can be obtained by reacting a compound represented by the formula (as-1) and a compound represented by the formula (as-2) in the presence of a basic catalyst.

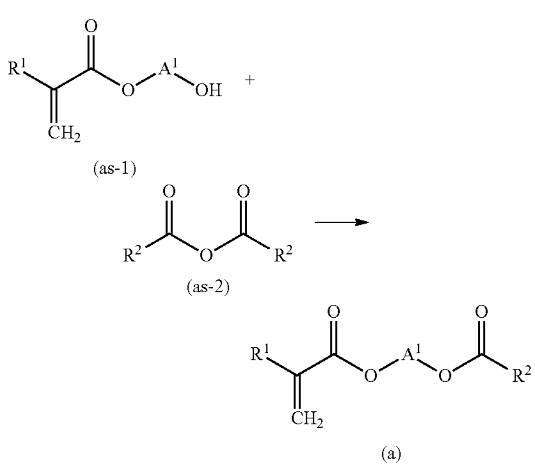

wherein $R^1$, $R^2$ and $A^1$ have the same meaning as defined above.

This reaction is usually carried out in a solvent. Examples of the basic catalyst preferably include pyridine. Examples of the solvent preferably include tetrahydrofuran.

As the compound represented by the formula (as-1), a marketed product, or a product which is produced according to the known method may be used.

The known method is, for example, a method in which a (meth)acrylic acid or a derivative (e.g., a (meth)acrylic acid chloride) is condensed with an appropriate diol (HO-$A^1$-OH). Examples of the marketed product include hydroxyethylmethacrylate, and hydroxybutylmethacrylate.

As the compound represented by the formula (as-2), a compound which is converted from a carboxylic acid to an acid anhydride corresponding to the kinds of $R^2$ may be used. Examples of the marketed product include heptafluoroisobutyric anhydride.

(2) The compound (a) can be produced by a method described in scheme below.

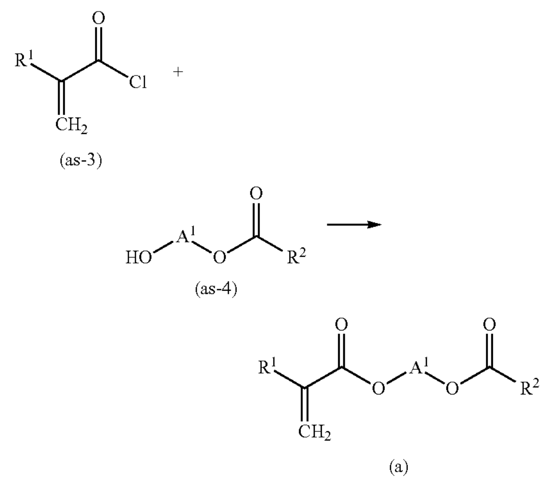

The compound represented by the formula (a) can be obtained by reacting a compound represented by the formula (as-3) and a compound represented by the formula (as-4) in the presence of or in the absence of a solvent. A deoxidizing agent (e.g., sodium carbonate) may be allowed to coexist in this reaction. Examples of the solvent preferably include tetrahydrofuran, methyl isobutyl ketone and toluene.

The compound represented by the formula (as-3) is a (meth)acryl chloride, and it is a marketed product. Alternatively, a compound represented by the formula (as-3) in which a chorine atom is replaced with a bromine or an iodine atom may be used in stead of the compound represented by the formula (as-3). The compound represented by the formula (as-3) in which a chorine atom is replaced with a bromine or an iodine atom can be produced by reacting a (meth)acrylic acid and a brominating agent or a iodinating agent.

The compound represented by the formula (as-4) can be produced by the condensation of a carboxylic acid (e.g., $R^2$—COOH) or a derivative (e.g., $R^2$—COCl) corresponding to the kinds of $R^2$ with an appropriate diol (HO-$A^1$-OH).

(3) The compound (a) can be produced by a method described in scheme below.

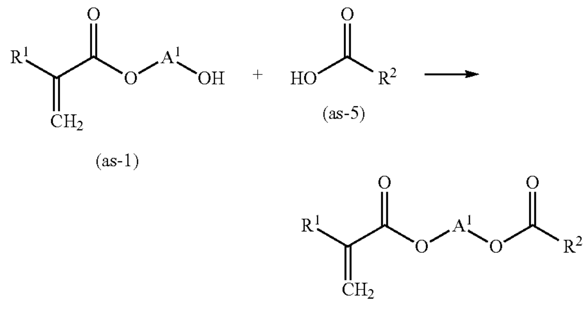

(as-1) (as-5) (a)

The compound represented by the formula (a) can be obtained by reacting a compound represented by the formula (as-1) and a compound represented by the formula (as-5).

Examples of compound represented by the formula (as-1) include the same as defined above.

A carboxylic acid represented by the formula (as-5) can be produced corresponding to the kinds of $R^2$ and according to the known method. When the compound represented by the formula (a') is produced, the following compounds can be used.

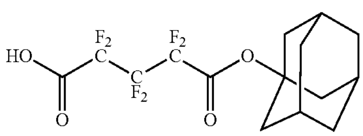
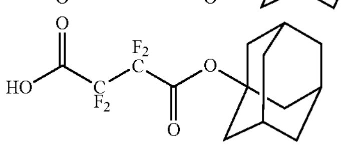
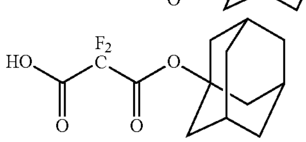
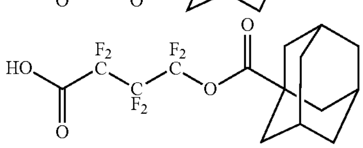
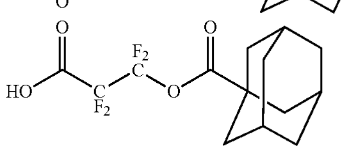
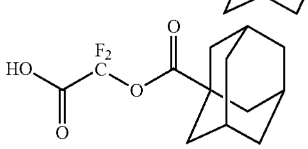
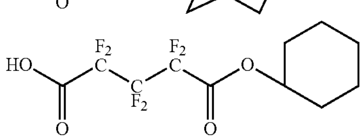
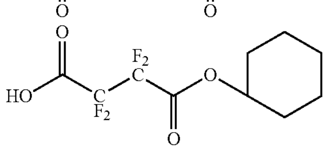

-continued

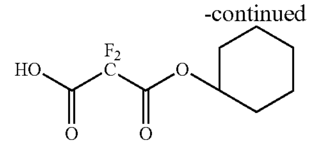
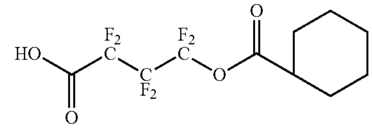
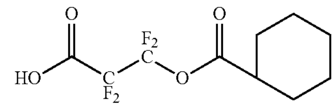
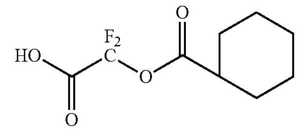
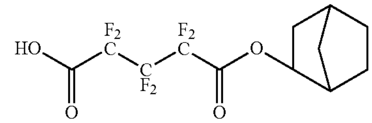
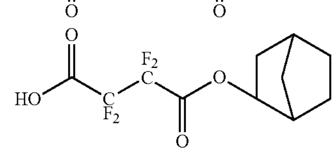
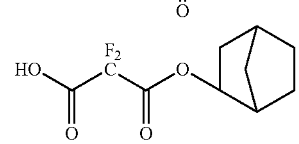
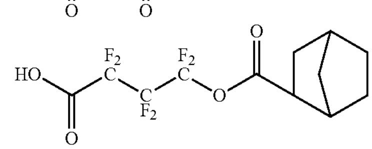
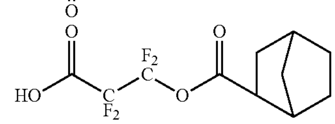
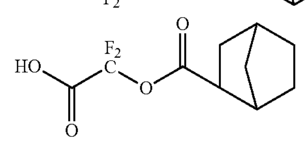

The reaction of the compound represented by the formula (as-1) and the carboxylic acid represented by the formula (as-5) is usually carried out in a solvent. Examples of the solvent preferably include tetrahydrofuran and toluene. A known esterification agent (e.g., an acid catalyst and carbodiimide catalyst) is allowed to coexist in this reaction.

The proportion of the structural units derived from the compound (a) in the resin (A) is generally 1 to 100 mole %, preferably 5 to 95 mole %, and more preferably 10 to 90 mole %, with respect to the total structural units (100 mole %) constituting the resin (A).

For achieving the proportion of the structural units derived from the compound (a) in the resin (A) within the above range, the amount of the compound (a) used can be adjusted with respect to the total amount of the monomer used when the resin (A) is produced (the same shall apply hereinafter for corresponding adjustment of the proportion). The compound (a) may be used as a single compound or as a mixture of two or more compounds when the resin (A) is produced.

The present resist composition preferably is a resist composition which can form a resist pattern through a synergetic effect of the resin and the acid generator (B). Therefore, the resin (A) preferably is insoluble or poorly soluble in alkali aqueous solution and may be converted into a resin soluble in an alkali aqueous solution by the action of an acid. Such resin having the properties and having the structural unit derived from the compound (a) hereinafter may be referred to as "resin (AA)".

Here "be converted into a resin soluble in an alkali aqueous solution by the action of an acid" means a resin that is insoluble or poorly soluble in aqueous alkali solution before contact with the acid becomes soluble in aqueous alkali solution after contact with an acid.

The resin (AA) therefore contains hydrophilic groups among which at least a part is protected by a protecting group, which can be removed by the action of an acid, and preferably all hydrophilic groups are protected by the protecting group. Such protecting groups will deprotect by the action of the acid, and resin (AA) will be converted into a resin which is soluble in an alkali aqueous solution. Hereinafter the hydrophilic group protected by the protecting group may be referred to as an "acid-labile group". Examples of the acid-labile group include a hydroxy group and a carboxy group, and a carboxy group is preferable. That is, the "acid-labile group" is a group in which an elimination group (i.e., the protecting group) is cleaved in contact with the acid and resulting in having a hydrophilic group such as a carboxy or a hydroxy group. The resin (AA) can be produced by polymerizing the compound (a) with a monomer having the acid-labile group.

In the present resist composition, the resin (A) itself may not always have the above properties. Such resin having the structural unit derived from the compound (a) but not having the properties hereinafter may be referred to as "resin (AB)".

By containing the resin (AA) and/or the resin (AB) in the resist composition, the composition brings an excellent mask error factor (MEF) and wide focus margin (DOF) when forming the resist pattern, and the resist pattern can be formed with few defects from the resist composition.

The resin (A) is preferably has a structural unit derived from a following monomer or a known monomer.

In the present specification, any group exemplified below is applicable to any of the chemical formulae having a similar group with optionally selecting the number of carbon atoms, unless otherwise specified. When a group enables linear and branched chain and/or cyclic structures, all structures may be included and may simultaneously present in one group, unless otherwise specified. When there is a stereoisomeric form, all stereoisomeric forms are included. Each group enables monovalent, or di- or more-valent group depending on the bonded position and bonding form.

A hydrocarbon group includes an aliphatic hydrocarbon group and an aromatic group. The aliphatic hydrocarbon group includes a chain aliphatic hydrocarbon group, an alicyclic hydrocarbon group and a combination thereof. The aliphatic hydrocarbon group may include a carbon-carbon double bond, but a saturated aliphatic hydrocarbon group is preferable.

Examples of a monovalent chain aliphatic hydrocarbon group include methyl, ethyl, propyl, butyl, pentyl, hexyl, heptyl, octyl, decyl, dodecyl, hexadecyl, pentadecyl, hexyldecyl, heptadecyl and octadecyl groups. The aliphatic hydrocarbon group may be any of a liner and a branched chain aliphatic hydrocarbon groups.

Examples of a divalent chain aliphatic hydrocarbon group include a group in which one hydrogen atom is removed from the above the monovalent chain aliphatic hydrocarbon group.

The cyclic aliphatic hydrocarbon group may be any of a monocyclic or a polycyclic aliphatic hydrocarbon groups. The cyclic aliphatic hydrocarbon group hereinafter may be referred to as "alicyclic hydrocarbon group".

Examples of a monovalent alicyclic hydrocarbon group include a group in which one hydrogen atom is removed from an alicyclic hydrocarbon. Examples of a divalent alicyclic hydrocarbon group include a group in which two hydrogen atoms are removed from the alicyclic hydrocarbon group.

Examples of the alicyclic hydrocarbon typically include a cycloalkane below.

(KA-1)

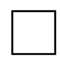
(KA-2)

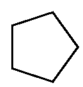
(KA-3)

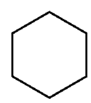
(KA-4)

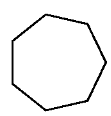
(KA-5)

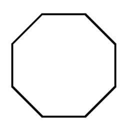
(KA-6)

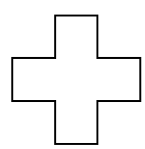
(KA-7)

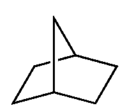
(KA-8)

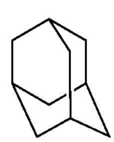
(KA-9)

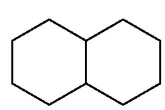
(KA-10)

-continued (KA-11)

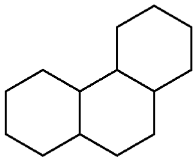

(KA-12)

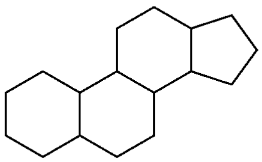

(KA-13)

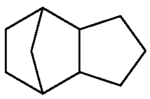

(KA-14)

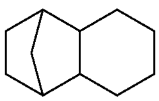

(KA-15)

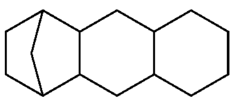

(KA-16)

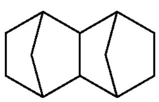

(KA-17)

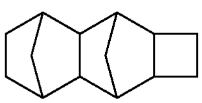

(KA-18)

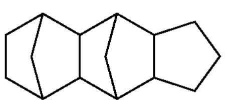

(KA-19)

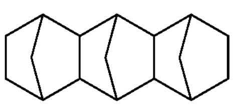

Examples of the aromatic hydrocarbon group typically include an aryl group such as phenyl, naphthyl, anthryl, biphenyl, phenanthryl and fluorenyl groups.

The aliphatic hydrocarbon group and the aromatic hydrocarbon group may be substituted with a substituent.

Typical examples of the substituent of the aliphatic hydrocarbon group include a halogen atom, an alkoxy group, an alkylthio group, an acyl group, an aryl group, an aralkyl group and an aryloxy group.

Typical examples of the substituent of the aromatic hydrocarbon group include a halogen atom, an alkoxy group, an alkylthio group, an acyl group, an alkyl group and an aryloxy group.

Examples of the halogen atom include fluorine, chlorine, bromine and iodine atoms.

Examples of the alkoxyl group include methoxy, ethoxy, propoxy, butoxy, pentyloxy, hexyloxy, heptyloxy, octyloxy, decyloxy and dodecyloxy groups. The alkoxyl group may be any of a liner and a branched chain alkoxyl groups.

Examples of the alkylthio group include a group in which an oxygen atom in the alkoxy group is replaced by a sulfur atom.

Examples of the acyl group include a group bonding a carbonyl group to the alkyl group, such as, acetyl, propionyl, butyryl, valeryl, hexylcarbonyl, heptylcarbonyl, octylcarbonyl, decylcarbonyl and dodecylcarbonyl groups, and a group bonding a carbonyl group to the aryl group. The alkyl group in the acyl group may be any of a liner and a branched chain alkyl groups.

Examples of the aryloxy group include a group bonding an oxygen atom to the aryl group.

Examples of the aralkyl group include benzyl, phenethyl, phenylpropyl, naphthylmethyl and naphthylethyl groups.

Examples of the aryl group and the alkyl group include the same as defined above.

"(meth)acrylic monomer" means at least one monomer having a structure of "$CH_2$═CH—CO—" or "$CH_2$═C($CH_3$)—CO—", as well as "(meth)acrylate" and "(meth)acrylic acid" mean "at least one acrylate or methacrylate" and "at least one acrylic acid or methacrylic acid", respectively.

<Monomer (a1)>

The monomer having an acid-labile group hereinafter may be referred to as "monomer (a1)". Examples of the acid-labile group when the hydrophilic group is carboxy group include a group in which a hydrogen atom of the carboxyl group (i.e., —COOH) is placed with an organic group and an atom of the organic group which bonds to —O— of the carboxyl group is tertiary carbon atom.

Among such the acid-labile group, preferred examples thereof include a group represented by the formula (1) below. Hereinafter the group represented by the formula (1) may refer to as an "acid-labile group (1)".

(1)

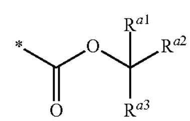

wherein $R^{a1}$ to $R^{a3}$ independently represent a $C_1$ to $C_8$ aliphatic hydrocarbon group or $R^{a1}$ and $R^{a2}$ may be bonded together with a carbon atom bonded to $R^{a1}$ and $R^{a2}$ to form a $C_3$ to $C_{20}$ ring, at least one —$CH_2$— contained in the aliphatic hydrocarbon group or the ring may be replaced by —O—, —S— or —CO—, * represents a bond.

Examples of the aliphatic hydrocarbon group of $R^{a1}$ to $R^{a3}$ include an alkyl group and an alicyclic hydrocarbon group.

Examples of the alkyl group include methyl, ethyl, n-propyl, iso-propyl, n-butyl, sec-butyl, tert-butyl, iso-butyl, n-pentyl, iso-pentyl, tert-pentyl, neo-pentyl, 1-methylbutyl, 2-methylbutyl, n-hexyl, 1-methylpentyl, 1,2-dimethylpropyl, and 1-ethylpropyl groups. Among these, the alkyl group preferably has 1 to 8 carbon atoms.

Examples of the alicyclic hydrocarbon group include a monocyclic or polycyclic saturated hydrocarbon groups such as cyclopropyl, cyclobutyl, cyclopentyl, cyclohexyl, cycloheptyl, cyclooctyl groups; and polycyclic hydrocarbon groups such as decahydronaphtyl, adamantyl, norbornyl (i.e., bicyclo[2.2.1]hexyl), and methyl norbornyl groups as well as groups as below.

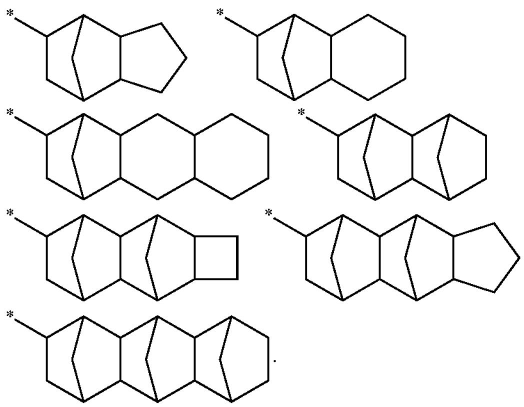

When $R^{a1}$ and $R^{a2}$ are bonded together to form a ring, examples of the group —C($R^{a1}$)($R^{a2}$)($R^{a3}$) include a group below.

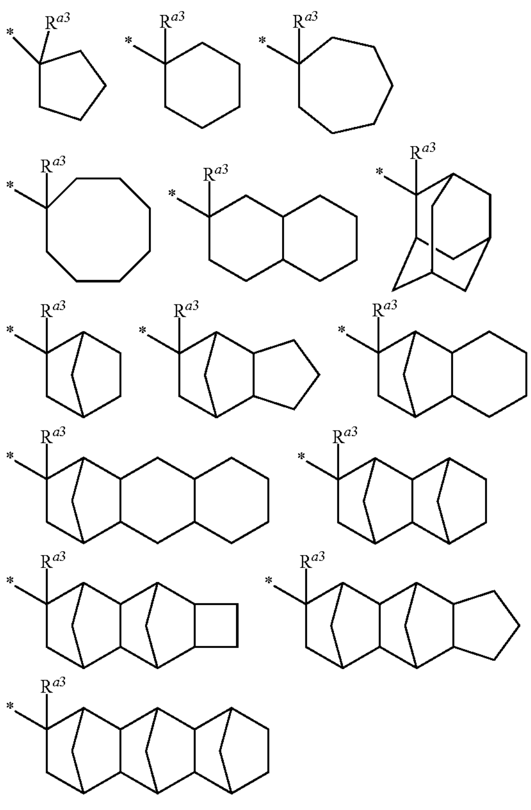

The ring preferably has 3 to 12 carbon atoms.

Specific examples of the acid-labile group include, for example, 1,1-dialkylalkoxycarbonyl group (a group in which $R^{a1}$ to $R^{a3}$ are alkyl groups, preferably tert-butoxycarbonyl group, in the formula (1)), 2-alkyladamantane-2-yloxycarbonyl group (a group in which $R^{a1}$, $R^{a2}$ and a carbon atom forms adamantyl group, and $R^{a3}$ is alkyl group, in the formula (1)), and 1-(adamantine-1-yl)-1-alkylalkoxycarbonyl group (a group in which $R^{a1}$ and $R^{a2}$ are alkyl group, and $R^{a3}$ is adamantyl group, in the formula (1)).

Examples of the acid-labile group when the hydrophilic group is a hydroxy group include a group in which a hydrogen atom of the hydroxy group is replaced with an organic group and resulting in having an acetal structure. Among such the acid-labile group, preferred examples thereof include a group represented by the formula (2) below. Hereinafter the group represented by the formula (2) may refer to as an "acid-labile group (2)".

(2)

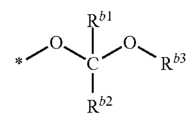

wherein $R^{b1}$ and $R^{b2}$ independently represent a hydrogen atom or a $C_1$ to $C_{12}$ hydrocarbon group, $R^{b3}$ represents a $C_1$ to $C_{20}$ hydrocarbon group, or $R^{b2}$ and $R^{b3}$ may be bonded together with a carbon atom and an oxygen atom bonded to $R^{b2}$ and $R^{b3}$ to form a $C_3$ to $C_{20}$ ring, respectively. One or more —$CH_2$— contained in the hydrocarbon group and the ring may be replaced by —O—, —S— or —CO—, * represents a bond.

The hydrocarbon group of $R^{b1}$ to $R^{b3}$ includes any of an aliphatic hydrocarbon group and an aromatic hydrocarbon group.

Examples of the aliphatic hydrocarbon group include the same examples described above.

Examples of the aromatic hydrocarbon groups include an aryl group such as phenyl, naphthyl, p-methylphenyl, p-tert-butylphenyl, p-adamantylphenyl, tolyl, xylyl, cumenyl, mesityl, biphenyl, anthryl, phenanthryl, 2,6-diethylphenyl and 2-methyl-6-ethylphenyl groups.

Examples of the ring which is formed by bonding with $R^{b2}$ and $R^{b3}$ include the same rings which are formed by bonding with $R^{a1}$ and $R^{a2}$.

At least one of $R^{b1}$ and $R^{b2}$ is preferably a hydrogen atom.

Specific examples of the acid-labile group (2) include a group below.

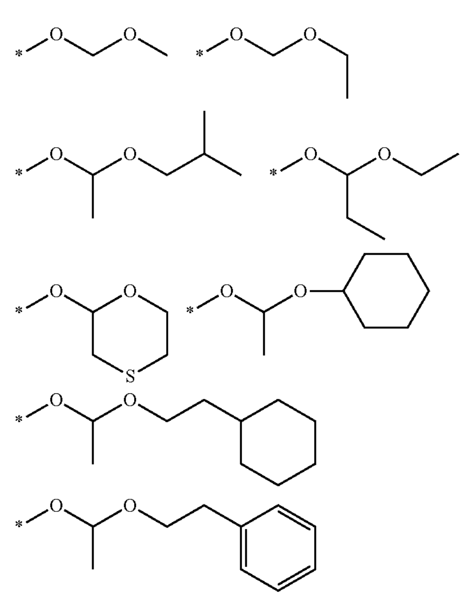

-continued

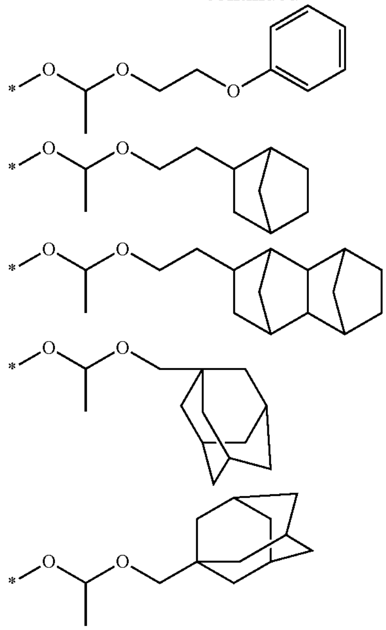

The monomer having an acid-labile group (a1) is preferably a monomer having an acid-labile group and a carbon-carbon double bond, for example, a monomer having an acid-labile group (1) and/or an acid-labile group (2) and a carbon-carbon double bond, and more preferably a (meth)acrylic monomer having an acid-labile group, for example, a (meth) acrylic monomer having an acid-labile group (1).

Among the (meth)acrylic monomer having an acid-labile group (1), it is preferably a monomer containing an acid-labile group having a $C_5$ to $C_{20}$ alicyclic hydrocarbon group. When a resin (AA) which can be obtained by polymerizing monomers having bulky structure such as the alicyclic hydrocarbon group is used, the resist composition having excellent resolution tends to be obtained during the production of a resist pattern.

As the (meth)acrylic monomer containing an acid-labile group having the alicyclic hydrocarbon group, example thereof include a monomer represented by the formula (a1-a) (hereinafter may be referred to as an "monomer (a1-1)").

(a1-a)

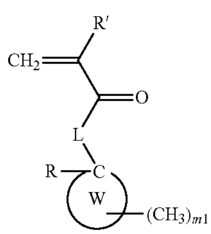

wherein R' represents a hydrogen atom or a methyl group;

L represents *—O— or *—O—$(CH_2)_{k1}$—CO—O—, k1 represents an integer of 1 to 7, * represents a bond to the carbonyl group (—CO—);

ring W represent a $C_5$ to $C_{20}$ alicyclic hydrocarbon group;

R represents a $C_1$ to $C_{10}$ aliphatic hydrocarbon group; and m1 represents an integer 0 to 14.

In the formula (a1-a), the alicyclic hydrocarbon group is preferably $C_5$ to $C_{12}$ monocyclic and polycyclic hydrocarbon group, and more preferably $C_5$ to $C_{10}$ alicyclic hydrocarbon group.

Among the (meth)acrylic monomer containing an acid-labile group (1) having the alicyclic hydrocarbon group, a monomer having an adamantyl group represented by the formula (a1-1) (hereinafter may be referred to as "monomer (a1-1)") and a monomer having a cycloalkyl group represented by the formula (a1-2) are preferable (hereinafter may be referred to as "monomer (a1-2)"). These may be used as a single compound or as a mixture of two or more compounds.

(a1-1)

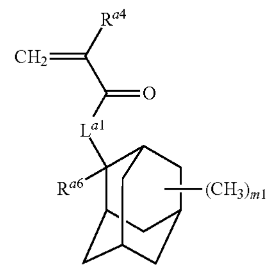

(a1-2)

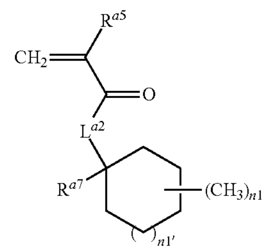

wherein $L^{a1}$ and $L^{a2}$ independently represent *—O— or *—O—$(CH_2)_{k1}$—CO—O—, k1 represents an integer of 1 to 7, * represents a bond to the carbonyl group (—CO—);

$R^{a4}$ and $R^{a5}$ independently represent a hydrogen atom or a methyl group;

$R^{a6}$ and $R^{a7}$ independently represent a $C_1$ to $C_{10}$ aliphatic hydrocarbon group; and m1 represents an integer 0 to 14;

n1 represents an integer 0 to 10; and n1' represents an integer 0 to 3.

In the formula (a1-1) and the formula (a1-2), $L^{a1}$ and $L^{a2}$ are preferably —O— or *—O—$(CH_2)_{k1'}$—CO—O—, here k1' represents an integer of 1 to 4, more preferably —O— or *—O—$CH_2$—CO—O—, and still more preferably —O—.

$R^{a4}$ and $R^{a5}$ are preferably a methyl group.

The aliphatic hydrocarbon groups of $R^{a6}$ and $R^{a7}$ are independently preferably a $C_1$ to $C_8$ alkyl group or $C_3$ to $C_{10}$ alicyclic hydrocarbon group, more preferably a $C_1$ to $C_8$ alkyl group or $C_3$ to $C_8$ alicyclic hydrocarbon group, and still more preferably a $C_1$ to $C_6$ alkyl group or $C_3$ to $C_6$ alicyclic hydrocarbon group.

m1 is preferably an integer of 0 to 3, and more preferably 0 or 1.

n1 is preferably an integer of 0 to 3, and more preferably 0 or 1.

n1' is preferably 0 or 1, and more preferably 1.

Examples of the monomer (a1-1) include a group below.
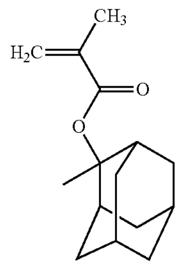
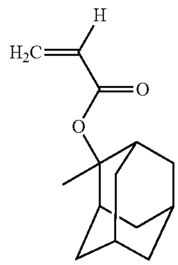
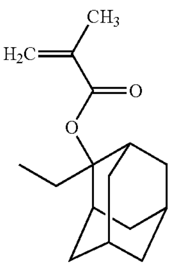
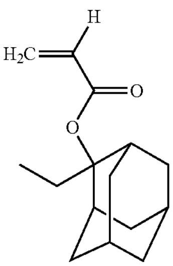
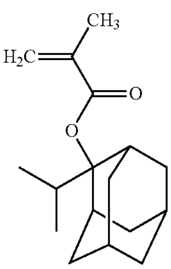
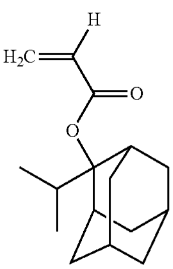
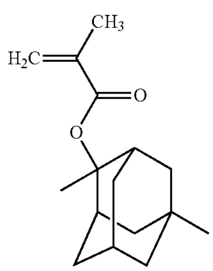
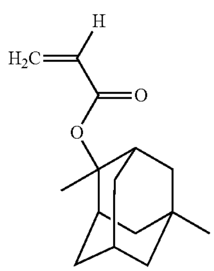
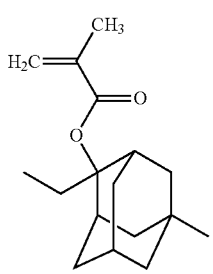
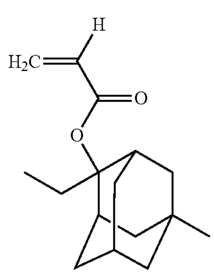
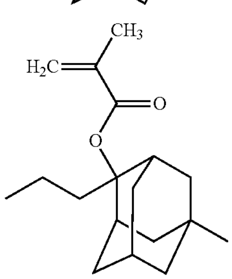
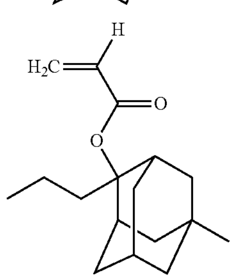
-continued
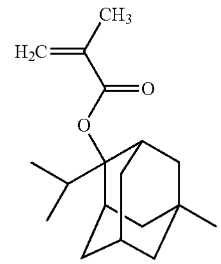
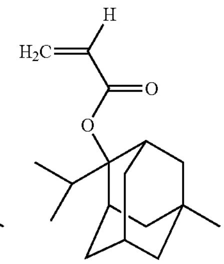
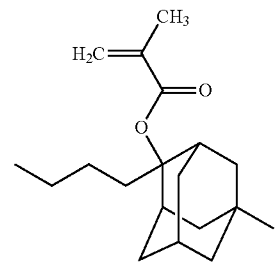
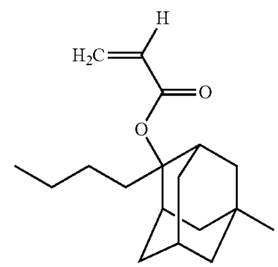
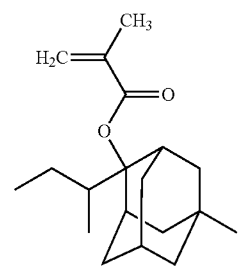
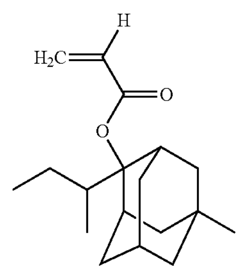
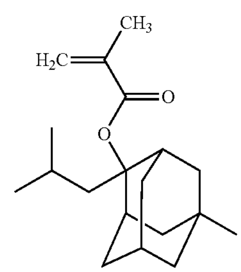
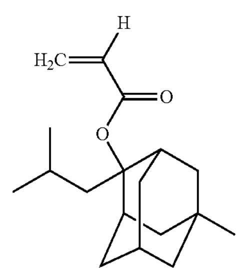
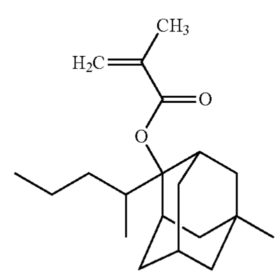

-continued
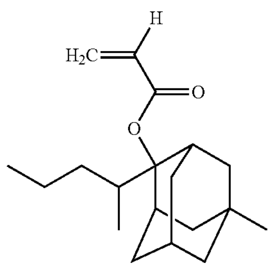
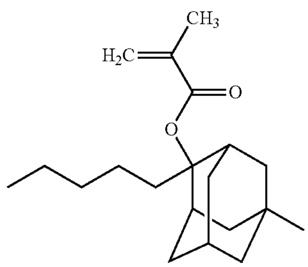
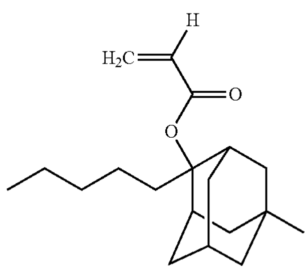
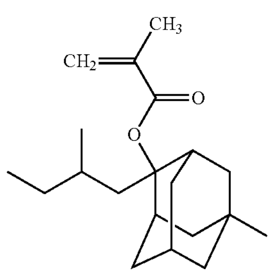
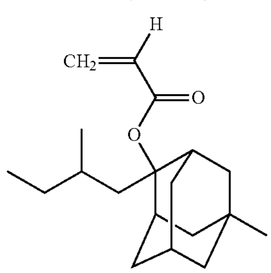
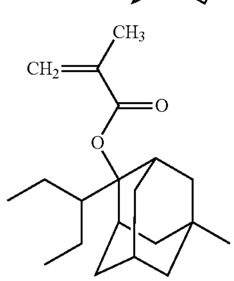
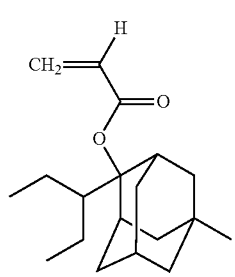
-continued
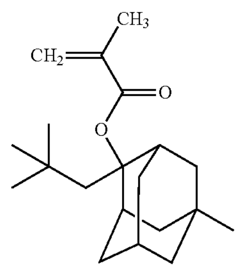
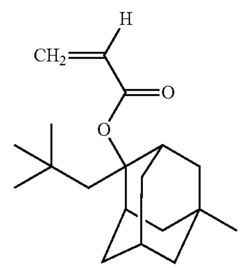
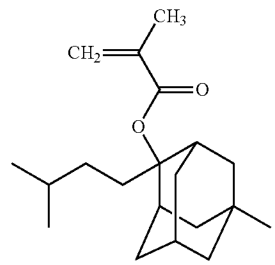
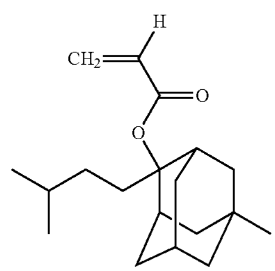
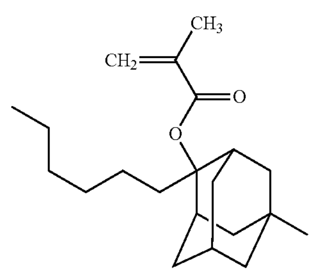
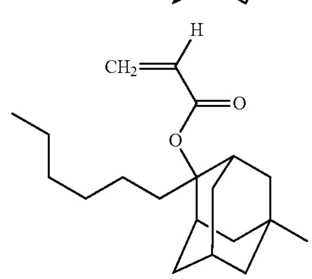
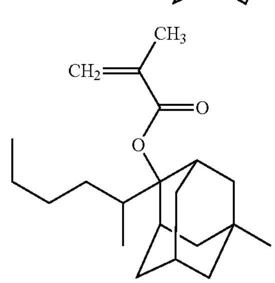

-continued
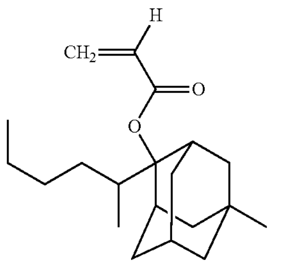
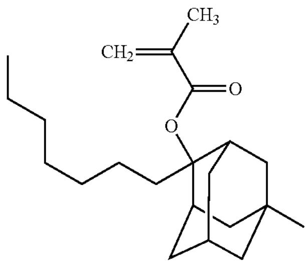
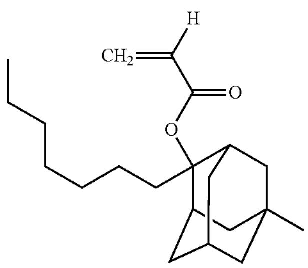
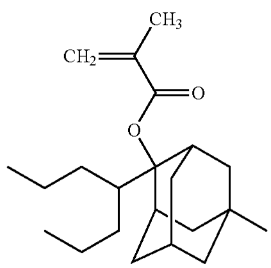
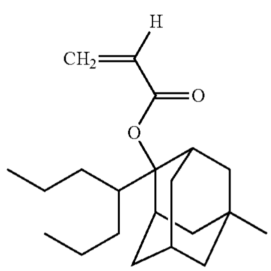
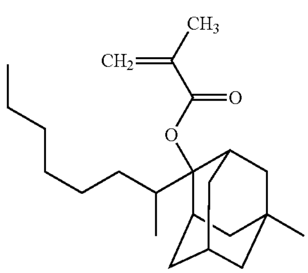
-continued
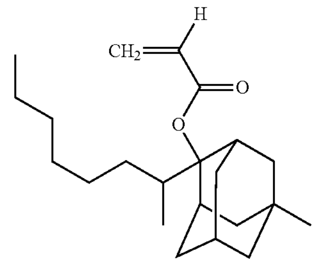
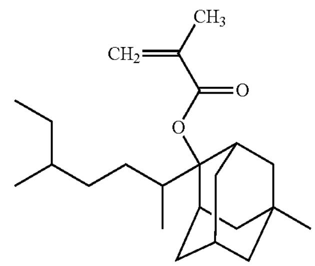
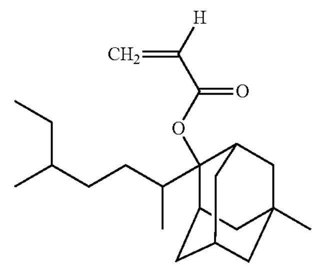
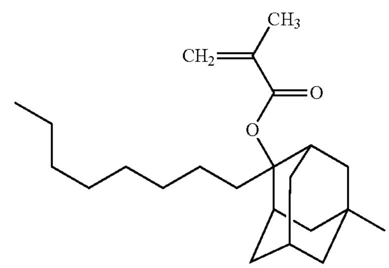
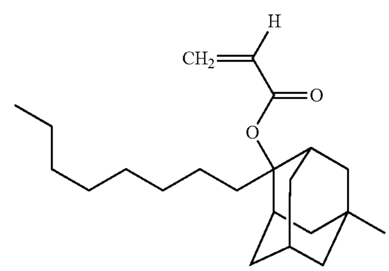
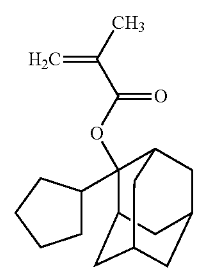
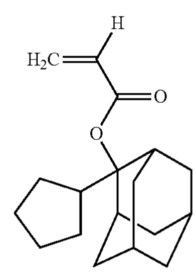

-continued
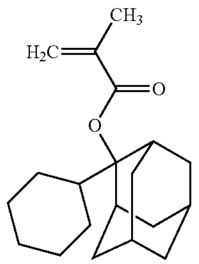
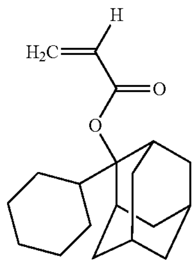
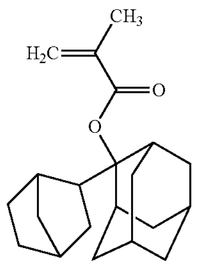
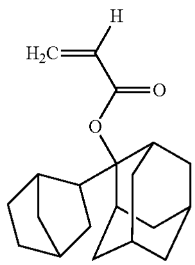
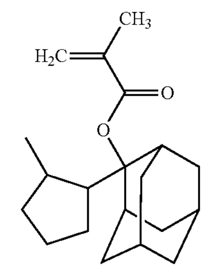
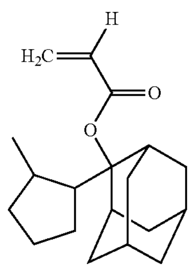
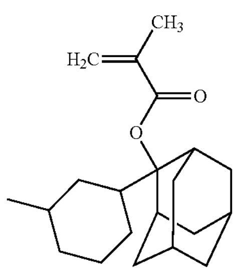
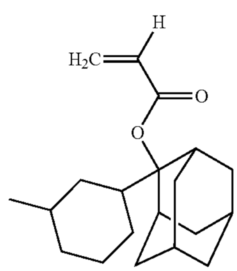
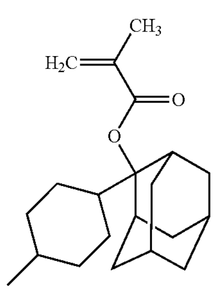
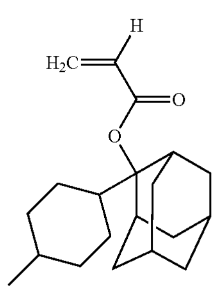
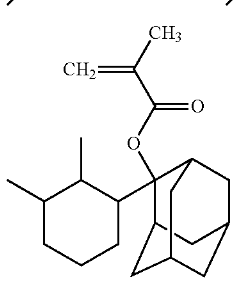
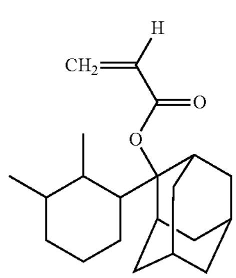
-continued
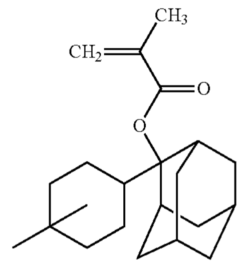
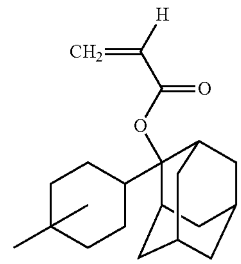
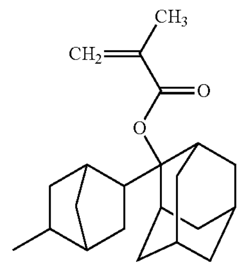
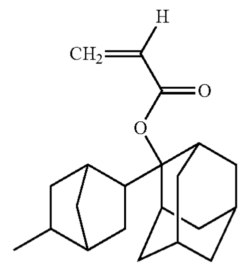
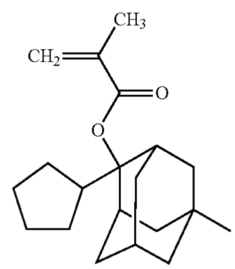
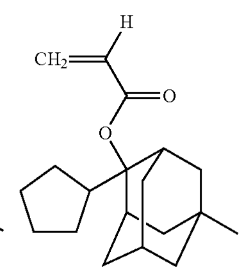
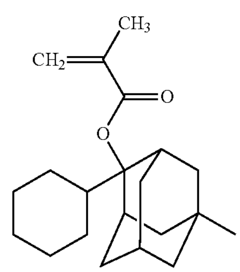
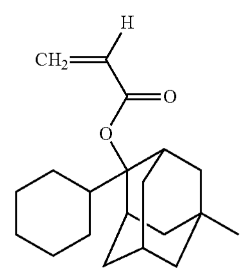
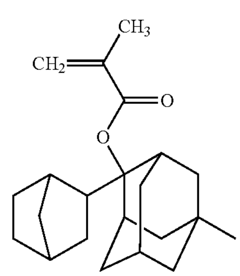
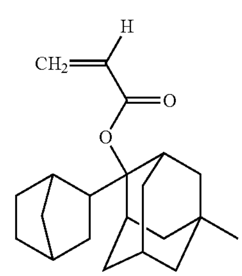
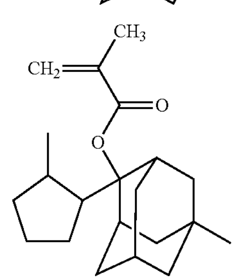
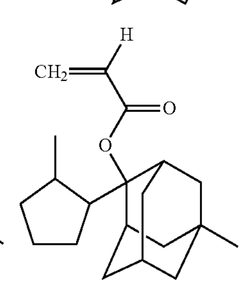

-continued
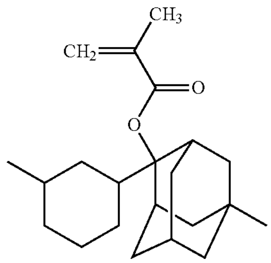
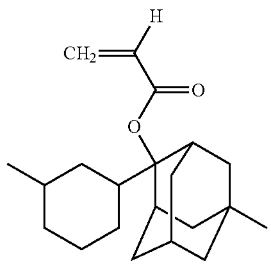
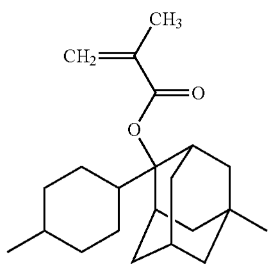
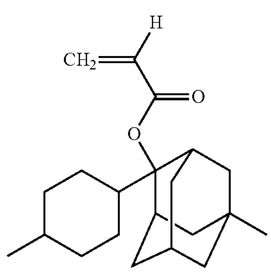
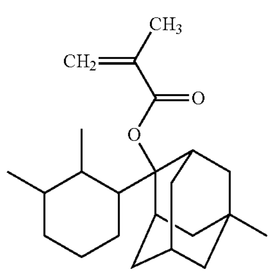
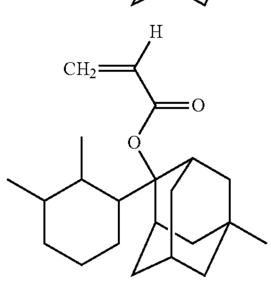
-continued
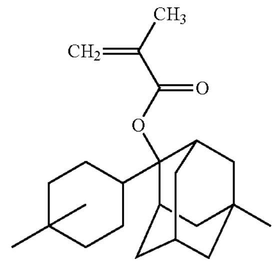
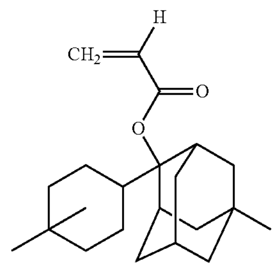
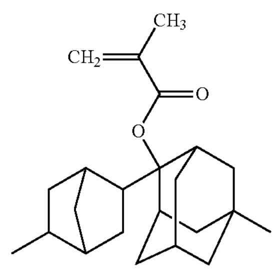
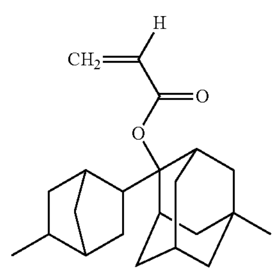
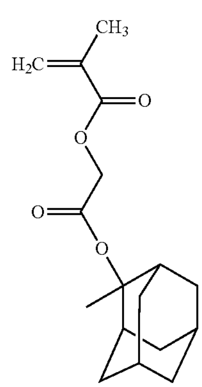
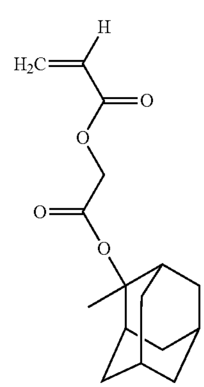

-continued
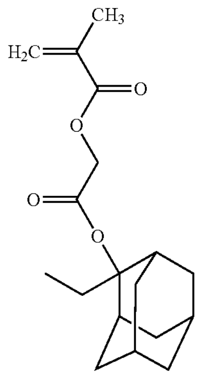
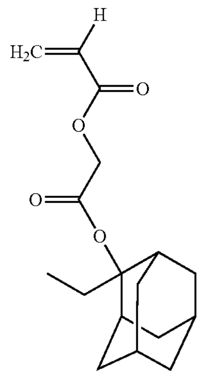
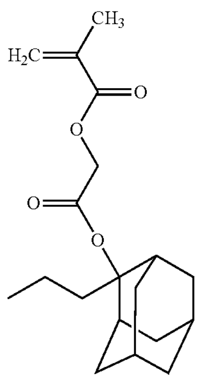
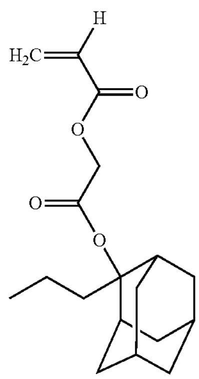
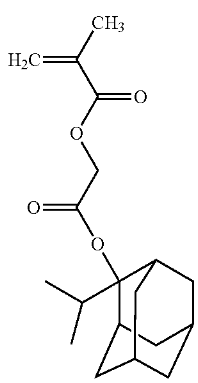
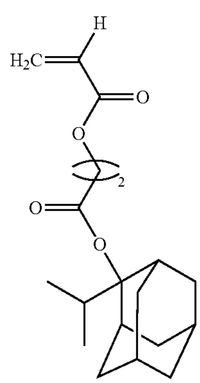
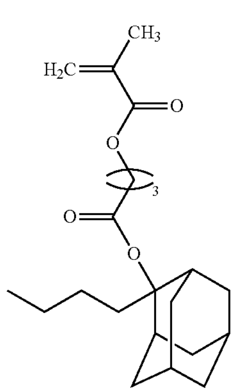
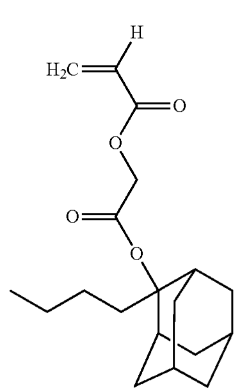
-continued
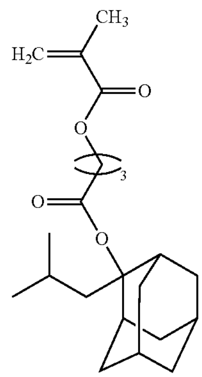
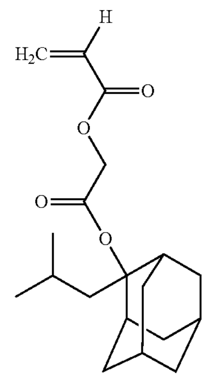
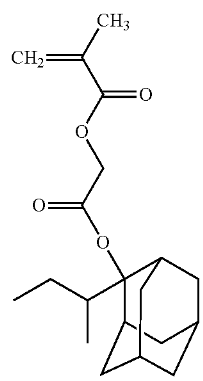
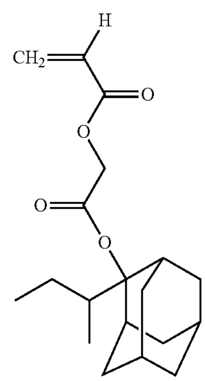
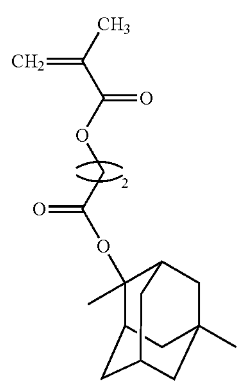
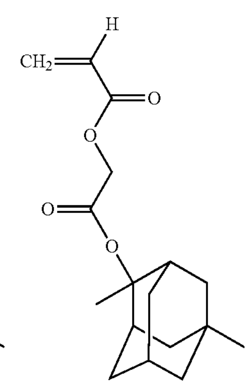
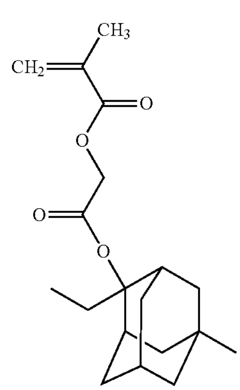
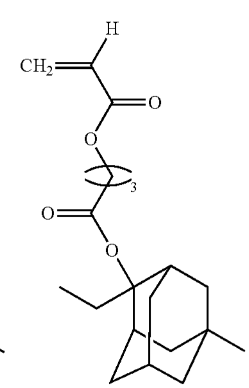

-continued
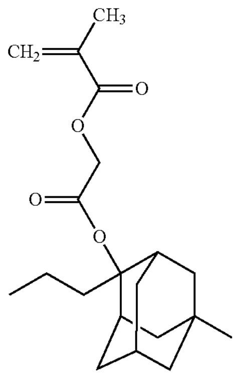
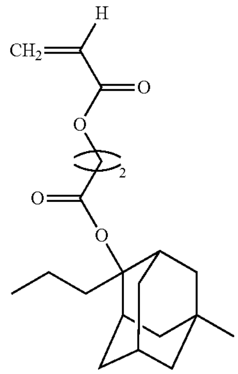
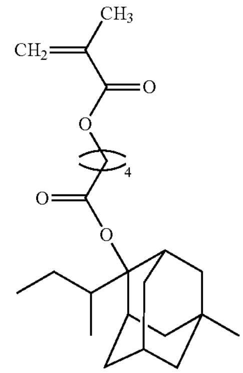
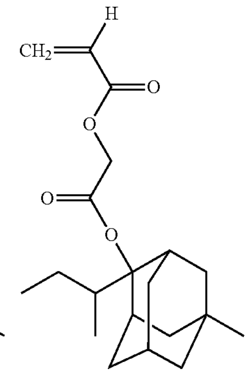
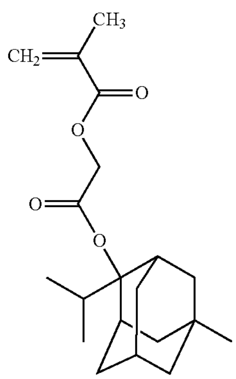
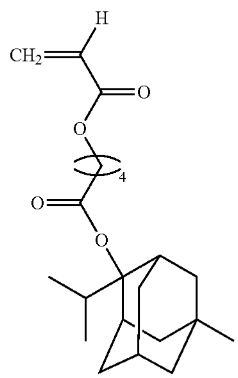
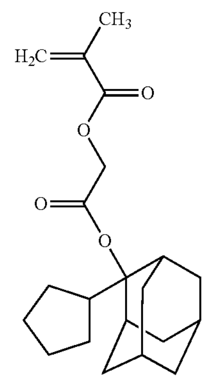
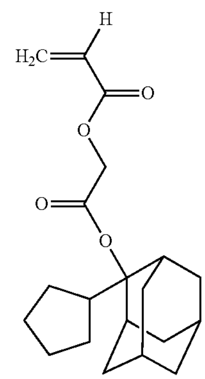
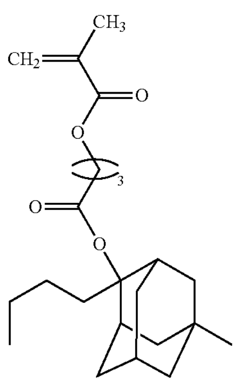
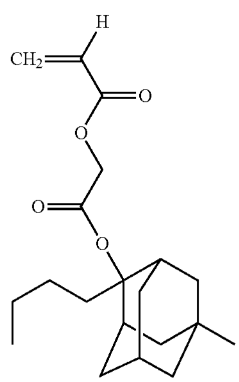
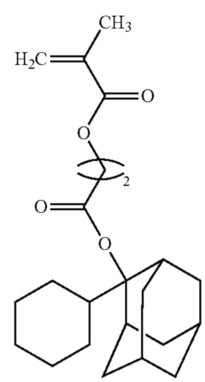
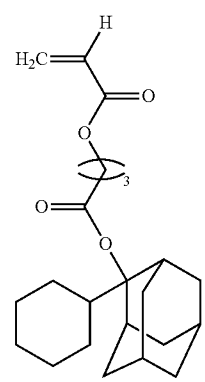
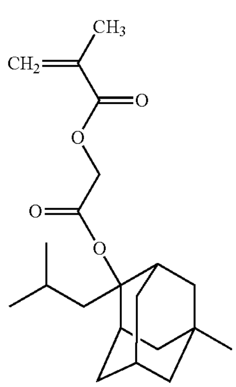
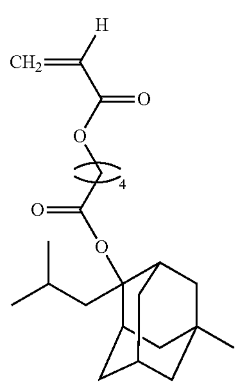
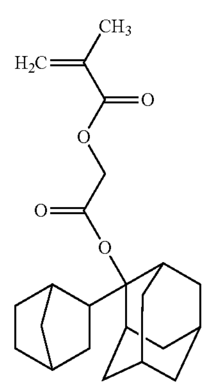
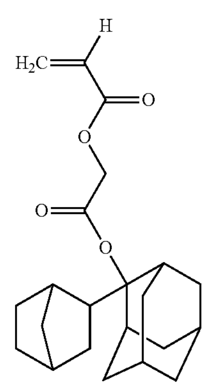

-continued
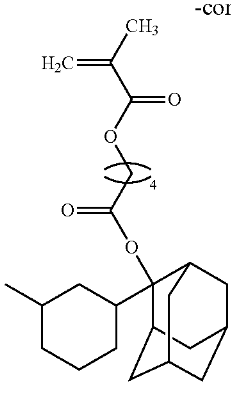
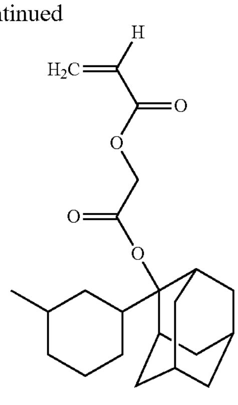
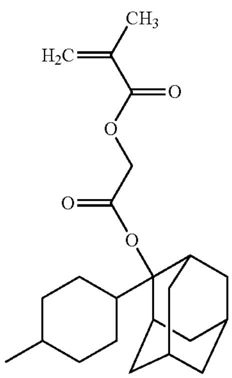
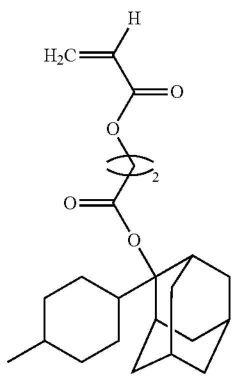
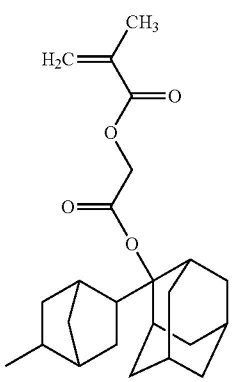
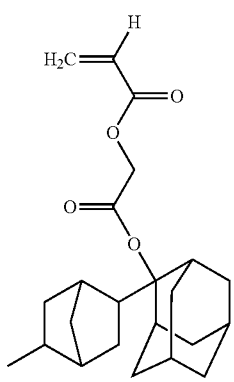
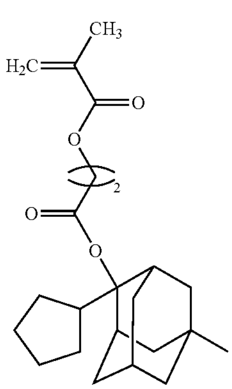
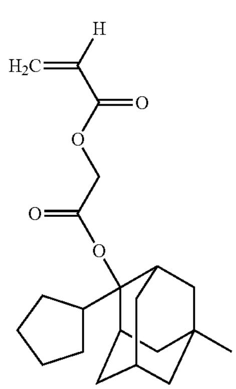
-continued
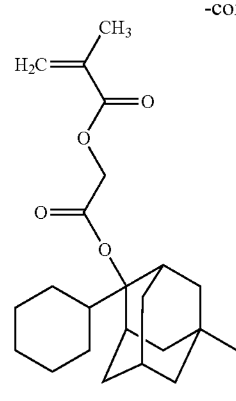
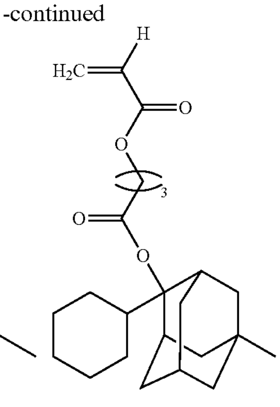
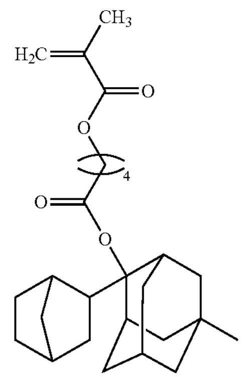
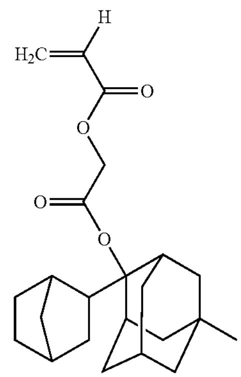
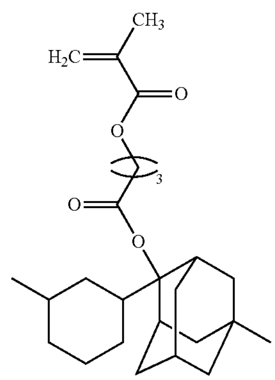
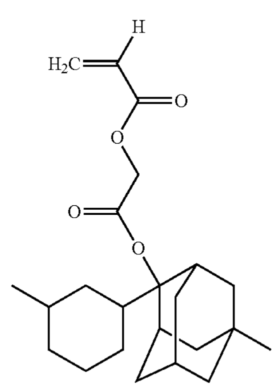

-continued
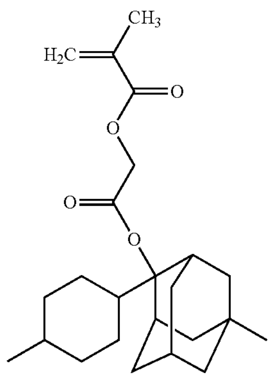
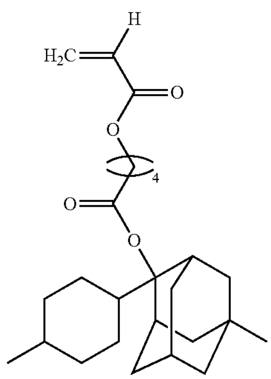
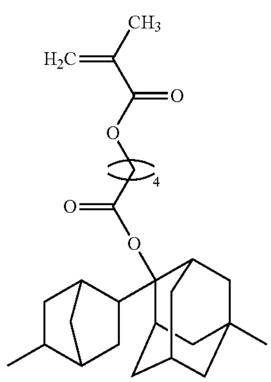
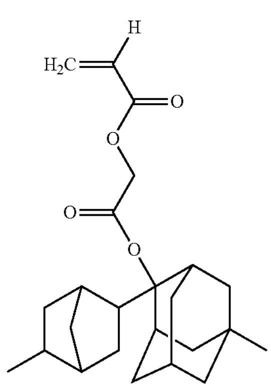
Among these, 2-methyladamantane-2-yl(meth)acrylate, 2-ethyladamantane-2-yl(meth)acrylate and 2-isopropyladamantane-2-yl (meth)acrylate are preferable, and 2-methyladamantane-2-yl methacrylate, 2-ethyladamantane-2-yl methacrylate and 2-isopropyladamantane-2-yl methacrylate are more preferable, as a monomer (a1-1).
Examples of the monomer (a1-2) include a group below.
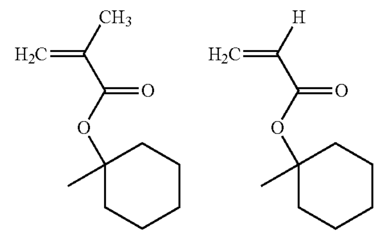
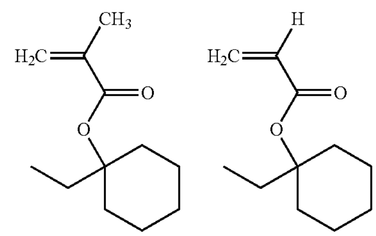
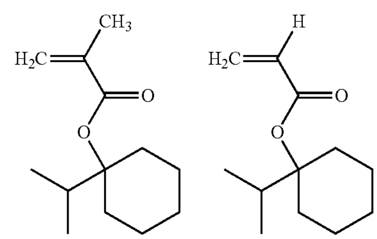
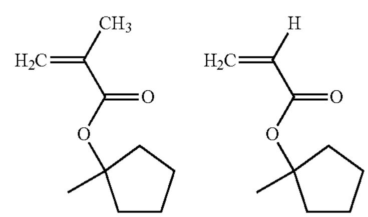
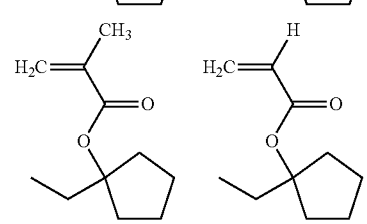
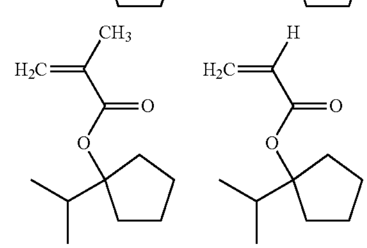
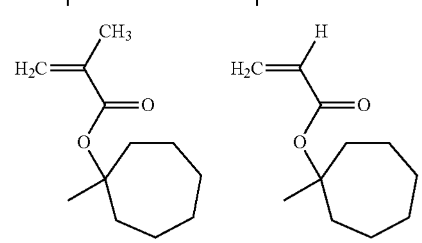

-continued

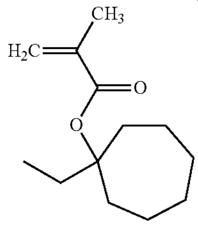

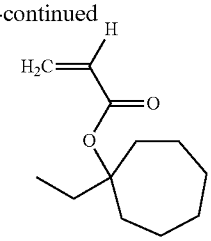

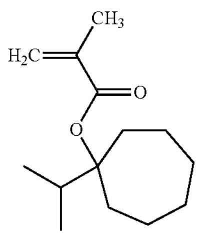

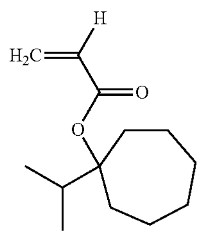

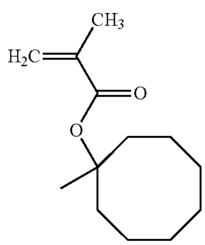

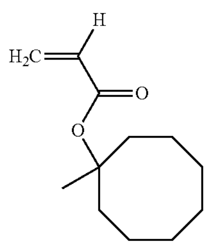

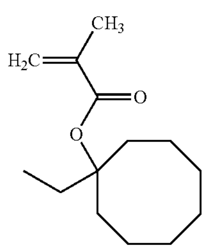

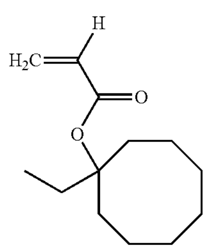

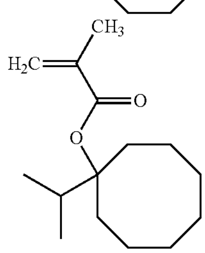

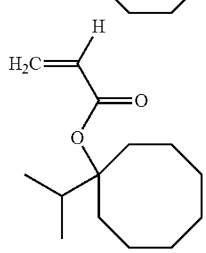

Among these, 1-ethylcyclohexane-1-yl (meth)acrylate is preferable, and 1-ethylcyclohexane-1-yl methacrylate is more preferable, as a monomer (a1-2).

When the resin (AA) contains the structural unit derived from the monomer (a1-1) and/or the monomer (a1-2), the total proportion thereof is generally 10 to 95 mol %, preferably 15 to 90 mol %, and more preferably 20 to 85 mol %, with respect to the total structural units of the resin (AA).

Monomers having an acid-labile group (1) and a carbon-carbon double bond includes a monomer having norbornene ring presented by the formula (a1-3). Such monomer may be hereinafter referred to as "monomer (a1-3)".

(a1-3)

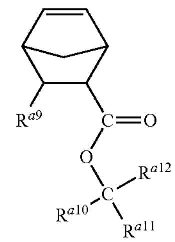

wherein $R^{a9}$ represents a hydrogen atom, a $C_1$ to $C_3$ alkyl group that optionally has a hydroxy group, a carboxy group, a cyano group or a —$COOR^{a13}$, $R^{a13}$ represents a $C_1$ to $C_{20}$ aliphatic hydrocarbon group, one or more hydrogen atom contained therein may be replaced with hydroxy group, one or more —$CH_2$— contained therein may be replaced by —O— or —CO—;

$R^{a10}$ to $R^{a12}$ independently represent a $C_1$ to $C_{20}$ aliphatic hydrocarbon group, or $R^{a10}$ and $R^{a11}$ may be bonded together to form a ring, one or more hydrogen atom contained therein may be replaced with a hydroxy group or the like, one or more —$CH_2$— contained therein may be replaced by —O— or —CO—.

Examples of the alkyl group having a hydroxy group of $R^{a9}$ include hydroxymethy, and 2-hydroxyethyl groups.

Examples of the —$COOR^{a13}$ group of $R^{a9}$ include a group in which a carbonyl group bonds to an alkoxy group, such as methoxycarbonyl, ethoxycarbonyl groups.

Examples of the aliphatic hydrocarbon group of $R^{a10}$ to $R^{a12}$ include methyl, ethyl, cyclohexyl, methylcyclohexyl, hydroxycyclohexyl, oxocyclohexyl and adamantyl groups.

Examples of the ring formed together with $R^{a10}$, $R^{a11}$ and carbon atom bonded thereto include an aliphatic hydrocarbon group such as cyclohexyl and adamantyl groups.

Examples of $R^{a13}$ include methyl, ethyl, propyl, 2-oxo-oxolane-3-yl and 2-oxo-oxolane-4-yl groups. $R^{13}$ is preferably a $C_1$ to $C_8$ alkyl or a $C_3$ to $C_{20}$ alicyclic hydrocarbon group.

Examples of the monomer having a norbornene ring (a1-3) include, for example, tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantane-2-yl 5-norbornene-2-carboxylate, 2-ethyl-2-adamantane-2-yl 5-norbornene-2-carboxylate, 1-(4-methy-cyclohexyl)-1-methylethyl 5-norbornene-2-carboxylate, 1-(4-hydroxycyclohexyl)-1-methylethyl 5-norbornene-2-carboxylate, 1-methyl-(4-oxocyclohexyl)-1-ethyl 5-norbornene-2-carboxylate, and 1-(1-adamantane-1-yl)-1-methylethyl 5-norbornene-2-carboxylate.

A resin having a structural unit derived from the monomer (a1-3) can improve the resolution of the obtained resist composition because it has a bulky structure, and also can improve a dry-etching tolerance of the obtained resist composition because of incorporated a rigid norbornene ring into a main chain of the resin (AA).

When the resin (A) contains the structural unit derived from the monomer represented by the formula (a1-3), the proportion thereof is generally 10 to 95 mol %, preferably 15 to 90 mol %, and more preferably 20 to 85 mol %, with respect to the total structural units constituting the resin (AA).

Examples of a monomer (a1) having an acid-labile (2) group and a carbon-carbon double bond include a monomer represented by the formula (a1-4). Such monomer may be hereinafter referred to as "monomer (a1-4)".

(a1-4)

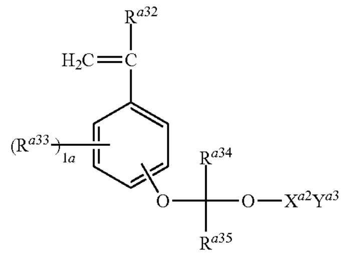

wherein $R^{a32}$ represents a hydrogen atom, a halogen atom or a $C_1$ to $C_6$ alkyl group that optionally has a halogen atom;

$R^{a33}$ in each occurrence independently represent a halogen atom, a hydroxy group, a $C_1$ to $C_6$ alkyl group, a $C_1$ to $C_6$ alkoxy group, a $C_2$ to $C_4$ acyl group, a $C_2$ to $C_4$ acyloxy group, an acryloyl group or methacryloyl group;

1a represents an integer 0 to 4;

$R^{a34}$ and $R^{a35}$ independently represent a hydrogen atom or a $C_1$ to $C_{12}$ hydrocarbon group;

$X^{a2}$ represents a single bond or an optionally substituted $C_1$ to $C_{17}$ divalent aliphatic hydrocarbon group, a hydrogen atom contained therein may be substituted with a halogen atom, a hydroxy group, a $C_1$ to $C_6$ alkyl group, a $C_1$ to $C_6$ alkoxy group, a $C_2$ to $C_4$ acyl group, and a $C_2$ to $C_4$ acyloxy group, and one or more —$CH_2$— contained therein may be replaced by —CO—, —O—, —S—, —$SO_2$— or —N($R^c$)—, $R^c$ represents a hydrogen atom or a $C_1$ to $C_6$ alkyl group;

$Y^{a3}$ represents a $C_1$ to $C_{18}$ hydrocarbon group, a hydrogen atom contained therein may be substituted with a halogen atom, a hydroxy group, a $C_1$ to $C_6$ alkyl group, a $C_1$ to $C_6$ alkoxy group, a $C_2$ to $C_4$ acyl group, and a $C_2$ to $C_4$ acyloxy group.

Examples of the alkyl group that optionally has a halogen atom of $R^{a32}$ include trifluoromethyl, perfluoroethyl, perfluoropropyl, perfluoro-isopropyl, perfluorobutyl, perfluoro-sec-butyl, perfluoro-tert-butyl, perfluoropentyl, perfluorohexyl, trichloromethyl, triburomomethyl and triiodomethyl groups.

Examples of the alkyl group, the alkoxy group and the like include the same examples described above.

Examples of the acyl group include acetyl, propionyl and butyryl groups.

Examples of the acyloxy group include acetyloxy, propionyloxy and butyryloxy groups.

In the formula (a1-4), the alkyl group of $R^{a32}$ and $R^{a33}$ is preferably a $C_1$ to $C_4$ alkyl group, more preferably a $C_1$ to $C_2$ alkyl group, and still more preferably methyl group.

The alkoxy group of $R^{a33}$ is preferably a $C_1$ to $C_4$ alkoxy group, more preferably a $C_1$ to $C_2$ alkoxy group, and still more preferably methoxy group.

Examples of the hydrocarbon group of $R^{a34}$ and $R^{a35}$ include any of an aliphatic hydrocarbon group, an alicyclic hydrocarbon group and an aromatic hydrocarbon group.

Preferred examples of the aliphatic group include iso-propyl, n-butyl, sec-butyl, tert-butyl, pentyl, hexyl, octyl, and 2-ethylhexyl groups.

Preferred examples of the alicyclic hydrocarbon group include a monocyclic or polycyclic saturated hydrocarbon groups such as cyclohexyl, adamantyl, 2-alkyl-adamantan-2-ly, 1-(1-adamantan-1-yl)-1-alkyl, alkane-1-yl, and isobornyl groups.

Preferred examples of the aromatic hydrocarbon group include phenyl, naphthyl, anthranil, p-methylphenyl, p-tert-butylphenyl, p-adamantylphenyl, tolyl, xylyl, cumenyl, mesityl, biphenyl, anthryl, phenanthryl, 2,6-diethylphenyl and 2-methyl-6-ethylphenyl groups.

The hydrocarbon group of $Y^{a3}$ is preferably a $C_1$ to $C_{18}$ aliphatic hydrocarbon group, a $C_3$ to $C_{18}$ alicyclic hydrocarbon group and a $C_6$ to $C_{18}$ aromatic hydrocarbon group.

Preferred examples of the substituent that may be optionally substituted to $X^{a2}$ and $Y^{a3}$ includes a hydroxy group.

Examples of the monomer represented by the formula (a1-4) include a monomer below.

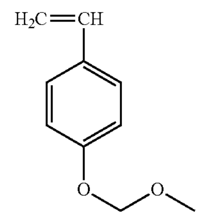

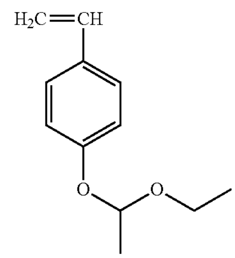

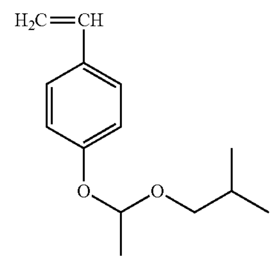

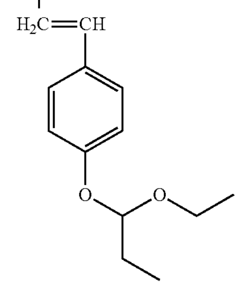

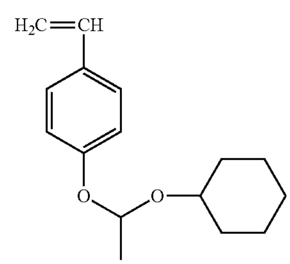

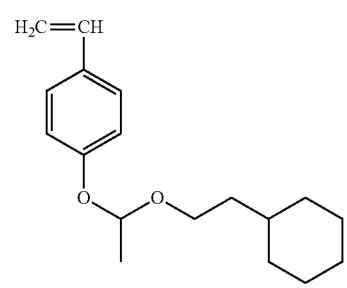

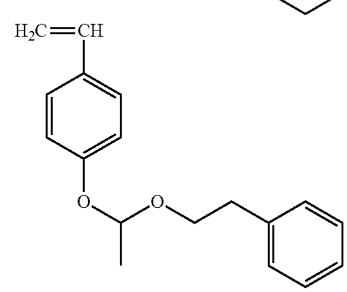

-continued
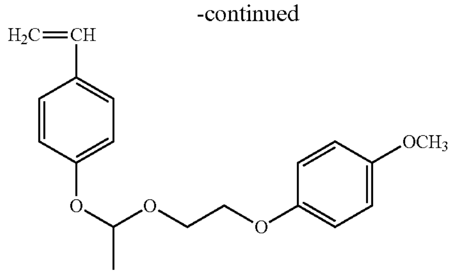
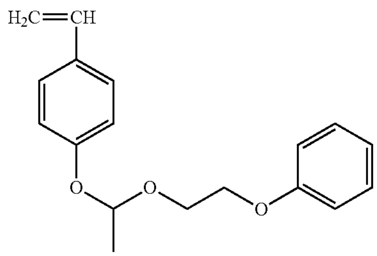
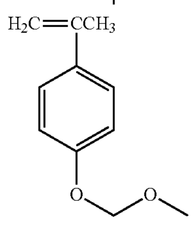
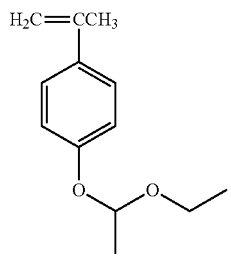
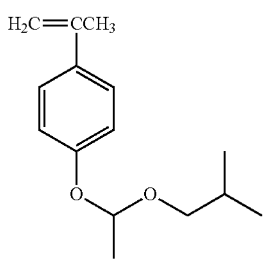
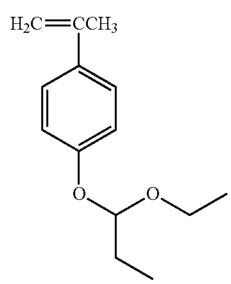
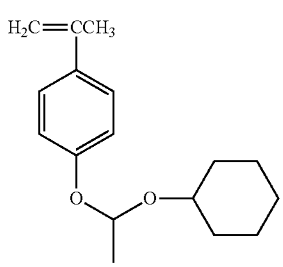
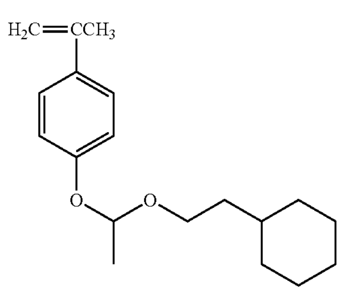
-continued
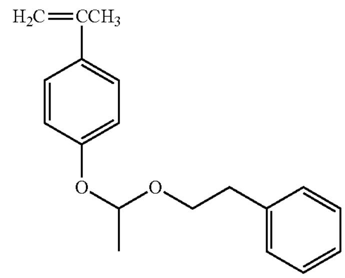
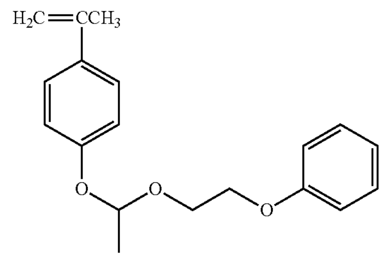
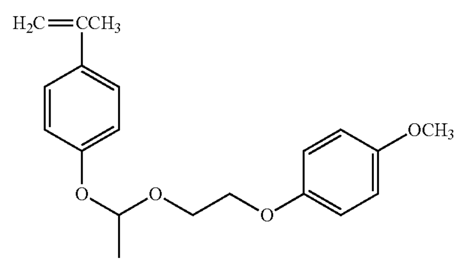
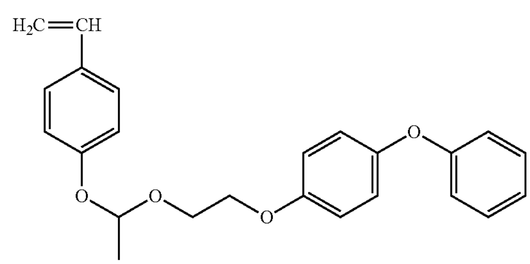
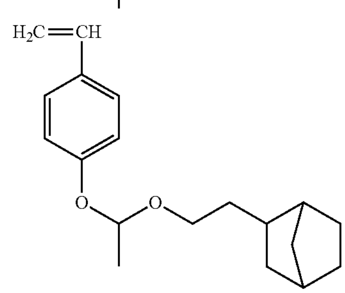
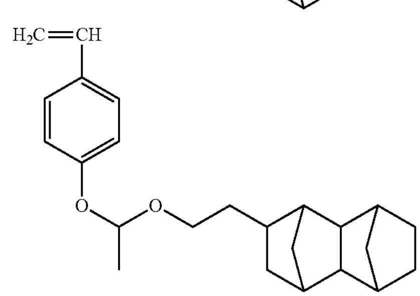

-continued
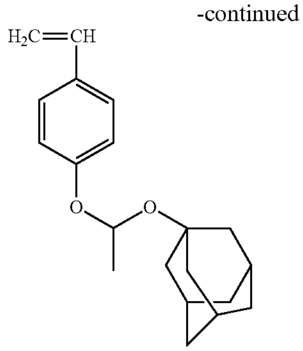
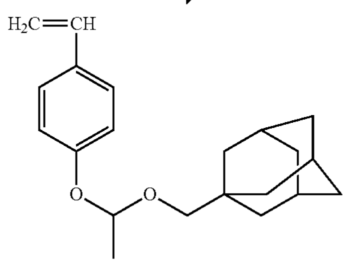
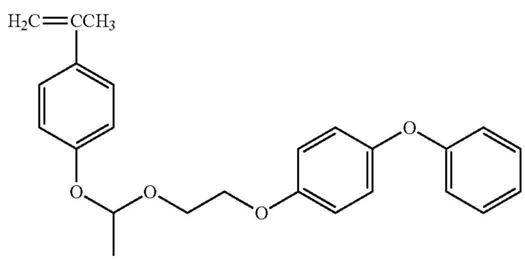
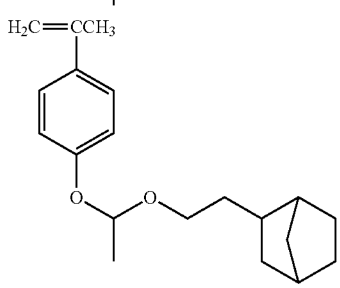
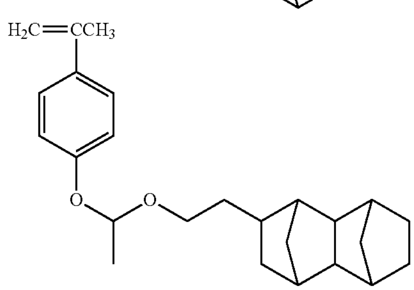
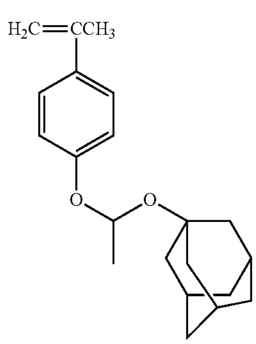
-continued
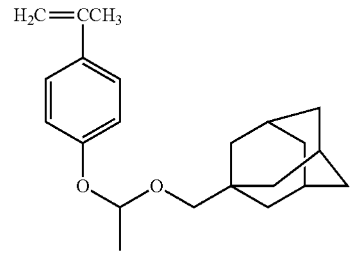
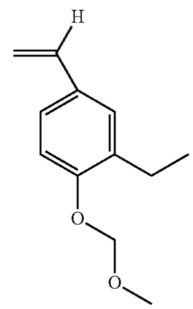
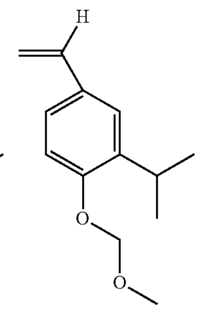
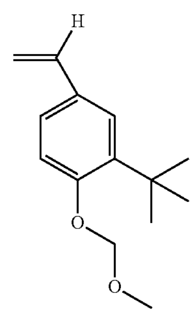
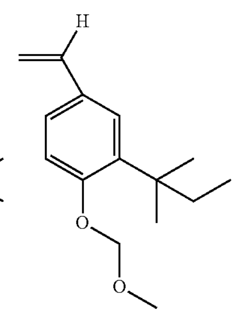
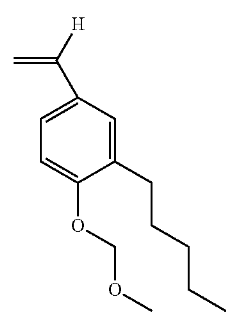
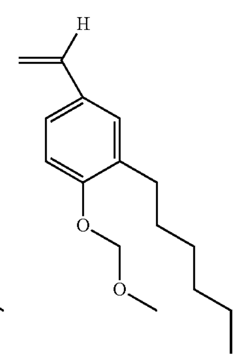
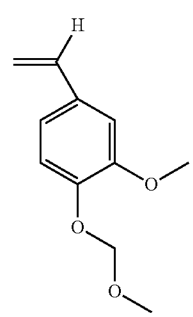
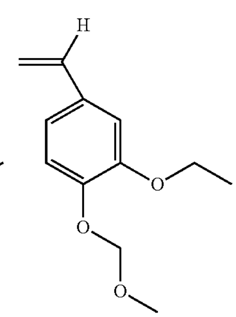

-continued
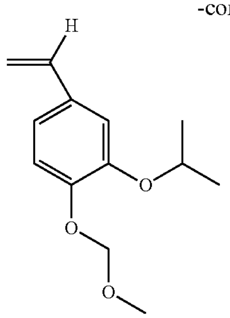
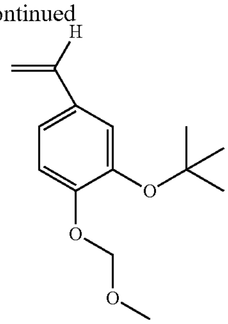
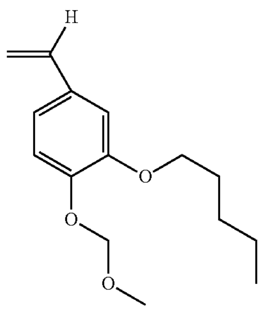
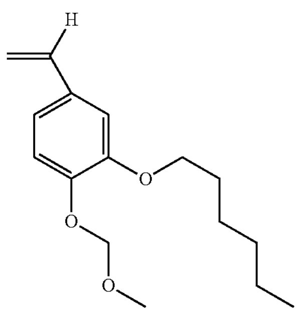
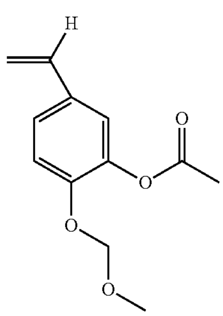
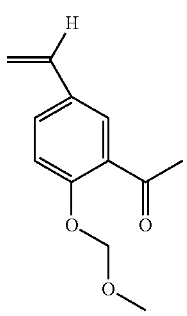
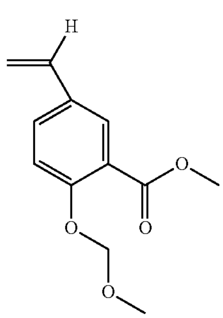
-continued
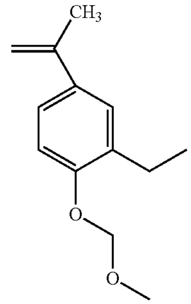
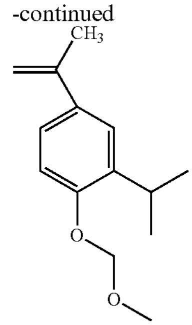
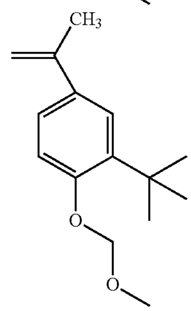
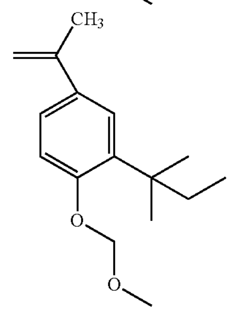
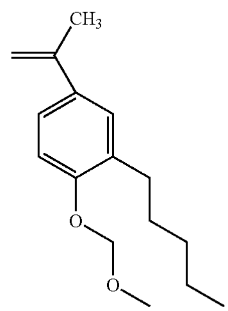
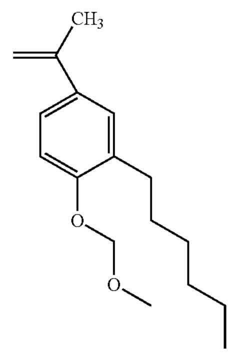
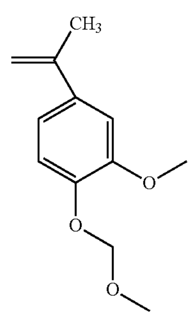
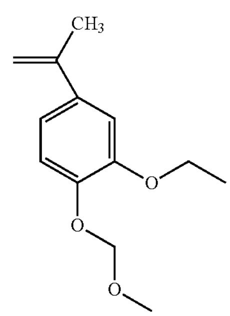
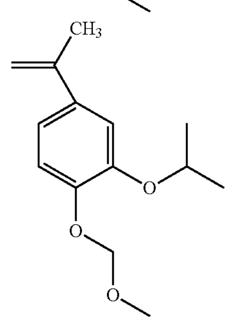
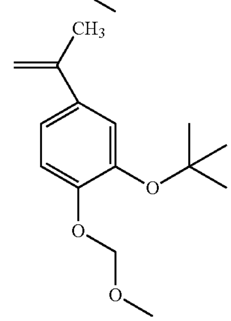

-continued

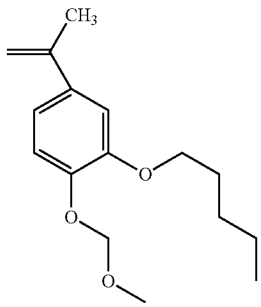

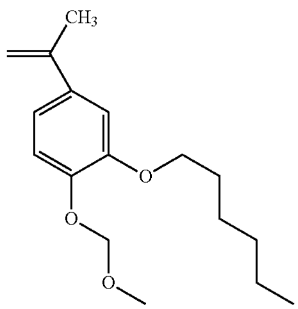

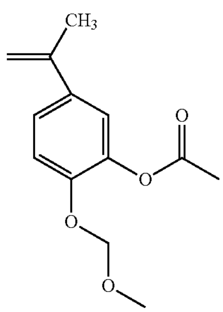

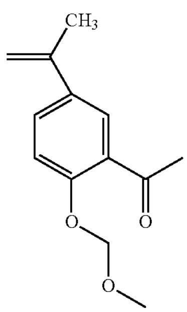

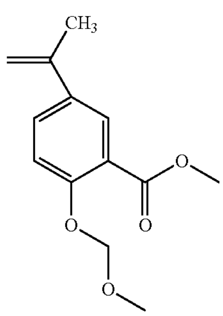

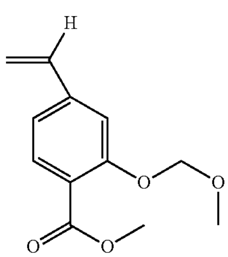

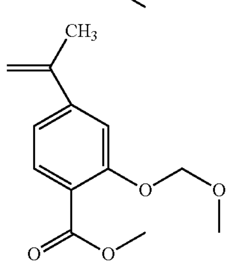

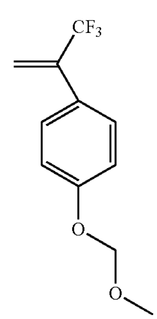

-continued

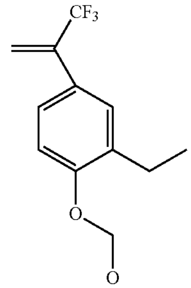

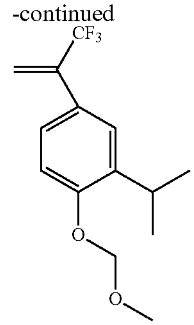

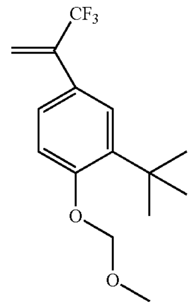

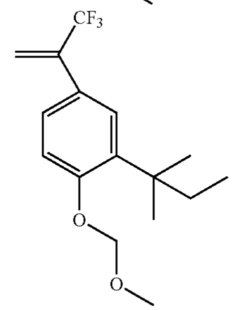

When the resin (AA) contains the structural unit derived from the monomer represented by the formula (a1-4), the proportion thereof is generally 10 to 95 mol %, preferably 15 to 90 mol %, more preferably 20 to 85 mol %, with respect to the total structural units constituting the resin (AA).

Examples of a monomer having an acid-labile group (2) and a carbon-carbon double bond include a monomer represented by the formula (a1-5). Such monomer may be hereinafter referred to as "monomer (a1-5)".

(a1-5)

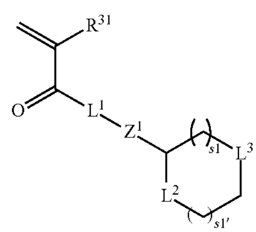

wherein $R^{31}$ represents a hydrogen atom, a halogen atom or a $C_1$ to $C_6$ alkyl group that optionally has a halogen atom;

$L^1$ to $L^3$ independently represent *—O—, *—S— or *—O—(CH$_2$)$_{k1}$—CO—O—, k1 represents an integer of 1 to 7, * represents a bond to the carbonyl group (—CO—);

s1 represents an integer of 1 to 4;

s1' represents an integer of 0 to 4;

$Z^1$ represents a single bond or a $C_1$ to $C_6$ alkanediyl group, and the —$CH_2$— contained in the alkanediyl group may be replaced by —O— or —CO—.

In the formula (a1-5), $R^{31}$ is preferably a hydrogen atom, a methyl group or a trifluoromethyl group;

$L^1$ is preferably —O—;

$L^2$ and $L^3$ are independently preferably *—O— or *—S—, and more preferably —O— for one and —S— for another;

s1 is preferably 1;

s1' is preferably an integer of 0 to 2;

$Z^1$ is preferably a single bond or —$CH_2$—CO—O—.

Examples of the compound represented by the formula (a1-5) include compounds below.

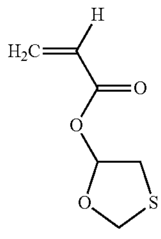
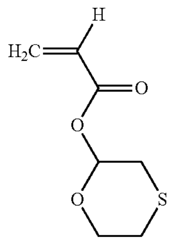
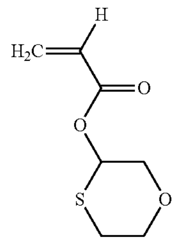
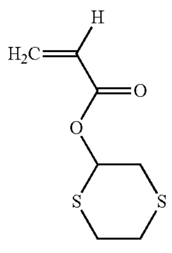
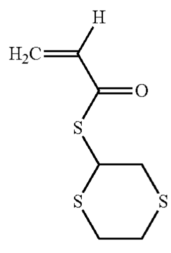
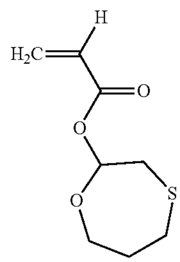
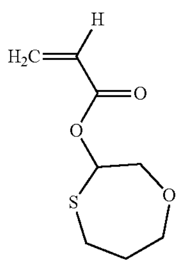
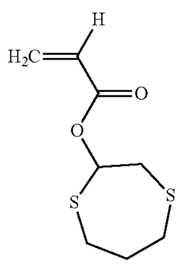
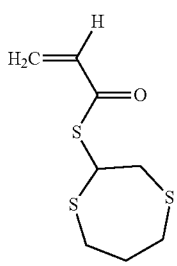
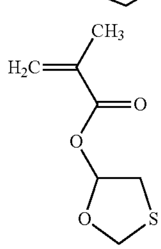
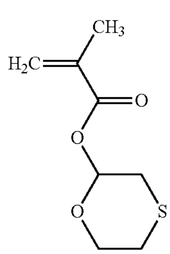
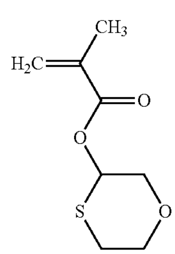
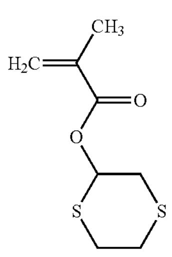
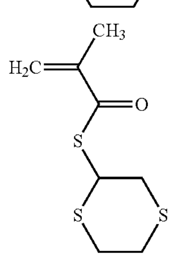
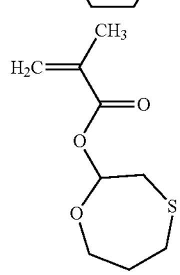
-continued
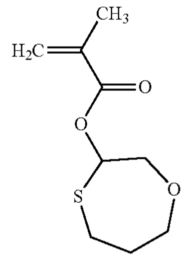
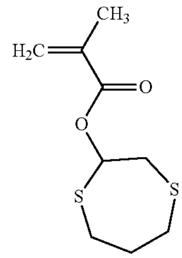
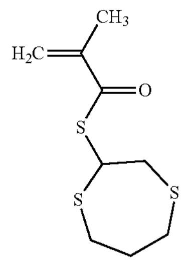
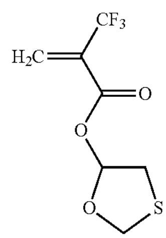
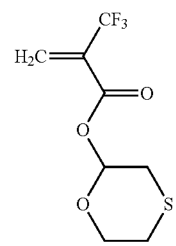
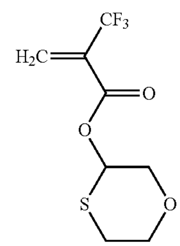
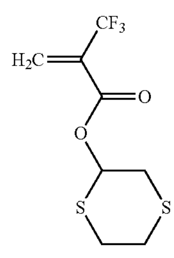
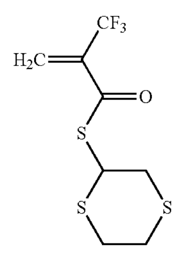
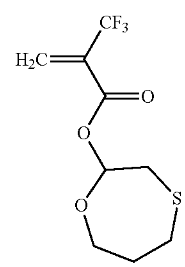
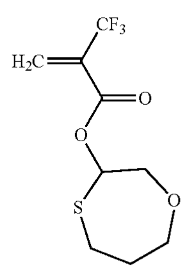
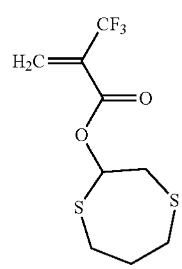
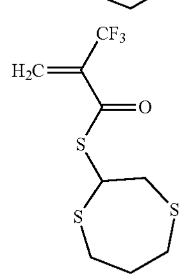

-continued

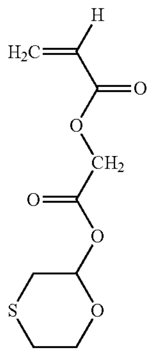
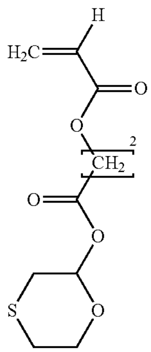
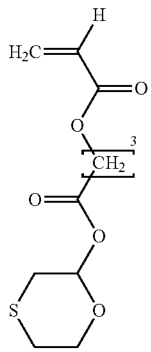
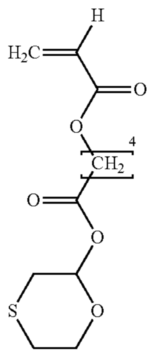
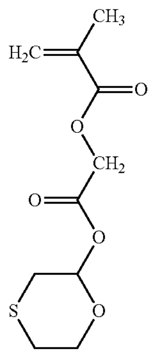
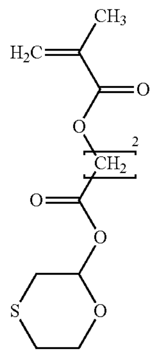
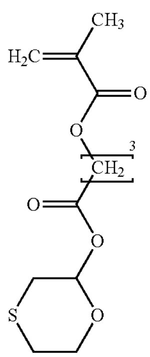
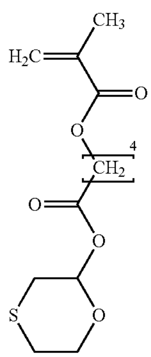
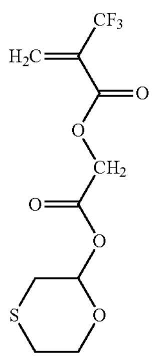
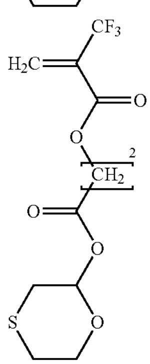
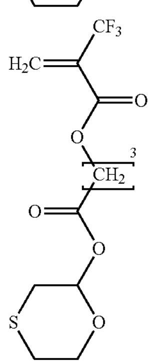
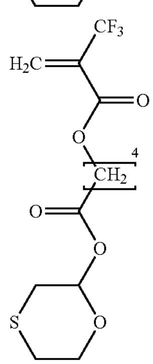

When the resin (AA) contains the structural unit derived from the monomer represented by the formula (a1-5), the proportion thereof is generally 10 to 95 mol %, preferably 15 to 90 mol %, and more preferably 20 to 85 mol %, with respect to the total structural units constituting the resin (AA).

Further, a monomer (a1) having an acid-labile group (1) and carbon-carbon double bond may be used for the resin (AA).

Specific examples of such another monomer include a monomer below.

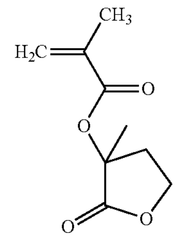
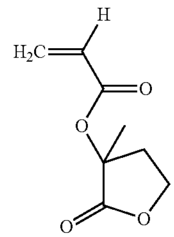
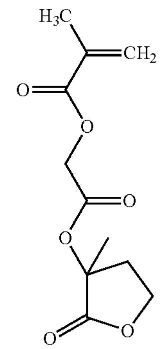
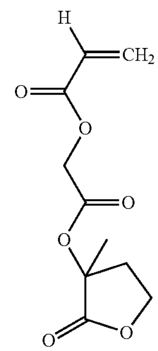
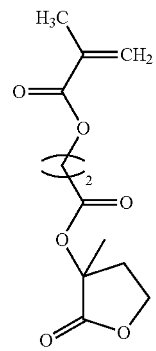
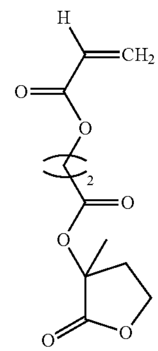
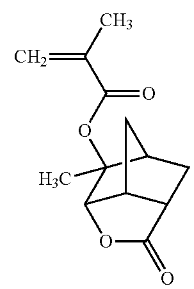
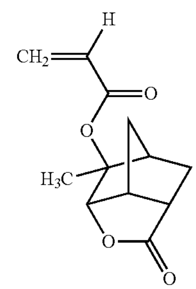
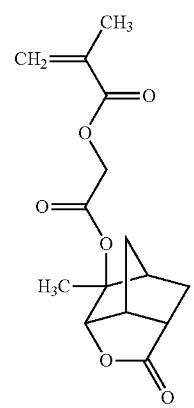
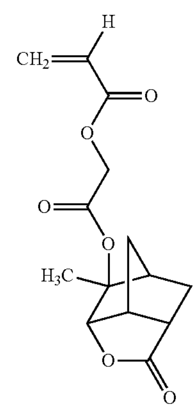
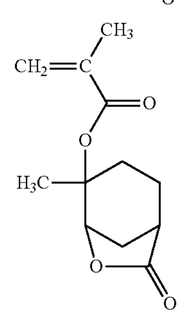
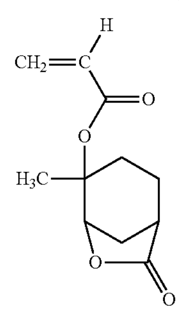

-continued

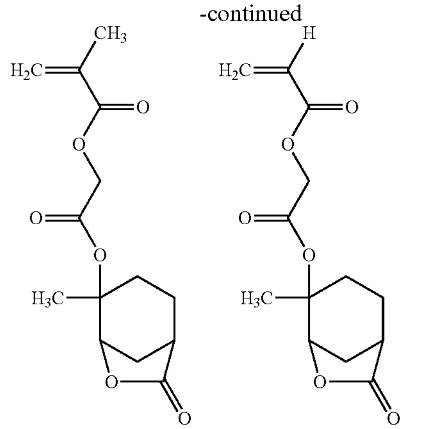

When the resin (AA) contains the structural unit derived from the other acid-labile monomer, the total proportion thereof is generally 10 to 95 mol %, preferably 15 to 90 mol %, and more preferably 20 to 85 mol %, with respect to the total structural units constituting the resin (AA).

<Acid-Stable Monomer>

The resin (AA) is preferably a copolymer of the compound (a), the monomer having the acid-labile group (a1) and a monomer not having the acid-labile group (hereinafter may be referred to as an "acid-stable monomer").

The resin (AB) is preferably a copolymer of the compound (a) and an acid-stable monomer.

The acid-stable monomer may be used as a single compound or as a mixture of two or more compounds.

When the resin (AA) is produced with the acid-stable monomer, the proportion of the acid-stable monomer can be adjusted based on the amount of the acid-labile monomer (a1). For example, the ratio of [the acid-labile monomer (a1)]:[the acid-stable monomer] is preferably 10 to 80 mol %:90 to 20 mol %, and more preferably 20 to 60 mol %:80 to 40 mol %

When the monomer having an adamantyl group is used as the monomer (a1), the proportion of the monomer having an adamantyl group (in particular, the monomer having the acid-labile group (a1-1)) is preferably 15 mol % or more with respect to the monomer having the acid-labile group (a1). As the mole ratio of the monomer having an adamantyl group increases within this range, the dry etching resistance of the resulting resist improves. The compound (a) can be counted as the acid-stable monomer when optimizing the proportion of the acid-labile monomer and the acid-stable monomer.

As the acid-stable monomer, a monomer having a hydroxy group or a lactone ring is preferable. When a resin containing the structural unit derived from the acid-stable monomer having hydroxy group (hereinafter such acid-stable monomer may be referred to as "acid-stable monomer (a2)") or the acid-stable monomer having a lactone ring (hereinafter such acid-stable monomer may be referred to as "acid-stable monomer (a3)") is used, the adhesiveness of resist to a substrate and resolution of resist tend to be improved.

<Acid-Stable Monomer (a2)>

The acid-stable monomer (a2) is preferably selected depending on the kinds of an exposure light source at producing the resist pattern.

That is, when KrF excimer laser lithography (248 nm), or high-energy irradiation such as electron beam or EUV light is used for the resist composition, using the acid-stable monomer having a phenolic hydroxy group (a2-0) such as hydroxystyrenes as the acid-stable monomer (a2) having the hydroxy group is preferable. When ArF excimer laser lithography (193 nm), i.e., short wavelength excimer laser lithography is used, using the acid-stable monomer (a2) having a hydroxy adamantyl group represented by the formula (a2-1) as the acid-stable monomer (a2) having the hydroxy group is preferable. The acid-stable monomer (a2) having the hydroxy group may be used as a single compound or as a mixture of two or more compounds.

Examples of the acid-stable monomer (a2) having phenolic hydroxy group include styrene monomer represented by the formula (a2-0) (hereinafter the monomer may be referred to as "acid-stable monomer (a2-0)") such as p- or m-hydroxystyrene.

(a2-0)

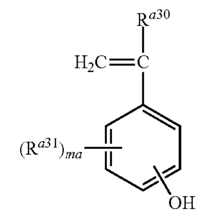

wherein $R^{a30}$ represents a hydrogen atom, a halogen atom or a $C_1$ to $C_6$ alkyl group that optionally has a halogen atom;

$R^{a31}$ in each occurrence independently represents a halogen atom, a hydroxy group, a $C_1$ to $C_6$ alkyl group, a $C_1$ to $C_6$ alkoxy group, a $C_2$ to $C_4$ acyl group, a $C_2$ to $C_4$ acyloxy group, an acryloyl group or methacryloyl group;

ma represents an integer 0 to 4.

In the formula (a2-0), examples of the alkyl group having a halogen atom of $R^{a30}$ include the same examples described in $R^{a32}$ of the formula (a1-4).

The alkyl group of $R^{a30}$ and $R^{a31}$ is preferably a $C_1$ to $C_4$ alkyl group, more preferably a $C_1$ to $C_2$ alkyl group, and still more preferably methyl group.

The alkoxy group of $R^{a31}$ is preferably a $C_1$ to $C_4$ alkoxy group, more preferably a $C_1$ to $C_2$ alkoxy group, and still more preferably methoxy group.

ma is preferably 0, 1 or 2, more preferably 0 or 1, and still more preferably 0.

When the resin (A) is produced using the acid-stable monomer (a2-0), a monomer in which the phenolic hydroxy group is protected by a protecting group can be used. Such protecting group may be a group which can be deprotected through contact with an acid or a base. Because the phenolic hydroxy group protected by the protecting group is deprotected through contact with the acid or the base, the acid-stable monomer (a2-0) can be easily obtained. However, because the resin (AA) has the structural unit derived from the monomer having the acid-labile group (a1) as described above, when the phenolic hydroxy group protected by the protecting group is deprotected, the phenolic hydroxy group is preferably placed in contact with the base, so that the acid-labile group does not get seriously impaired. Examples of the protecting group which is deprotectable by the base include an acetyl group. Examples of the base include 4-dimethylaminopyrizine and triethylamine.

Specific examples of the acid-stable monomer (a2-0) include a monomer below.

-continued
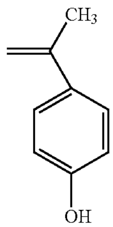
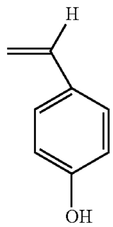
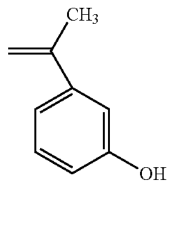
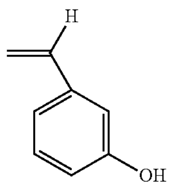
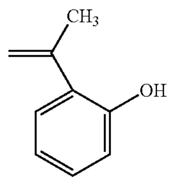
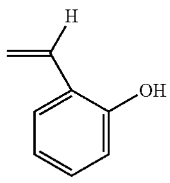
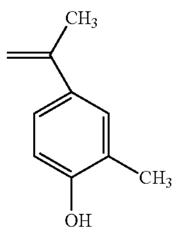
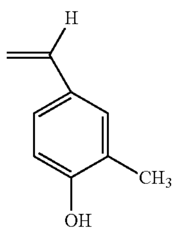
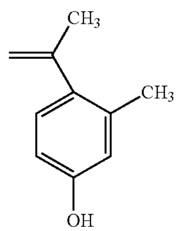
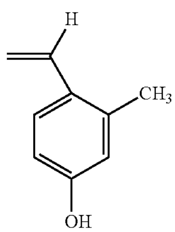
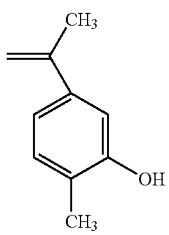
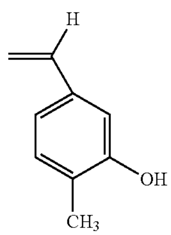
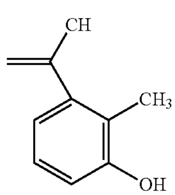
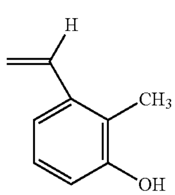
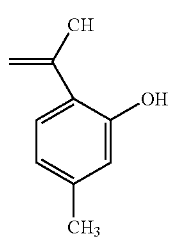
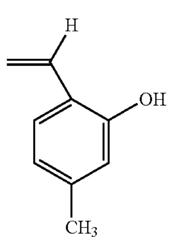
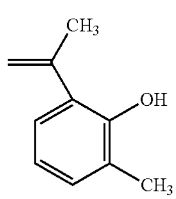
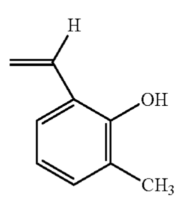
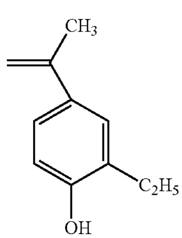
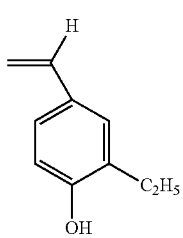
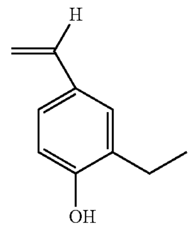
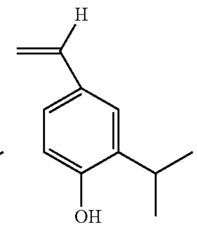
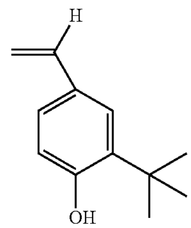
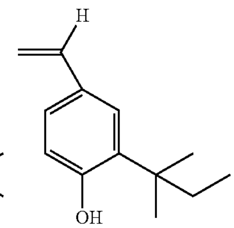
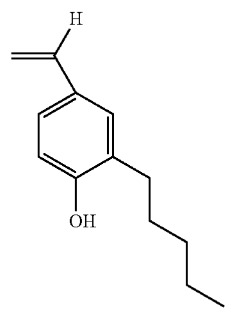
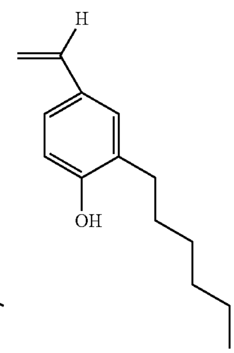
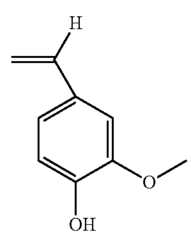
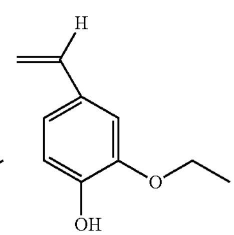
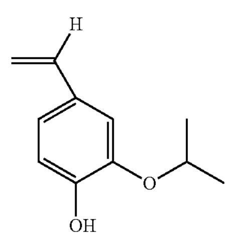
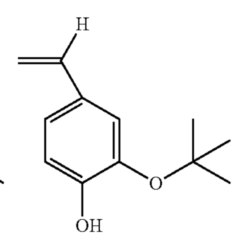
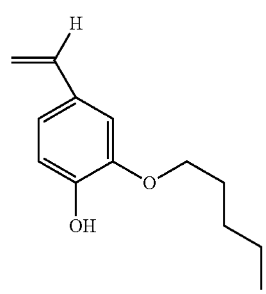

-continued

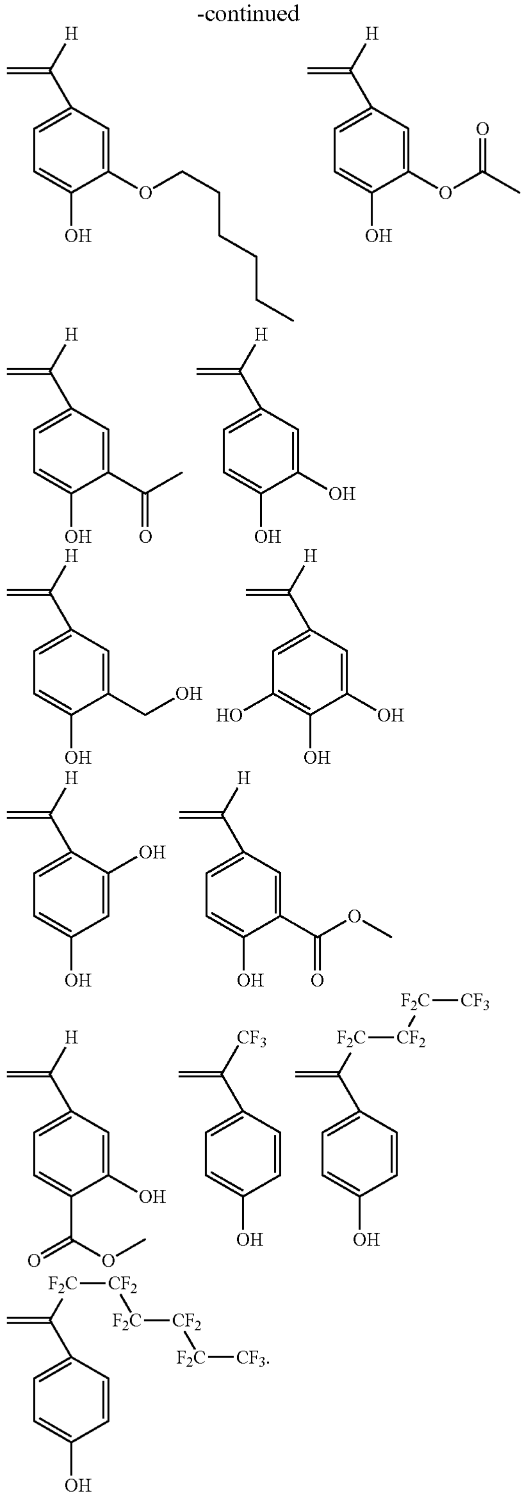

Among these, 4-hydroxystyrene and 4-hydroxy-α-methylstyrene are preferable. These 4-hydroxystyrene and 4-hydroxy-α-methylstyrene may be protected its phenolic hydroxy group by an appropriate protecting group.

When the resin (AA) contains the structural unit derived from the monomer represented by the formula (a2-0), the proportion thereof is generally 5 to 95 mol %, preferably 10 to 80 mol %, and more preferably 15 to 80 mol %, with respect to the total structural units constituting the resin (AA).

When the resin (AB) contains the structural unit derived from the monomer represented by the formula (a2-0), the proportion thereof is generally 5 to 95 mol %, preferably 10 to 80 mol %, and more preferably 15 to 80 mol %, with respect to the total structural units constituting the resin (AB).

Examples of the acid-stable monomer having a hydroxy adamantyl group include a monomer represented by the formula (a2-1) (hereinafter the monomer may be referred to as "acid-stable monomer (a2-1)").

(a2-1)

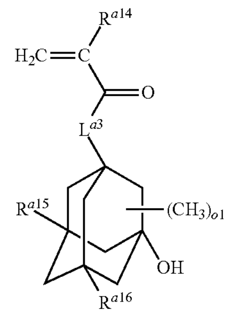

wherein $L^{a3}$ represents *—O— or *—O—$(CH_2)_{k2}$—CO—O—, k2 represents an integer of 1 to 7, * represents a bond to a carbonyl group (—CO—);

$R^{a14}$ represents a hydrogen atom or a methyl group;

$R^{a15}$ and $R^{a16}$ independently represent a hydrogen atom, a methyl group or a hydroxy group;

o1 represents an integer of 0 to 10.

In the formula (a2-1), $L^{a3}$ is preferably *—O—, *—O—$(CH_2)_{k2'}$—CO—O—, here k2' represents an integer of 1 to 4, and more preferably *—O—;

$R^{a14}$ is preferably a methyl group.

$R^{a15}$ is preferably a hydrogen atom.

$R^{a16}$ is preferably a hydrogen atom or a hydroxy group.

o1 is preferably an integer of 0 to 3, and more preferably an integer of 0 or 1.

Examples of the acid-stable monomer (a2-1) having the hydroxy adamantyl group include a monomer below. Among these, 3-hydroxyadamantane-1-yl (meth)acrylate, 3,5-dihydroxyadamantane-1-yl (meth)acrylate and 1-(3,5-dihydroxyadamantane-1-yl oxycarbonyl)methyl (meth)acrylate are preferable, and 3-hydroxyadamantane-1-yl (meth)acrylate and 3,5-dihydroxyadamantane-1-yl (meth)acrylate are more preferable, and 3-hydroxyadamantane-1-yl methacrylate and 3,5-dihydroxyadamantane-1-yl methacrylate are still more preferable.

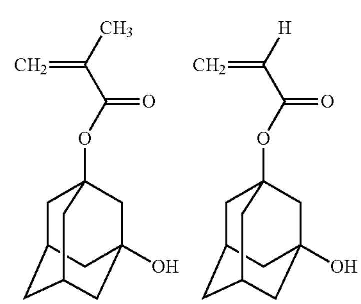

-continued
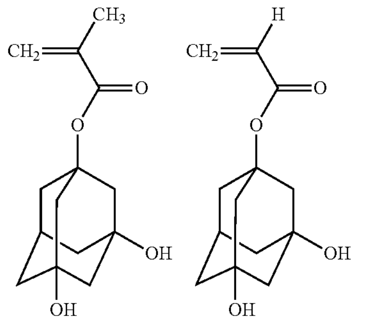
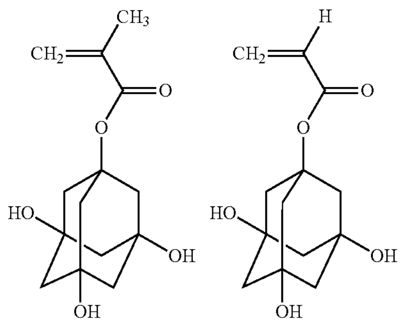
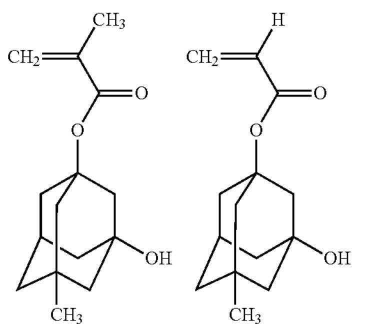
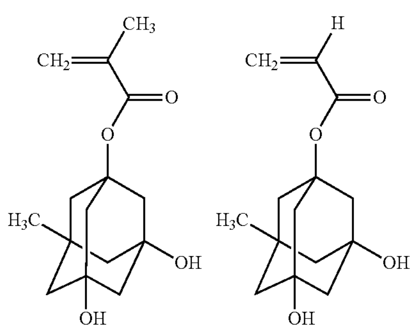
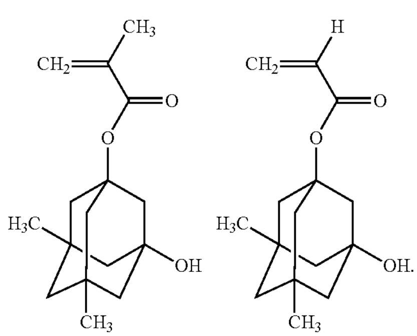
-continued
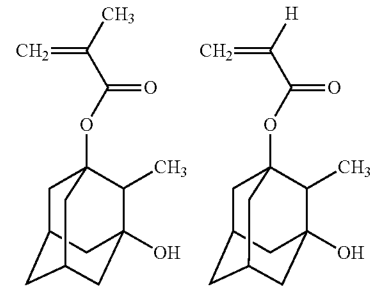
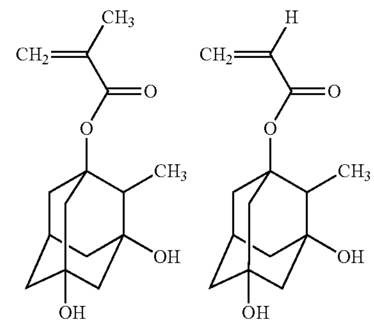
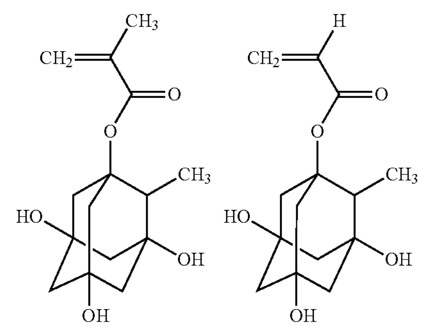
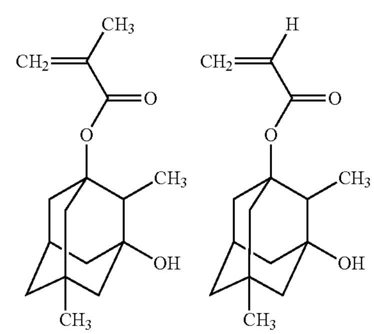
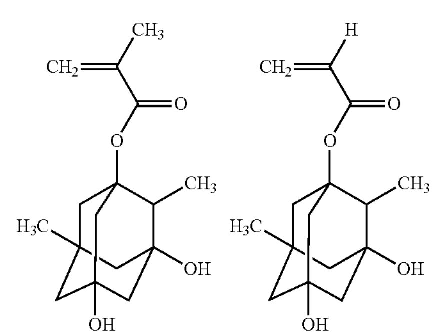

-continued
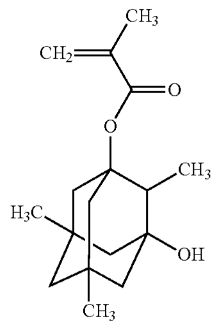
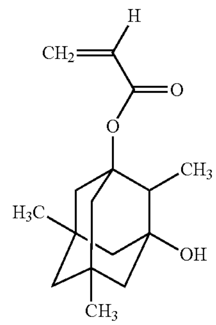
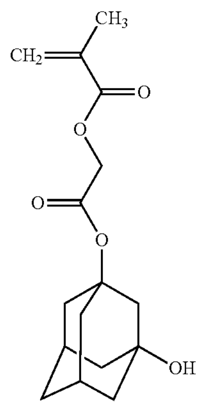
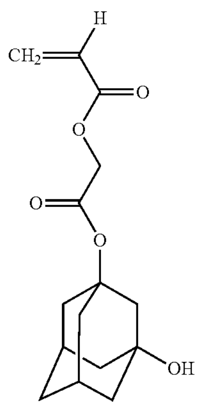
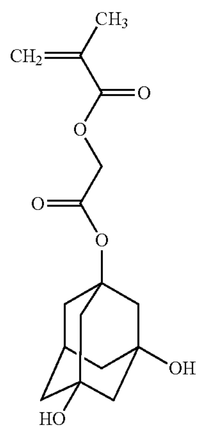
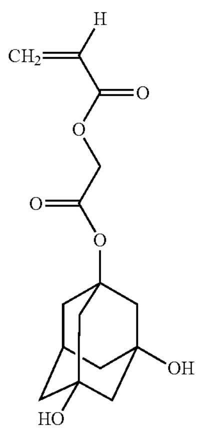
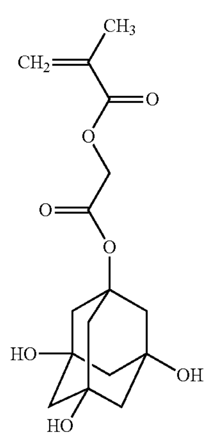
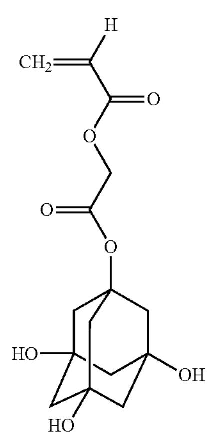
-continued
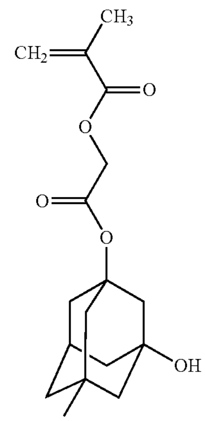
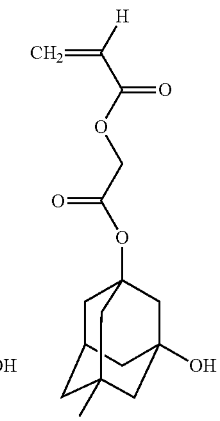
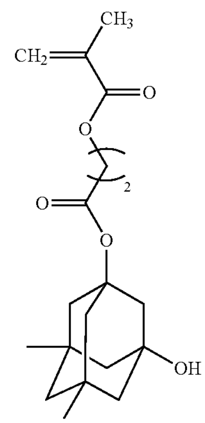
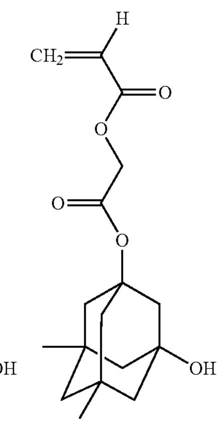
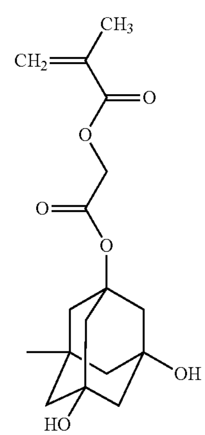
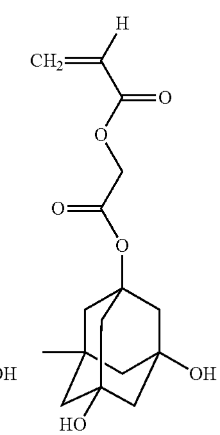
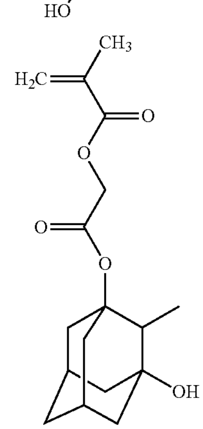
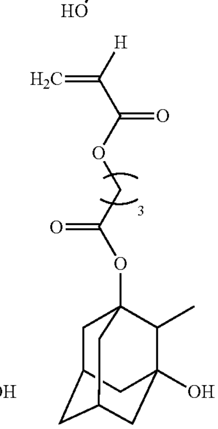

-continued

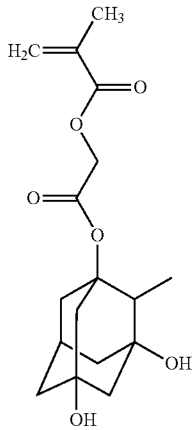

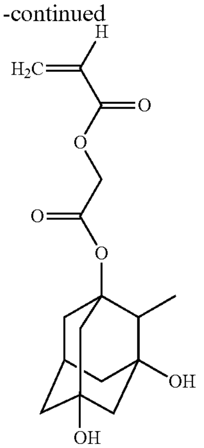

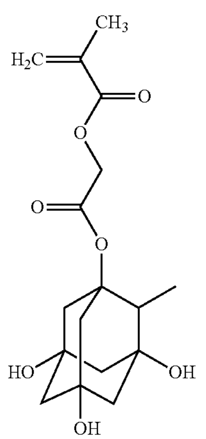

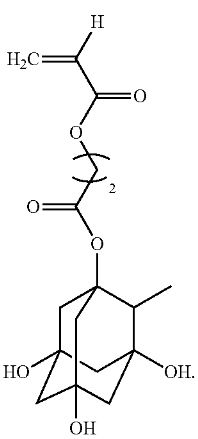

When the resin (AA) contains the structural unit derived from the monomer represented by the formula (a2-1), the proportion thereof is generally 3 to 45 mol %, preferably 5 to 40 mol %, and more preferably 5 to 35 mol %, with respect to the total structural units constituting the resin (AA).

When the resin (AB) contains the structural unit derived from the monomer represented by the formula (a2-1), the proportion thereof is generally 3 to 45 mol %, preferably 5 to 40 mol %, and more preferably 5 to 35 mol %, with respect to the total structural units constituting the resin (AB).

<Acid-Stable Monomer (a3)>

The lactone ring included in the acid-stable monomer (a3) may be a monocyclic compound such as β-propiolactone ring, γ-butyrolactone, δ-valerolactone, or a condensed ring with monocyclic lactone ring and other ring. Among these, γ-butyrolactone and condensed ring with γ-butyrolactone and other ring are preferable.

Examples of the acid-stable monomer (a3) having the lactone ring include monomers represented by any of the formula (a3-1), the formula (a3-2) or the formula (a3-3). These monomers may be used as a single compound or as a mixture of two or more compounds.

(a3-1)

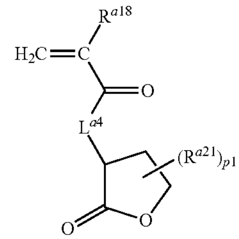

(a3-2)

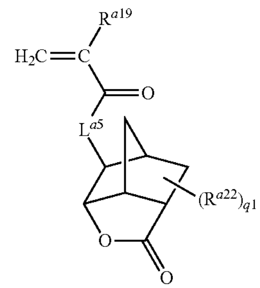

(a3-3)

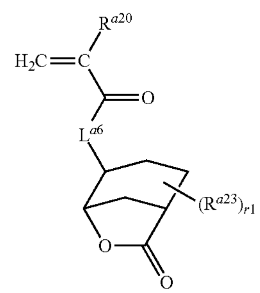

wherein $L^{a4}$ to $L^{a6}$ independently represents *—O— or *—O—$(CH_2)_{k3}$—CO—O—, k3 represents an integer of 1 to 7, * represents a bond to a carbonyl group;

$R^{a18}$ to $R^{a20}$ independently represents a hydrogen atom or a methyl group;

$R^{a21}$ represents a $C_1$ to $C_4$ alkyl group;

$R^{a22}$ and $R^{a23}$ independently represent a carboxy group, a cyano group or a $C_1$ to $C_4$ alkyl group;

p1 represents an integer of 0 to 5;

q1 and r1 independently represent an integer of 0 to 3.

In the formulae (a3-1) to (a3-3), $L^{a4}$ to $L^{a6}$ is independently preferably *—O—, *—O—$(CH_2)_{k3'}$—CO—O—, here k3' represents an integer of 1 to 4, and more preferably *—O—.

$R^{a18}$ to $R^{a20}$ is preferably a methyl group.

$R^{a21}$ is preferably a methyl group.

$R^{a22}$ and $R^{a23}$ are independently preferably a carboxy group, a cyano group or a methyl group.

p1, q1 and r1 are independently preferably an integer of 0 to 2, and more preferably 0 or 1.

Examples of the acid-stable monomers having γ-butyrolactone ring (a3-1) include a monomer below.

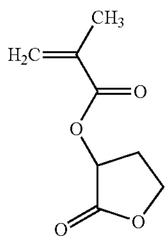
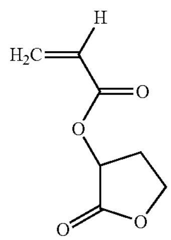
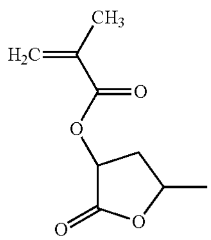
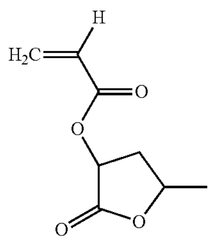
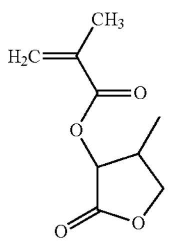
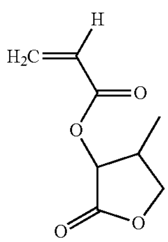
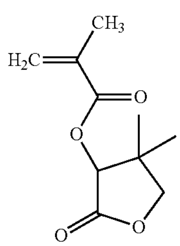
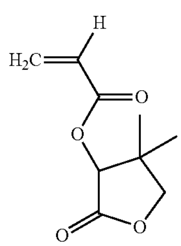
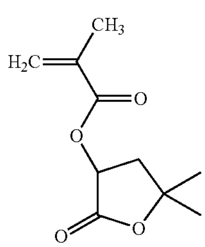
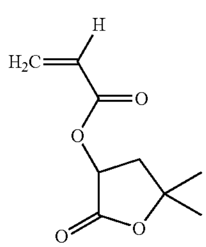
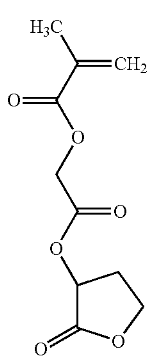
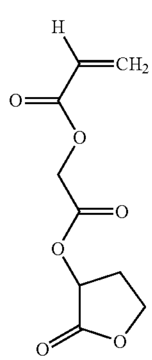
-continued
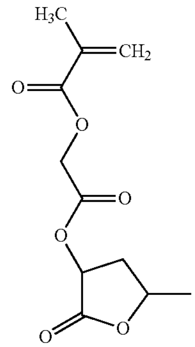
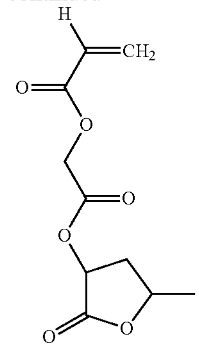
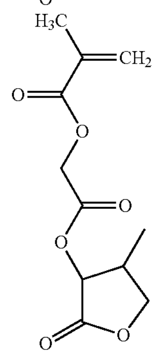
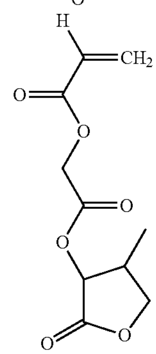
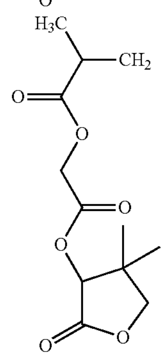
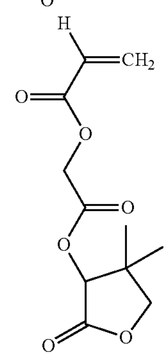
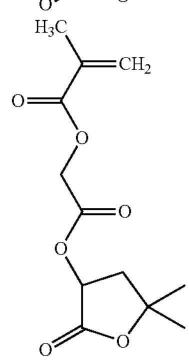
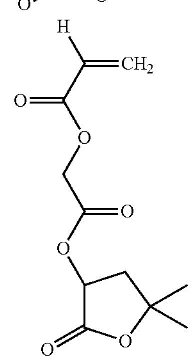
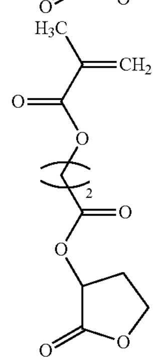
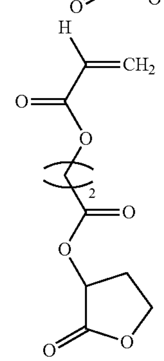

-continued
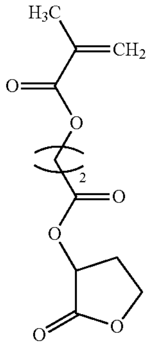
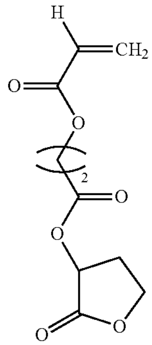
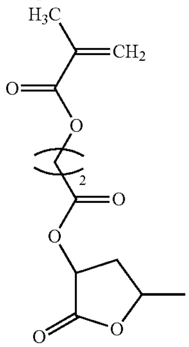
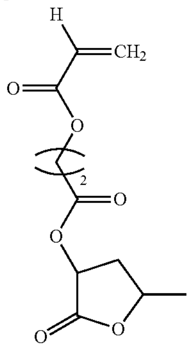
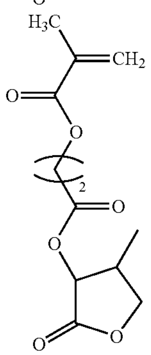
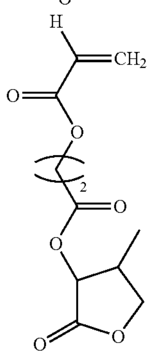
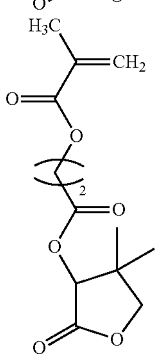
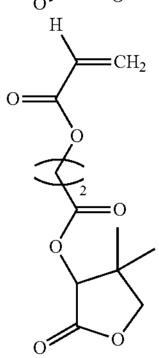
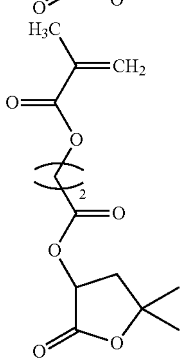
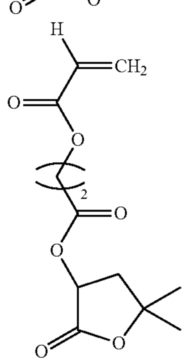
-continued
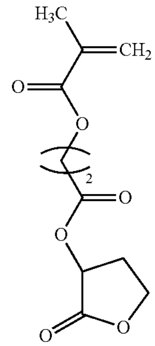
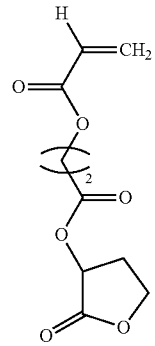
Examples of the acid-stable monomers having γ-butyrolactone ring and norbornene ring represented by the formula (a3-2) include a monomer below.
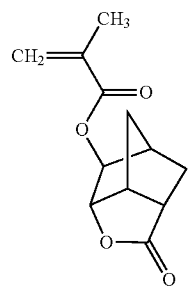
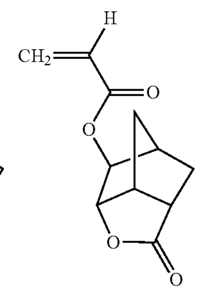
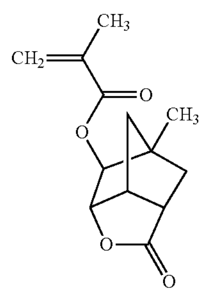
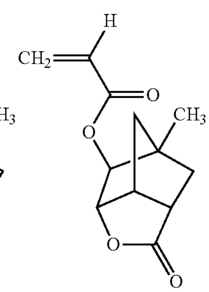
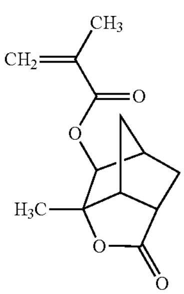
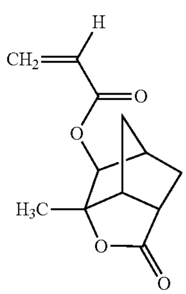
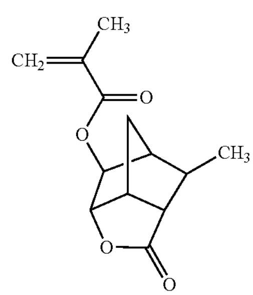
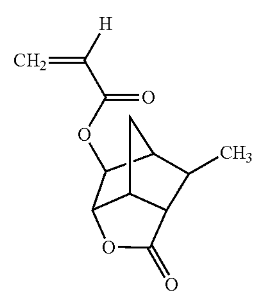

-continued
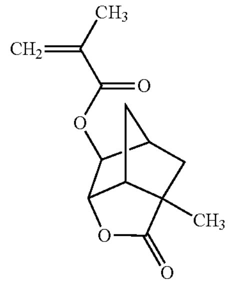
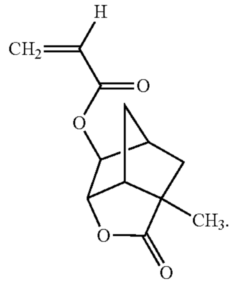
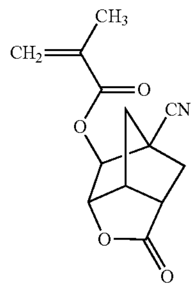
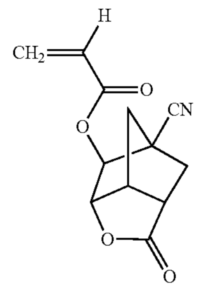
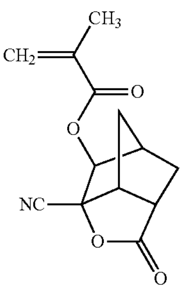
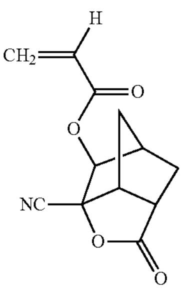
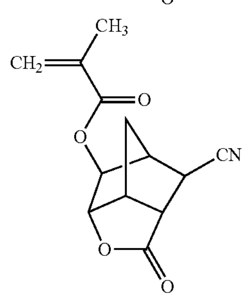
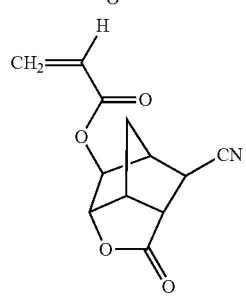
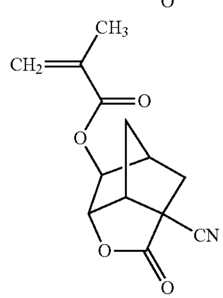
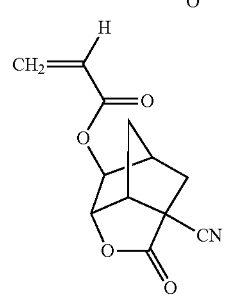
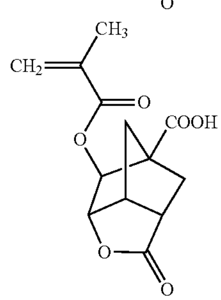
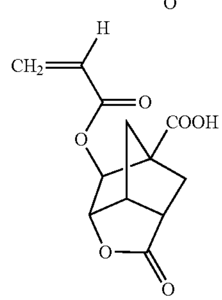
-continued
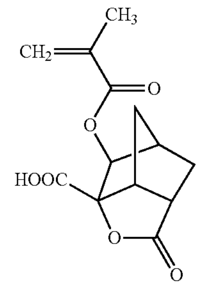
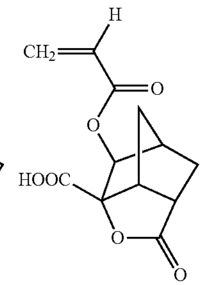
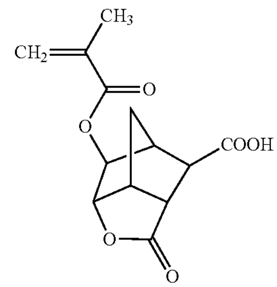
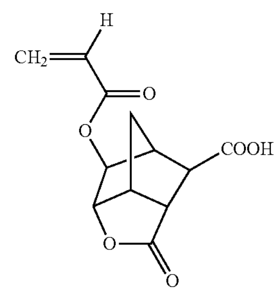
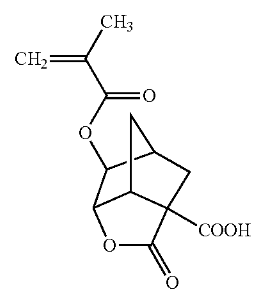
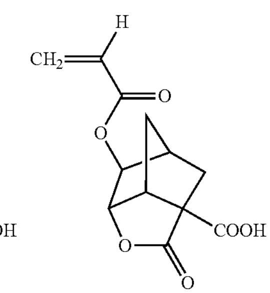
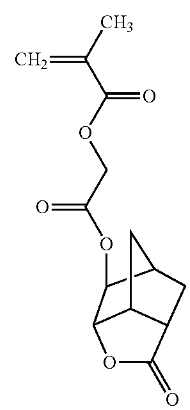
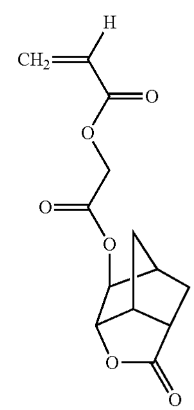

-continued
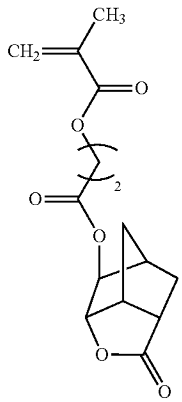
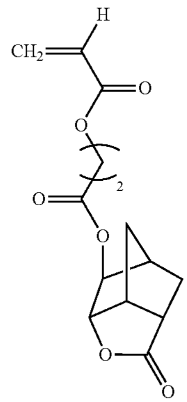
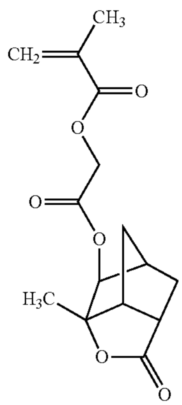
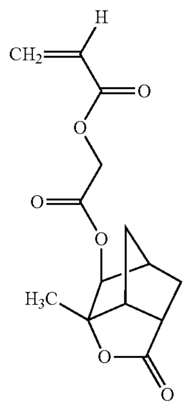
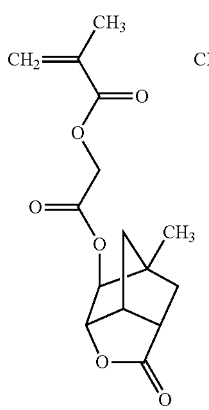
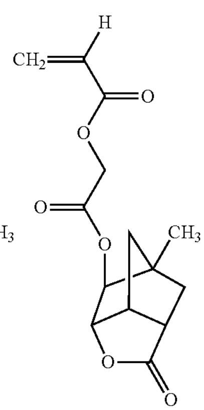
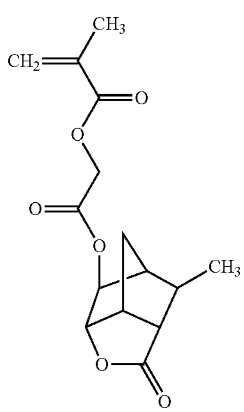
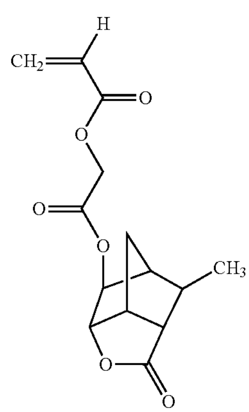
-continued
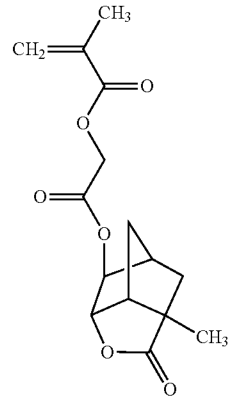
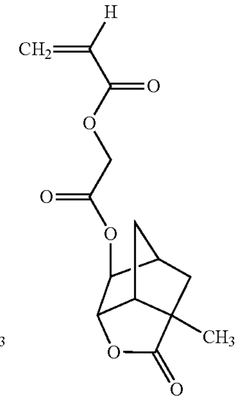
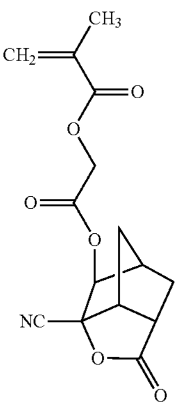
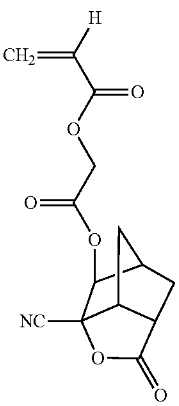
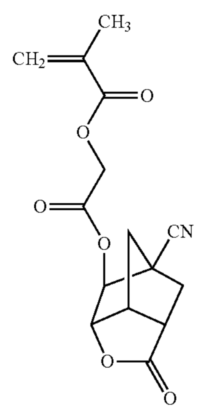
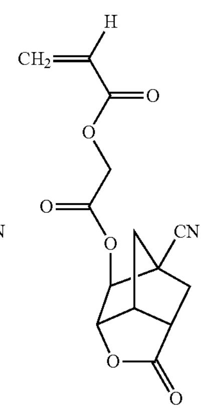
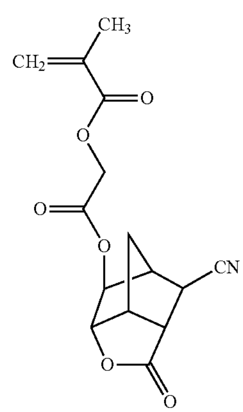
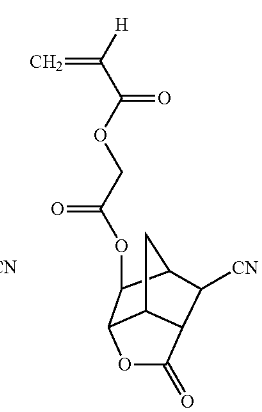

-continued
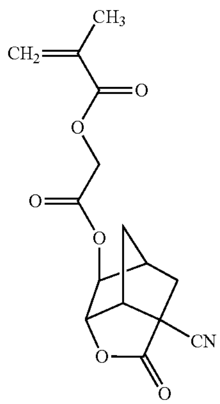
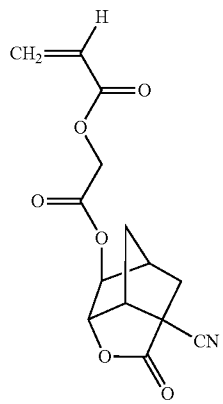
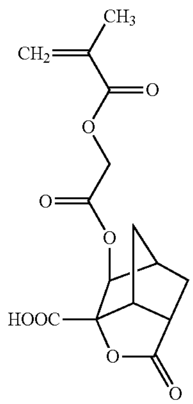
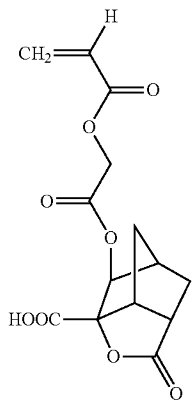
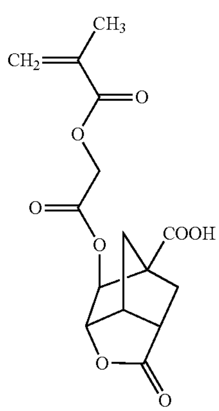
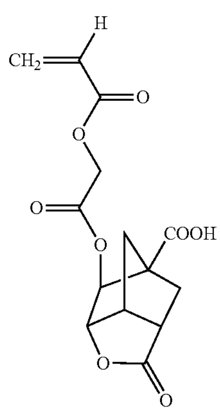
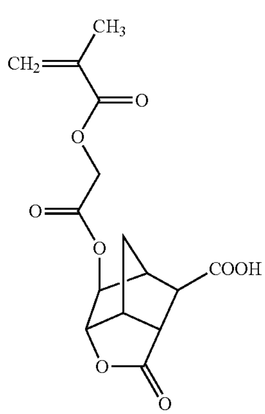
-continued
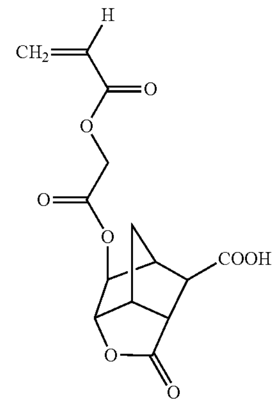
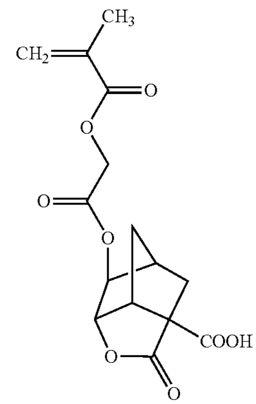
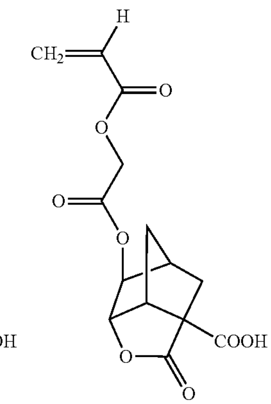
Examples of the acid-stable monomers having a condensed ring with γ-butyrolactone ring and cyclohexane ring represented by the formula (a3-3) include a monomer below.
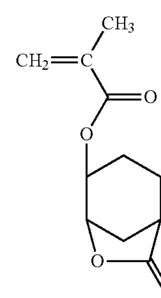
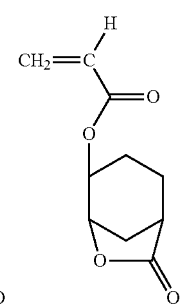
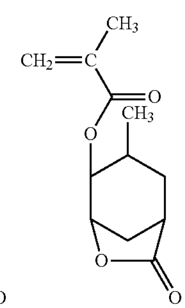
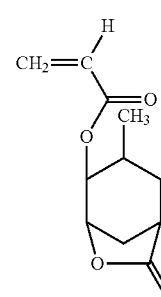
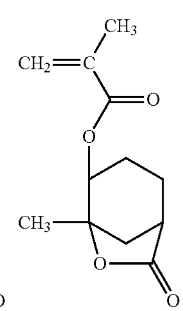
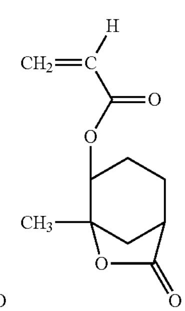

-continued
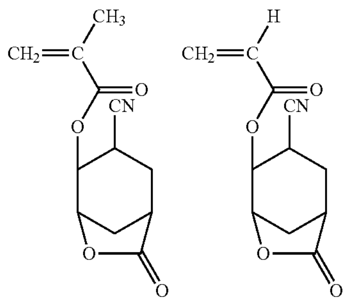
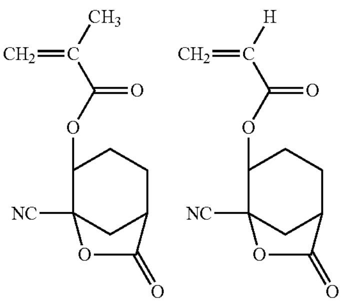
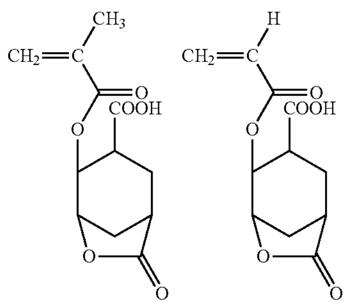
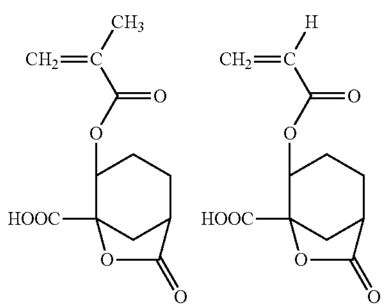
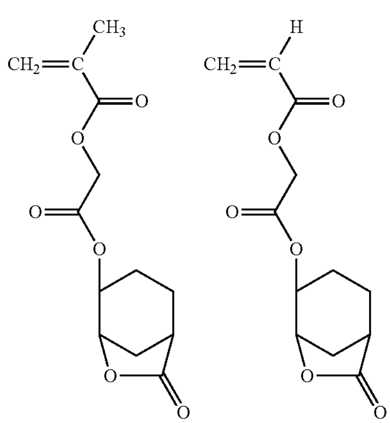
-continued
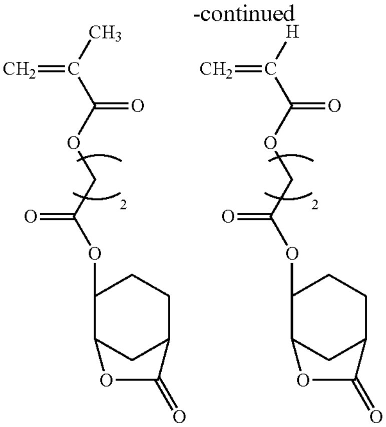
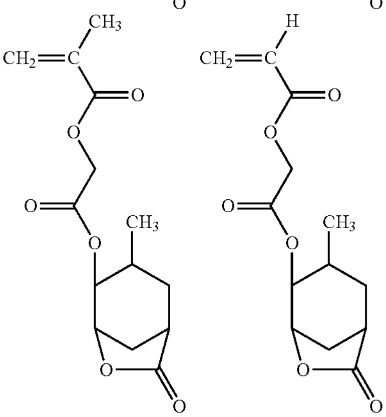
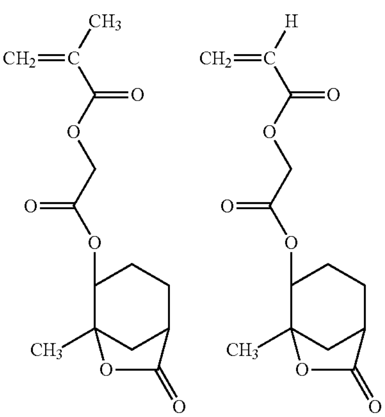 [SMILES: C=C(C)C(=O)OCC(=O)OC1CCC2CC1(C(=O)O)OC2=O ; C=CC(=O)OCC(=O)OC1CCC2CC1(C(=O)O)OC2=O]
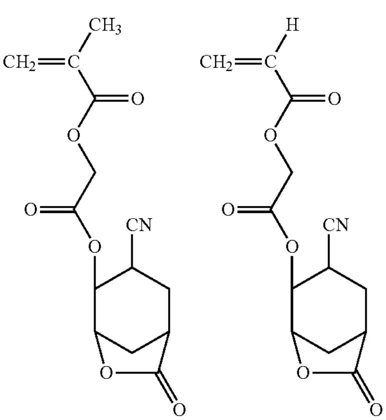

-continued

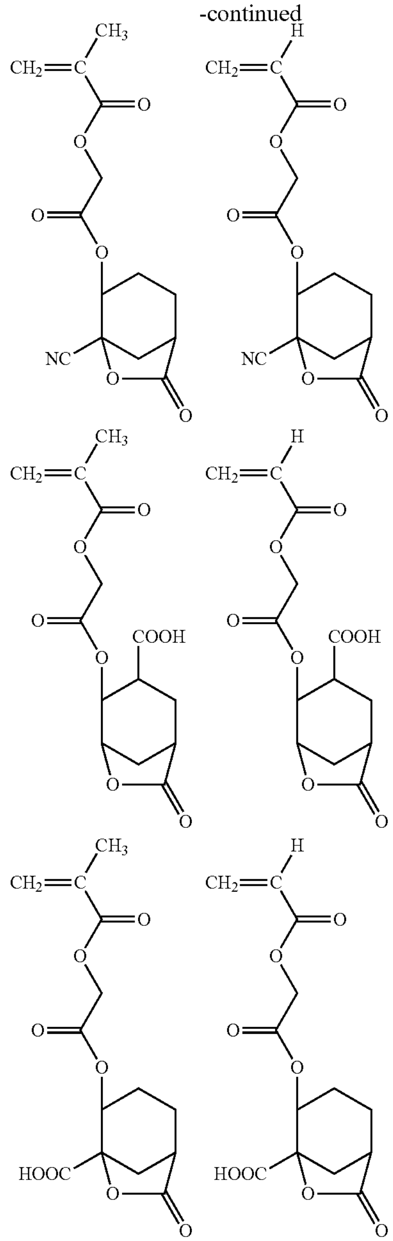

Among the acid-stable monomer having lactone ring (a3), (5-oxo-4-oxatricyclo[4.2.1.$0^{3,7}$]nonane-2-yl) (meth)acrylate, tetrahydro-2-oxo-3-furyl (meth)acrylate, and 2-(5-oxo-4-oxatricyclo[4.2.1.$0^{3,7}$]nonane-2-yloxy)-2-oxoethyl (meth) acrylate are preferable, and the (meth)acrylate compounds are more preferable.

When the resin (AA) contains the structural unit derived from the monomer represented by the formula (a3-1), the structural unit derived from the monomer represented by the formula (a3-2) and/or the structural unit derived from the monomer represented by the formula (a3-3), the proportion thereof is generally 5 to 50 mol %, preferably 10 to 40 mol %, and more preferably 15 to 40 mol %, respectively, with respect to the total structural units constituting the resin (AA).

When the resin (AA) contains the structural unit derived from the acid stable monomer (a3) having a lactone ring, the total proportion thereof is preferably 5 to 60 mol %, and more preferably 15 to 55 mol %, with respect to the total structural units constituting the resin (AA).

When the resin (AB) contains the structural unit derived from the acid stable monomer represented by the formula (a3-1), the structural unit derived from the monomer represented by the formula (a3-2) and/or the structural unit derived from the monomer represented by the formula (a3-3), the proportion thereof is generally 5 to 50 mol %, preferably 10 to 40 mol %, and more preferably 15 to 40 mol %, respectively, with respect to the total structural units constituting the resin (AB).

When the resin (AB) contains the structural unit derived from the acid stable monomer (a3) having a lactone ring, the total proportion thereof is preferably 5 to 60 mol %, and more preferably 15 to 55 mol %, with respect to the total structural units constituting the resin (AB).

<Acid-Stable Monomer (a4)>

An acid-stable monomer (a4) and an acid-stable monomer (a5) may be used for the production of the resin (AA).

The acid-stable monomer (a4) has a group represented by the formula (3) below.

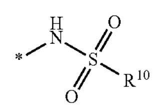

(3)

wherein $R^{10}$ represents a $C_1$ to $C_6$ fluorinated alkyl group.

Examples of the fluorinated alkyl group of $R^{10}$ include difluoromethyl, trifluoromethyl, 1,1-difluoroethyl, 2,2-difluoroethyl, 2,2,2-trifluoroethyl, perfluoroethyl, 1,1,2,2-tetrafluoropropyl, 1,1,2,2,3,3-hexafluoropropyl, perfluoroethylmethyl, 1-(trifluoromethyl)-1,2,2,2-tetratrifluoroethyl, perfluoropropyl, 1,1,2,2-tetrafluorobutyl, 1,1,2,2,3,3-hexafluorobutyl, 1,1,2,2,3,3,4,4-octafluorobutyl, perfluorobutyl, 1,1-bis(trifluoro)methyl-2,2,2-trifluoroethyl, 2-(perfluoropropyl)ethyl, 1,1,2,2,3,3,4,4-octafluoropentyl, perfluoropentyl, 1,1,2,2,3,3,4,4,5,5-decafluoropentyl, 1,1-bis(trifluoromethyl)-2,2,3,3,3-pentafluoropropyl, 2-(perfluorobutyl)ethyl, 1,1,2,2,3,3,4,4,5,5-decafluorohexyl, 1,1,2,2,3,3,4,4,5,5,6,6-dodecafluorohexyl, perfluoropentylmethyl and perfluorohexyl groups.

The fluorinated alkyl group of $R^{10}$ preferably has 1 to 4 carbon atom, more preferably trifluoromethyl, perfluoroethyl and perfluoropropyl groups, and still more preferably trifluoromethyl group.

Specific examples of the acid stable monomer (a4) having the group represented by the formula (a4) include a monomer below.

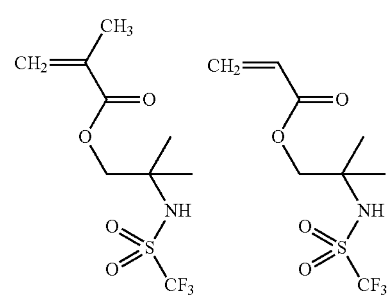

-continued
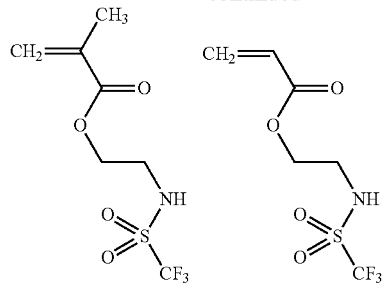
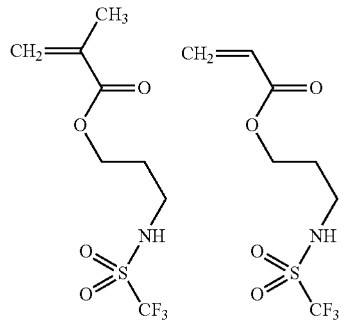
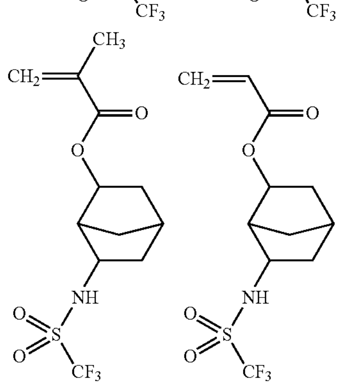
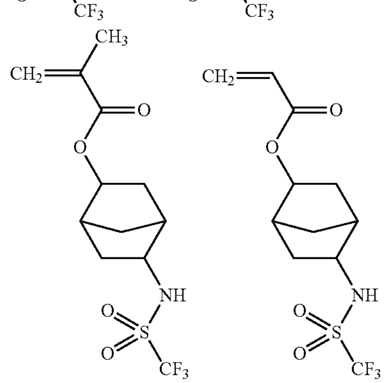
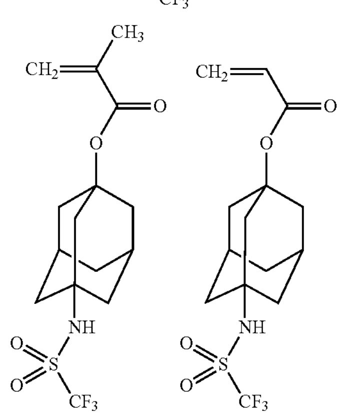
-continued
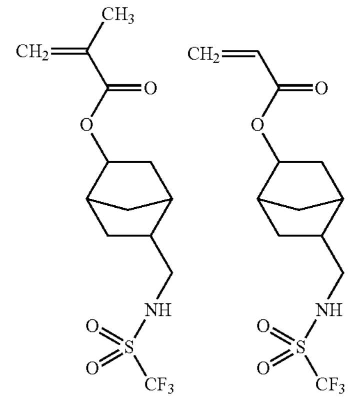
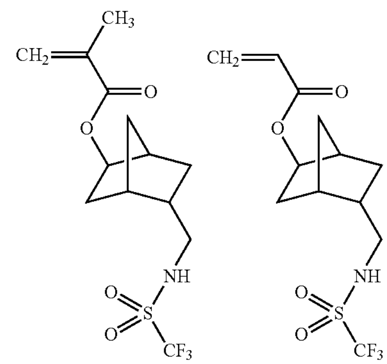
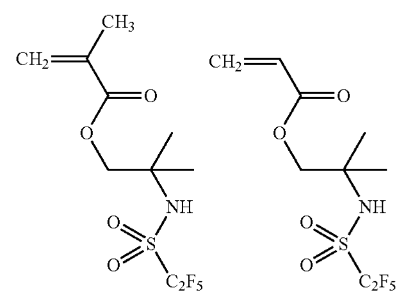
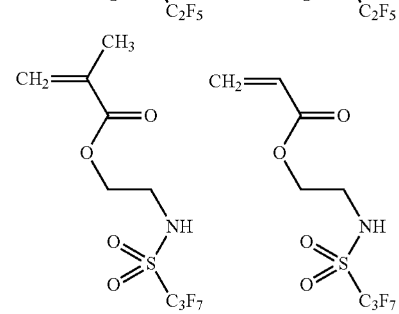
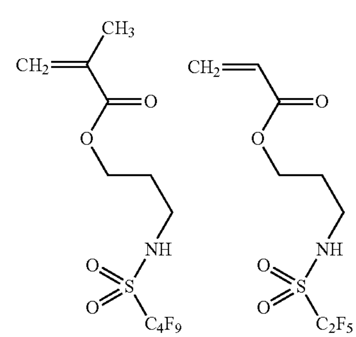

-continued

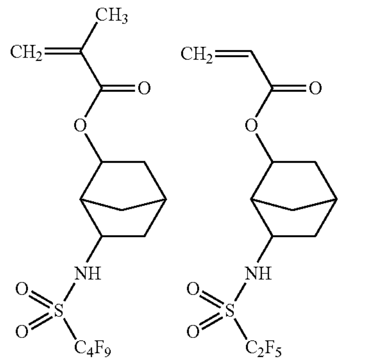

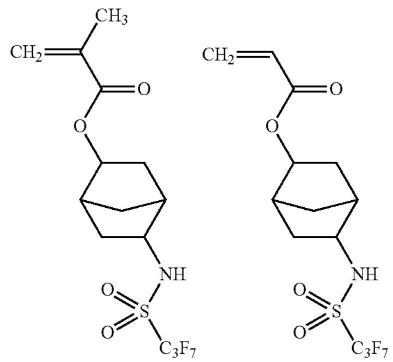

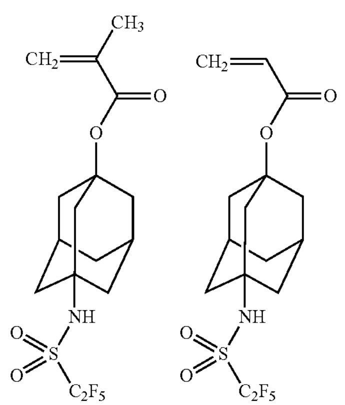

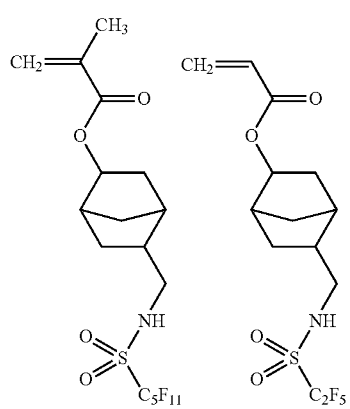

-continued

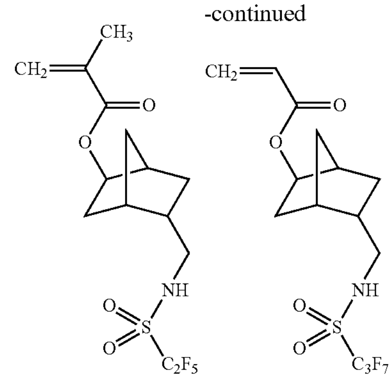

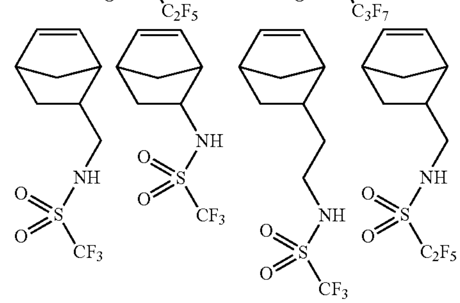

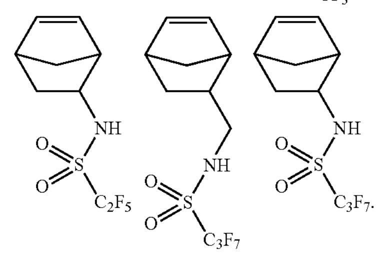

When the resin (AA) contains the structural unit derived from the acid-stable monomer represented by the formula (a4), the proportion thereof is generally 1 to 30 mol %, preferably 3 to 25 mol %, and more preferably 5 to 20 mol %, with respect to the total structural units (100 mole %) of the resin (AA).

When the resin (AB) contains the structural unit derived from the acid-stable monomer represented by the formula (a4), the proportion thereof is generally 5 to 90 mol %, preferably 10 to 80 mol %, and more preferably 20 to 70 mol %, with respect to the total structural units (100 mole %) of the resin (AB).

<Acid-Stable Monomer (a5)>

The acid-stable monomer (a5) has a group represented by the formula (4).

(4)

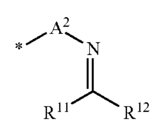

wherein $R^{11}$ represents an optionally substituted $C_6$ to $C_{12}$ aromatic hydrocarbon group;

$R^{12}$ represents an optionally substituted $C_1$ to $C_{12}$ hydrocarbon group, the hydrocarbon group may be contain a hetero atom;

$A^2$ represents a single bond, —$(CH_2)_{m10}$—$SO_2$—O—* or —$(CH_2)_{m10}$—CO—O—*, the —$CH_2$— contained in the [—$(CH_2)_{m10}$—] may be replaced by —O—, —CO— or —$SO_2$—, a hydrogen atom contained in the [—$(CH_2)_{m10}$—] may be replaced by a fluorine atom;

m10 represents an integer 1 to 12.

Examples of the aromatic hydrocarbon group of $R^{11}$ include an aryl group such as phenyl, naphthyl, p-methylphenyl, p-tert-butylphenyl, p-adamantylphenyl, tolyl, xylyl, cumenyl, mesityl, biphenyl, anthryl, phenanthryl, 2,6-diethylphenyl and 2-methyl-6-ethylphenyl groups.

A hydrogen atom contained in the aromatic hydrocarbon group may be replaced by a $C_1$ to $C_4$ alkyl group, a halogen atom, a phenyl group, a nitro group, a cyano group, a hydroxy group, a phenyloxy group and tert-butylphenyl group.

Specific examples of the preferable group for $R^{11}$ include a group below. * represents a bond to a carbon atom.

($R^{11}$-1)

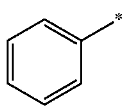

($R^{11}$-2)

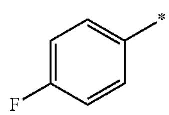

($R^{11}$-3)

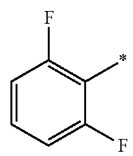

($R^{11}$-4)

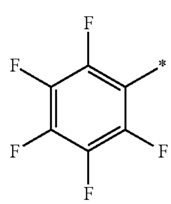

($R^{11}$-5)

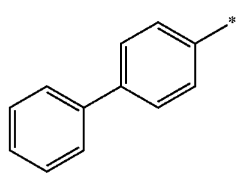

($R^{11}$-6)

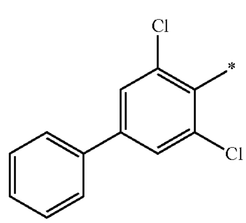

($R^{11}$-7)

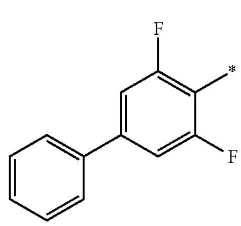

-continued ($R^{11}$-8)

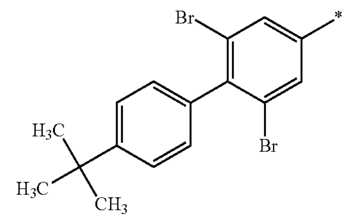

($R^{11}$-9)

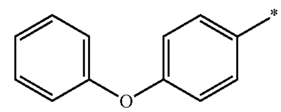

($R^{11}$-10)

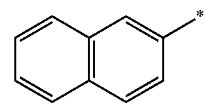

($R^{11}$-11)

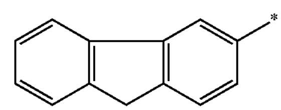

($R^{11}$-12)

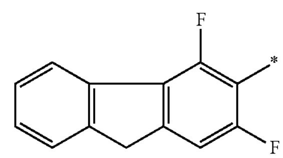

($R^{11}$-13)

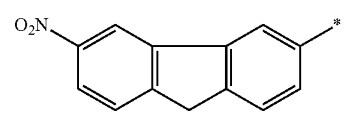

($R^{11}$-14)

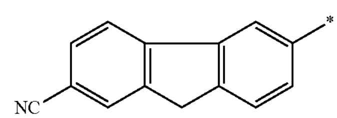

The hydrocarbon group of $R^{12}$ may be any of a liner chain aliphatic hydrocarbon group, an alicyclic hydrocarbon group and an aromatic hydrocarbon group.

Typical examples of the aliphatic hydrocarbon group are an alkyl group, and examples of the alkyl group include the same groups described above.

Examples of the alicyclic hydrocarbon group include the same examples described above.

When $R^{12}$ is an aliphatic hydrocarbon group or an alicyclic hydrocarbon group, these may contain a hetero atom. Examples of the hetero atom include a halogen atom, a sulfur atom, an oxygen atom and a nitrogen atom, and may include a configuration of linking group such as a sulfonyl group and a carbonyl group.

Specific examples of $R^{12}$ containing such hetero atom include a group below.

*—$CF_3$ ($R^{12}$-1)

*—CN ($R^{12}$-2)

*—$CH_3$ ($R^{12}$-3)

-continued
(R12-4)
*—$CF_2CH_3$
(R12-5)
*—$CF_2CF_3$
(R12-6)
*—$CF_2CF_2CF_3$
(R12-7)
*—$CF_2C_2H_5$
(R12-8)
*—$CF_2CF_2CF_2$—$CO_2$—$CH_3$
(R12-9)
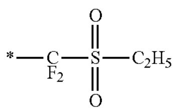
(R12-10)
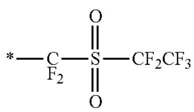
(R12-11)
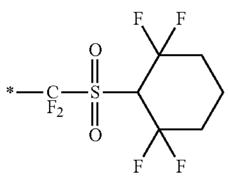
(R12-12)
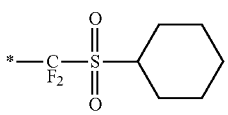
(R12-13)
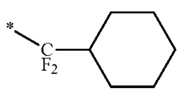
(R12-14)
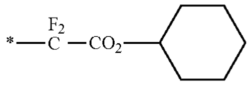
(R12-15)
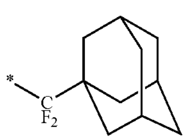
(R12-16)
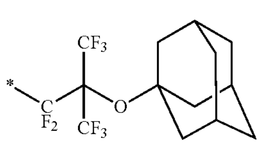
(R12-17)
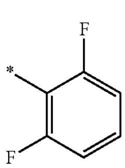
-continued
(R12-18)
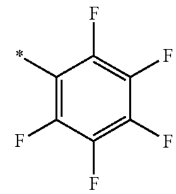
When $R^{12}$ is an aromatic hydrocarbon group, specific examples thereof include the same examples as $R^{11}$.
Specific examples of $A^2$ include a group below.
($A^2$-1)
—
($A^2$-2)
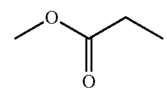
($A^2$-3)
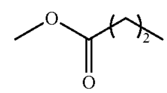
($A^2$-4)
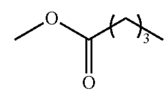
($A^2$-5)
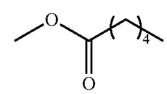
($A^2$-6)
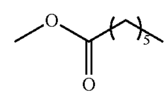
($A^2$-7)
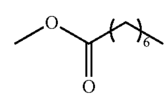
($A^2$-8)
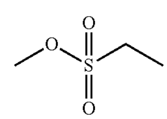
($A^2$-9)
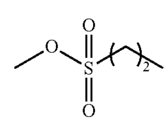
($A^2$-10)
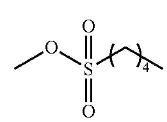
($A^2$-11)
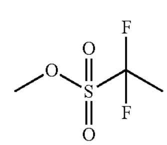

-continued

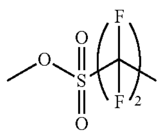

($A^2$-12)

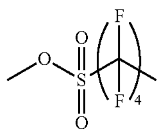

($A^2$-13)

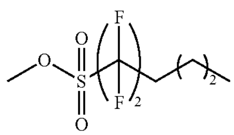

($A^2$-14)

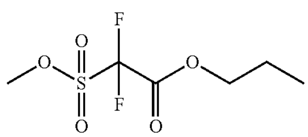

($A^2$-15)

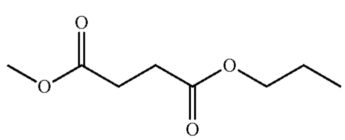

($A^2$-16)

An acid-stable monomer (a5) containing a group represented by the formula (4) include an acid-stable monomer represented by the formula (a5-1).

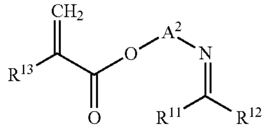

(a5-1)

wherein $R^{13}$ represents a hydrogen atom or a methyl group; $R^{11}$, $R^{12}$ and $A^2$ are the same definitions described above.

Specific examples of the acid-stable monomer (a5-1) include a monomer below.

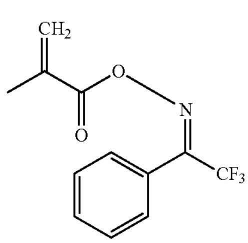

-continued

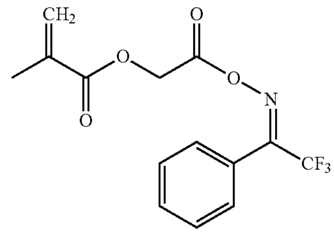

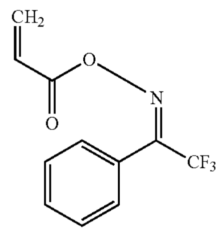

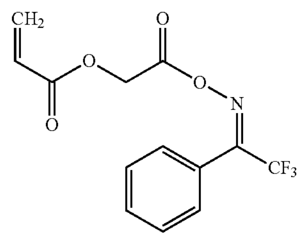

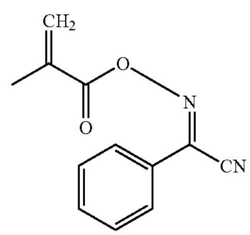

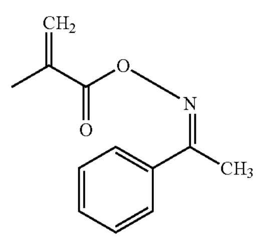

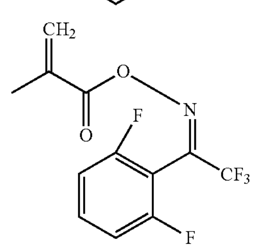

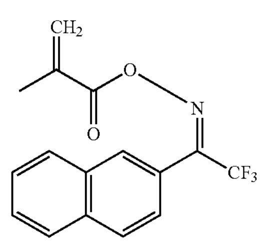

-continued

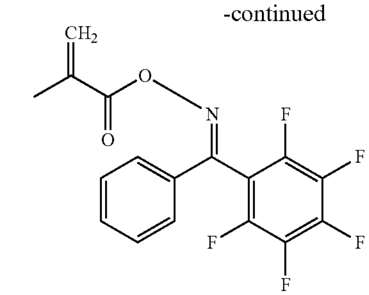

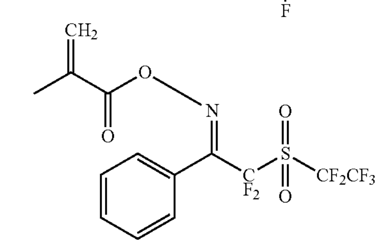

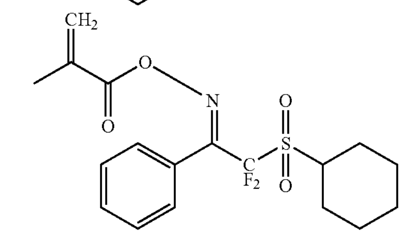

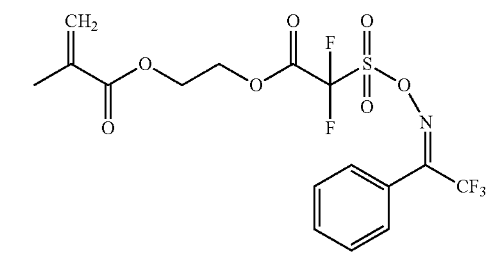

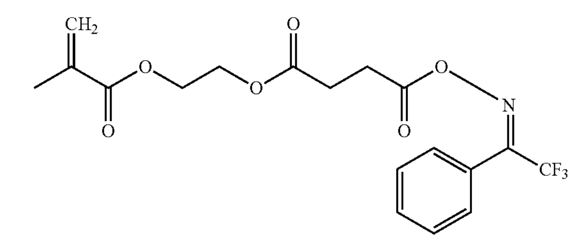

When the resin (AA) contains the structural unit derived from the monomer represented by the formula (a5-1), the proportion thereof is generally 1 to 30 mol %, preferably 3 to 25 mol %, and more preferably 5 to 20 mol %, with respect to the total structural units constituting the resin (AA).

When the resin (AB) contains the structural unit derived from the monomer represented by the formula (a5-1), the proportion thereof is generally 5 to 90 mol %, preferably 10 to 80 mol %, and more preferably 20 to 70 mol %, with respect to the total structural units (100 mol %) constituting the resin (AB).

<Acid-Stable Monomer (a6)>

The acid-stable monomer (a6) is a monomer represented by the formula (a6-1).

(a6-1)

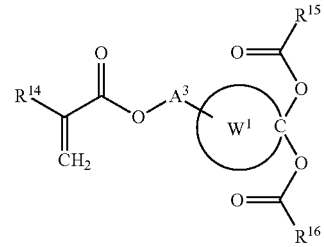

wherein ring $W^1$ represents a $C_3$ to $C_{36}$ alicyclic hydrocarbon group;

$A^3$ represents a single bond or an $C_1$ to $C_{17}$ divalent aliphatic hydrocarbon group, and the —$CH_2$— contained in the aliphatic hydrocarbon group may be replaced by —O— or —CO—, provided that an atom bonded to —O— is a carbon atom;

$R^{14}$ represents a $C_1$ to $C_6$ alkyl group that optionally has a halogen atom, a hydrogen atom or a halogen atom;

$R^{15}$ and $R^{16}$ independently represent a $C_1$ to $C_6$ alkyl group that optionally has a halogen atom.

The alicyclic hydrocarbon group of ring $W^1$ includes a monocyclic or polycyclic hydrocarbon group, preferably a $C_5$ to $C_{18}$ alicyclic hydrocarbon group, and more preferably a $C_6$ to $C_{12}$ alicyclic hydrocarbon group. Examples thereof include a ring represented by the formula (KA-1) to the formula (KA-19). That is, the group illustrated below

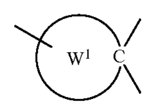

in the formula (a6-1) is a group in which one hydrogen atom bonded to an atom constituting any one of the ring represented by the formula (KA-1) to the formula (KA-19) is replaced with a bond to $A^3$, and other two hydrogen atoms bonded to another atom constituting the ring are replaced respectively with a bond to —O—CO—$R^{15}$ and a bond to —O—CO—$R^{16}$.

Examples of the ring $W^1$ preferably include a cyclohexane ring, an adamantane ring, a norbornene ring, and a norbornane ring.

Examples of the a divalent aliphatic hydrocarbon group of $A^3$ include;

a linear chain alkanediyl group such as methylene, ethylene, propane-1,3-diyl, propane-1,2-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl groups, ethan-1,1-diyl, propane-1,1-diyl and propane-2,2-diyl groups;

a branched chain alkanediyl group such as a group in which a linear chain alkanediyl group is bonded a side chain of a $C_1$ to $C_4$ alkyl group such as methyl, ethyl, propyl, isopropyl, butyl, sec-butyl and tert-butyl, for example, butan-1,3-diyl, 2-methylpropane-1,3-diyl, 2-methylpropane-1,2-diyl, pentane-1,4-diyl, 2-methylbutane-1,4-diyl groups;

a mono-alicyclic hydrocarbon group such as cyclobutan-1,3-diyl, cyclopentan-1,3-diyl, cyclohexane-1,2-diyl, 1-methylhexane-1,2-diyl, cyclohexane-1,4-diyl, cyclooctan-1,2-diyl, cyclooctan-1,5-diyl groups;

a poly-alicyclic hydrocarbon group such as norbornane-2,3-diyl, norbornane-1,4-diyl, norbornane-2,5-diyl, adamantane-1,5-diyl and adamantane-2,6-diyl groups; and a combination of two or more groups.

The aliphatic hydrocarbon group of $A^3$ may have a substituent.

Examples of the combination of the alkanediyl group and the alicyclic hydrocarbon group include groups below.

($X^X$-A)

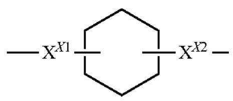

($X^X$-B)

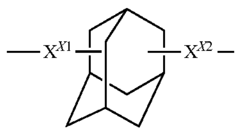

($X^X$-C)

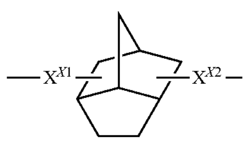

wherein $X^{X1}$ and $X^{X2}$ independently represent a $C_1$ to $C_6$ alkanediyl group or a single bond, provided that both of $X^{X1}$ and $X^{X2}$ are not a single bond, and the total carbon number of the group is 17 or less, respectively.

Examples of $A^3$ in which a —$CH_2$— contained in the aliphatic hydrocarbon group is replaced by —O— or —CO— include, for example, the same example of the group (a-g1) in the formula (a).

$A^3$ is preferably a single bond or a group represented by *—$(CH_2)_{s1}$—CO—O—, s1 represents an integer of 1 to 6, * represent a bond, and more preferably a single bond or *—$CH_2$—CO—O—.

$R^{14}$ is preferably a hydrogen atom or a methyl group.

The halogen atom of $R^{14}$ to $R^{16}$ is preferably fluorine atom.

Examples of the alkyl group having a halogen atom include trifluoromethyl, perfluoroethyl, perfluoropropyl, perfluoroisopropyl, perfluorobutyl, perfluoro-sec-butyl, perfluoro-tert-butyl, perfluoropentyl and perfluorohexyl groups. Among these, trifluoromethyl, perfluoroethyl and perfluoropropyl are preferable.

Examples of the acid-stable monomer (a6-1) include acid-stable monomers below. $R^{14}$ to $R^{16}$ and $A^3$ are the same meaning defined above.

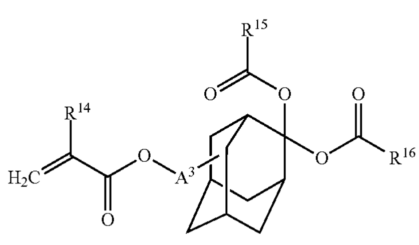

-continued

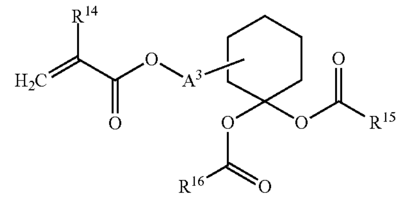

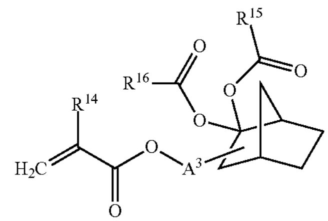

Among these, acid-stable monomers represented by the formula below are preferable.

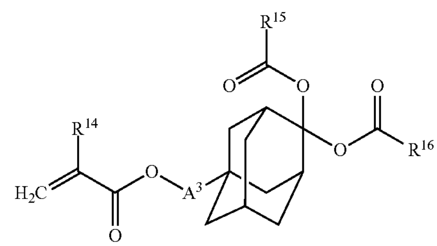

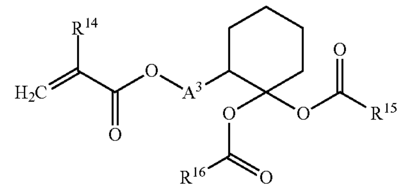

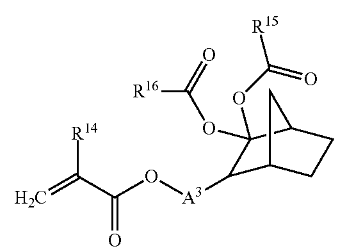

Specific examples of the acid-stable monomer (a6-1) include acid-stable monomer below.

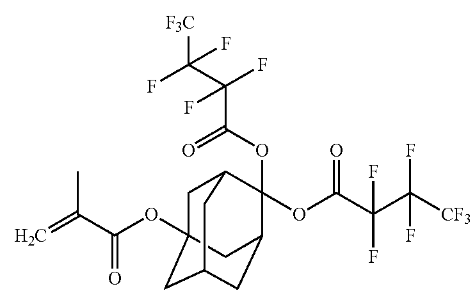

-continued
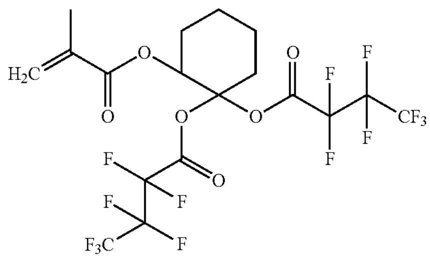
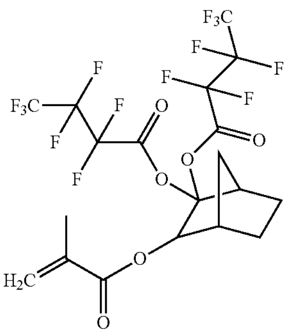
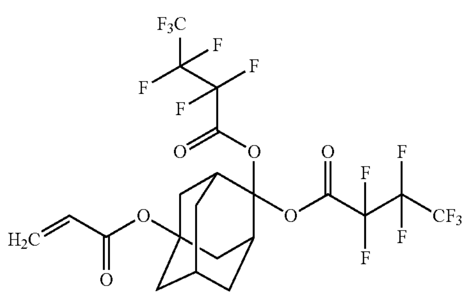
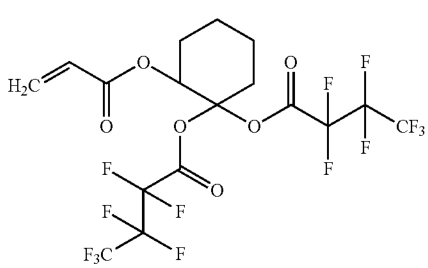
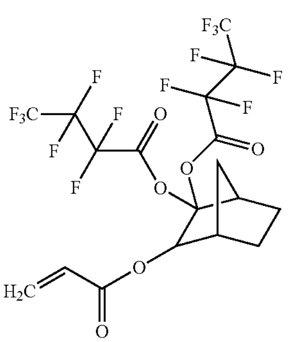
-continued
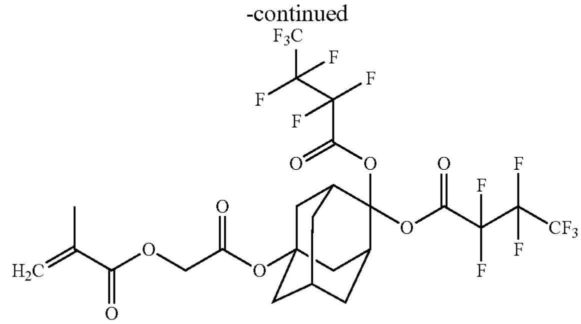
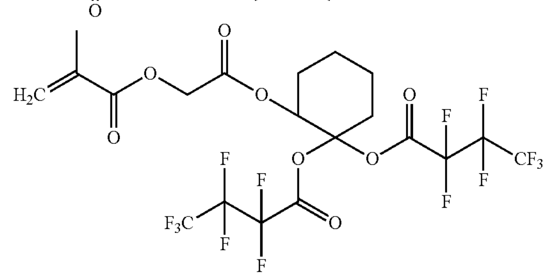
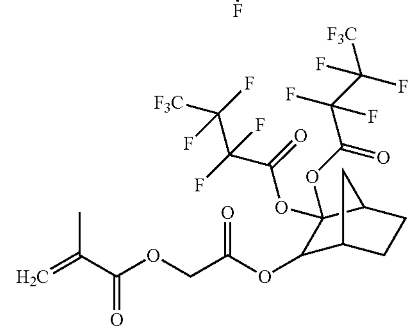
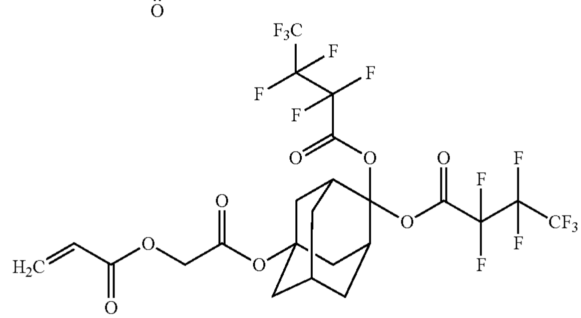
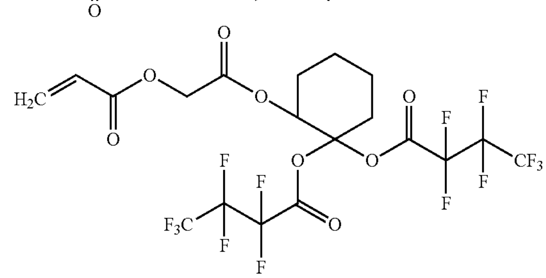
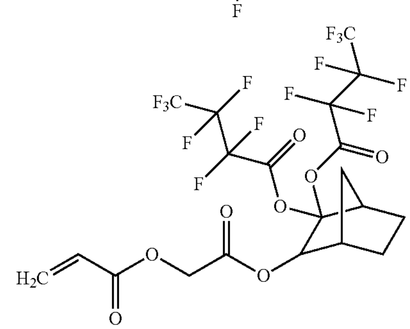

-continued

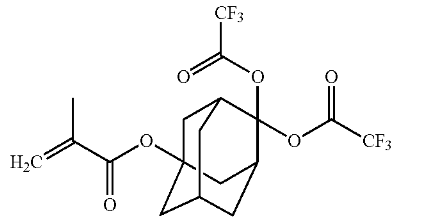

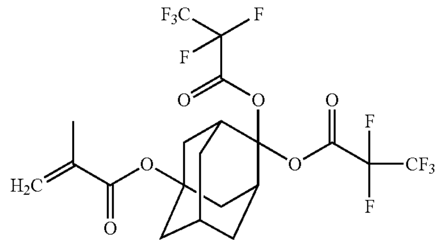

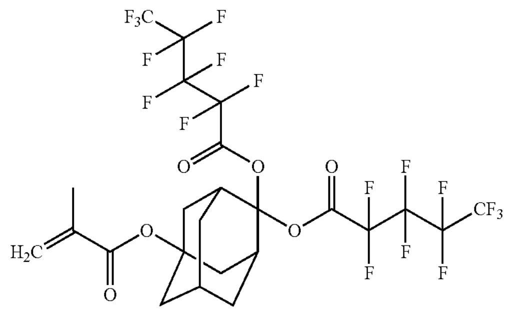

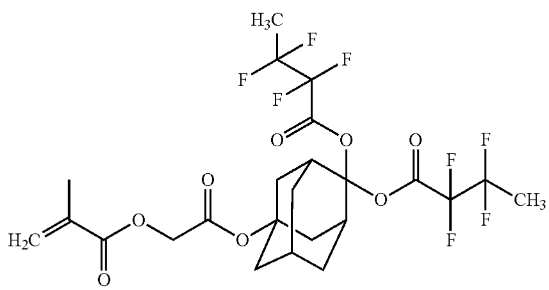

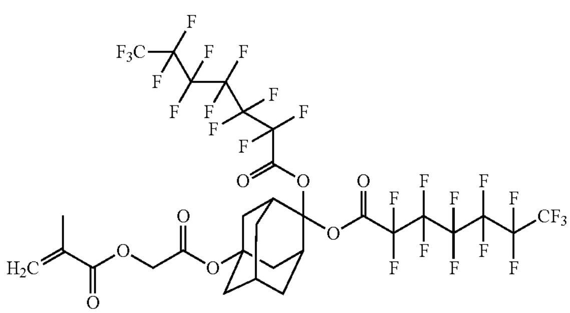

Preferable acid-stable monomer (a6-1) can be produced by reacting a compound represented by the formula (a6-1-a) and a compound represented by the formula (a6-1-b).

(a6-1-a)

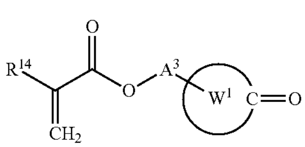

-continued (a6-1-b)

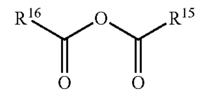

wherein $R^{14}$, $R^{15}$, $R^{16}$, $A^3$ and $W^1$ have the same meaning as defined above.

Typical compound represented by the formula (a6-1-a) is 1-methacryloyloxy-4-oxoadamantane described in JP2002-226436-A.

Examples of the compound represented by the formula (a6-1-b) include pentafluoropropionic anhydride, heptafluoro butyric anhydride and trifluoro butyric anhydride. The reaction is preferably carried out at around a boiling point of the compound represented by the formula (a6-1-b) used.

When the resin (AA) contains the structural unit derived from the monomer represented by the formula (a6), the proportion thereof is generally 1 to 30 mol %, preferably 3 to 25 mol %, and more preferably 5 to 20 mol %, with respect to the total structural units constituting the resin (AA).

When the resin (AB) contains the structural unit derived from the monomer represented by the formula (a6), the proportion thereof is generally 5 to 90 mol %, preferably 10 to 80 mol %, and more preferably 20 to 70 mol %, with respect to the total structural units constituting the resin (AB).

<Acid-Stable Monomer (a7)>

Examples of the acid-stable monomer other than the above include maleic anhydride represented by the formula (a7-1), itaconic anhydride represented by the formula (a7-2) or an acid-stable monomer having norbornene ring represented by the formula (a7-3), for example.

(a7-1)

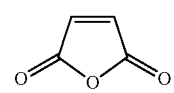

(a7-2)

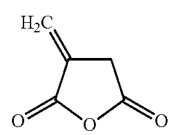

(a7-3)

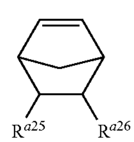

wherein $R^{a25}$ and $R^{a26}$ independently represent a hydrogen atom, a $C_1$ to $C_3$ alkyl group that optionally has a hydroxy group, a cyano group, a carboxy group or —$COOR^{a27}$, or $R^{a25}$ and $R^{a26}$ may be bonded together to form —CO—O—CO—, $R^{a27}$ represents a $C_1$ to $C_{18}$ aliphatic hydrocarbon group, one or more —$CH_2$— contained in the aliphatic hydrocarbon group may be replaced by —O— or —CO—, provided that excluding a group in which the —$COOR^{a27}$ is an acid-labile group, that is, $R^{a27}$ does not include a group in which the tertiary carbon atom bonds to —O—.

Examples of the alkyl group that optionally has a hydroxy group of $R^{a25}$ and $R^{a26}$ include, for example, methyl, ethyl, propyl, hydroxymethyl and 2-hydroxyethyl groups.

The aliphatic hydrocarbon group of $R^{a27}$ has preferably a $C_1$ to $C_8$ alkyl group and a $C_4$ to $C_{18}$ alicyclic hydrocarbon group, and more preferably a $C_1$ to $C_6$ alkyl group and a $C_4$ to $C_{12}$ alicyclic hydrocarbon group, and still more preferably a methyl, ethyl, propyl, 2-oxo-oxolane-3-yl and 2-oxo-oxolane-4-yl groups.

Specific examples of the acid-stable monomer having the norbornene ring (a7-3) include 2-norbornene, 2-hydroxy-5-norbornene, 5-norbornene-2-carboxylic acid, methyl 5-norbornene-2-carboxylate, 2-hydroxy-1-ethyl 5-norbornene-2-carboxylate, 5-norbornene-2-methanol and 5-norbornene-2,3-dicarboxylic acid anhydride.

When the resin (AA) contains the structural unit derived from the monomer represented by the formula (a7-1), the monomer represented by the formula (a7-2) and/or the monomer represented by the formula (a7-3), the total proportion thereof is generally 2 to 40 mol %, preferably 3 to 30 mol %, and more preferably 5 to 20 mol %, with respect to the total structural units constituting the resin (AA).

When the resin (AB) contains the structural unit derived from the monomer represented by the formula (a7-1), the monomer represented by the formula (a7-2) and/or the monomer represented by the formula (a7-3), the total proportion thereof is generally 5 to 70 mol %, preferably 10 to 60 mol %, and more preferably 20 to 50 mol %, with respect to the total structural units constituting the resin (AB).

Further, examples of the acid-stable monomer other than the above include a monomer having a sultone ring represented by the formula (a7-4).

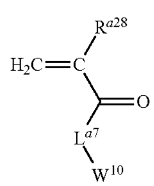

(a7-4)

wherein $L^{a7}$ represents an oxygen atom or *-T-$(CH_2)_{k2}$—CO—O—, k2 represents an integer of 1 to 7, T represents an oxygen atom or NH, * represents a single bond to carbonyl group;

$R^{a28}$ represents a hydrogen atom or a methyl group;

$W^{10}$ represent a group having an optionally substituted sultone ring.

The sultone ring is a ring in which two of adjacent methylene groups are replaced by an oxygen atom and a sulfonyl group, respectively, and examples thereof include a ring below. The sultone ring group is a group in which a hydrogen atom contained in the sultone ring below is replaced by a bond, which correspond to a bond to $L^{a7}$ in the formula (a7-4)

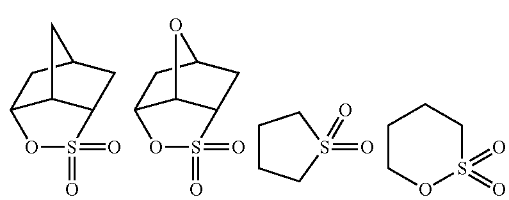

The group having an optionally substituted sultone ring means a group in which a hydrogen atom other than a hydrogen atom which has been replaced by a bond contained in the sultone ring is replaced by a substituent (monovalent group other than a hydrogen atom), and examples thereof include a hydroxy group, cyano group, a $C_1$ to $C_6$ alkyl group, a $C_1$ to $C_6$ fluorinated alkyl group, a $C_1$ to $C_6$ hydroxy alkyl group, a $C_1$ to $C_6$ alkoxy group, a $C_1$ to $C_7$ alkoxycarbonyl group, a $C_1$ to $C_7$ acyl group and a $C_1$ to $C_8$ acyloxy group.

Specific examples of the acid-stable monomer (a7-4) having a sultone ring include a monomer below.

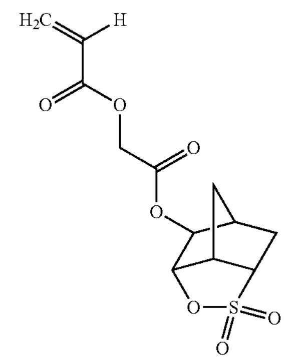

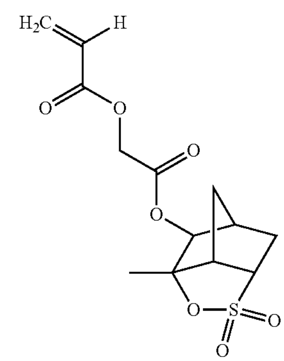

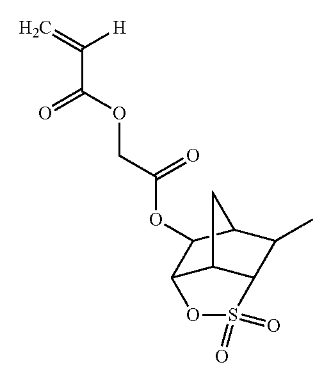

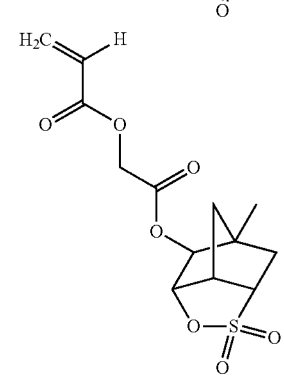

-continued
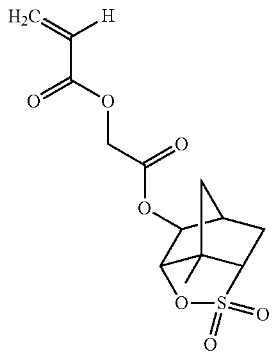
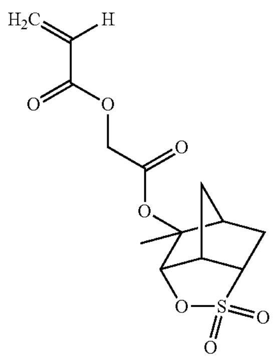
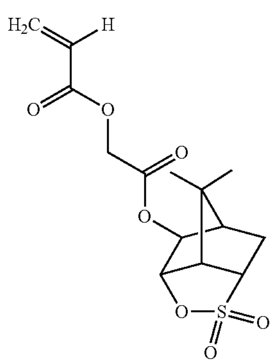
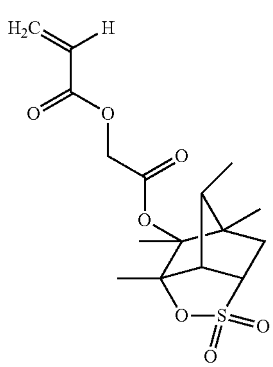
-continued
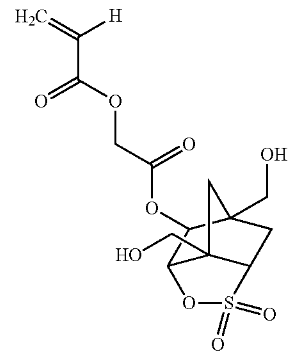
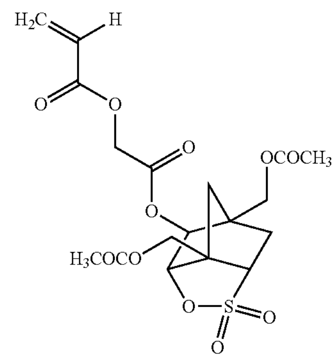
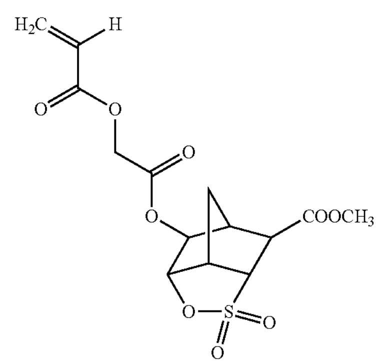
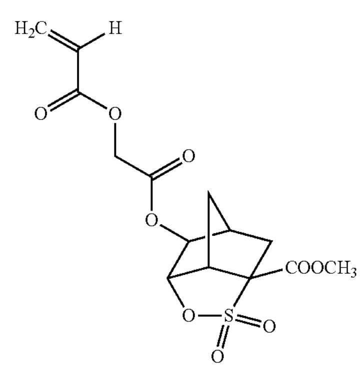

-continued
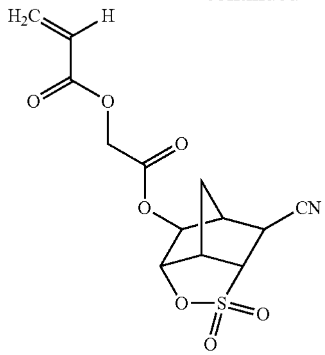
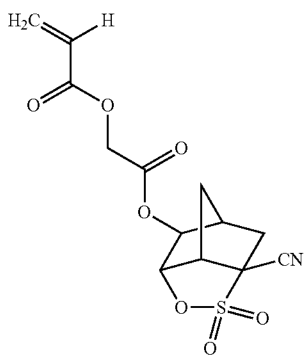
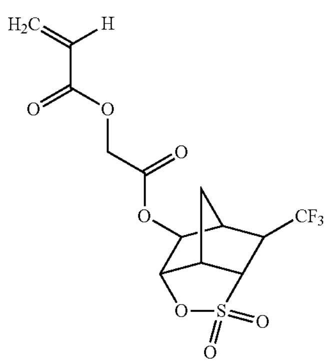
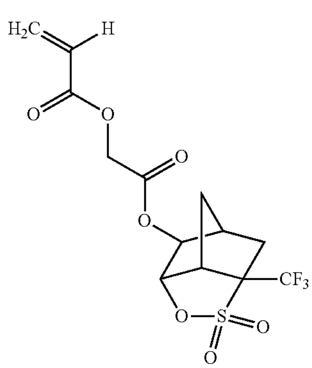
-continued
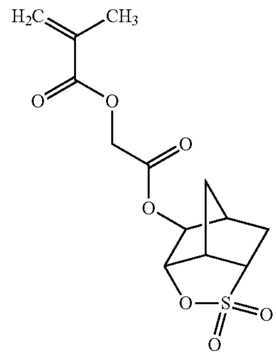
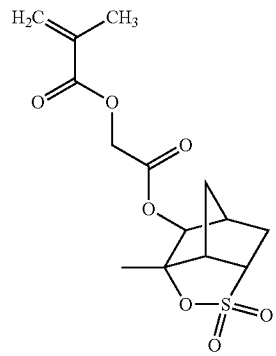
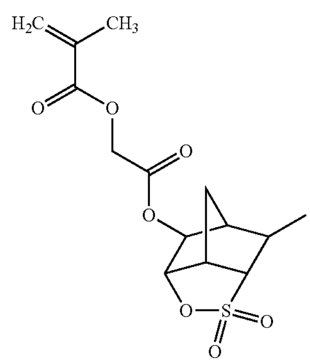
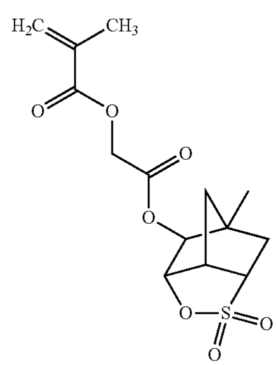

-continued
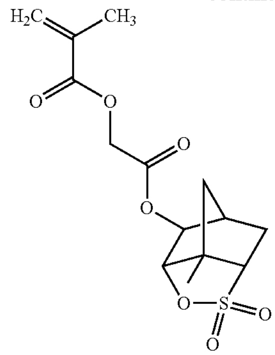
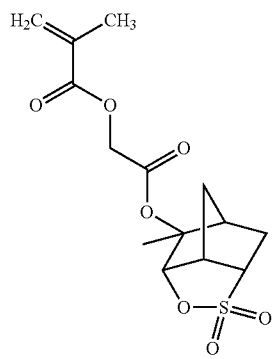
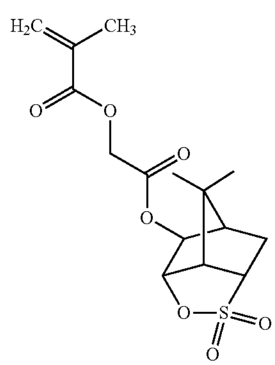
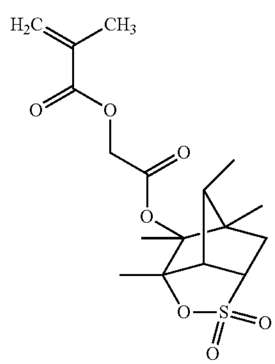
-continued
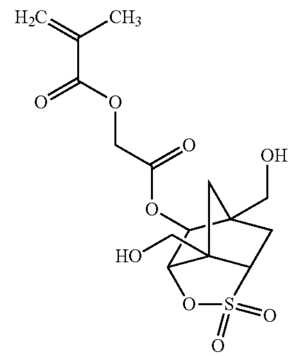
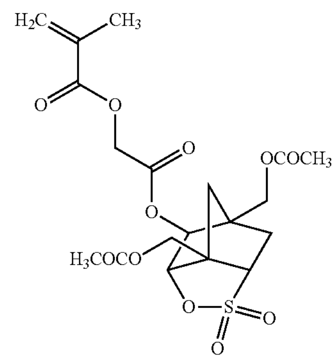
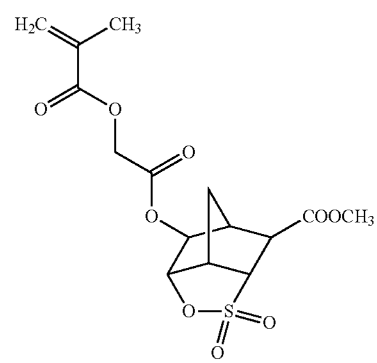
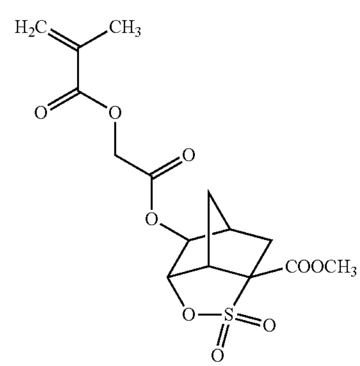

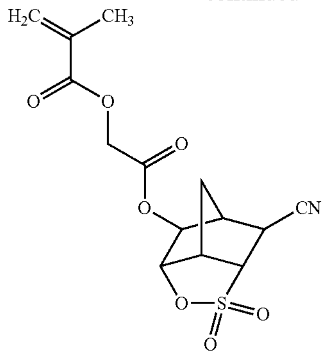
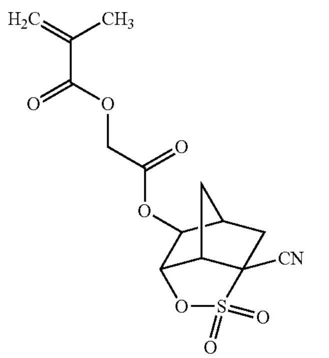
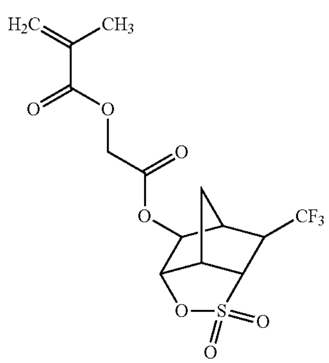
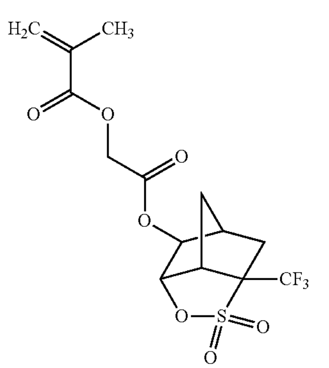
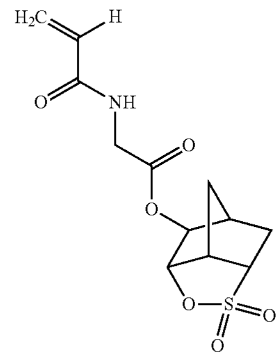
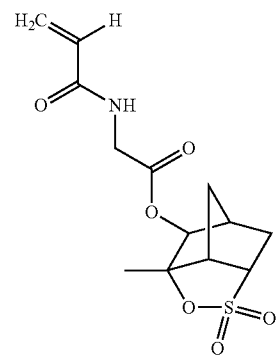
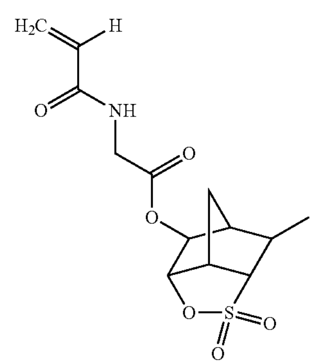
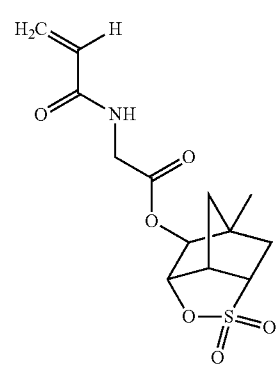

-continued
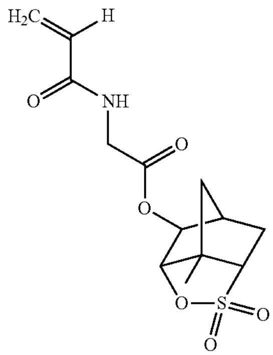
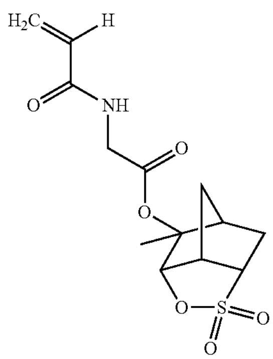
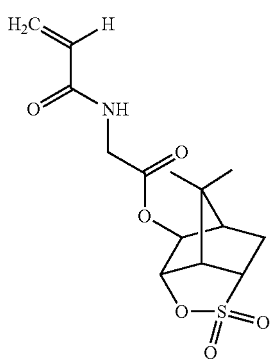
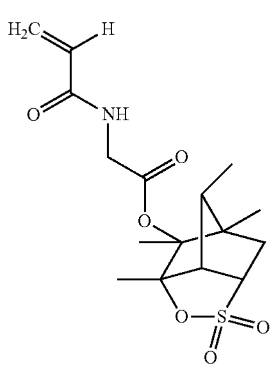
-continued
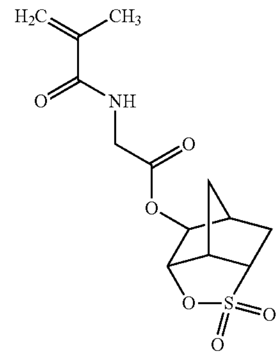
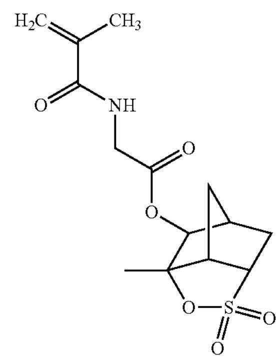
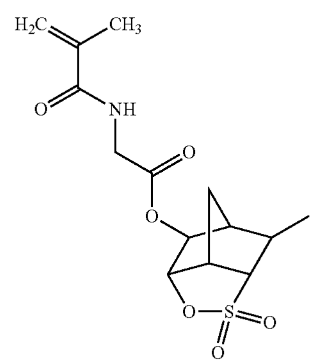
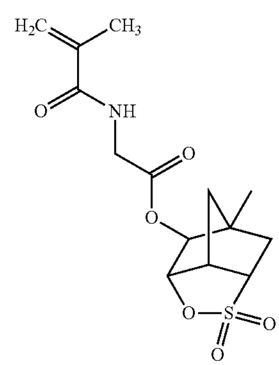

-continued
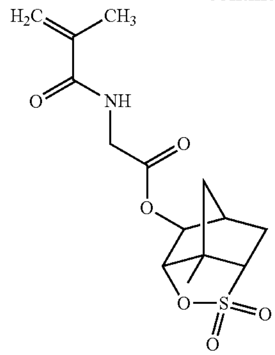
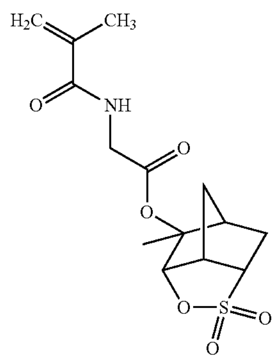
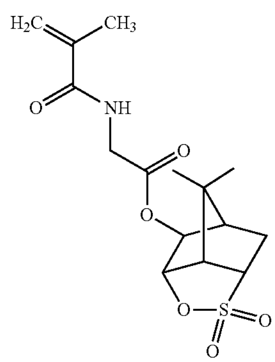
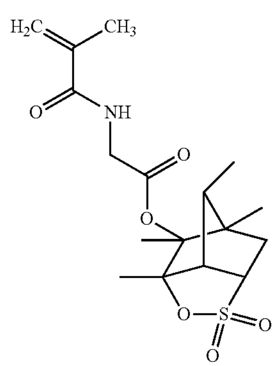
-continued
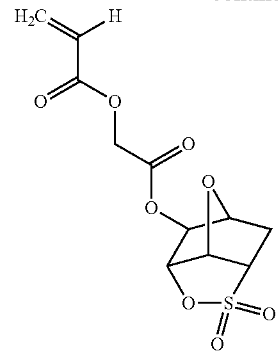
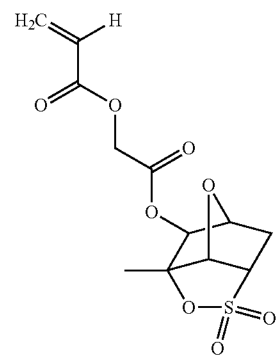
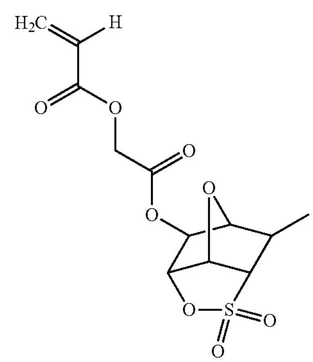
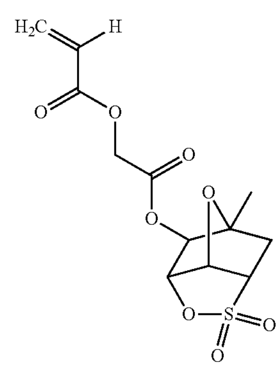

-continued
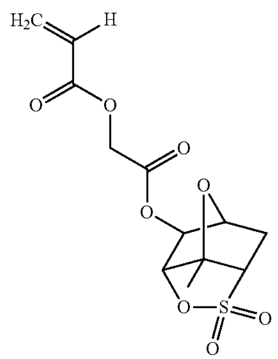
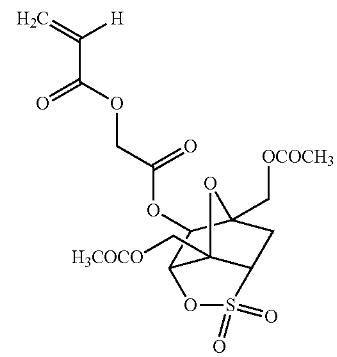
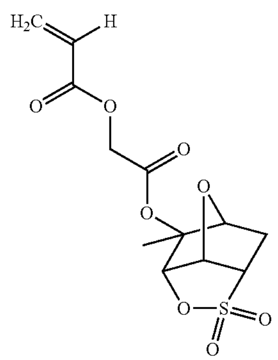
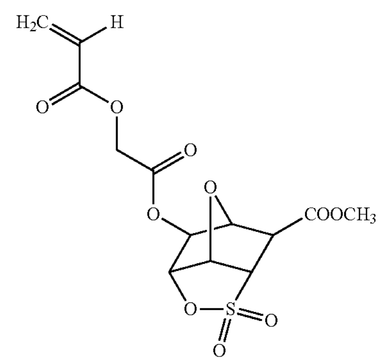
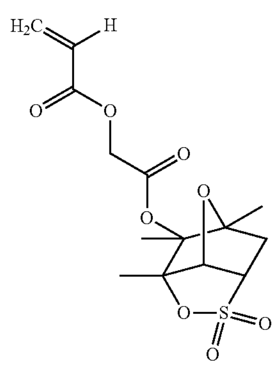
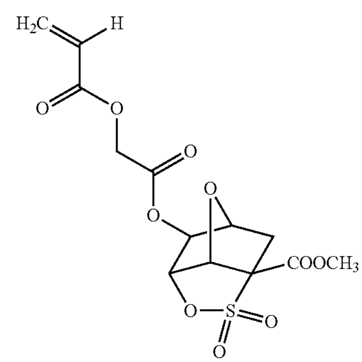
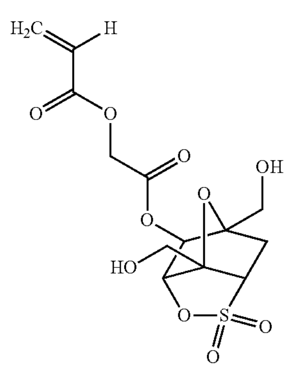
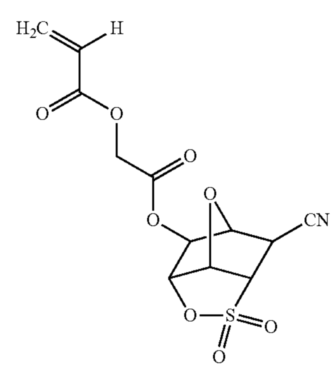

-continued
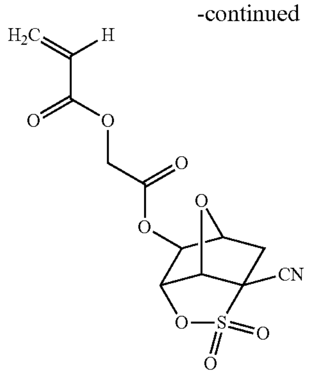
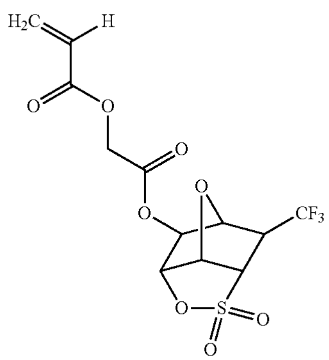
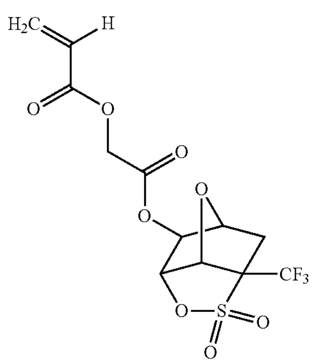
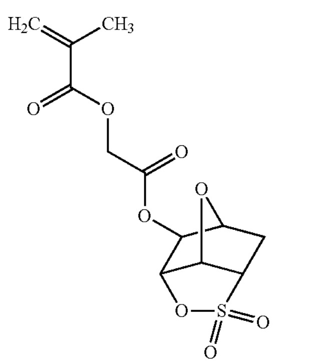
-continued
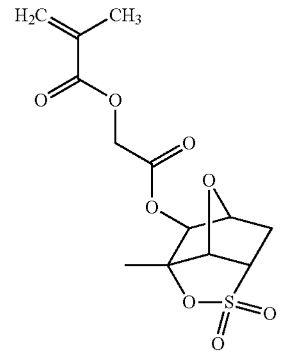
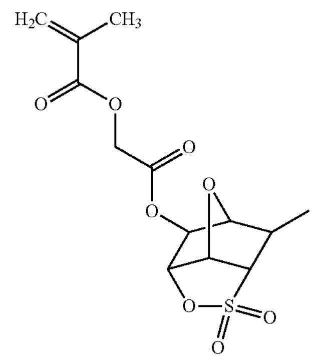
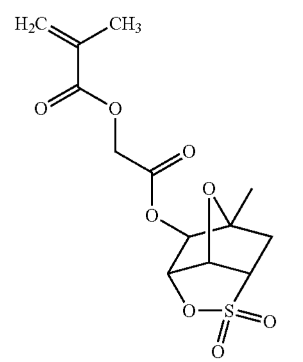
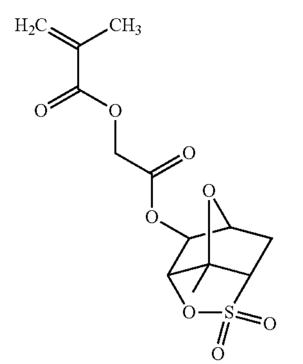

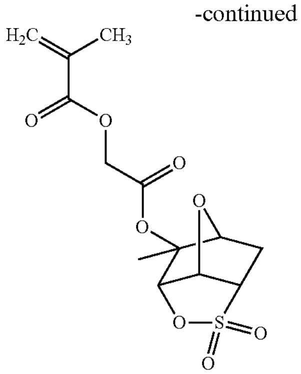
H2C
CH3
O
S
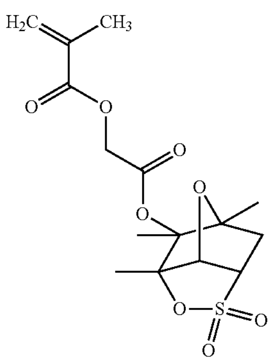
H2C
CH3
O
S
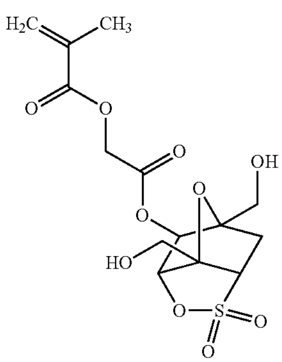
H2C
CH3
OH
HO
O
S
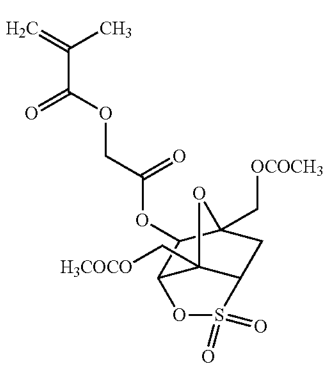
H2C
CH3
OCOCH3
H3COCO
O
S
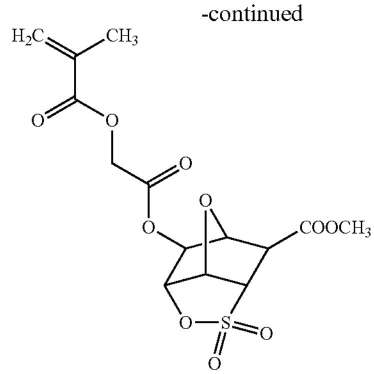
H2C
CH3
COOCH3
O
S
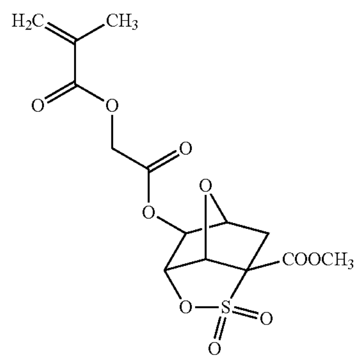
H2C
CH3
COOCH3
O
S
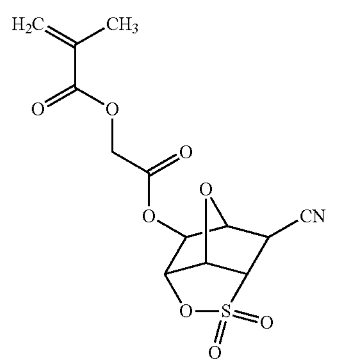
H2C
CH3
CN
O
S
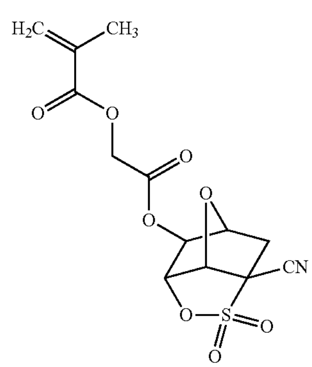
H2C
CH3
CN
O
S -continued
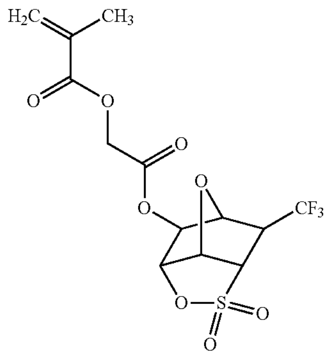
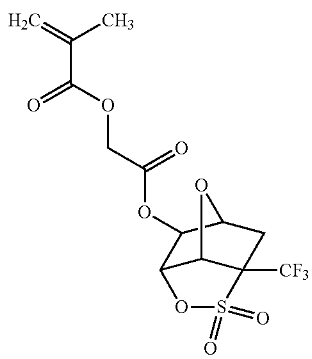
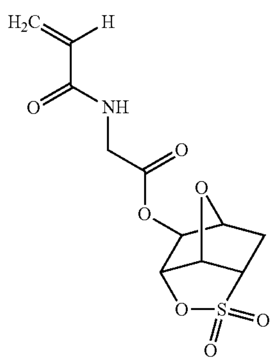
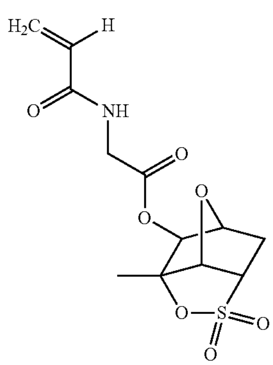
-continued
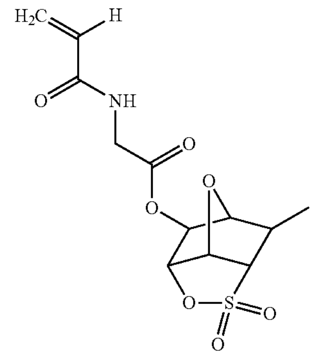
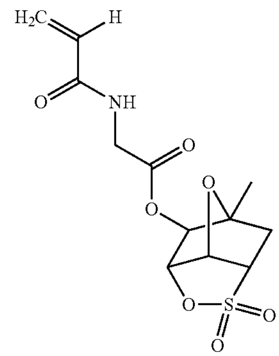
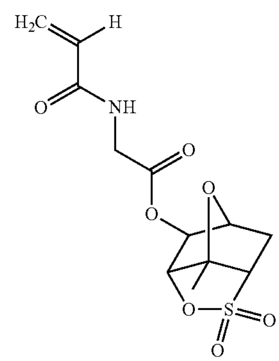
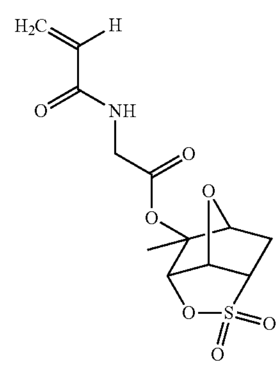

-continued
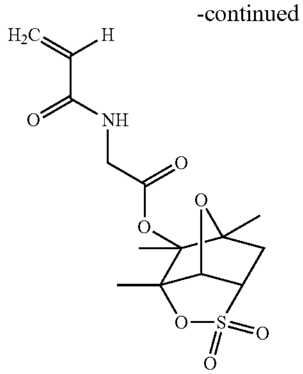
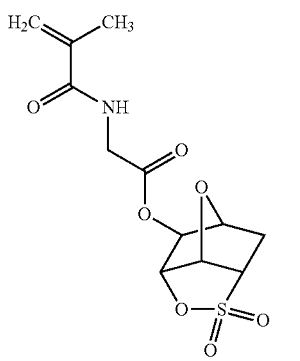
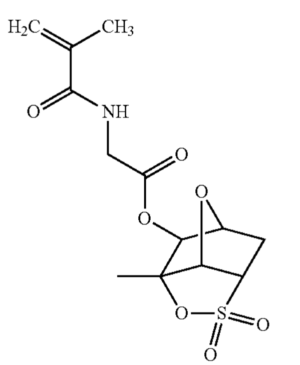
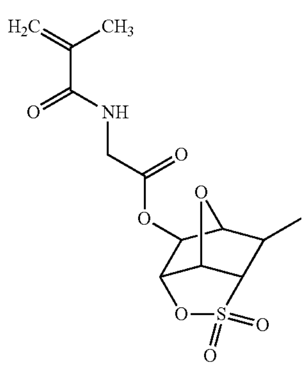
-continued
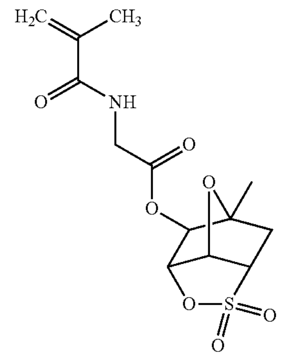
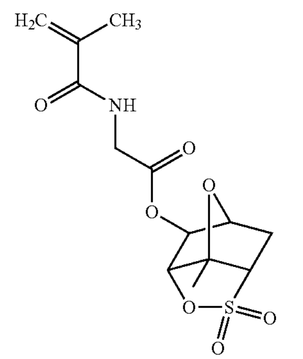
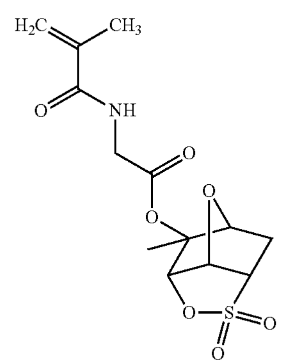
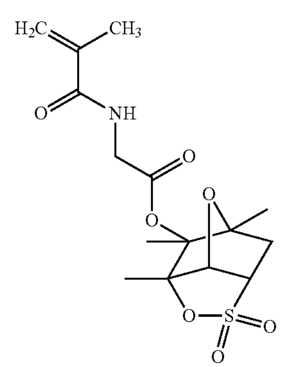

-continued
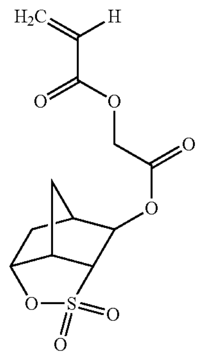
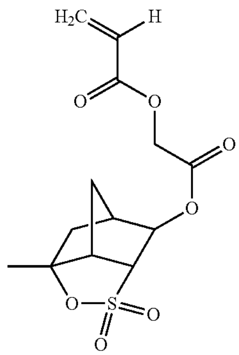
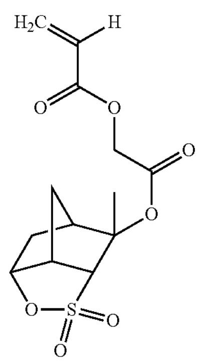
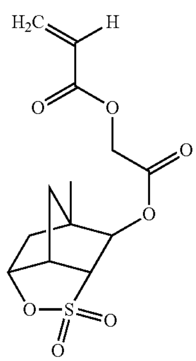
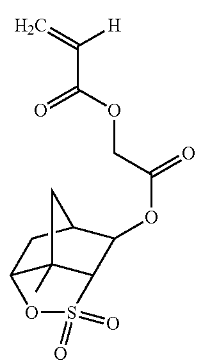
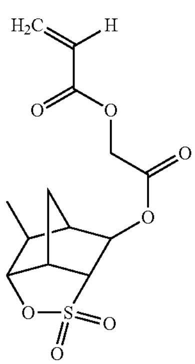
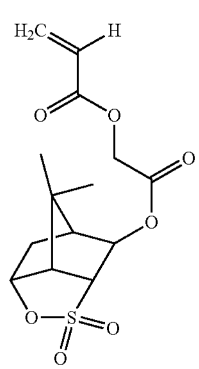
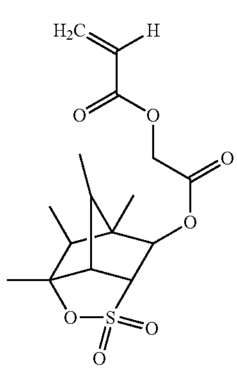
-continued
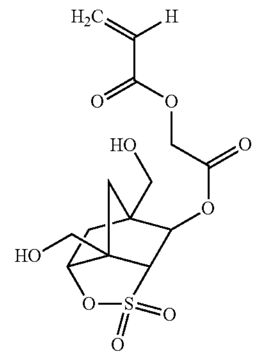
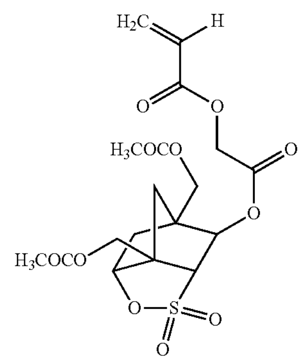
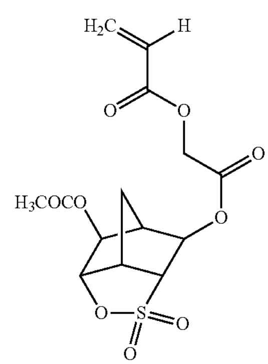
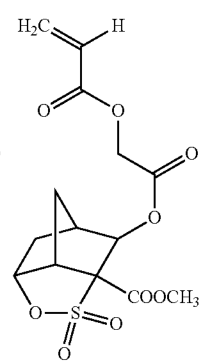
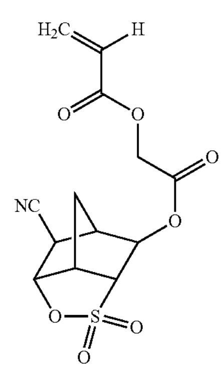
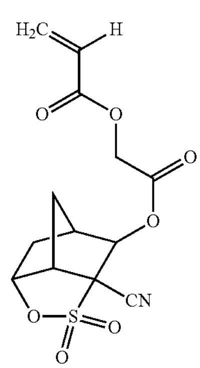

-continued
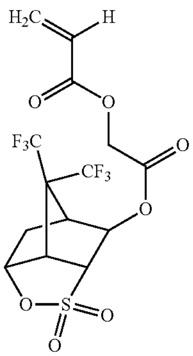
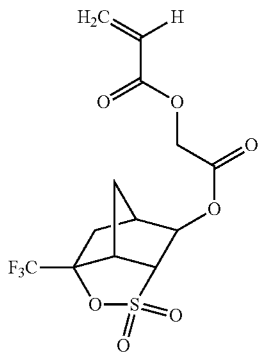
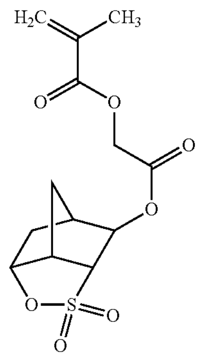
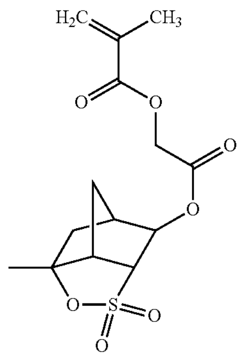
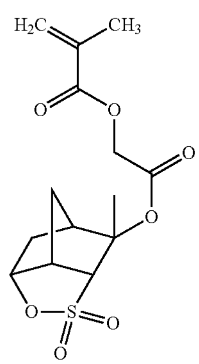
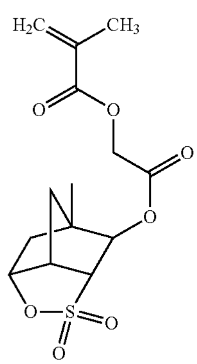
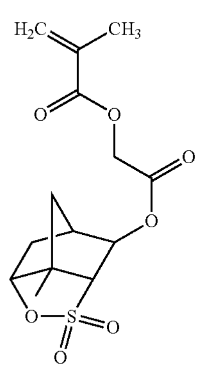
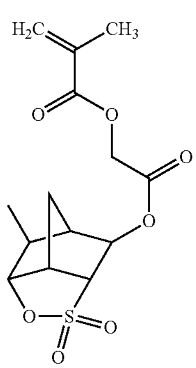
-continued
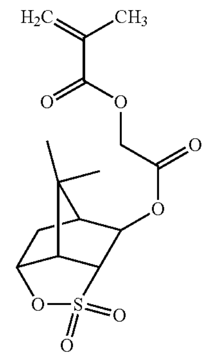
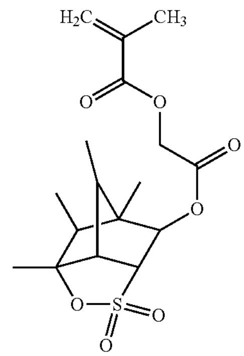
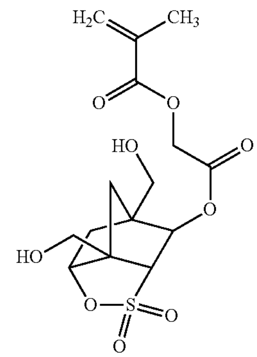
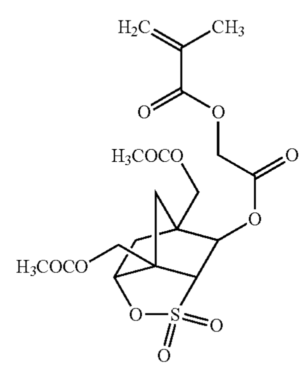
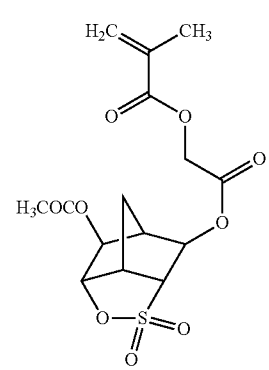
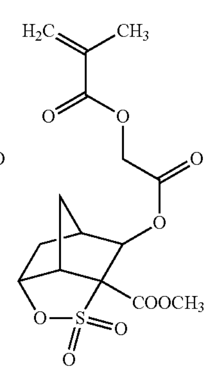

-continued
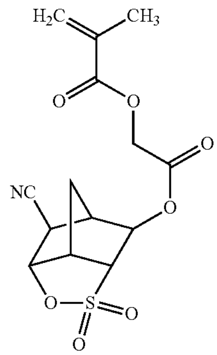
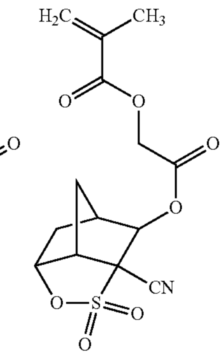
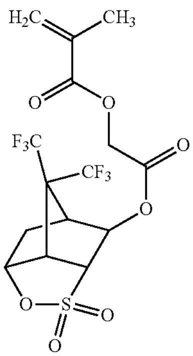
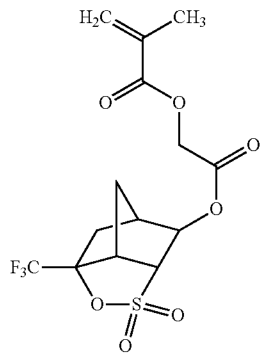
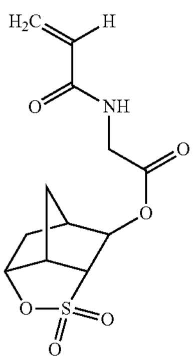
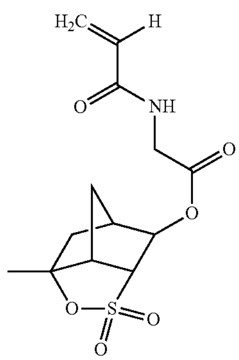
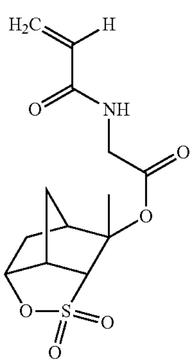
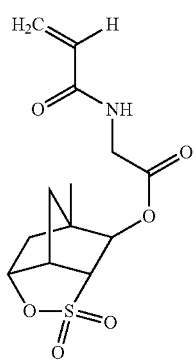
-continued
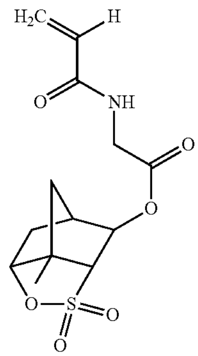
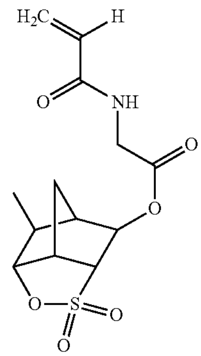
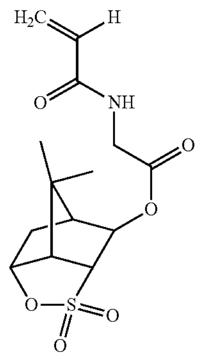
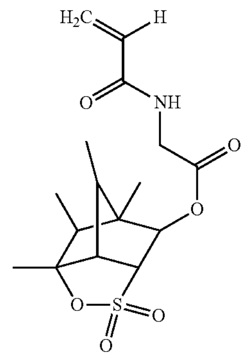
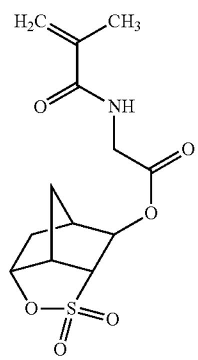
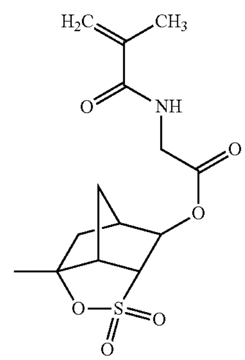
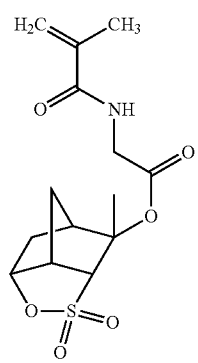
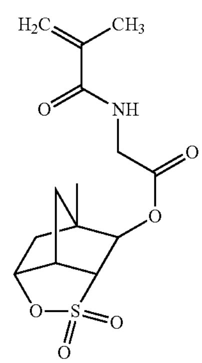

-continued
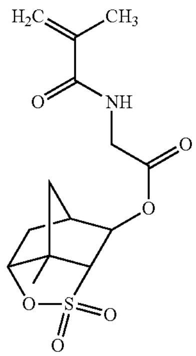
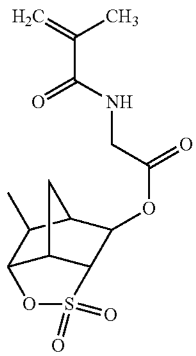
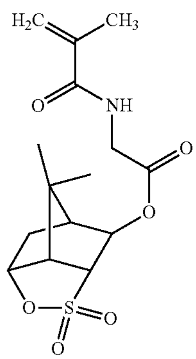
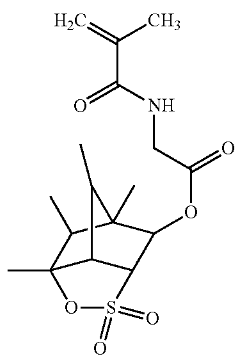
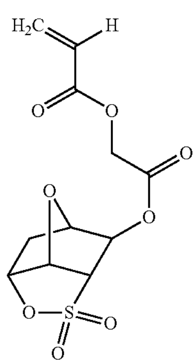
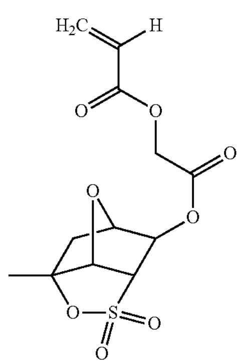
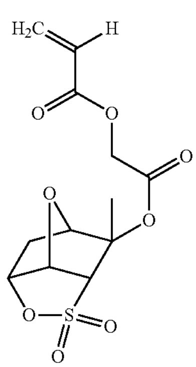
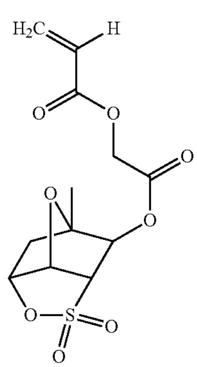
-continued
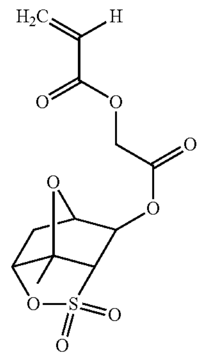
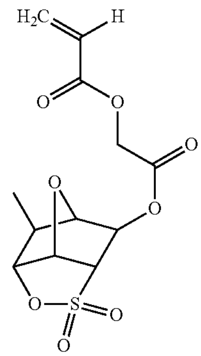
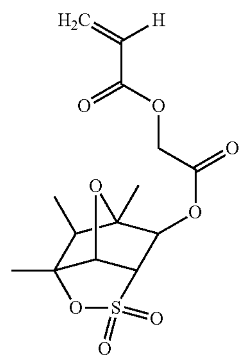
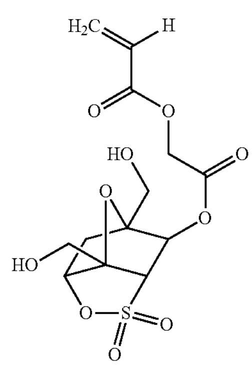
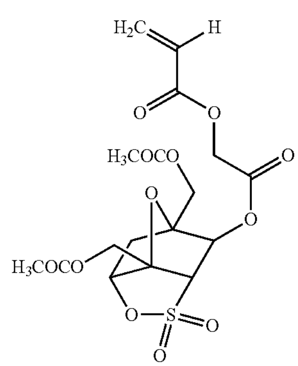

-continued
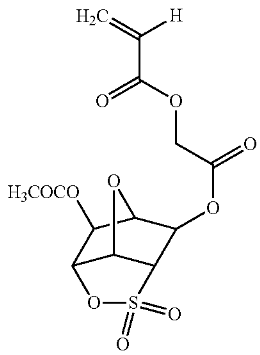
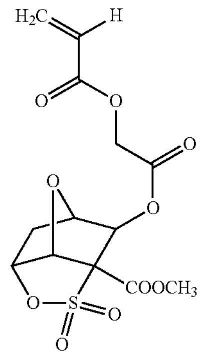
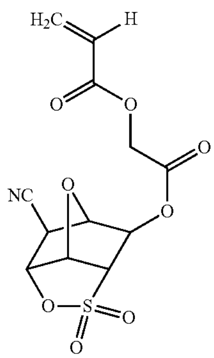
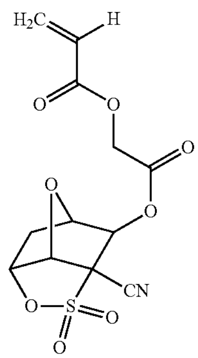
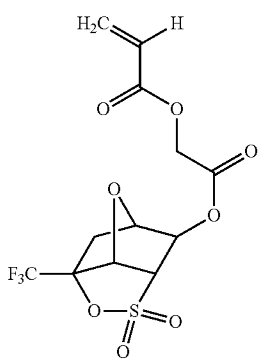
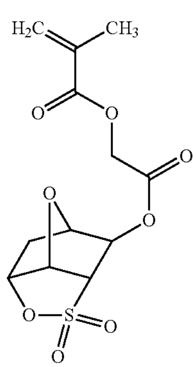
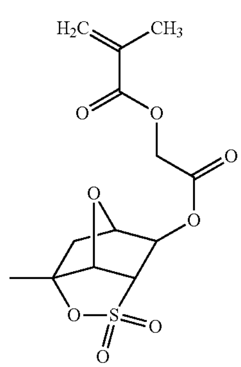
-continued
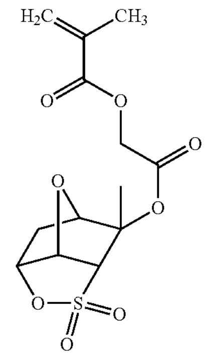
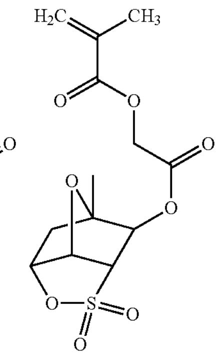
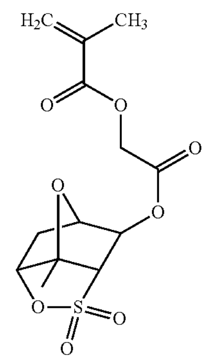
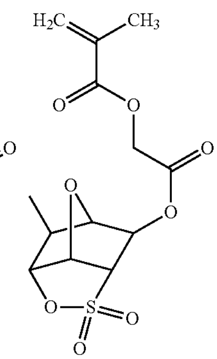
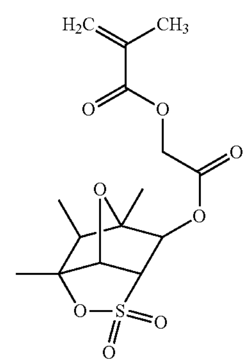
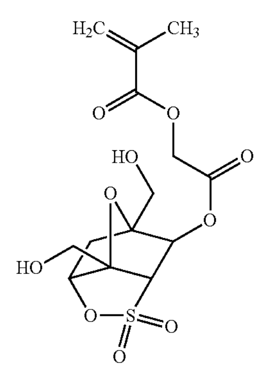

-continued
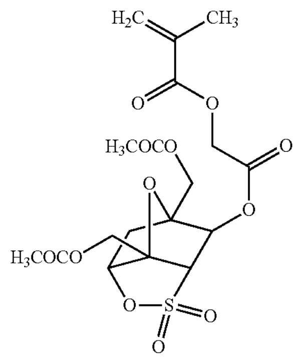
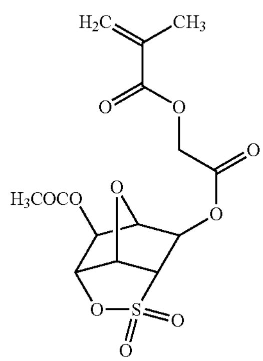
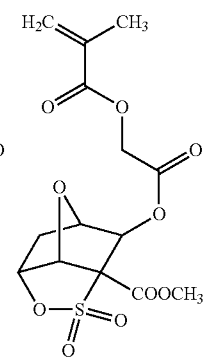
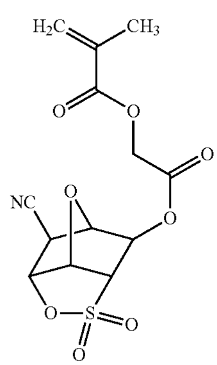
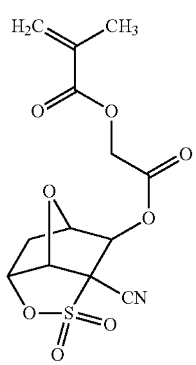
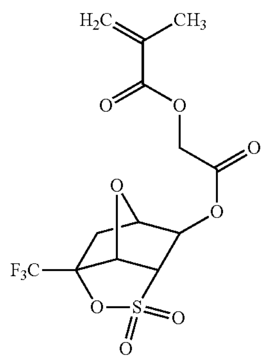
-continued
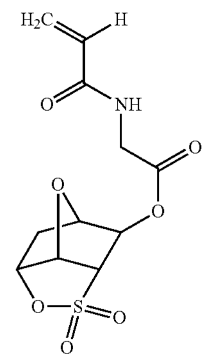
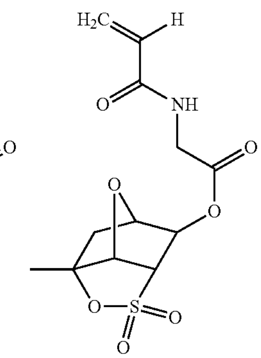
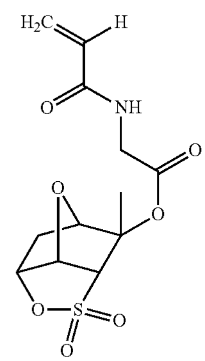
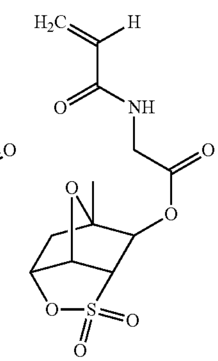
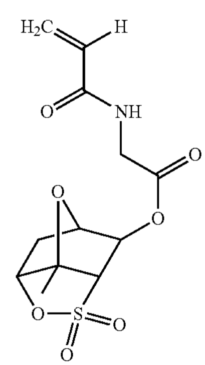
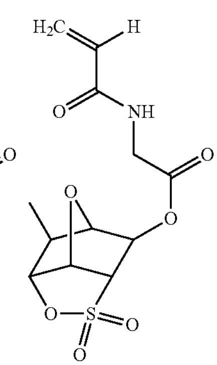
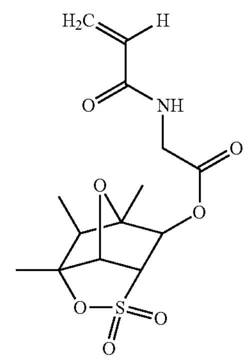

-continued

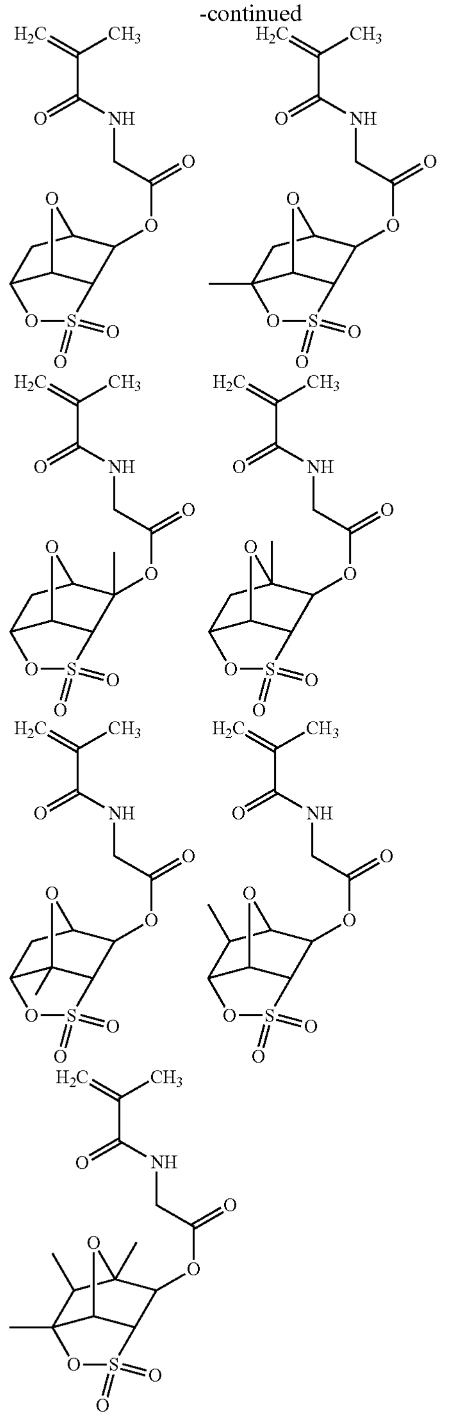

When the resin (AA) contains the structural unit derived from the acid-stable monomer (a7) represented by the formula (a7-4), the proportion thereof is generally 2 to 40 mol %, preferably 3 to 35 mol %, and more preferably 5 to 30 mol %, with respect to the total structural units (100 mol %) constituting the resin (AA).

When the resin (AB) contains the structural unit derived from the acid-stable monomer (a7) represented by the formula (a7-4), the proportion thereof is generally 5 to 90 mol %, preferably 10 to 80 mol %, and more preferably 20 to 70 mol %, with respect to the total structural units constituting the resin (AB).

<Acid-Stable Monomer (a8)>

An acid-stable monomer (a8) containing a fluorine atom as follows is used for manufacturing the resin (A),

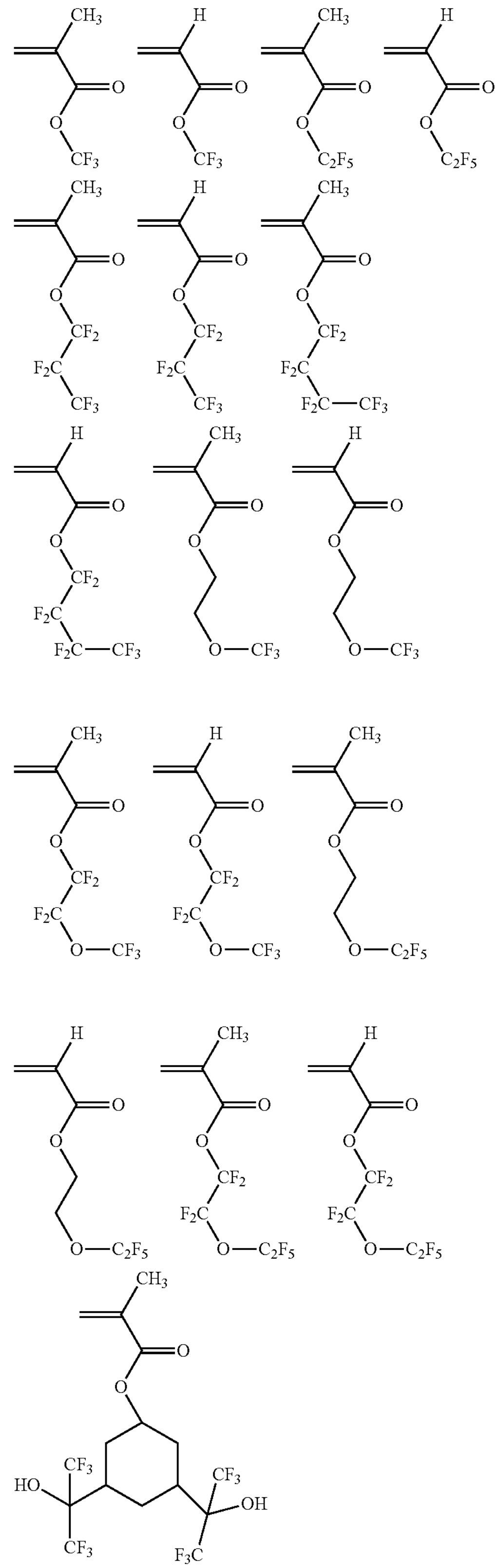

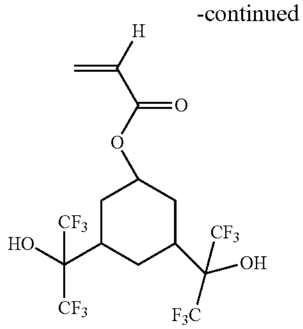
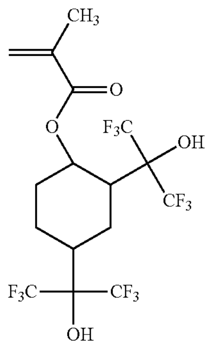
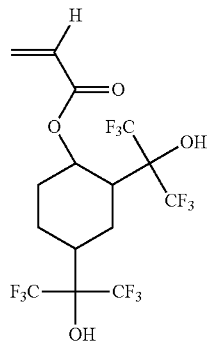
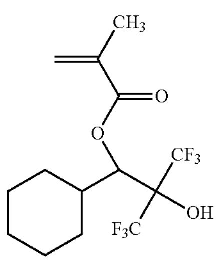
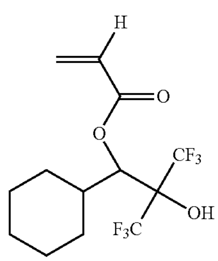
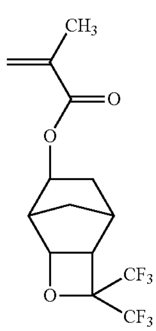
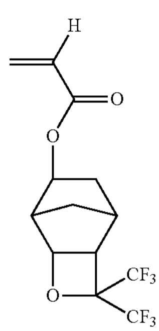
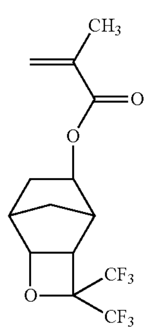
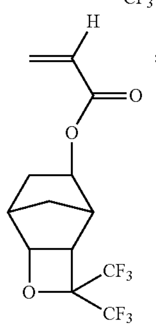
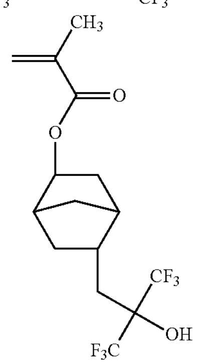
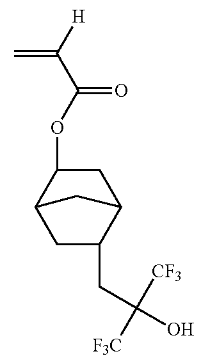
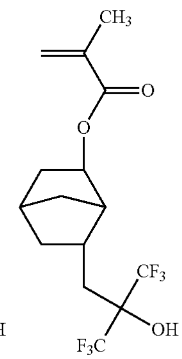
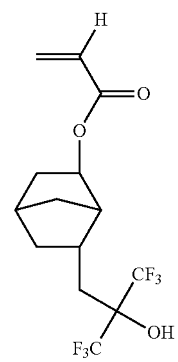
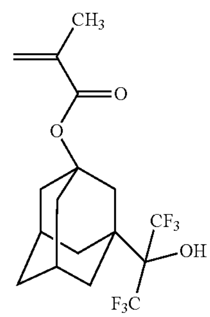
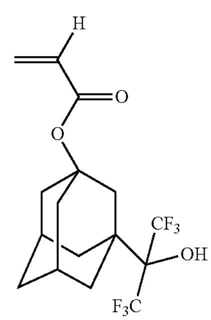
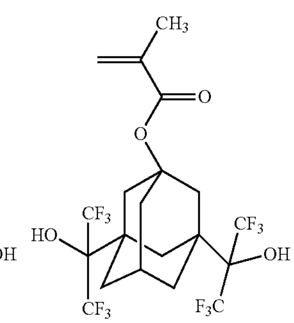
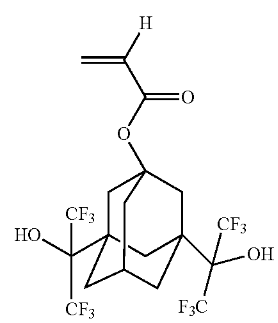
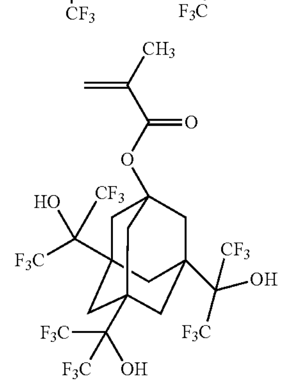

-continued

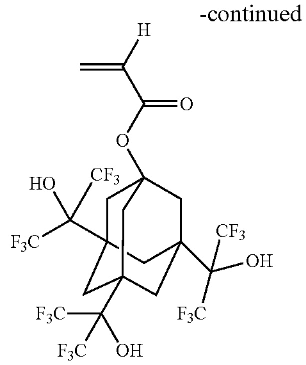

Among these, 5-(3,3,3-trifluoro-2-hydroxy-2-[trifluoromethyl]propyl) bicyclo[2.2.1]hept-2-yl (meth)acrylate, 6-(3,3,3-trifluoro-2-hydroxy-2-[trifluoromethyl]propyl) bicyclo [2.2.1]hept-2-yl (meth)acrylate, 4,4-bis(trifluoromethyl)-3-oxatricyclo[4.2.1.$0^{2,5}$]nonyl which have mono- or poly-alicyclic hydrocarbon group are preferable.

When the resin (AA) contains the structural unit derived from the monomer represented by the formula (a8), the proportion thereof is generally 1 to 20 mol %, preferably 2 to 15 mol %, and more preferably 3 to 10 mol %, with respect to the total structural units constituting the resin (AA).

When the resin (AB) contains the structural unit derived from the monomer represented by the formula (a8), the proportion thereof is generally 5 to 90 mol %, preferably 10 to 80 mol %, and more preferably 20 to 70 mol %, with respect to the total structural units (100 mol %) constituting the resin (AB).

<Production of the Resin>

The resin (AA) may be a copolymer polymerized at least the compound (a) and the monomer (a1), and the acid-stable monomer as needed, and preferably a copolymer polymerized the compound (a), the monomer (a1), and the acid-stable monomer (a2) and/or the acid-stable monomer (a3).

In the production of the resin (AA), the monomer (a1) used is preferably at least one of the monomer having the adamantyl group (a1-1) and the monomer having the cycloalkyl group (a1-2), and more preferably the monomer having the adamantyl group (a1-1).

The acid-stable monomer is preferably the monomer having the hydroxyadamantyl group (a2-1) and the acid-stable monomer (a3). The monomer having the lactone ring (a3) is preferably at least one of the monomer having the γ-butyrolactone ring (a3-1), and the monomer having the condensed ring of the γ-butyrolactone ring and the norbornene ring (a3-2).

The resin (AA) can be produced by a known polymerization method, for example, radical polymerization method. The monomer may be used as a single compound or as a mixture of two or more compounds.

When the resin (AA) contains the structural unit derived from the monomer (a1), the total proportion thereof is generally 10 to 95 mol %, preferably 20 to 80 mol %, with respect to the total structural units (100 mole %) of the resin (AA).

The weight average molecular weight of the resin (AA) is preferably 2500 or more (more preferably 3000 or more, and still more preferably 3500 or more), and 50,000 or less (more preferably 30,000 or less, and still more preferably 10,000 or less). The weight average molecular weight is a value determined by gel permeation chromatography using polystyrene as the standard product. The detailed condition of this analysis is described in Examples.

The resin (AB) may be an acid-stable resin having only the structural unit derived from the compound (a), or an acid-stable resin having the structural unit derived from the compound (a) and the structural unit derived from the acid-stable monomer (preferably at least one the acid-stable monomer selected from the acid-stable monomers (a2) to (a8)). Among these, an acid-stable resin having the structural unit derived from the compound (a) and at least one of the structural unit derived from the acid-stable monomer (a5) and the structural unit derived from the acid-stable monomer (a6) is preferable.

The present resist composition may contain the resin (AB) in addition to the resin (AA), or in stead of the resin (AA). When the resin (AB) is added in addition to the resin (AA), the content the resin (AB) is generally 0.1 to 20 parts by weight with respect to 100 parts by weight of the resin (AA).

The resin (AB) can be produced by a known polymerization method, for example, radical polymerization method. The monomer may be used as a single compound or as a mixture of two or more compounds when the resin (AB) is produced.

The weight average molecular weight of the resin (AB) is preferably 8000 or more (more preferably 10000 or more, and still more preferably 11000 or more), and 80,000 or less (more preferably 60,000 or less, and still more preferably 50,000 or less).

<Resin (X)>

When the present resist composition contains the resin (AB) in stead of the resin (AA), the resist composition preferably further includes a resin having a structural unit derived from the monomer containing the acid-labile group, that is, a rein having the above properties. Such resin is a resin free of a structural unit derived from the compound (a) but having the above properties, hereinafter such resin may be referred to as "resin (X)", as described below.

When the present resist composition contains the resin (X) in addition to the resin (AB), the content of the resin (AB) is, for example, 0.1 to 20 parts by weight, with respect to 100 parts by weight of the resin (X).

The resin (X) may be used in combination of the resin (AA).

When the present resist composition contains the resin (AA) and the resin (X), the weight ratio of the resins (AA):(X) may be 1:100 to 99.9:0.1.

The resin (X) is preferably a copolymer polymerized at least the monomer (a1), an the acid-stable monomer (a2) and/or the acid-stable monomer (a3).

In the production of the resin (X), the monomer (a1) used is preferably at least one of the monomer having the adamantyl group (a1-1) and the monomer having the cycloalkyl group (a1-2), and more preferably the monomer having the adamantyl group (a1-1).

The acid-stable monomer (a2) is preferably the monomer having the hydroxyadamantyl group (a2-1), and the acid-stable monomer having the lactone ring (a3) is preferably at least one of the monomer having the γ-butyrolactone ring (a3-1) and the monomer having the condensed ring of the γ-butyrolactone ring and the norbornene ring (a3-2).

The resin (X) can also he produced by a known polymerization method, for example, radical polymerization method. The monomer may be used as a single compound or as a mixture of two or more compounds.

When the resin (X) is produced, the proportion of the above monomer may be the same range described above, or may be arbitrary range in consideration of property of the resin. In particular, the mole ratio of the monomer (a1):monomer (a2) and/or (a3) used may be 10:90 to 95:5.

The weight average molecular weight of the resin (X) is preferably 2,500 or more (more preferably 3,000 or more, and more preferably 3,500 or more), and 50,000 or less (more preferably 30,000 or less, and more preferably 10,000 or less).

<Acid Generator (B)>

An acid generator (B) is classified into non-ionic-based or ionic-based acid generator. The present resist composition may be used either acid generators.

Examples of the non-ionic-based acid generator include organic halogenated compounds; sulfonate esters such as 2-nitrobenzyl ester, aromatic sulfonate, oxime sulfonate, N-sulfonyl oxyimide, sulfonyl oxyketone and diazo naphthoquinone 4-sulfonate; sulfones such as disulfone, ketosulfone and sulf one diazomethane.

Examples of the ionic acid generator includes onium salts containing onium cation (such as diazonium salts, phosphonium salts, sulfonium salts, iodonium salts).

Examples of anion of onium salts include sulfonate anion, sulfonylimide anion and sulfonylmethyde anion.

For the acid generator (B), compounds which generate an acid by radiation described in JP S63-26653-A, JP S55-164824-A, JP S62-69263-A, JP S63-146038-A, JP S63-163452-A, JP S62-153853-A, JP S63-146029-A, U.S. Pat. Nos. 3,779,778-B, 3,849,137-B, DE3,914,407-B and EP-126,712-A can be used.

A fluorine-containing acid generator is preferable for the acid generator (B), and a sulfonic acid salt represented by the formula (B1) is more preferable, hereinafter, such acid generator may be referred to as "acid generator (B1)", as described below. In the acid generator (131), electropositive $Z^+$ hereinafter may be referred to as "an organic cation", and electronegative one in which the organic cation has been removed from the compound may be referred to as "sulfonate anion".

(B1)

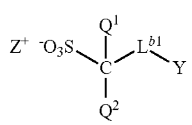

wherein $Q^1$ and $Q^2$ independently represent a fluorine atom or a $C_1$ to $C_6$ perfluoroalkyl group;

$L^{b1}$ represents an optionally substituted $C_1$ to $C_{17}$ divalent aliphatic hydrocarbon group, and the —$CH_2$— contained in the aliphatic hydrocarbon group may be replaced by —O— or —CO—;

Y represents an optionally substituted $C_1$ to $C_{18}$ aliphatic hydrocarbon group, and a —$CH_2$— contained in the aliphatic hydrocarbon group may be replaced by —O—, —CO— or —$SO_2$—; and $Z^+$ represents an organic cation.

Examples of the perfluoroalkyl group of $Q^1$ and $Q^2$ include trifluoromethyl, perfluoroethyl, perfluoropropyl, perfluoroisopropyl, perfluorobutyl, perfluoro-sec-butyl, perfluoro-tert-butyl, perfluoropentyl and perfluorohexyl groups.

Among these, $Q^1$ and $Q^2$ independently are preferably trifluoromethyl or fluorine atom, and more preferably both a fluorine atom.

Examples of the a divalent aliphatic hydrocarbon group of $L^{b1}$ include;

a linear chain alkanediyl group such as methylene, ethylene, propane-1,3-diyl, propane-1,2-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl groups, ethan-1,1-diyl, propane-1,1-diyl and propane-2,2-diyl groups;

a branched chain alkanediyl group such as a group in which a linear chain alkanediyl group is bonded a side chain of a $C_1$ to $C_4$ alkyl group such as methyl, ethyl, propyl, isopropyl, butyl, sec-butyl and tert-butyl, for example, butan-1,3-diyl, 2-methylpropane-1,3-diyl, 2-methylpropane-1,2-diyl, pentane-1,4-diyl, 2-methylbutane-1,4-diyl groups;

a mono-alicyclic hydrocarbon group such as cyclobutan-1,3-diyl, cyclopentan-1,3-diyl, cyclohexane-1,2-diyl, 1-methylhexane-1,2-diyl, cyclohexane-1,4-diyl, cyclooctan-1,2-diyl, cyclooctan-1,5-diyl groups;

a poly-alicyclic hydrocarbon group such as norbornane-2,3-diyl, norbornane-1,4-diyl, norbornane-2,5-diyl, adamantane-1,5-diyl and adamantane-2,6-diyl groups; and a combination of two or more groups.

Examples of the aliphatic hydrocarbon group of $L^{b1}$ in which the —$CH_2$— contained in the aliphatic hydrocarbon group is replaced by —O— or —CO— include, for example, groups represented by the formula (b1-1) to the formula (b1-6). Among these, the groups represented by the formula (b1-1) to the formula (b1-4) are preferable, and the group represented by the formula (b1-1) or the formula (b1-2) is more preferable.

In the formula (b1-1) to the formula (b1-6), the group is represented so as to correspond with two sides of the formula (B1), that is, the left side of the group bonds to $C(Q^1)(Q^2)$- and the right side of the group bonds to —Y (examples of the formula (b1-1) to the formula (b1-6) are the same as above). * represents a bond.

(b1-1)

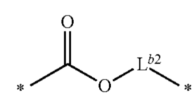

(b1-2)

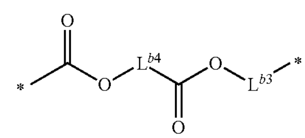

(b1-3)

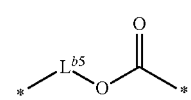

(b1-4)

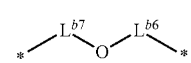

(b1-5)

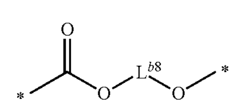

(b1-6)

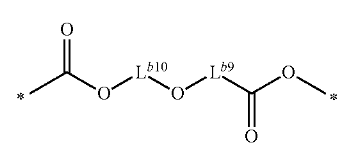

wherein $L^{b2}$ represents a single bond or a $C_1$ to $C_{15}$ divalent aliphatic hydrocarbon group, the aliphatic hydrocarbon group is preferably a saturated aliphatic hydrocarbon group;

$L^{b3}$ represents a single bond or a $C_1$ to $C_{12}$ divalent aliphatic hydrocarbon group, the aliphatic hydrocarbon group is preferably a saturated aliphatic hydrocarbon group;

$L^{b4}$ represents a $C_1$ to $C_{13}$ divalent aliphatic hydrocarbon group, the aliphatic hydrocarbon group is preferably a saturated aliphatic hydrocarbon group, the total number of the carbon atoms in $L^{b3}$ and $L^{b4}$ is at most 13;

$L^{b5}$ represents a $C_1$ to $C_{15}$ divalent saturated hydrocarbon group;

$L^{b6}$ and $L^{b7}$ independently represent a $C_1$ to $C_{15}$ divalent aliphatic hydrocarbon group, the aliphatic hydrocarbon group is preferably a saturated aliphatic hydrocarbon group, the total number of the carbon atoms in $L^{b6}$ and $L^{b7}$ is at most 16;

$L^{b8}$ represents a $C_1$ to $C_{14}$ divalent aliphatic hydrocarbon group, the aliphatic hydrocarbon group is preferably a saturated aliphatic hydrocarbon group;

$L^{b9}$ and $L^{b10}$ independently represent a $C_1$ to $C_{11}$ divalent aliphatic hydrocarbon group, the aliphatic hydrocarbon group is preferably a saturated aliphatic hydrocarbon group, the total number of the carbon atoms in $L^{b9}$ and $L^{b10}$ is at most 12.

Among these, the divalent group represented by the formula (b1-1) is preferable, and the divalent group represented by the formula (b1-1) in which $L^{b2}$ represents a single bond or a —$CH_2$— is more preferable.

Specific examples of the divalent group represented by the formula (b1-1) include groups below.

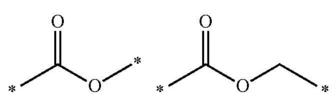

Specific examples of the divalent group represented by the formula (b1-2) include groups below.

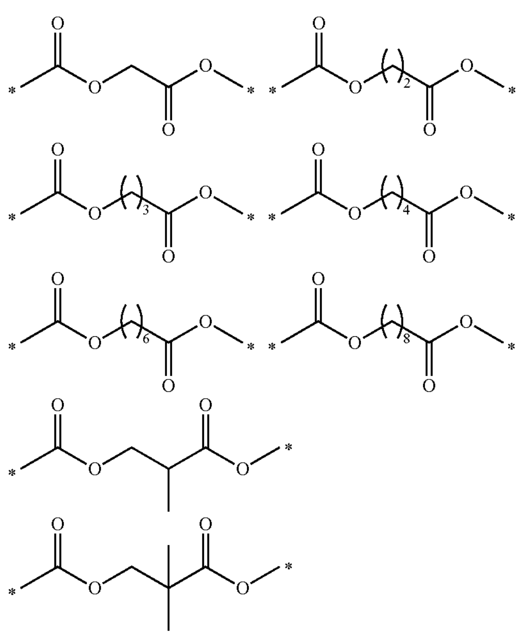

Specific examples of the divalent group represented by the formula (b1-3) include groups below.

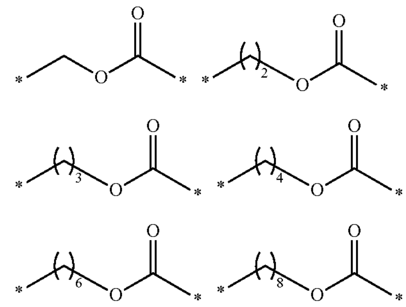

Specific examples of the divalent group represented by the formula (b1-4) include a group below.

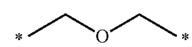

Specific examples of the divalent group represented by the formula (31-5) include groups below.

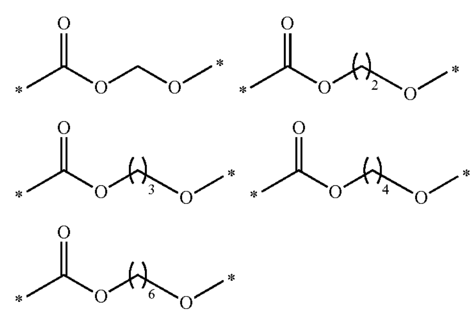

Specific examples of the divalent group represented by the formula (b1-6) include groups below.

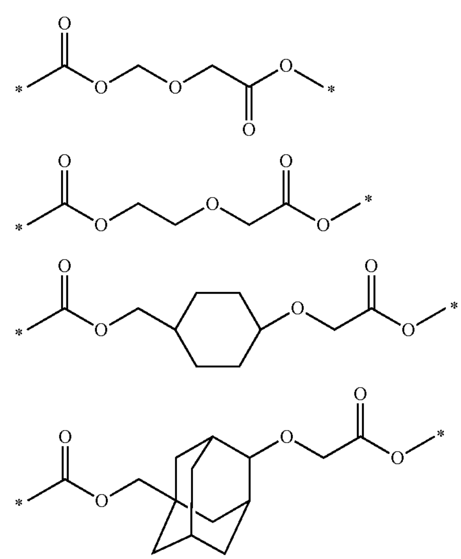

-continued

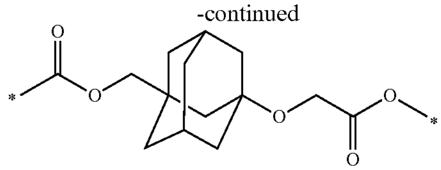

The aliphatic hydrocarbon group of $L^{a1}$ may have a substituent.

Examples of the substituent thereof include a halogen atom, a hydroxy group, a carboxy group, a $C_6$ to $C_{18}$ aromatic hydrocarbon group, a $C_7$ to $C_{21}$ aralkyl group, a $C_2$ to $C_4$ acyl group and a glycidyloxy group.

Examples of the aromatic hydrocarbon group include phenyl, naphthyl, p-methylphenyl, p-tert-butylphenyl, p-adamantylphenyl, tolyl, xylyl, cumenyl, mesityl, biphenyl, anthryl, phenanthryl, 2,6-diethylphenyl and 2-methyl-6-ethylphenyl groups.

Examples of the aralkyl group include benzyl, phenethyl, phenylpropyl, trityl, naphthylmethyl and naphthylethyl groups.

Examples of the acyl group include acetyl, propionyl and butyryl groups.

The aliphatic hydrocarbon group of Y is preferably an alkyl group and alicyclic hydrocarbon group or a combination group thereof.

Examples of the alkyl group include methyl, ethyl, propyl, butyl, heptyl and hexyl groups. The alkyl group is preferably a $C_1$ to $C_6$ alkyl group.

Examples of the alicyclic hydrocarbon group include a group represented by the formula (Y1) to the formula (Y11) as described below. The alicyclic hydrocarbon group is preferably a $C_3$ to $C_{12}$ alicyclic hydrocarbon group.

(Y1)

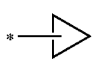

(Y2)

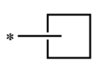

(Y3)

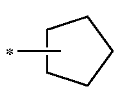

(Y4)

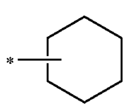

(Y5)

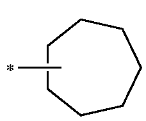

(Y6)

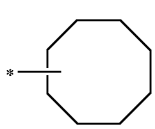

(Y7)

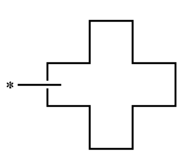

-continued (Y8)

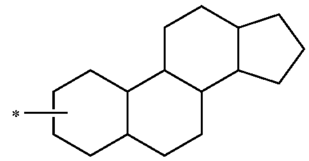

(Y9)

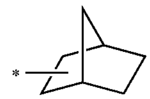

(Y10)

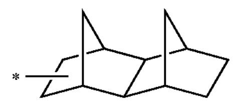

(Y11)

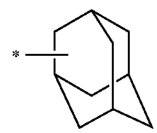

(Y12)

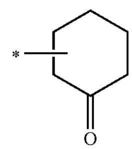

(Y13)

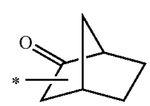

(Y14)

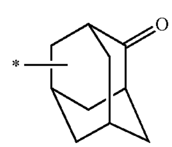

(Y15)

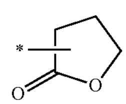

(Y16)

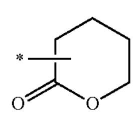

(Y17)

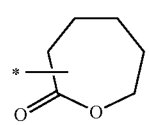

(Y18)

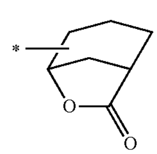

-continued (Y19)

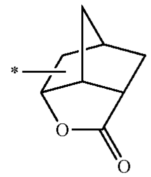

(Y20)

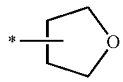

(Y21)

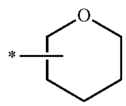

(Y22)

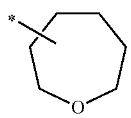

(Y23)

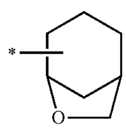

(Y24)

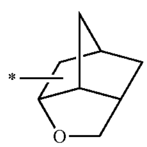

(Y25)

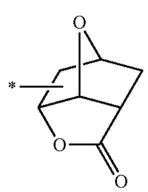

(Y26)

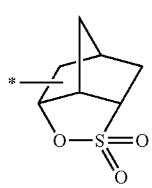

Examples of Y in which a —$CH_2$— contained in the aliphatic hydrocarbon group is replaced by —O—, —CO— or $SO_2$— include, for example, a cyclic ether group (a group replaced one or two —$CH_2$— by one or two —O—), a cyclic ketone group (a group replaced one or two —$CH_2$— by one or two —CO—), a sultone ring group (a group replaced adjacent two —$CH_2$— by —O— and —$SO_2$—, respectively as described in the formula (a7-4)), or a lactone ring group (a group replaced adjacent two —$CH_2$— by —O— and —CO—, respectively).

Examples thereof include a group represented by the formula (Y12) to the formula (Y26) as described above.

Among these, the aliphatic hydrocarbon group of Y is preferably groups represented by the formula (Y1) to the formula (Y19), more preferably group below.

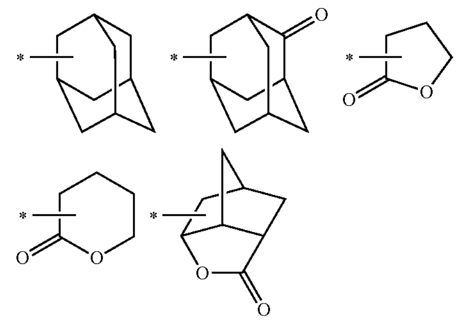

Examples of the substituent of Y include a halogen atom (other than a fluorine atom), a hydroxy group, a $C_1$ to $C_{12}$ alkoxy group, a $C_6$ to $C_{18}$ aromatic hydrocarbon group, a $C_7$ to $C_{21}$ aralkyl group, a $C_2$ to $C_4$ acyl group, a glycidyloxy group or a —$(CH_2)_{j2}$—O—CO—$R^{b1}$ group, wherein $R^{b1}$ represents a $C_1$ to $C_{16}$ hydrocarbon group, j2 represents an integer of 0 to 4. The aromatic hydrocarbon group and the aralkyl group may further have a substituent such as a $C_1$ to $C_6$ alkyl group, a halogen atom or a hydroxy group.

Examples of the alkoxyl group include methoxy, ethoxy, propoxy, butoxy, hexyloxy, octyloxy, 2-ethylhexyloxy, nonyloxy, decyloxy, undecyloxy and dodecyloxy groups.

Examples of the hydrocarbon group of $R^{b1}$ include a $C_1$ to $C_{16}$ chain aliphatic hydrocarbon group, a $C_3$ to $C_{16}$ alicyclic hydrocarbon group and a $C_6$ to $C_{18}$ aromatic hydrocarbon group.

Examples of Y having alkyl group(s)-containing alicyclic hydrocarbon group include the groups below.

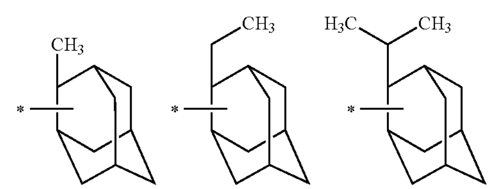

Examples of Y having a hydroxy group or a hydroxy group-containing alicyclic hydrocarbon group include the groups below.

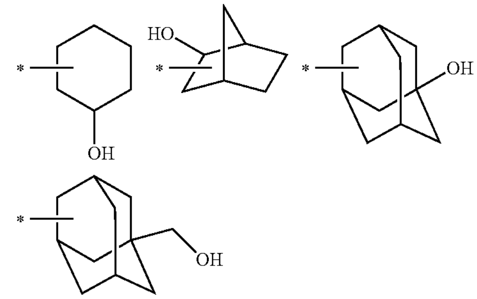

Examples of Y having an aromatic hydrocarbon group-containing alicyclic hydrocarbon group include the groups below.

-continued

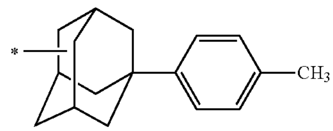

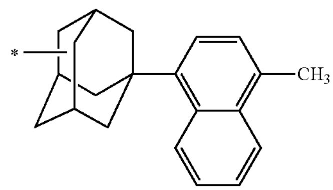

Examples of Y having a $-(CH_2)_{j2}-O-CO-R^{b1}$ group-containing alicyclic hydrocarbon group include the group below.

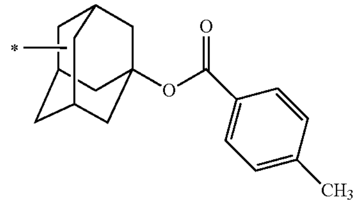

Y is preferably an adamantyl group which is optionally substituted, for example, a hydroxy group, and more preferably an adamantyl group and a hydroxyadamantyl group.

The sulfonate anion is preferably a divalent group represented by the formula (b1-1), and more preferably groups represented by the formula (a1-1-1) to the formula (b1-1-9).

(b1-1-1)

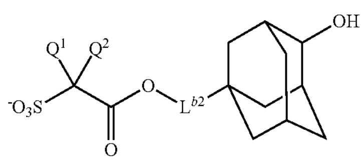

(b1-1-2)

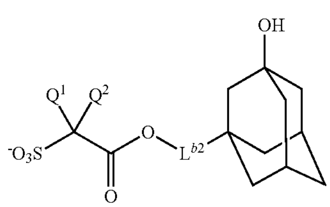

(b1-1-3)

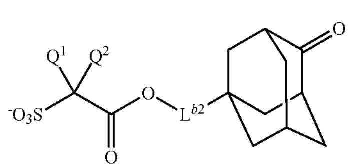

(b1-1-4)

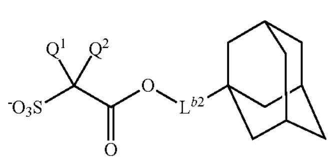

(b1-1-5)

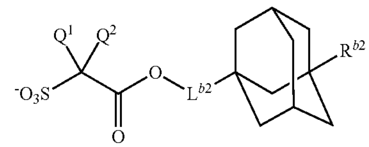

(b1-1-6)

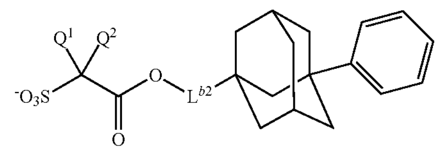

(b1-1-7)

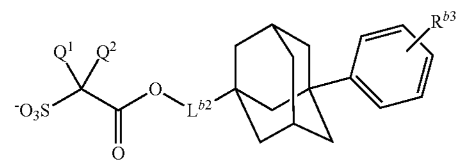

(b1-1-8)

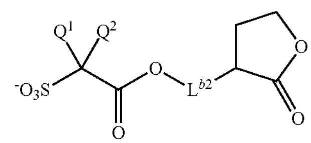

(b1-1-9)

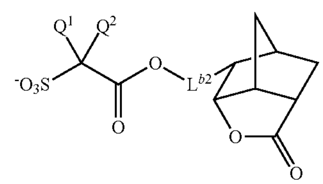

In the formula (b1-1-1) to the formula (b1-1-9), $Q^1$, $Q^2$ and $L^{b2}$ represent the same meaning as defined above (preferably both fluorine atom for $Q^1$ and $Q^2$, and preferably the group represented by the formula (b1-1) for $L^{b2}$) $R^{b2}$ and $R^{b3}$ independently represent a $C_1$ to $C_4$ aliphatic hydrocarbon group or a hydroxy group (preferably methyl group or a hydroxy group).

Examples of the sulfonate anion having a chain aliphatic hydrocarbon group or a non-substituted alicyclic hydrocarbon for Y, and a divalent group represented by the formula (b1-1) for $L^{a1}$ include anions below.

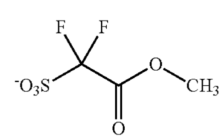

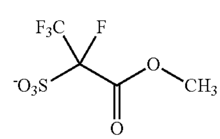

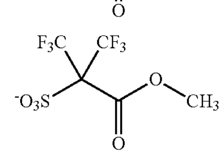

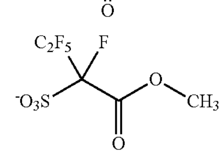

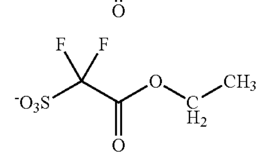

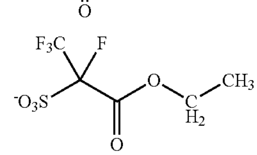

-continued
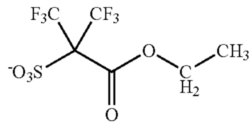
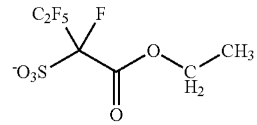
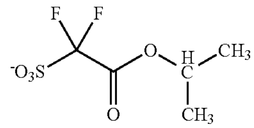
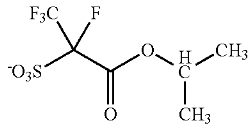
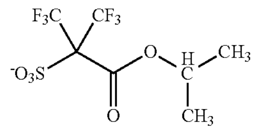
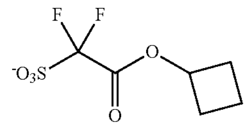
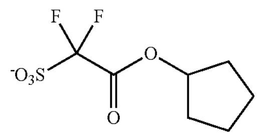
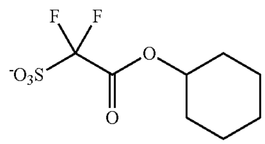
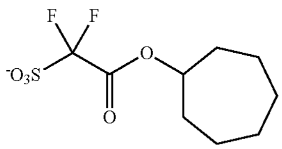
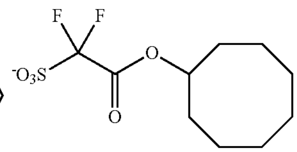
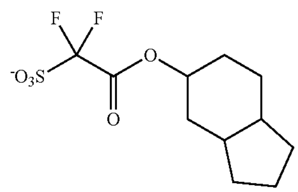
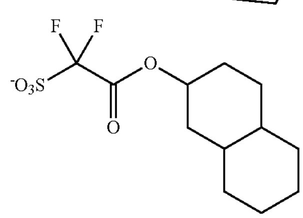
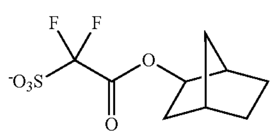
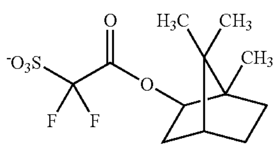
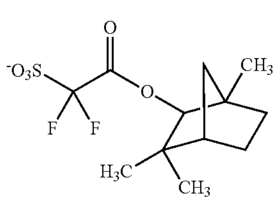
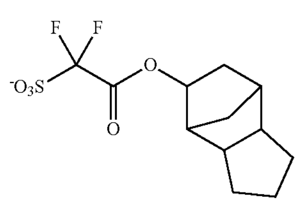
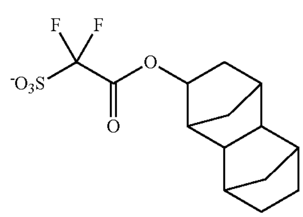
-continued
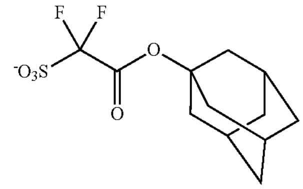
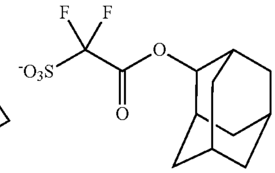
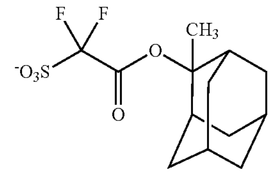
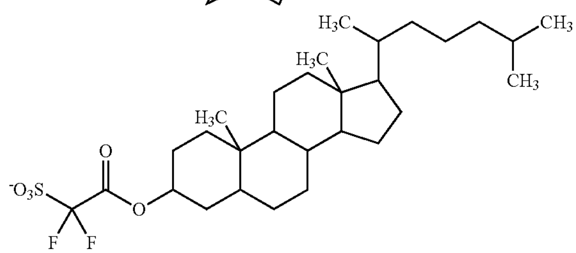
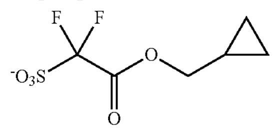
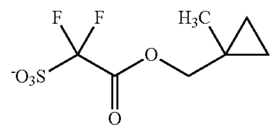
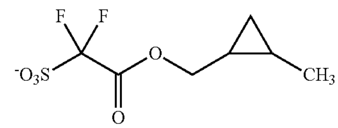
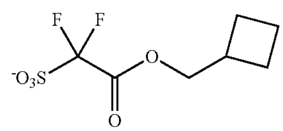
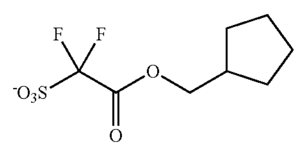
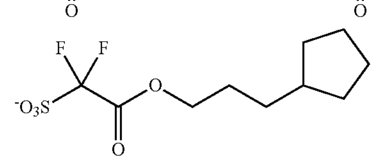
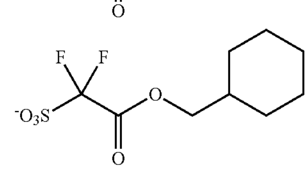
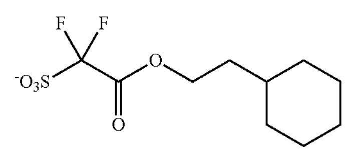
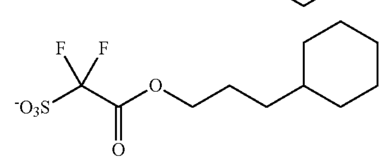
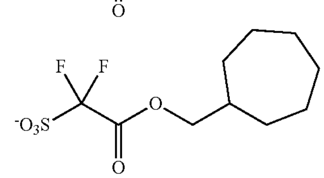

-continued
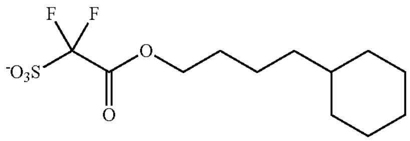
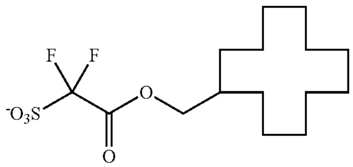
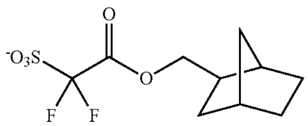
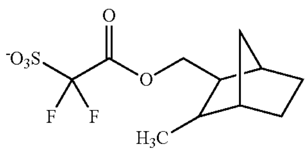
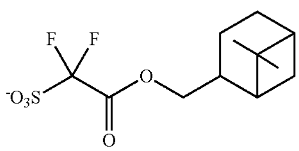
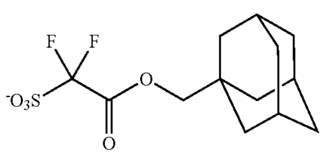
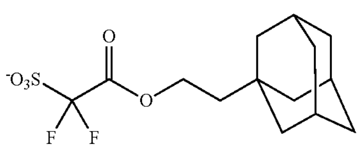
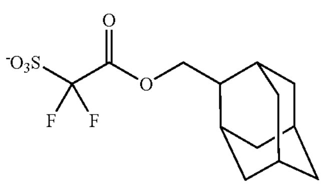
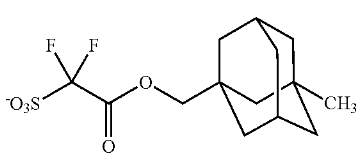
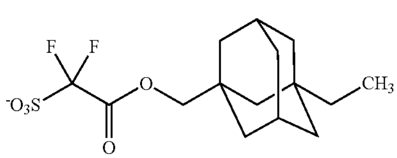
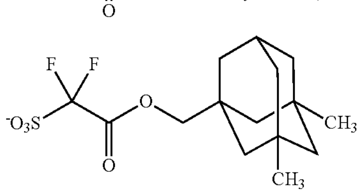
-continued
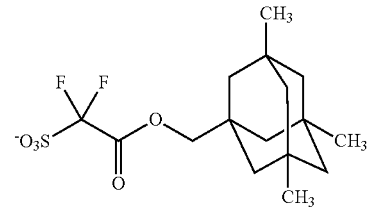
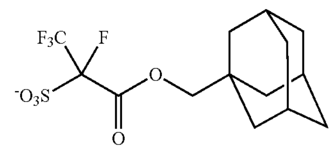
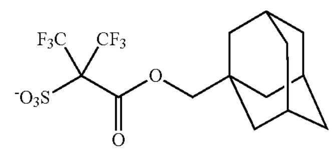
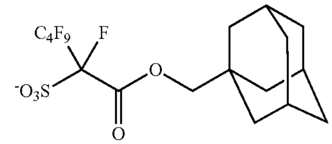
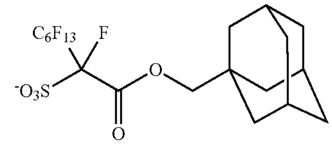
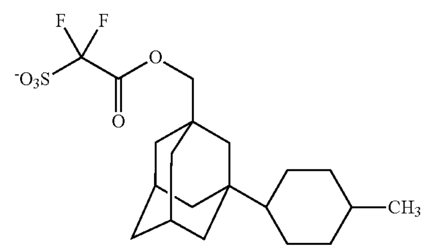
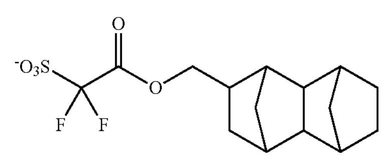
Examples of the sulfonate anion having an alicyclic hydrocarbon group substituted with a —$(CH_2)_{j2}$—CO—O—$R^{b1}$ group for Y, and a divalent group represented by the formula (b1-1) for $L^{a1}$ include anions below.
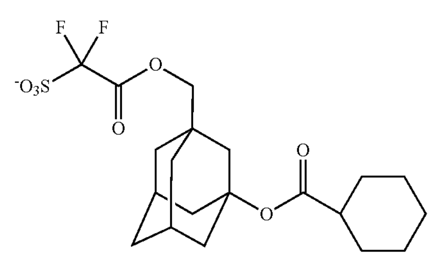

-continued
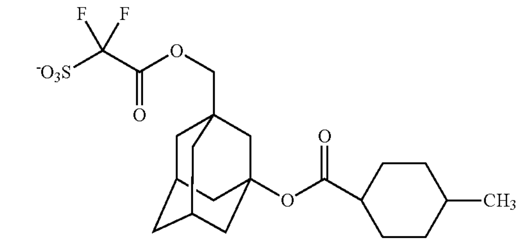
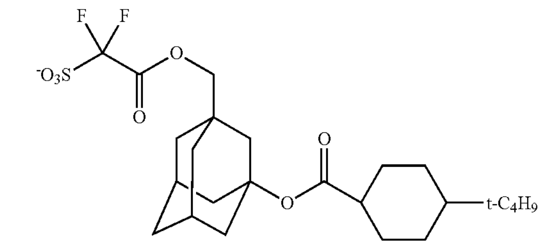
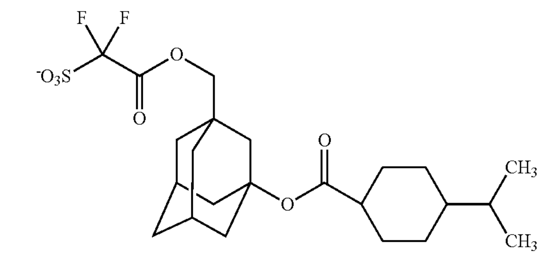
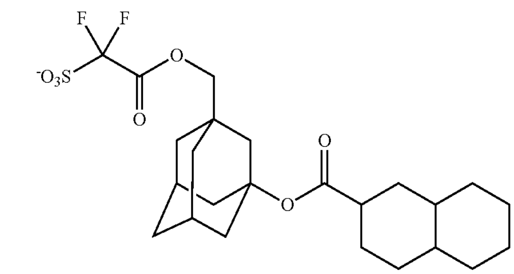
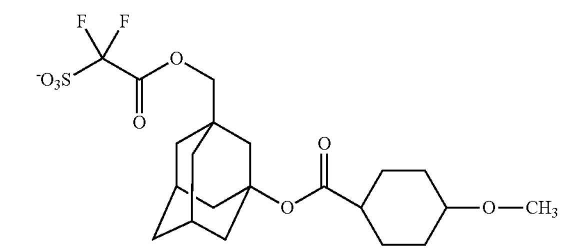
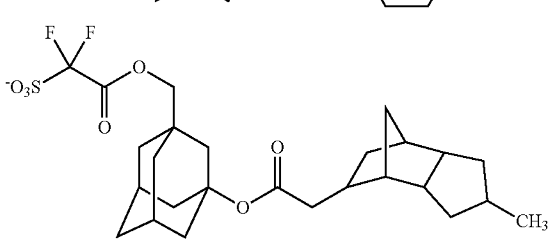
-continued
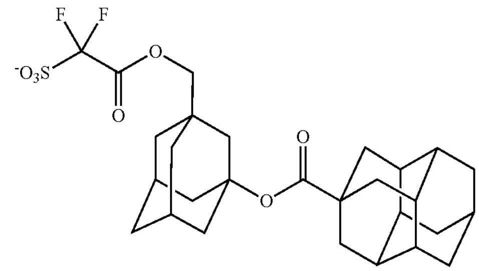
Examples of the sulfonate anion having an alicyclic hydrocarbon group substituted with a hydroxy group for Y, and a divalent group represented by the formula (b1-1) for $L^{a1}$ include anions below.
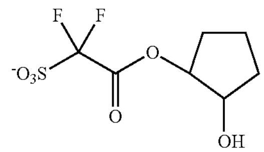
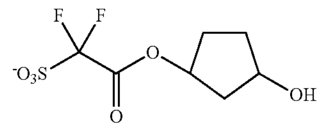
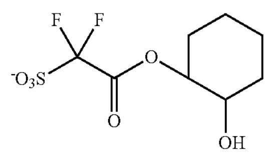
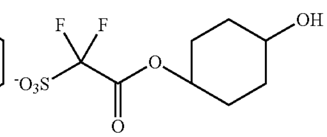
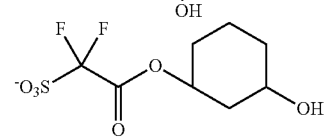
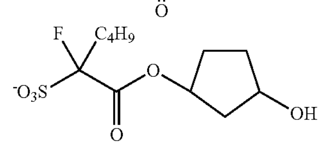
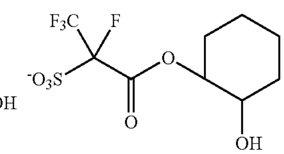
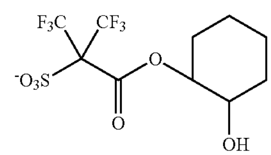
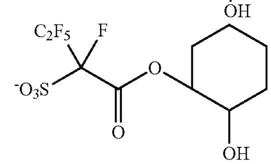
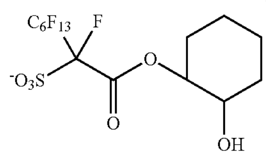
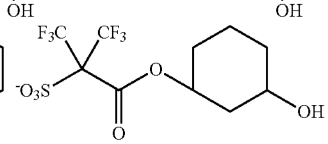
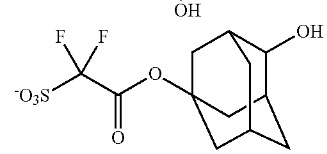
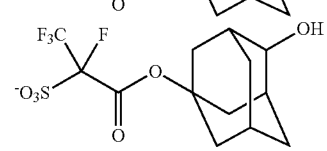
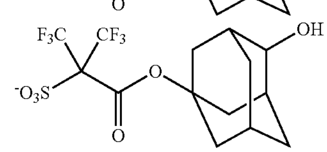

-continued
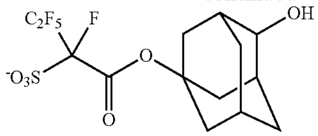
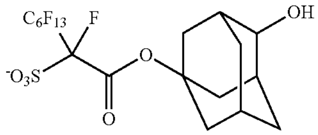
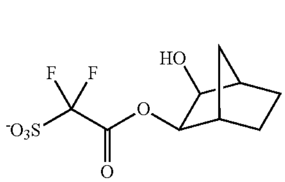
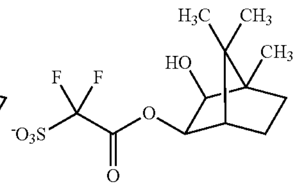
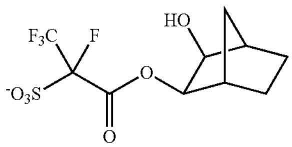
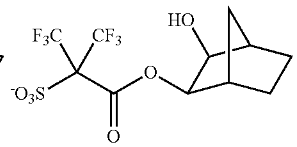
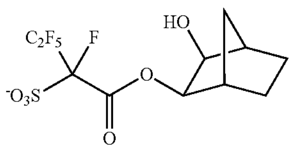
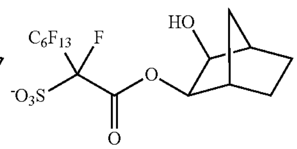
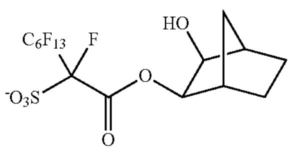
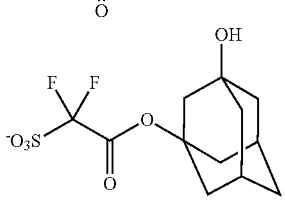
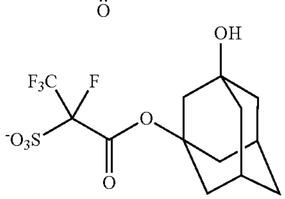
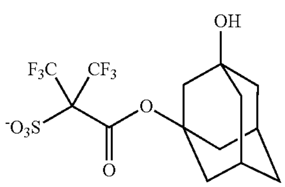
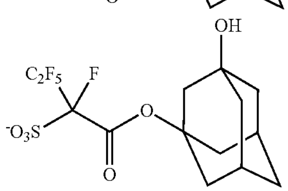
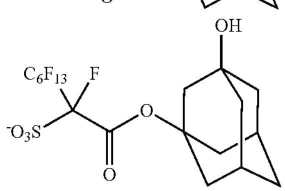
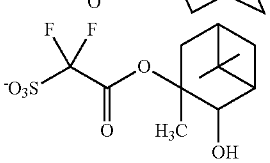
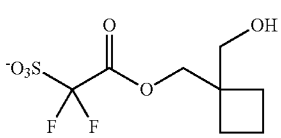
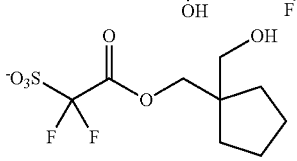
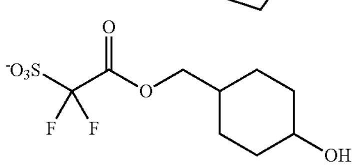
-continued
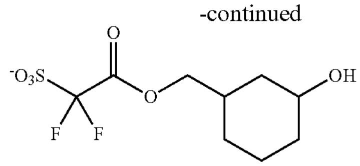
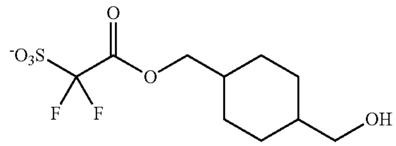
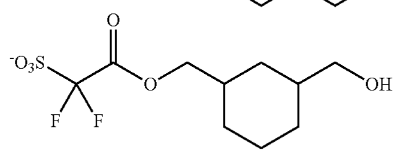
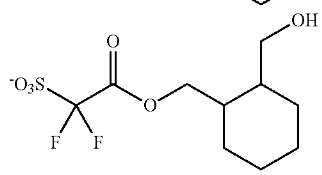
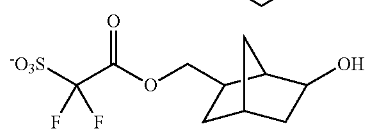
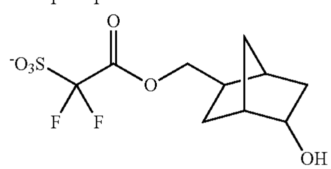
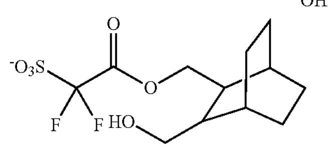
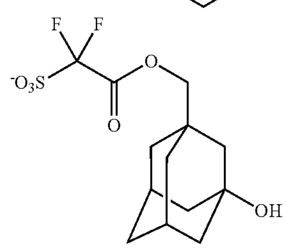
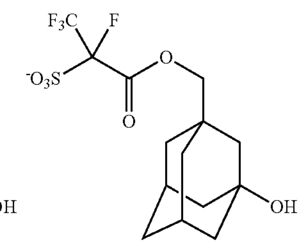
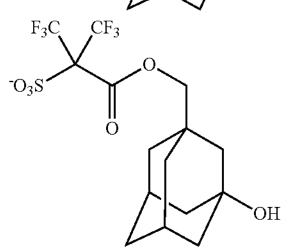
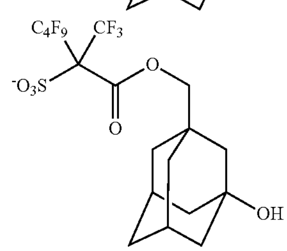
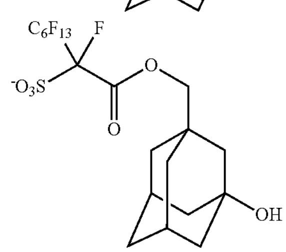
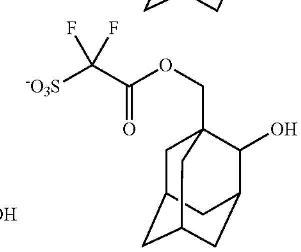

-continued
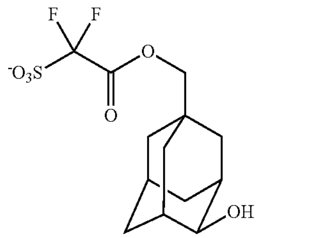
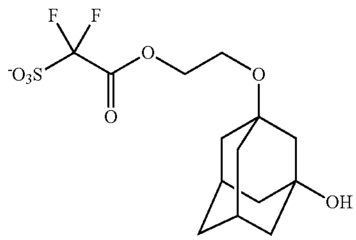
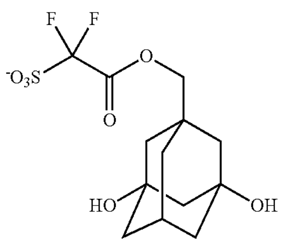
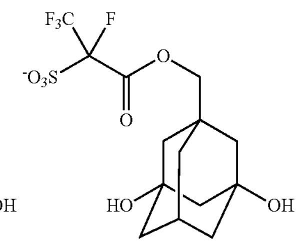
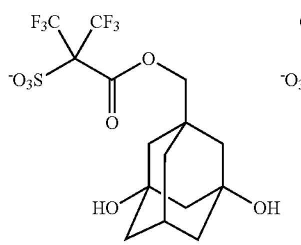
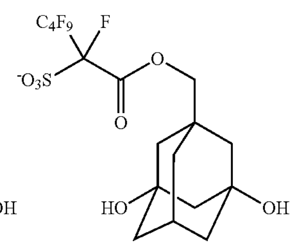
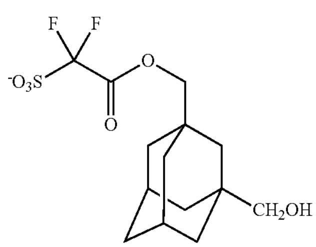
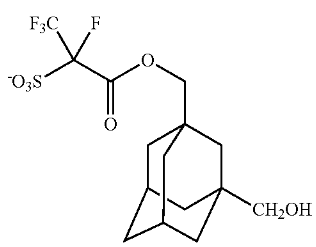
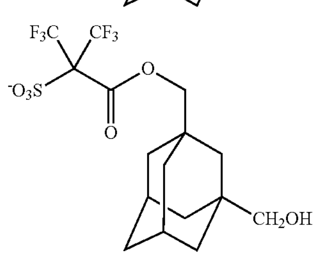
-continued
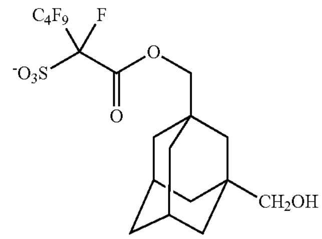
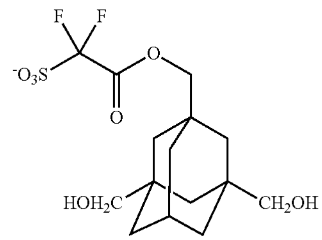
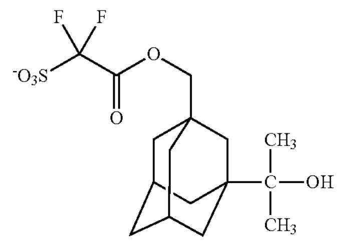
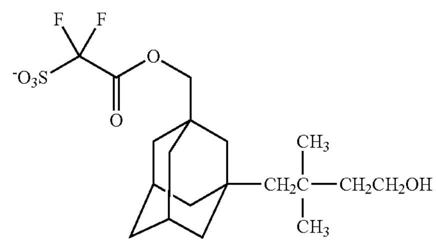
Examples of the sulfonate anion having an aliphatic hydrocarbon group substituted with an aromatic hydrocarbon group or a aralkyl group for Y, and a divalent group represented by the formula (b1-1) for $L^{a1}$ include anions below.
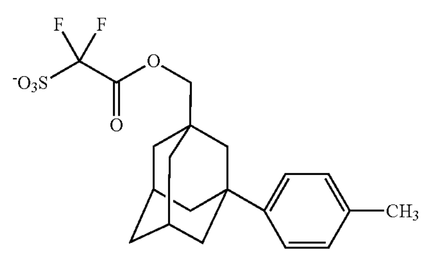
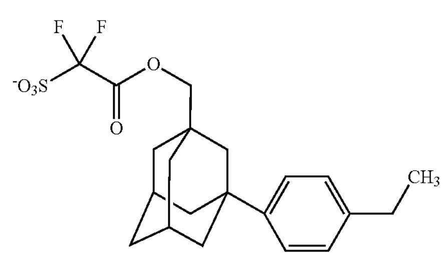

-continued
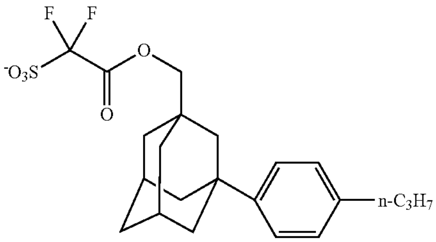
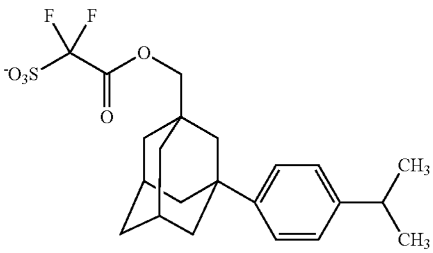
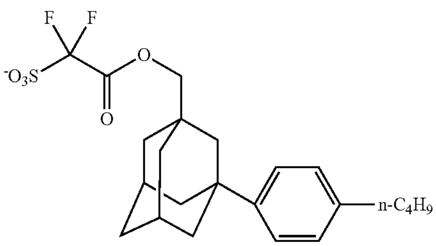
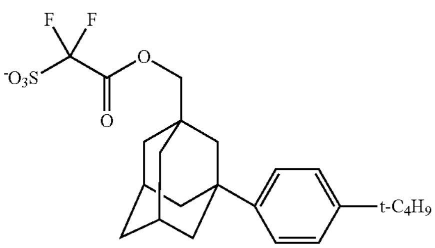
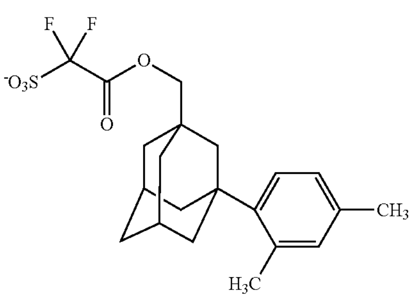
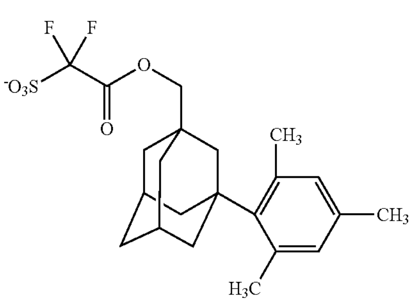
-continued
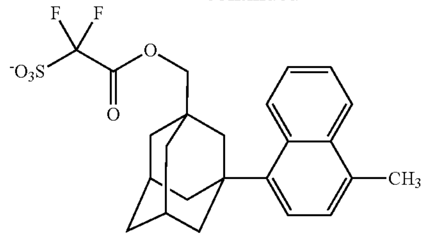
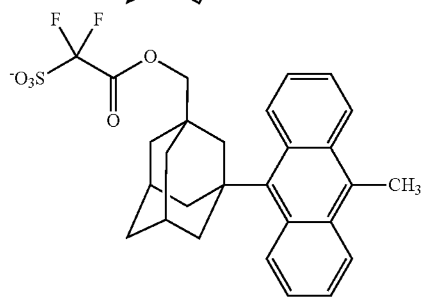
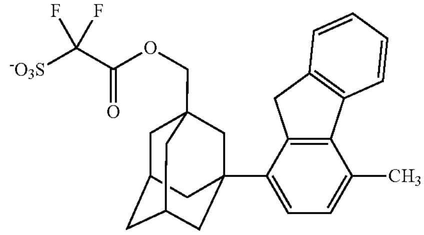
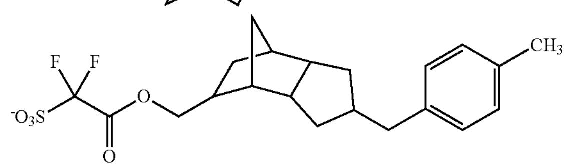
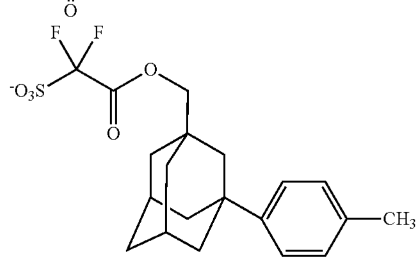
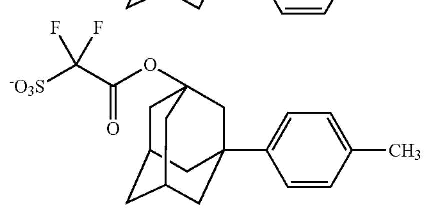
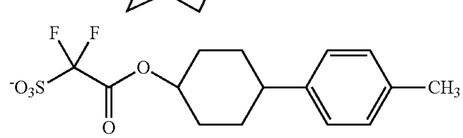
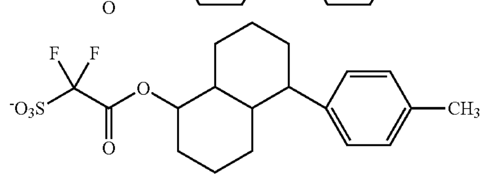
Examples of the sulfonate anion having a cyclic ether group for Y, and a divalent group represented by the formula (b1-1) for $L^{a1}$ include anion below.

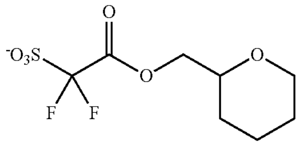
Examples of the sulfonate anion having a lactone ring for Y, and a divalent group represented by the formula (b1-1) for $L^{a1}$ include anions below.
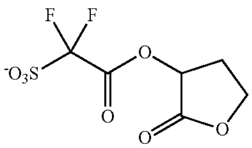
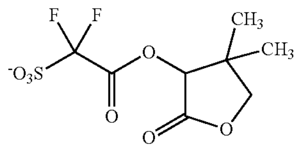
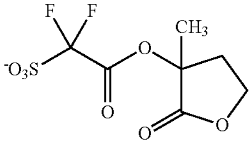
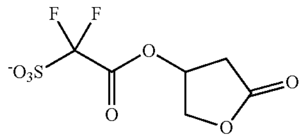
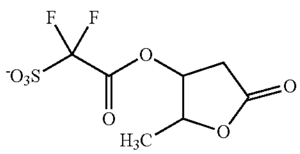
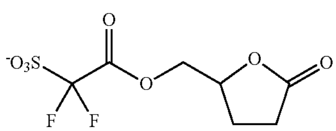
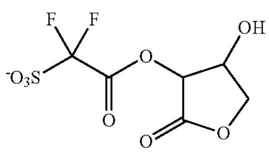
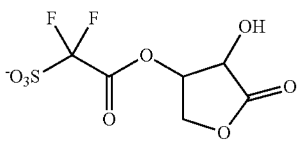
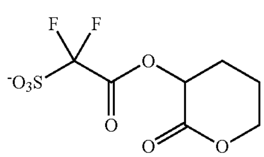
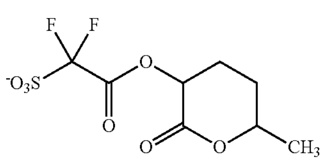
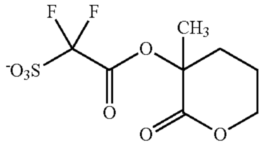
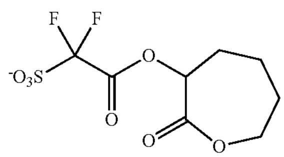
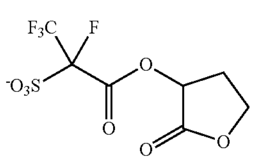
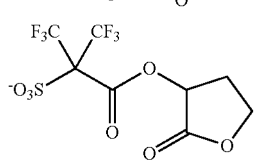
-continued
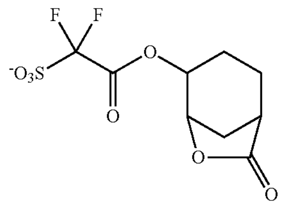
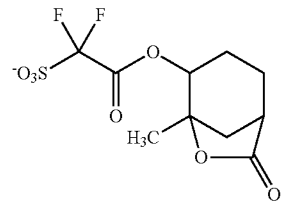
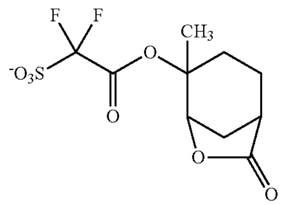
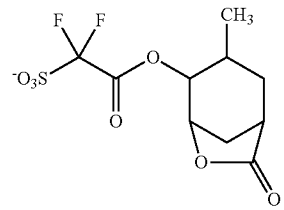
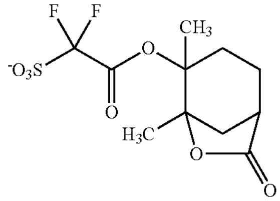
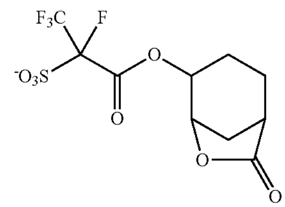
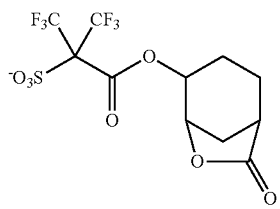
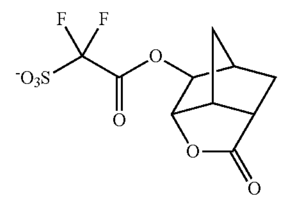
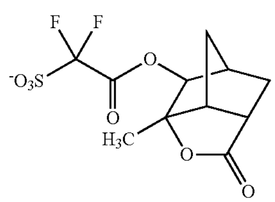
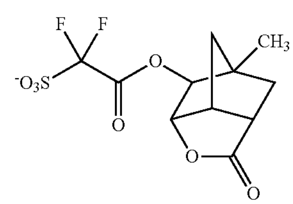
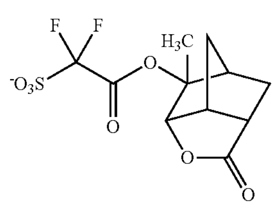
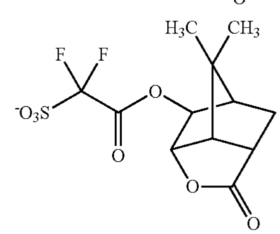
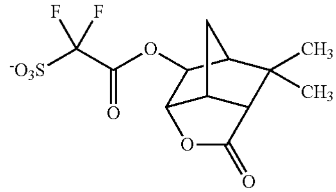
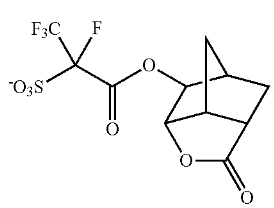
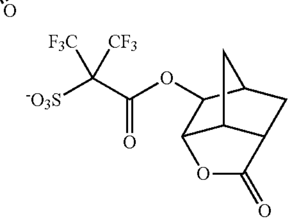

-continued
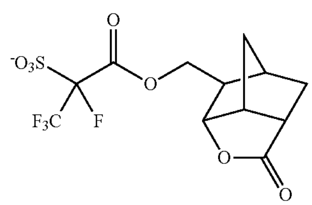
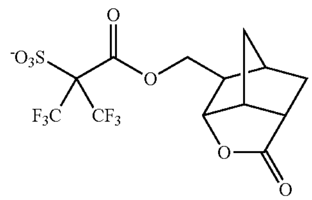
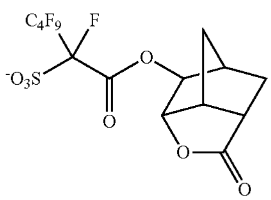
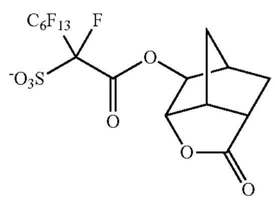
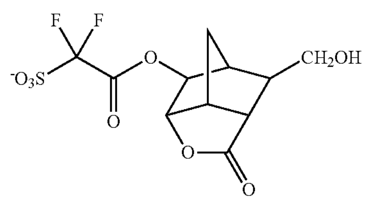
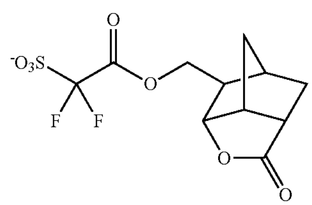
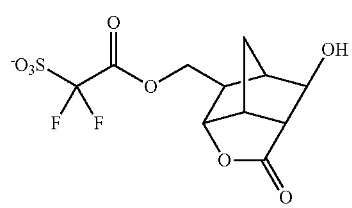
Examples of the sulfonate anion having a cyclic ketone group for Y, and a divalent group represented by the formula (b1-1) for $L^{a1}$ include anions below.
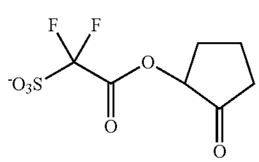
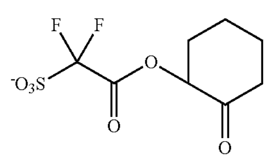
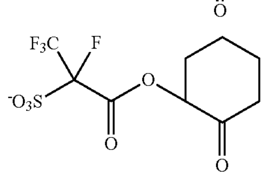
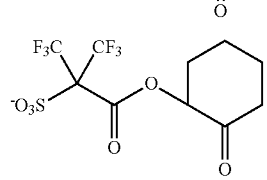
-continued
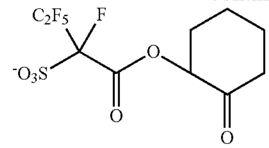
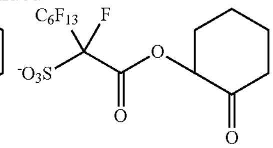
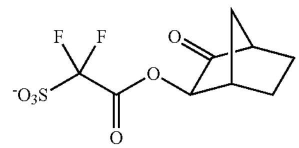
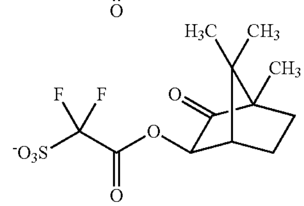
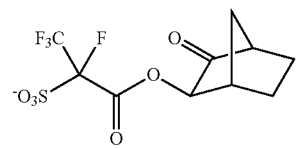
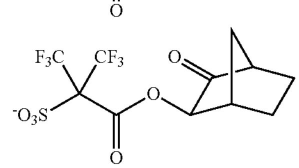
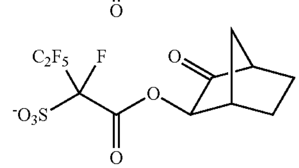
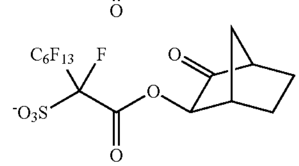
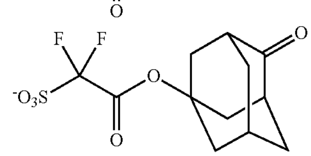
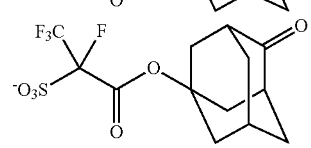
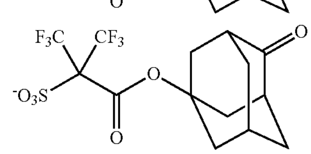
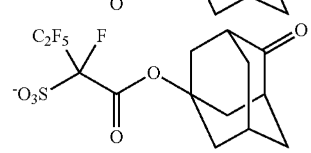
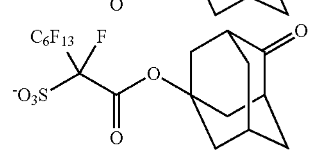

-continued

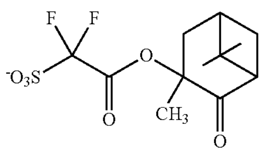

Examples of the sulfonate anion having a sultone ring group for Y, and a divalent group represented by the formula (b1-1) for $L^{a1}$ include anions below.

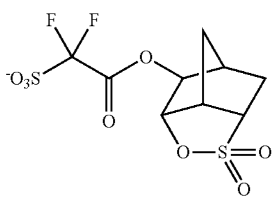

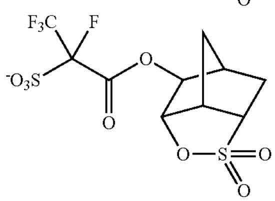

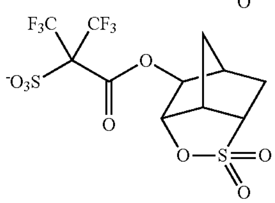

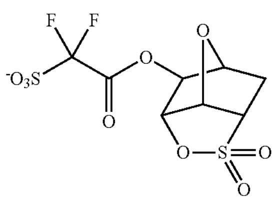

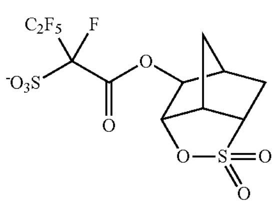

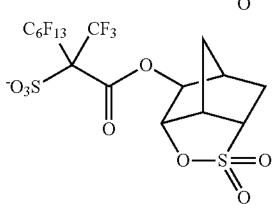

Examples of the sulfonate anion having a chain aliphatic hydrocarbon group or a non-substituted alicyclic hydrocarbon for Y, and a divalent group represented by the formula (b1-2) for $L^{a1}$ include anions below.

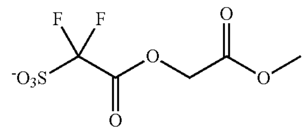

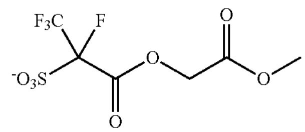

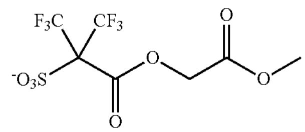

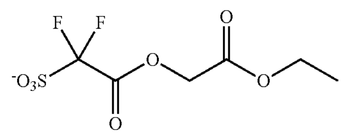

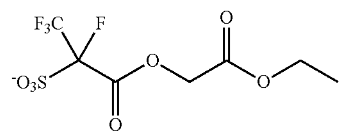

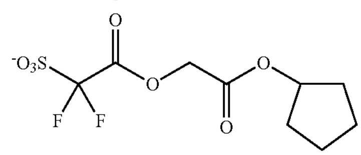

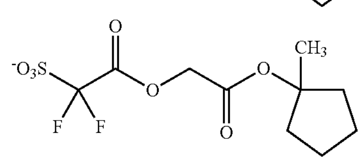

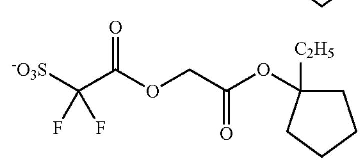

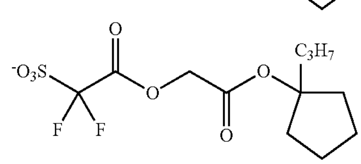

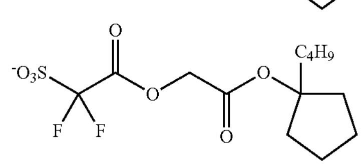

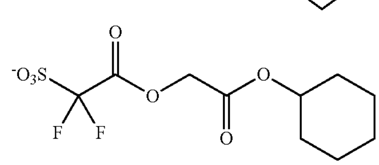

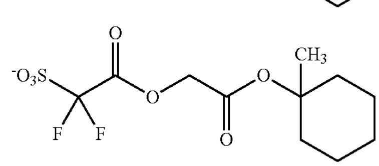

-continued
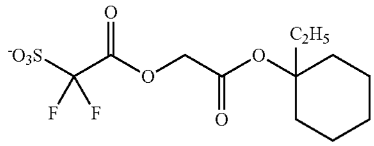
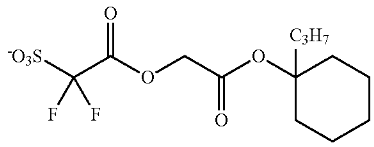
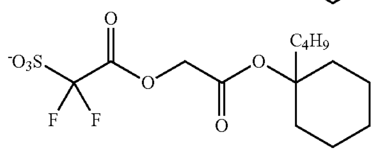
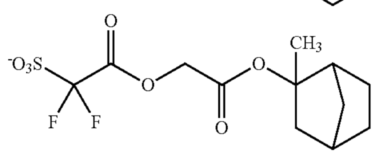
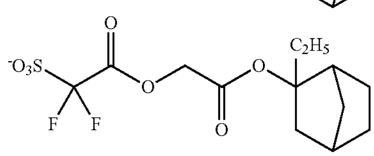
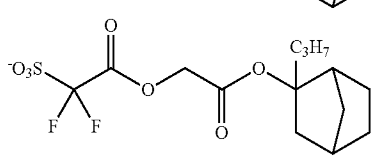
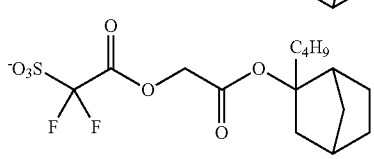
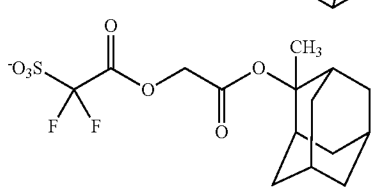
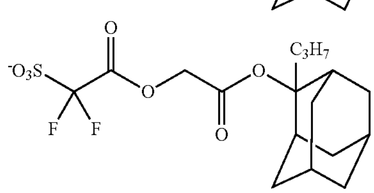
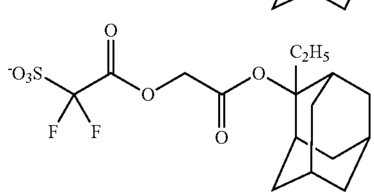
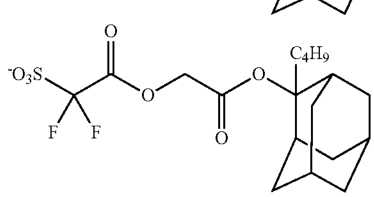
-continued
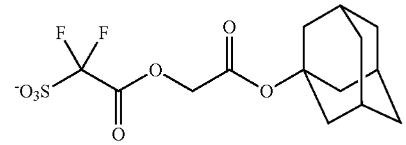
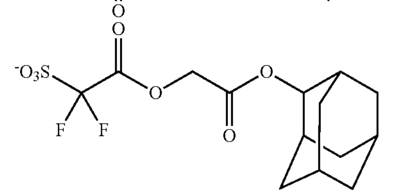
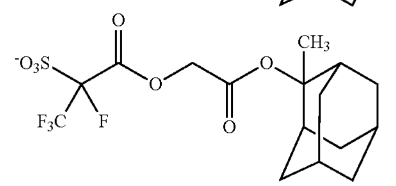
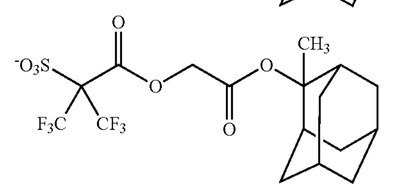
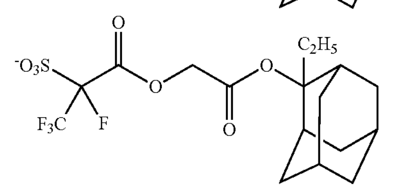
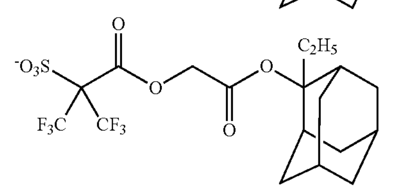
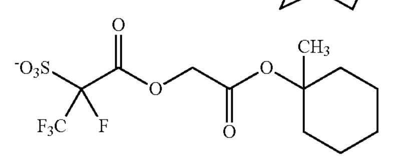
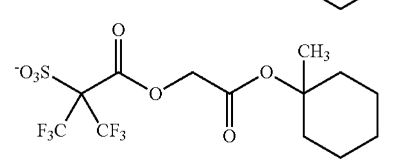
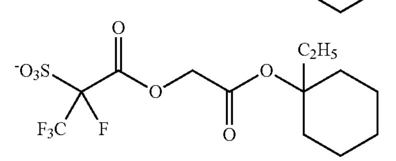
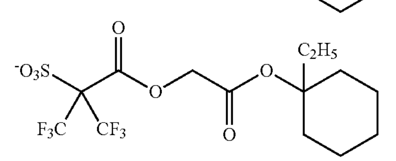
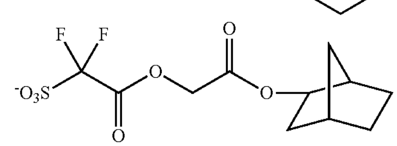

-continued
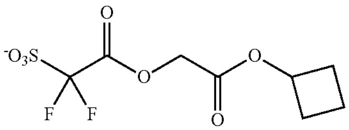
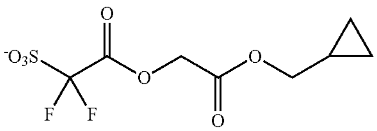
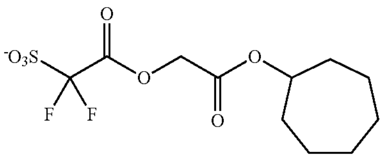
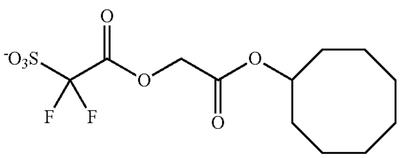
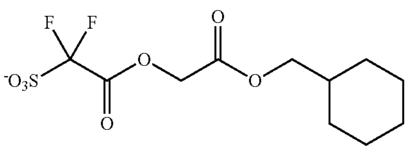
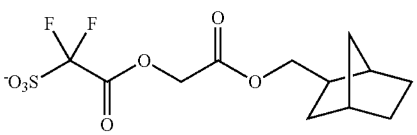
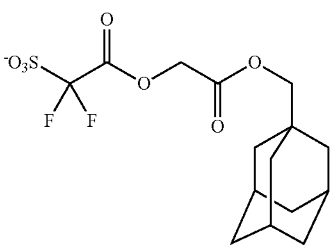
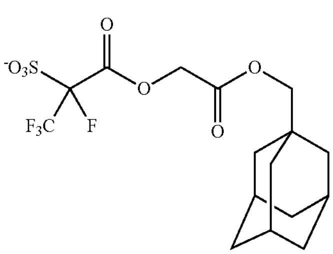
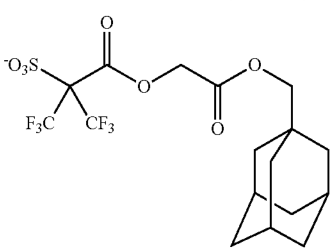
-continued
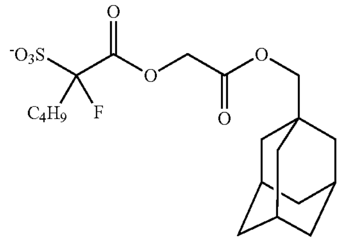
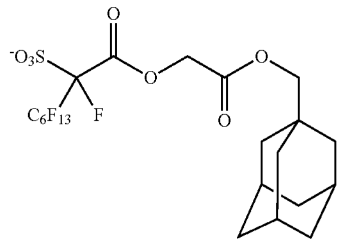
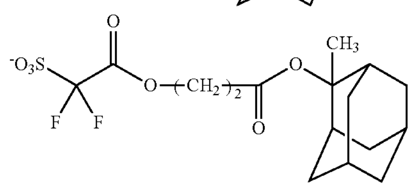
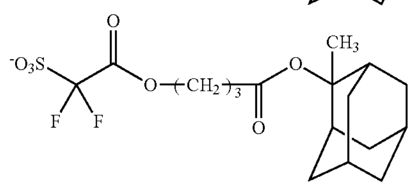
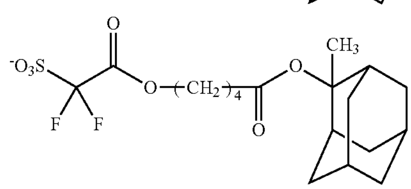
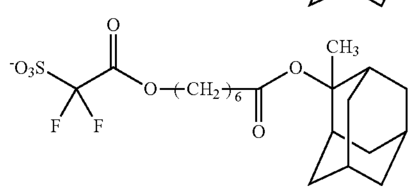
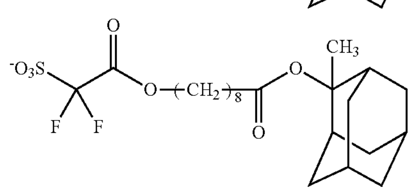
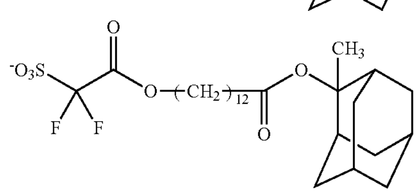
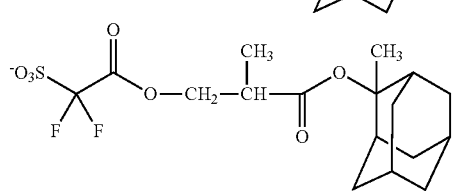

-continued

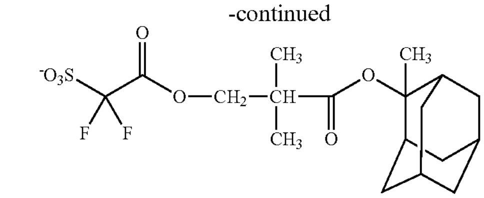

Examples of the sulfonate anion having an alicyclic hydrocarbon group substituted with a —$(CH_2)_{j2}$—CO—O—$R^{b1}$ group for Y, and a divalent group represented by the formula (b1-2) for $L^{a1}$ include anions below.

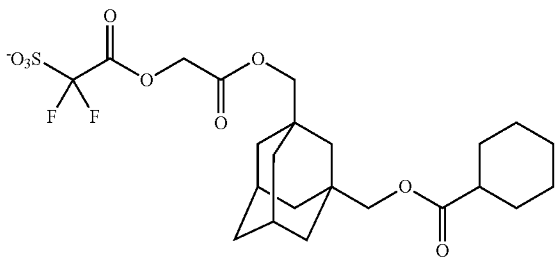

Examples of the sulfonate anion having an alicyclic hydrocarbon group substituted with a hydroxy group for Y, and a divalent group represented by the formula (b1-2) for $L^{a1}$ include anions below.

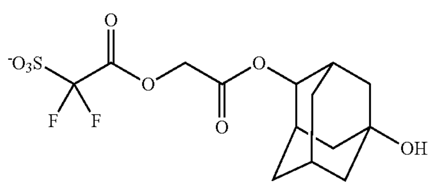

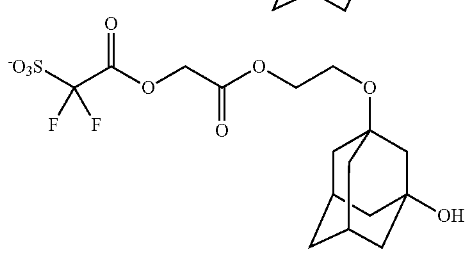

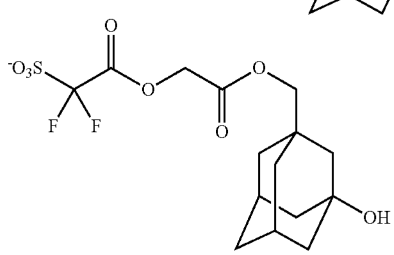

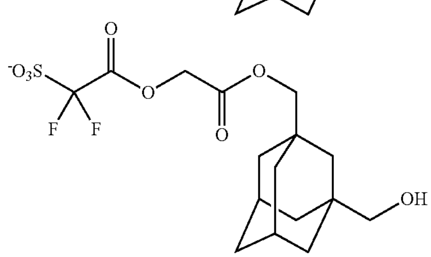

-continued

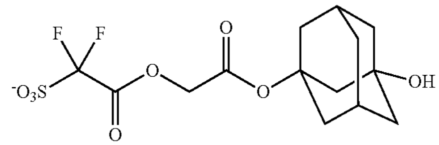

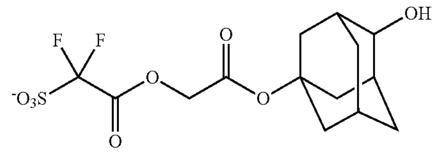

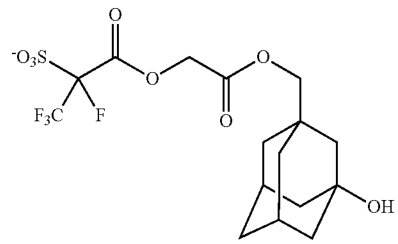

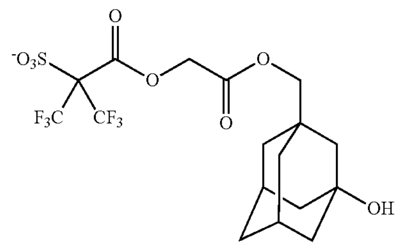

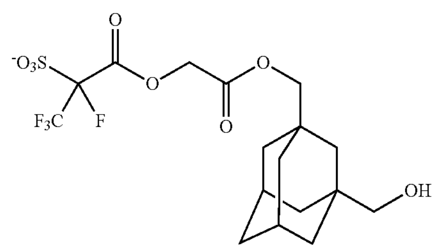

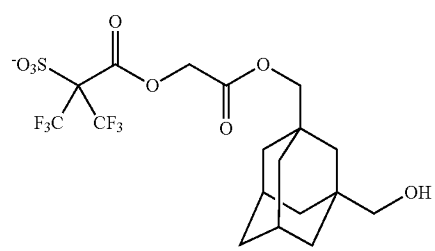

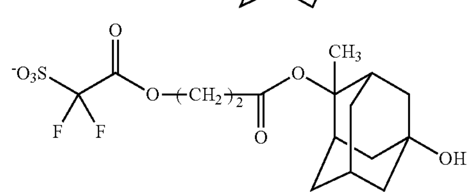

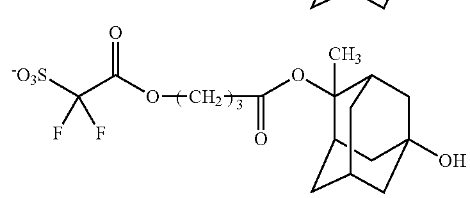

-continued

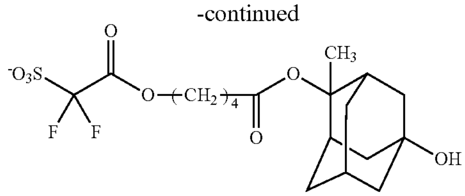

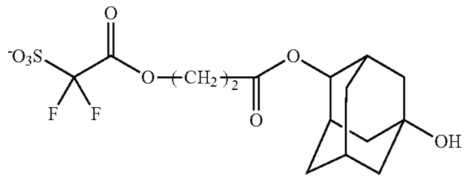

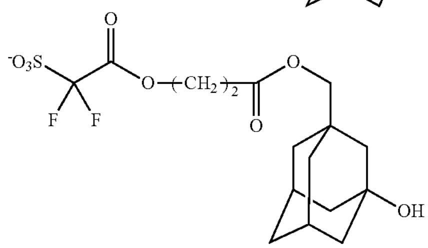

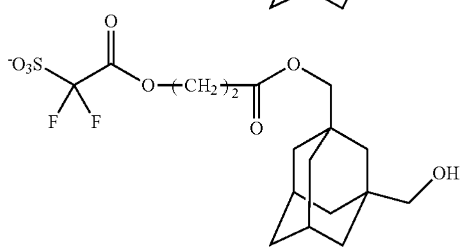

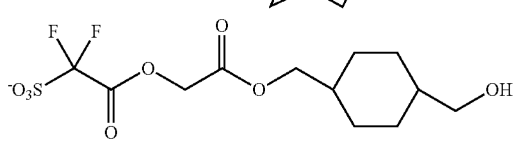

Examples of the sulfonate anion having an aliphatic hydrocarbon group substituted with an aromatic hydrocarbon group or a aralkyl group for Y, and a divalent group represented by the formula (b1-2) for $L^{a1}$ include anions below.

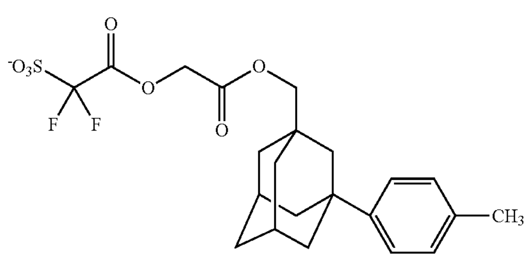

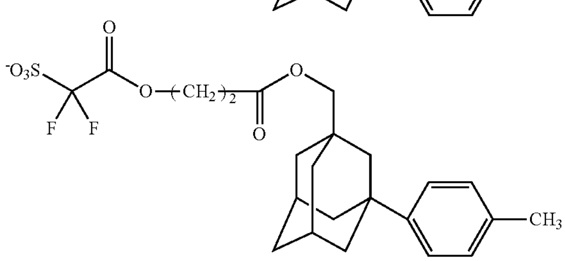

Examples of the sulfonate anion having a cyclic ether group for Y, and a divalent group represented by the formula (b1-2) for $L^{a1}$ include anion below.

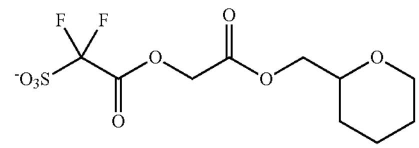

Examples of the sulfonate anion having a lactone ring for Y, and a divalent group represented by the formula (b1-2) for $L^{a1}$ include anions below.

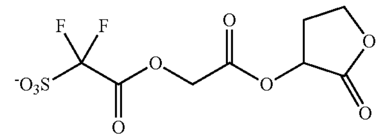

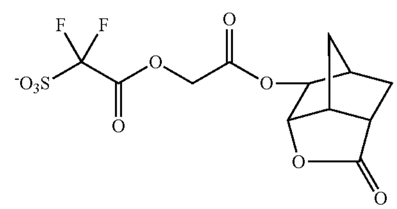

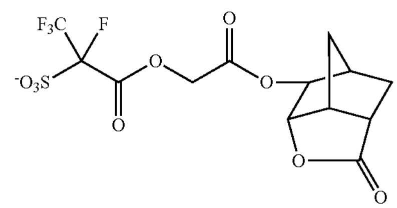

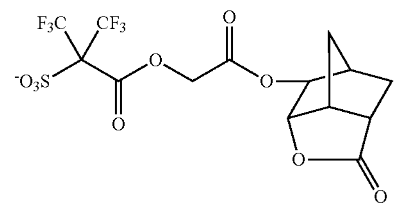

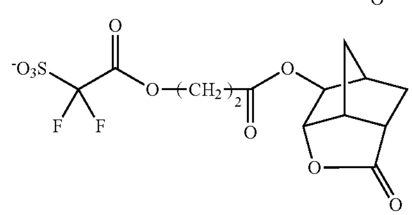

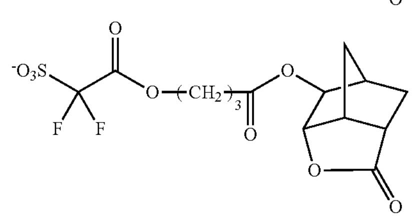

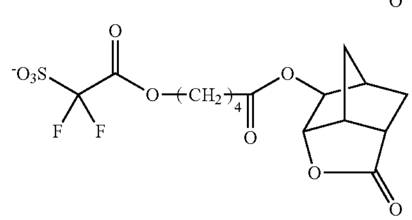

-continued
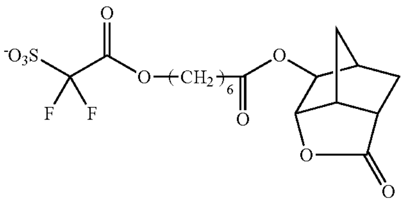
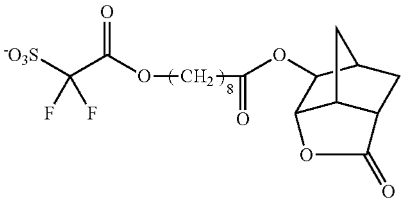
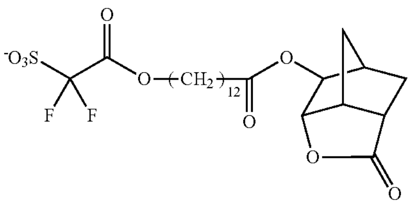
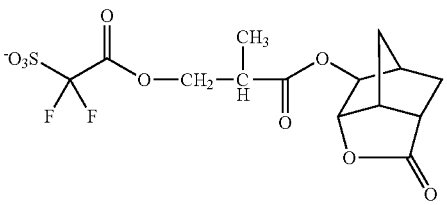
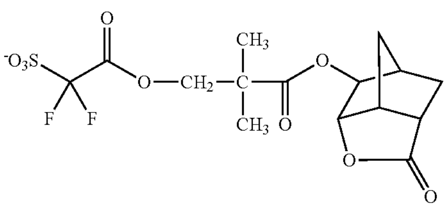
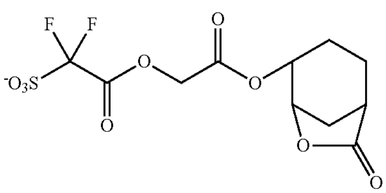
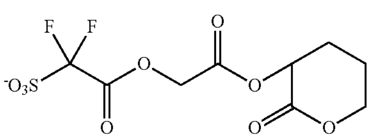
Examples of the sulfonate anion having a cyclic ketone group for Y, and a divalent group represented by the formula (b1-2) for $L^{a1}$ include anions below.
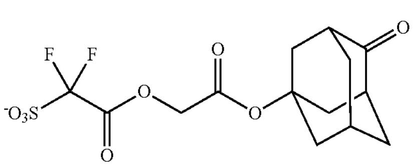
-continued
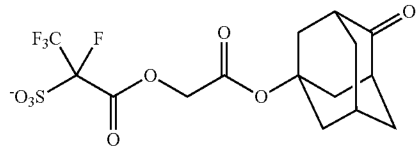
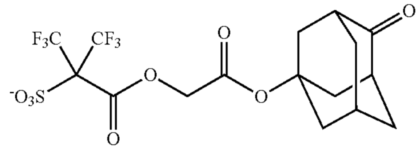
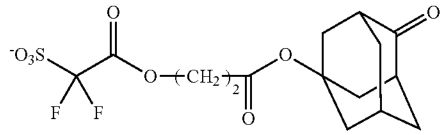
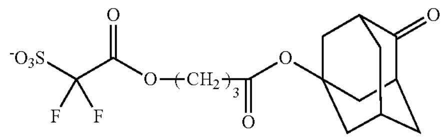
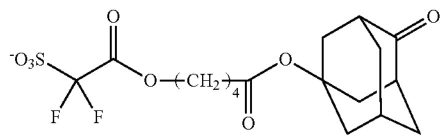
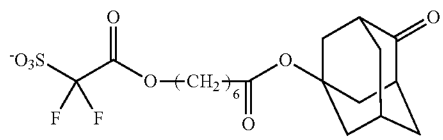
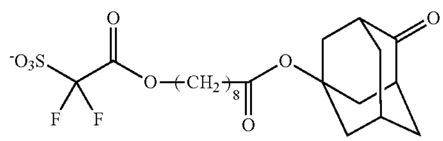
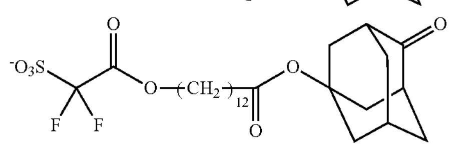
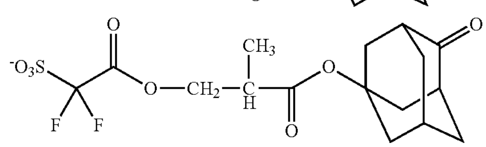
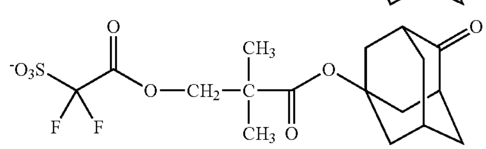
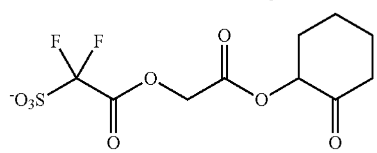
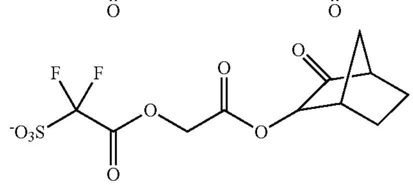

Examples of the sulfonate anion having a sultone ring group for Y, and a divalent group represented by the formula (b1-2) for $L^{a1}$ include anions below.

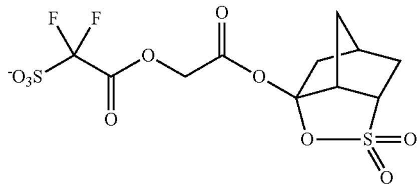

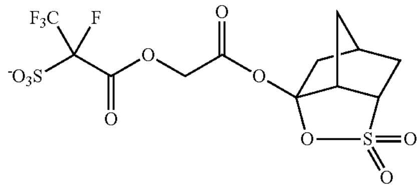

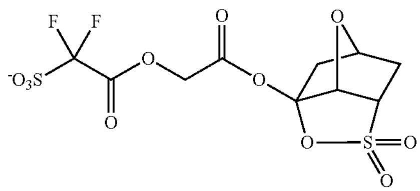

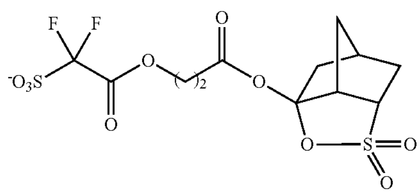

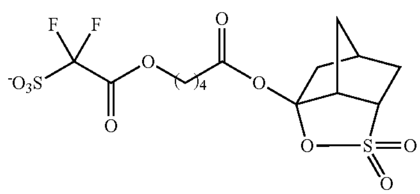

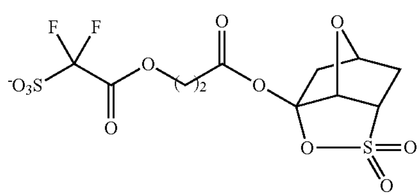

Examples of the sulfonate anion having a chain aliphatic hydrocarbon group for Y, and a divalent group represented by the formula (b1-3) for $L^{a1}$ include anions below.

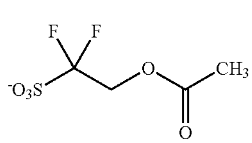

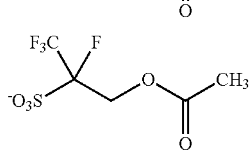

-continued

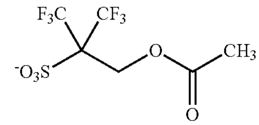

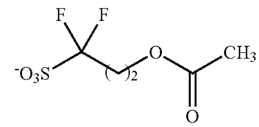

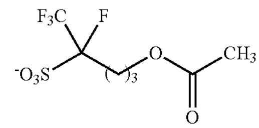

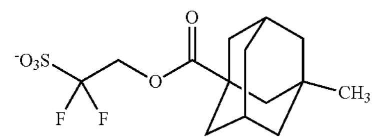

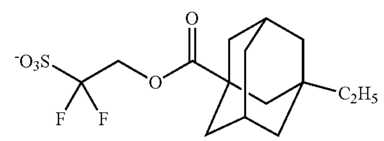

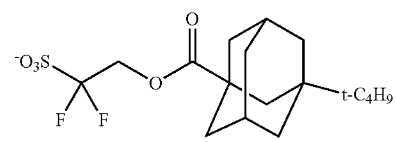

Examples of the sulfonate anion having an alicyclic hydrocarbon group substituted with an alkoxy group for Y, and a divalent group represented by the formula (b1-3) for $L^{a1}$ include anions below.

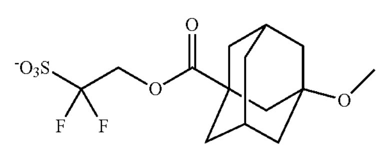

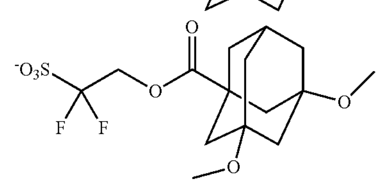

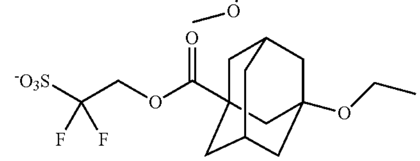

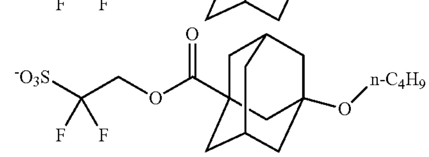

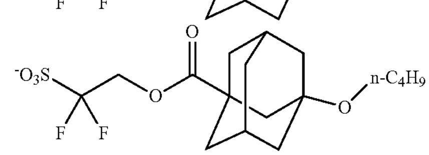

Examples of the sulfonate anion having an alicyclic hydrocarbon group substituted with a hydroxy group for Y, and a divalent group represented by the formula (b1-3) for $L^{a1}$ include anions below.

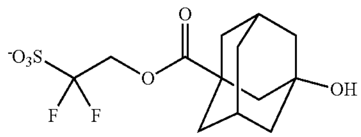
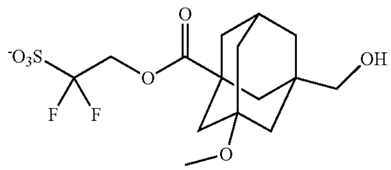
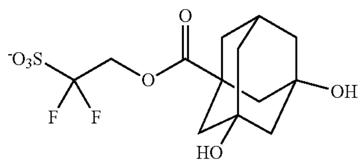
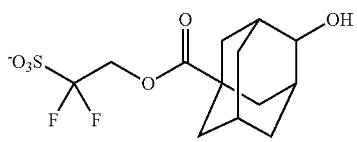
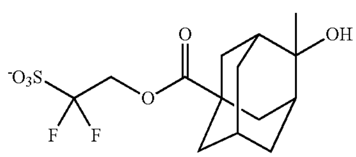
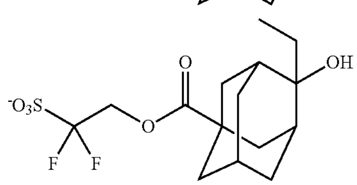
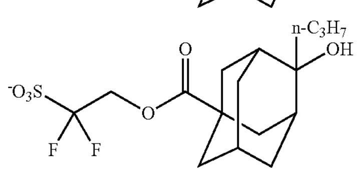
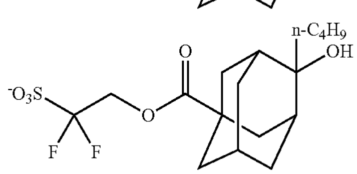
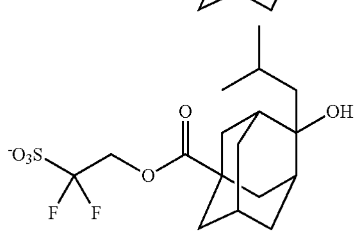

Examples of the sulfonate anion having a cyclic ketone group for Y, and a divalent group represented by the formula (b1-3) for $L^{a1}$ include anions below.

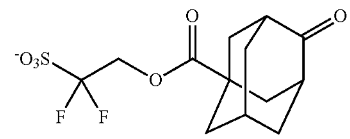
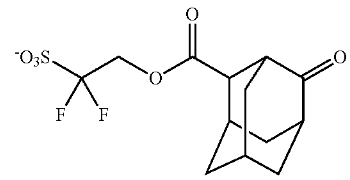

Examples of the sulfonate anion having a chain aliphatic hydrocarbon group for Y, and a divalent group represented by the formula (b1-4) for $L^{a1}$ include anion below.

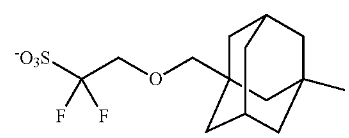

Examples of the sulfonate anion having an alicyclic hydrocarbon group substituted with an alkoxy group for Y, and a divalent group represented by the formula (b1-4) for $L^{a1}$ include anions below.

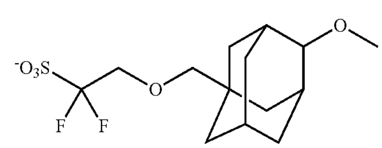
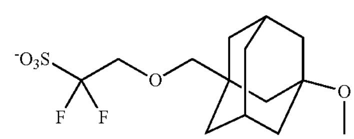
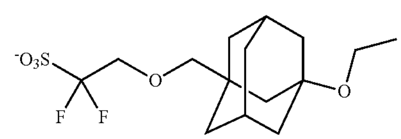
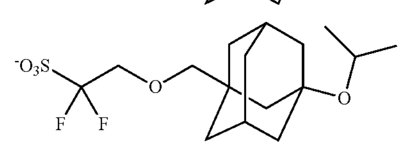
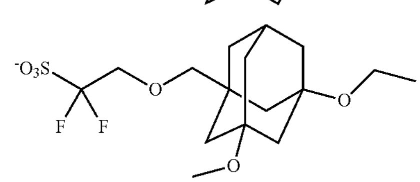

Examples of the sulfonate anion having an alicyclic hydrocarbon group substituted with a hydroxy group for Y, and a divalent group represented by the formula (b1-4) for $L^{a1}$ include anions below.

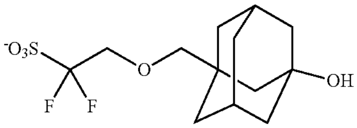
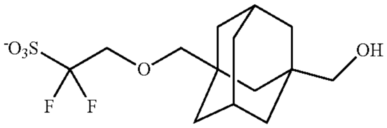
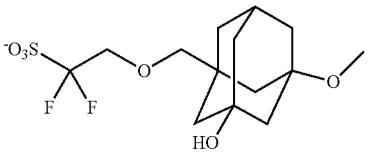
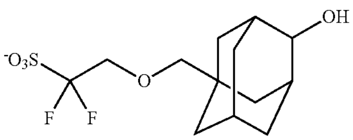
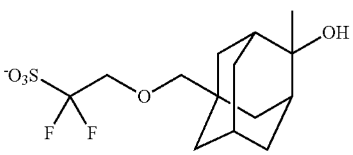
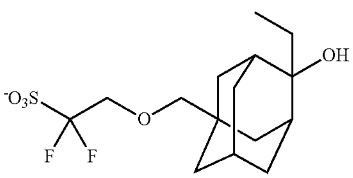
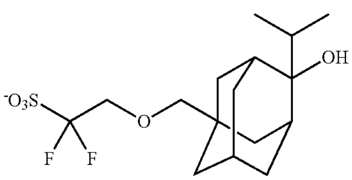
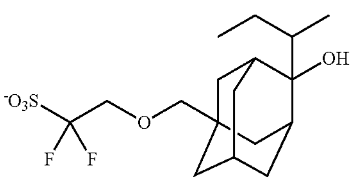
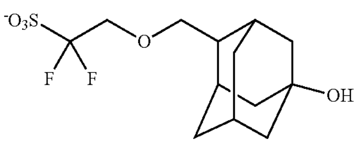
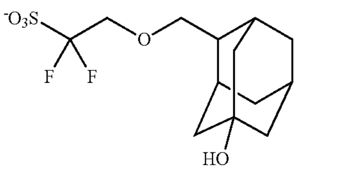
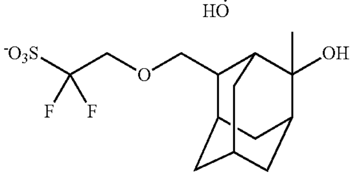
-continued
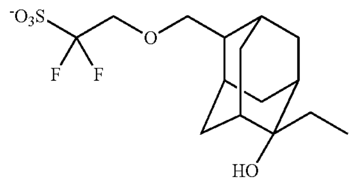
Examples of the sulfonate anion having a cyclic ketone group for Y, and a divalent group represented by the formula (b1-4) for $L^{a1}$ include anions below.
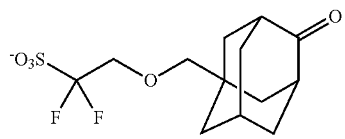
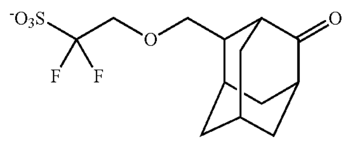
Among these, a sulfonate anion containing a divalent group represented by the formula (b1-1) for $L^{a1}$ is preferable. Specific examples of the preferable sulfonate anion include an anion below.
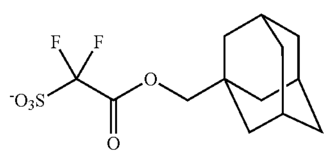
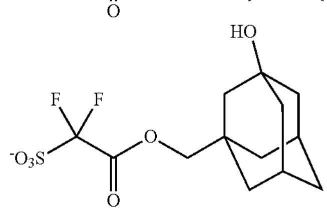
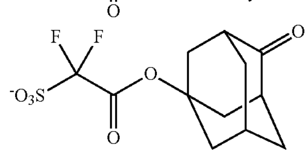
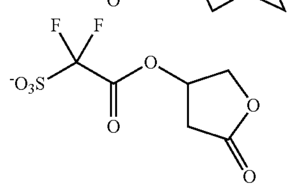
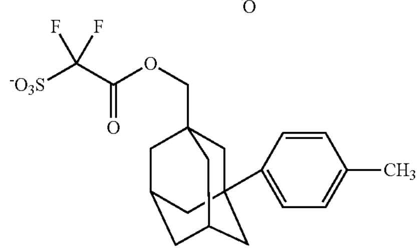

-continued

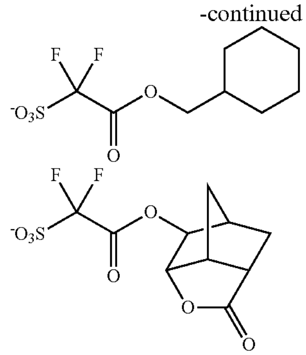

In particular, a sulfonate anion in which Y is an optionally substituted $C_3$ to $C_{18}$ alicyclic hydrocarbon group is more preferable.

Examples of the cation of the acid generator (B) include an onium cation, for example, sulfonium cation, iodonium cation, ammonium cation, benzothiazolium cation and phosphonium cation. Among these, sulfonium cation and iodonium cation are preferable, and organic cations represented by any of the formula (b2-1) to the formula (b2-4) are more preferable.

$Z^+$ of the formula (B1) is preferably represented by any of the formula (b2-1) to the formula (b2-4).

(b2-1)

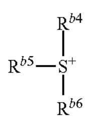

(b2-2)

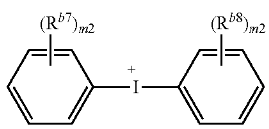

(b2-3)

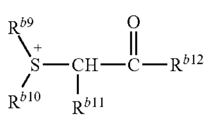

(b2-4)

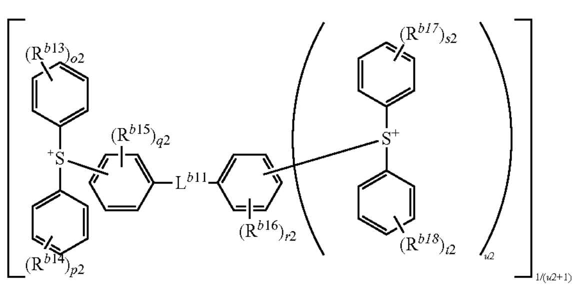

wherein $R^{b4}$ to $R^{b6}$ independently represent a $C_1$ to $C_{30}$ hydrocarbon group which includes a $C_1$ to $C_{30}$ alkyl group, a $C_3$ to $C_{18}$ alicyclic hydrocarbon group or a $C_6$ to $C_{18}$ aromatic hydrocarbon group, the alkyl group may be substituted with a hydroxy group, a $C_1$ to $C_{12}$ alkoxy group or a $C_6$ to $C_{18}$ aromatic hydrocarbon group, the alicyclic hydrocarbon group may be substituted with a halogen atom, a $C_2$ to $C_4$ acyl group and a glycidyloxy group, the aromatic hydrocarbon group may be substituted with a halogen atom, a hydroxy group, a $C_1$ to $C_{18}$ alkyl group, a $C_3$ to $C_{18}$ alicyclic hydrocarbon group or a $C_1$ to $C_{12}$ alkoxy group;

$R^{b7}$ and $R^{b8}$ in each occurrence independently represent a hydroxy group, a $C_1$ to $C_{12}$ alkyl group or a $C_1$ to $C_{12}$ alkoxyl group;

m2 and n2 independently represent an integer of 0 to 5;

$R^{b9}$ and $R^{b10}$ independently represent a $C_1$ to $C_{18}$ alkyl group or a $C_3$ to $C_{18}$ alicyclic hydrocarbon group;

$R^{b11}$ represents is hydrogen atom, a $C_1$ to $C_{18}$ alkyl group, a $C_3$ to $C_{18}$ alicyclic hydrocarbon group or a $C_6$ to $C_{18}$ aromatic hydrocarbon group;

$R^{12}$ represents a $C_1$ to $C_{18}$ hydrocarbon group which includes a $C_1$ to $C_{18}$ alkyl group, a $C_3$ to $C_{18}$ alicyclic hydrocarbon group or a $C_6$ to $C_{18}$ aromatic hydrocarbon group, the aromatic hydrocarbon group may be substituted with a $C_1$ to $C_{12}$ alkyl group, a $C_1$ to $C_{12}$ alkoxy group, a $C_3$ to $C_{18}$ alicyclic hydrocarbon group or an alkyl carbonyloxy group;

$R^{b9}$ and $R^{b10}$ may be bonded to form a sulfur-containing $C_3$ to $C_{12}$ ring (preferably a $C_3$ to $C_7$ ring), and a —$CH_2$— contained in the ring may be replaced by —O—, —S— or —CO—;

$R^{b11}$ and $R^{12}$ may be bonded to form a $C_3$ to $C_{12}$ ring (preferably a $C_4$ to $C_7$ ring) containing —CH—CO—, and a —$CH_2$— contained in the ring may be replaced by —S— or —CO—;

$R^{b13}$ to $R^{b18}$ in each occurrence independently represent a hydroxy group, a $C_1$ to $C_{12}$ alkyl group or a $C_1$ to $C_{12}$ alkoxy group;

$L^{b11}$ represents —S— or —O—;

o2, p2, s2 and t2 independently represent an integer of 0 to 5;

q2 or r2 independently represent an integer of 0 to 4;

u2 represents an integer of 0 or 1.

Examples of the alkyl group, the alicyclic hydrocarbon group, the aromatic hydrocarbon group, the alkoxyl group, the halogen atom and the acyl group include the same as defined above.

Examples of the alkylcarbonyloxy group of the $R^{b12}$ include methylcarbonyloxy, ethylcarbonyloxy, n-propylcarbonyloxy, isopropylcarbonyloxy, n-butylcarbonyloxy, sec-butylcarbonyloxy, tert-butylcarbonyloxy, pentylcarbonyloxy, hexylcarbonyloxy, octylcarbonyloxy, and 2-ethylhexycarbonyloxy.

Examples of the preferred alkyl group include methyl, ethyl, propyl, butyl, hexyl, octyl, and 2-ethylhexyl groups, in particular, the alkyl group of $R^{b9}$ to $R^{b11}$ is preferably a $C_1$ to $C_{12}$ alkyl group.

Examples of the preferred alicyclic hydrocarbon group include a cyclopropyl, cyclobutyl, cyclopentyl, cyclohexyl, cycloheptyl, cyclodecyl, 2-alkyladamantane-2-yl, 1-(adamantane-1-yl)alkane-1-yl and isobornyl groups, in particular, the alicyclic hydrocarbon group of $R^{b9}$ to $R^{b11}$ is preferably a $C_3$ to $C_{18}$ alicyclic hydrocarbon group and more preferably a $C_4$ to $C_{12}$ alicyclic hydrocarbon group.

Examples of the preferred aromatic hydrocarbon groups include phenyl, 4-methoxy phenyl, 4-etyhlphenyl, 4tert-butylphenyl, 4-cyclohexylphenyl, 4-methoxyphenyl, biphenyl and naphthyl group.

Examples of the aromatic group substituted with an alkyl group typically represent an aralkyl group such as benzyl, phenethyl, phenylpropyl, trityl, naphthylmethyl and naphthylethyl groups.

Examples of the ring formed by $R^{b9}$ and $R^{b10}$ bonded together include thiolane-1-ium ring (tetrahydrothiophenium ring), thian-1-ium ring and 1,4-oxathian-4-ium ring.

Examples of the ring formed by $R^{b11}$ and $R^{b12}$ bonded together include oxocycloheptane ring, oxocyclohexane ring, oxonorbornane ring, and oxoadamantane ring.

Among the cations represented by the formula (b2-1) to the formula (b2-4), the cation represented by the formula (b2-1) is preferable, and triphenyl sulfonium cation (v2=w2=x2=0 in the formula (2-1-1)) and tritolyl sulfonium cation (v2=w2=x2=1, and $R^{b19}$, $R^{b20}$ and $R^{b21}$ are a methyl group in the formula (b2-1-1)) are more preferable.

(b2-1-1)

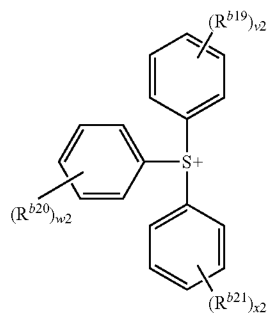

wherein $R^{b19}$ to $R^{b21}$ in each occurrence independently represent a halogen atom, a hydroxy group, a $C_1$ to $C_{18}$ aliphatic hydrocarbon group or a $C_1$ to $C_{12}$ alkoxy group;

v2 to x2 independently represent an integer of 0 to 5.

The aliphatic hydrocarbon group is preferably a $C_1$ to $C_{12}$ alkyl group or a $C_4$ to $C_{18}$ alicyclic hydrocarbon group.

In the formula (b2-1-1), $R^{b19}$ to $R^{b21}$ independently preferably represent a halogen atom (and more preferably fluorine atom), a hydroxy group, a $C_1$ to $C_{12}$ alkyl group or a $C_1$ to $C_{12}$ alkoxy group; and v2 to x2 independently represent preferably 0 or 1.

Specific examples of the cation of the formula (b2-1-1) include a cation below.

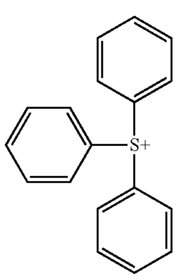

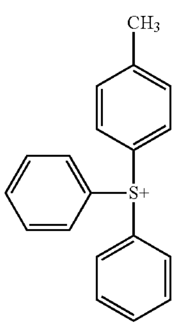

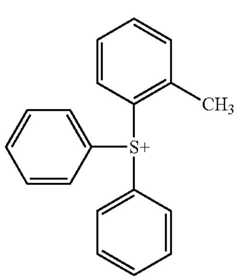

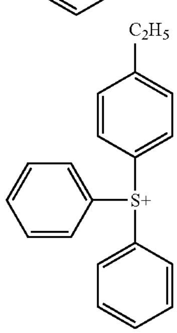

-continued

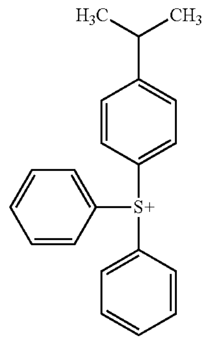

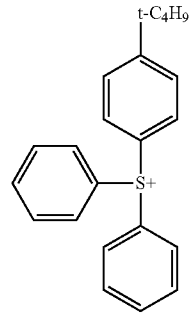

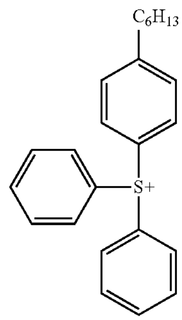

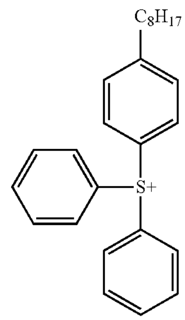

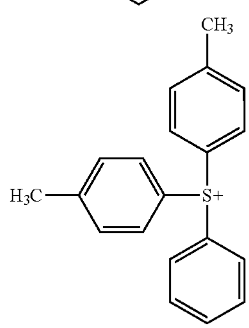

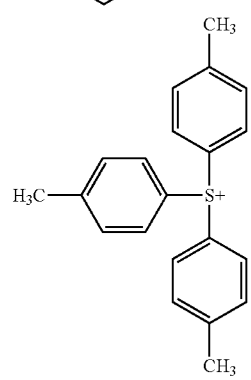

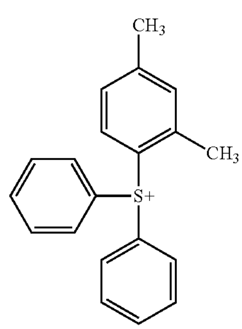

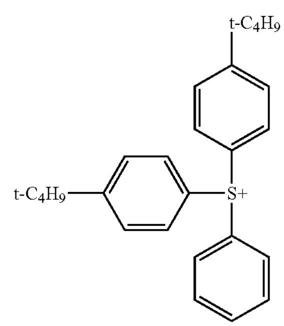

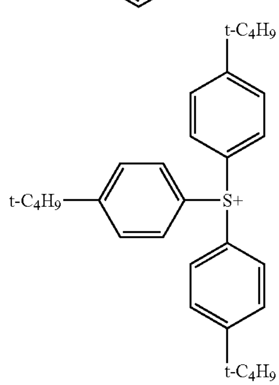

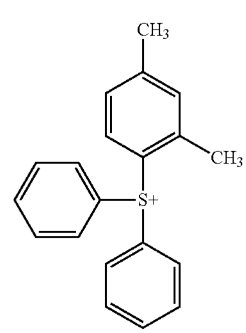

-continued
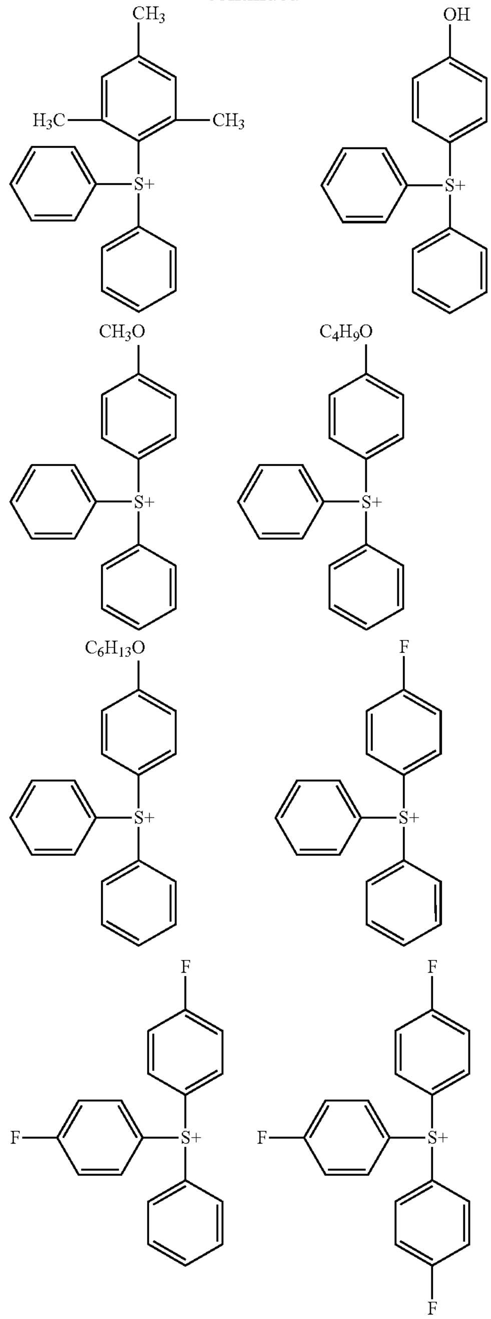
The resist composition including the acid generator (B1) having such organic cation can result in a good focus margin at producing the resist pattern.
Specific examples of the cation of the formula (b2-2) include a cation below.
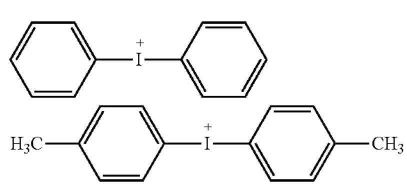
-continued
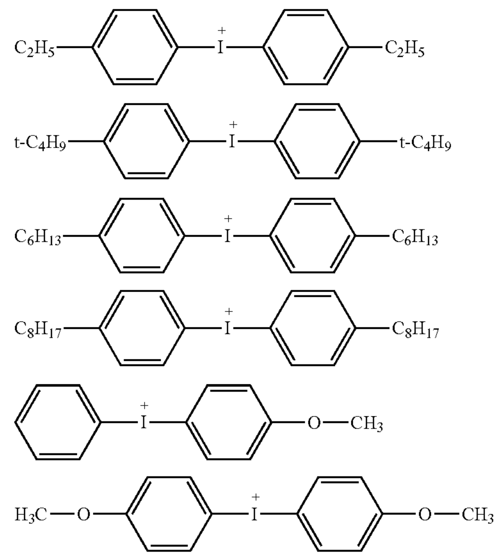
Specific examples of the cation of the formula (b2-3) include a cation below.
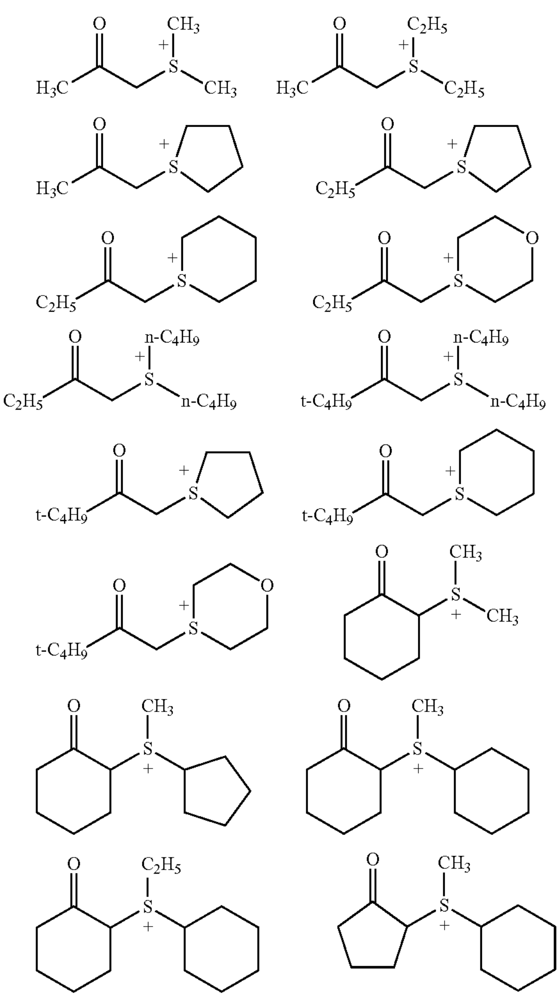

-continued
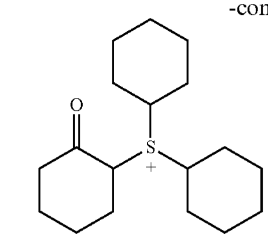
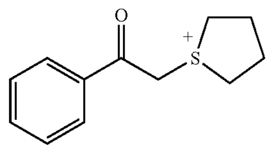
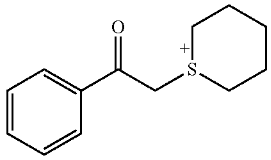
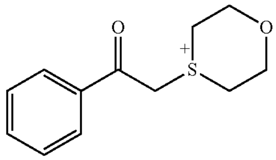
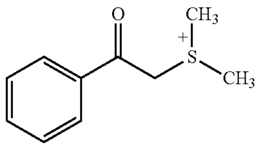
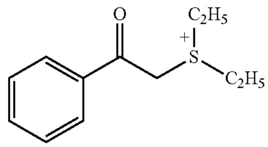
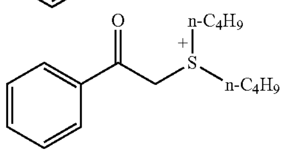
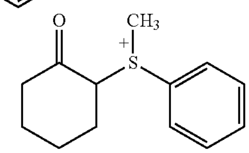
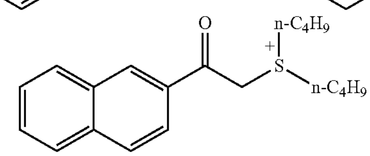
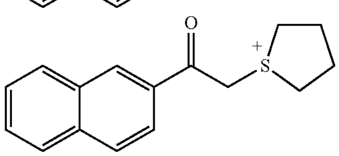
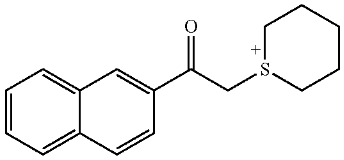
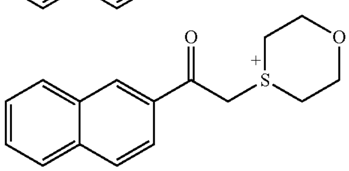
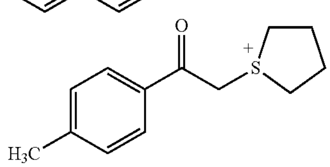
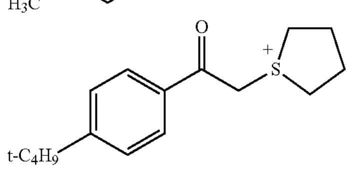
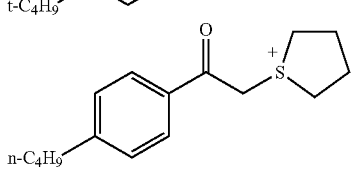
-continued
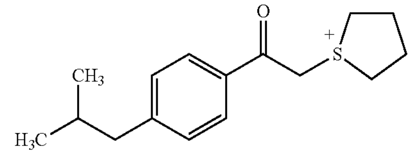
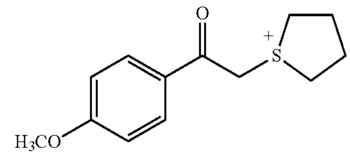
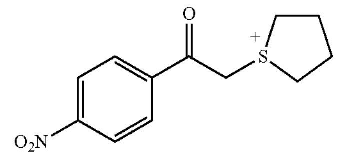
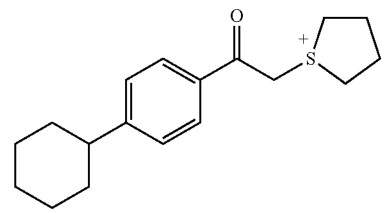
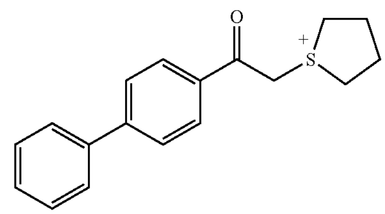
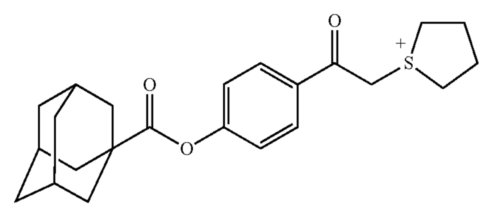
Specific examples of the cation of the formula (b2-4) include a cation below.
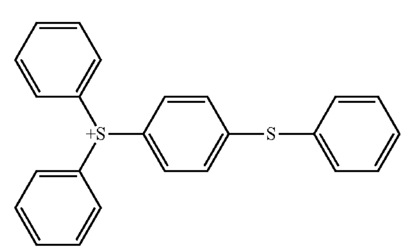
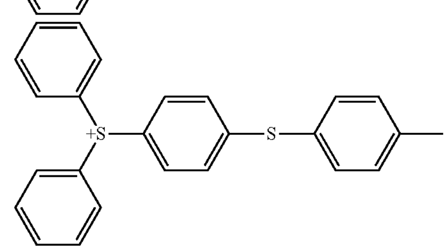

-continued
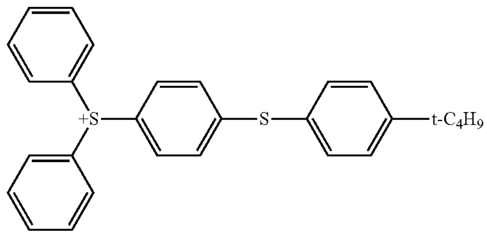
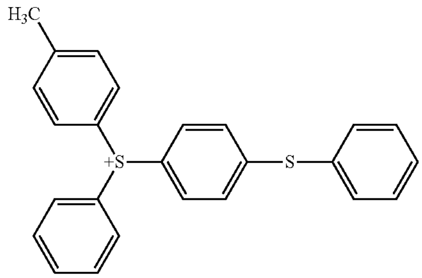
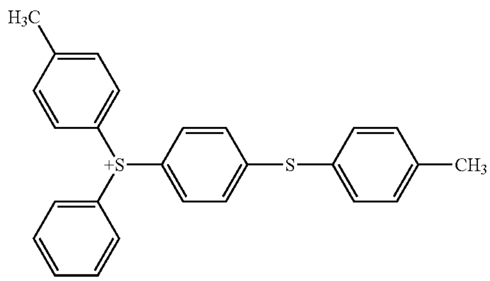
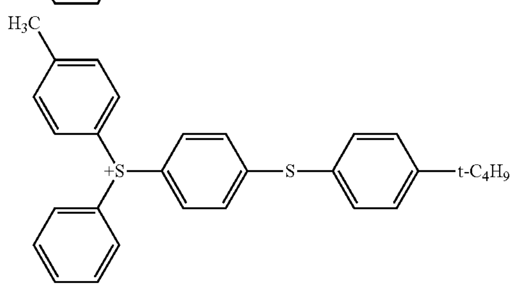
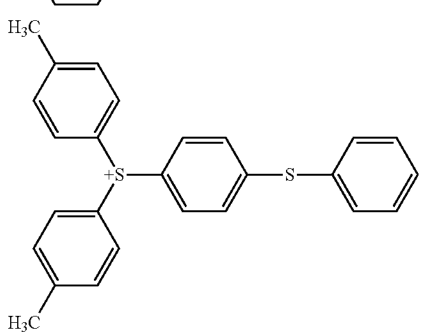
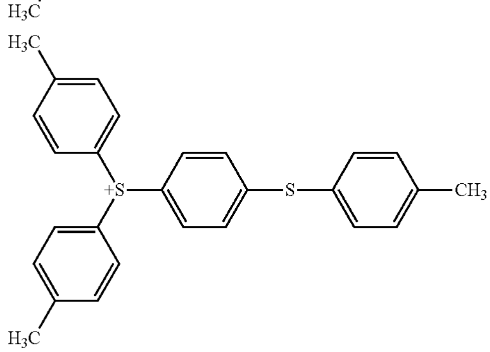
-continued
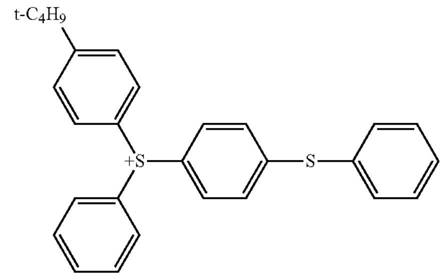
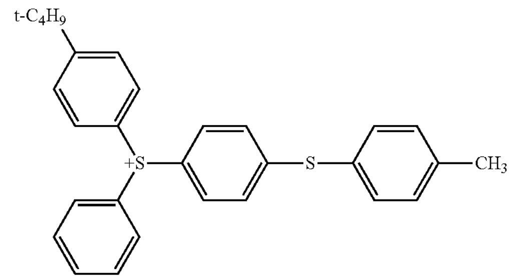
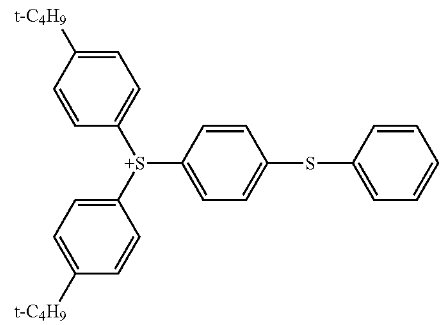
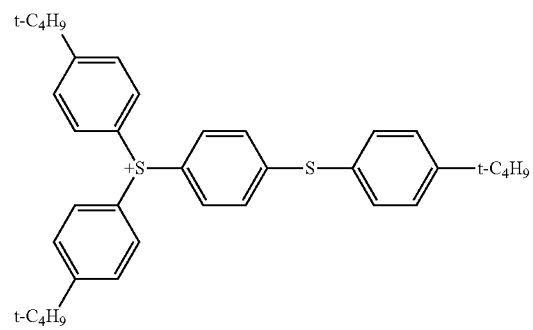
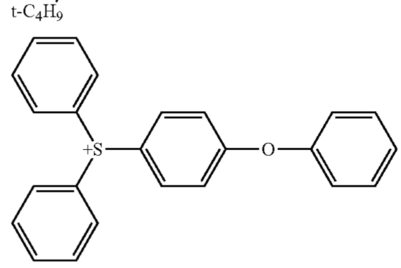
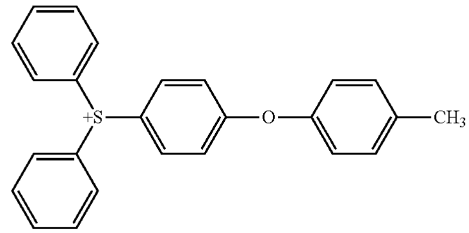

-continued
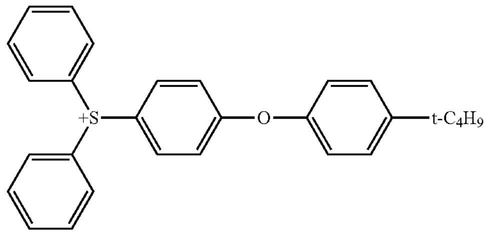
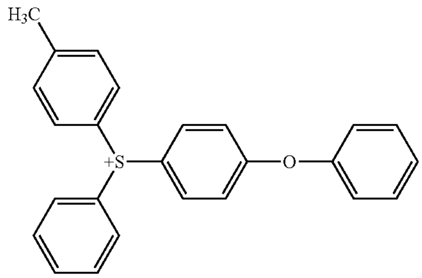
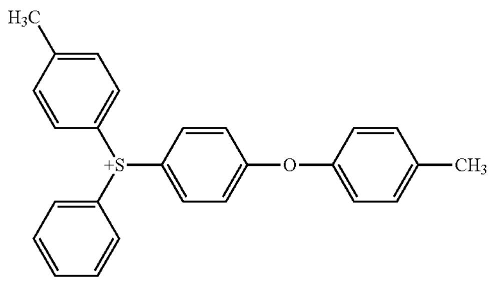
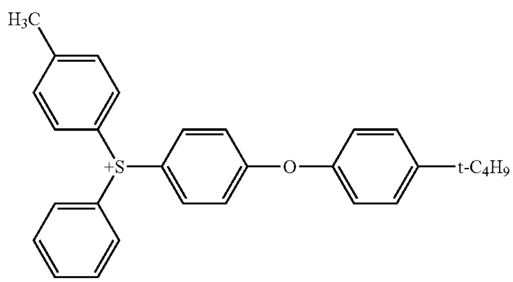
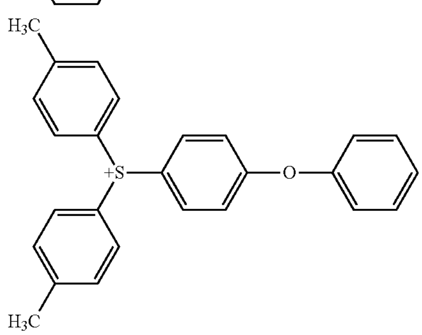
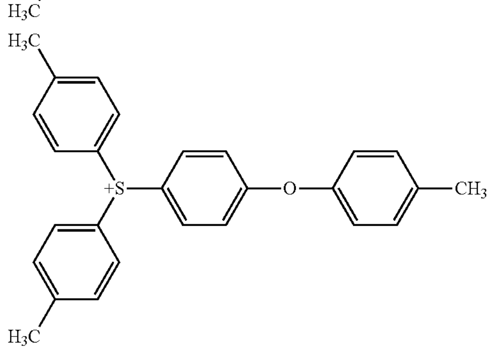
-continued
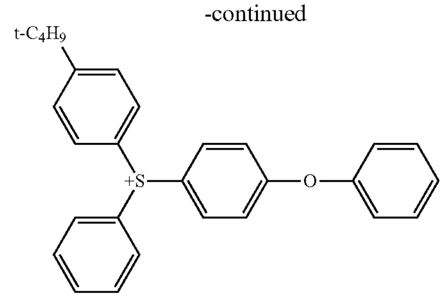
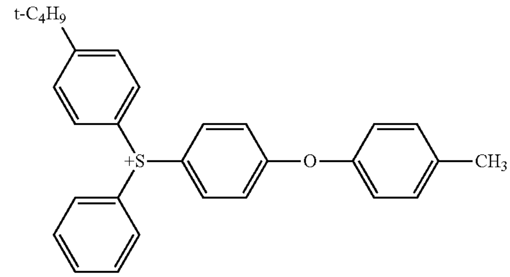
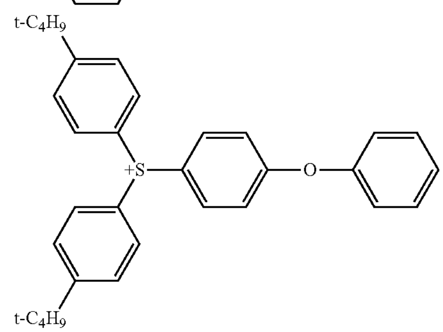
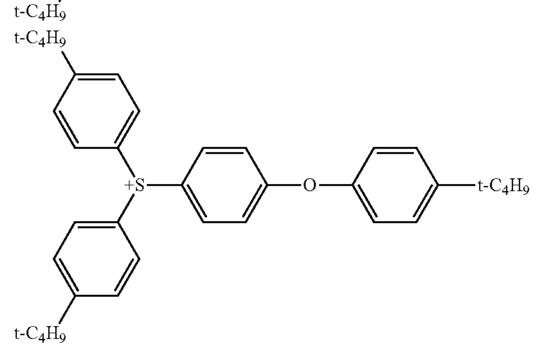
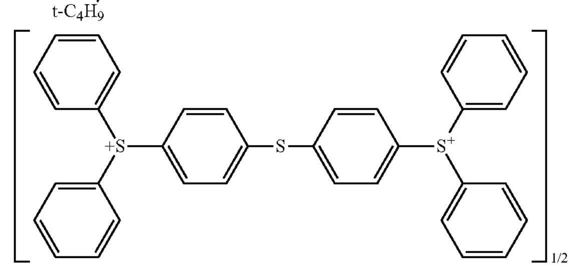
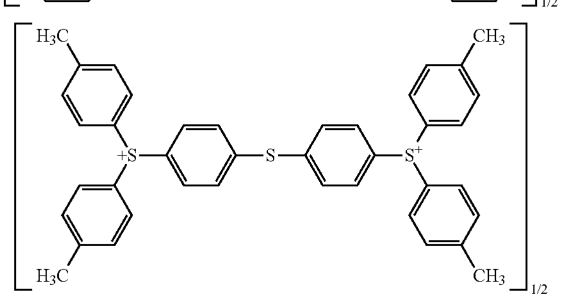

-continued

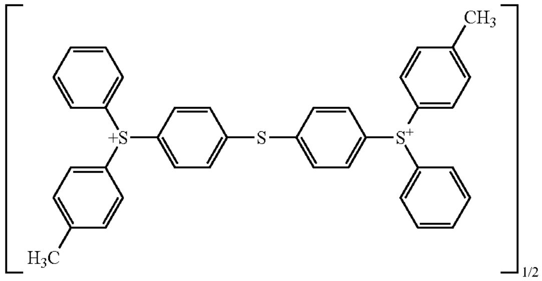

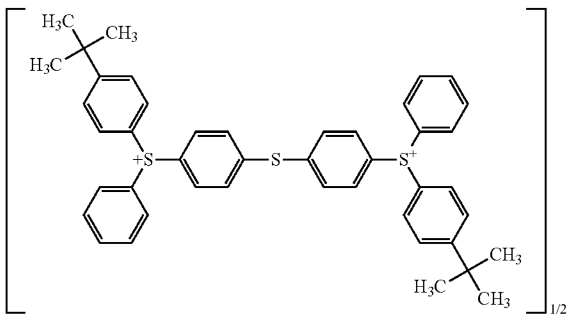

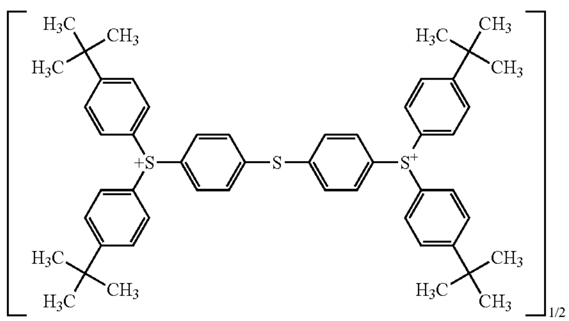

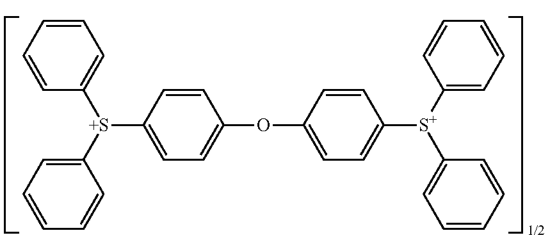

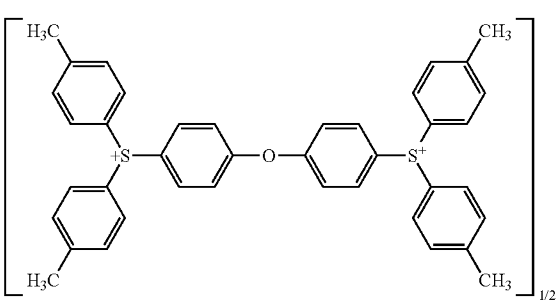

-continued

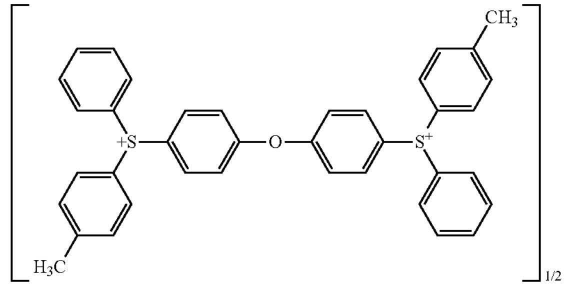

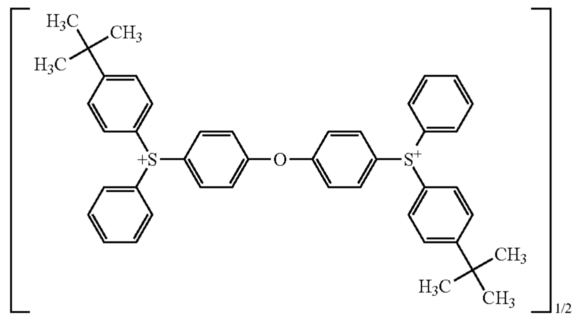

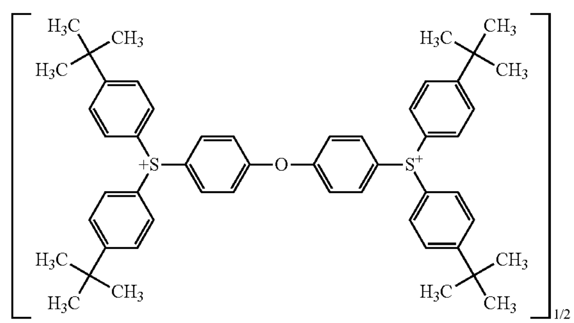

The acid generator (B1) is a compound in combination of the above sulfonate anion and an organic cation.

The above sulfonate anion and the organic cation may optionally be combined, a combination of any of the anion represented by the formula (b1-1-1) to the formula (b1-1-9) and the cation represented by the formula (b2-1-1), as well as a combination of any of the anion represented by the formula (b1-1-3) to the formula (b1-1-5) and the cation represented by the formula (b2-3) are preferable.

Preferred acid generators (B1) are a salt represented by the formula (B1-1) to the formula (B1-17). Among these, the formulae (B1-1), (B1-2), (B1-3), (B1-6), (B1-11), (B1-12), (B1-13) and (B1-14) which contain triphenyl sulfonium cation or tritolyl sulfonium cation are preferable, and the formulae (B1-1), (B1-2), (B1-3), (B1-11) and (B1-12) are more preferable.

-continued
(B1-1)
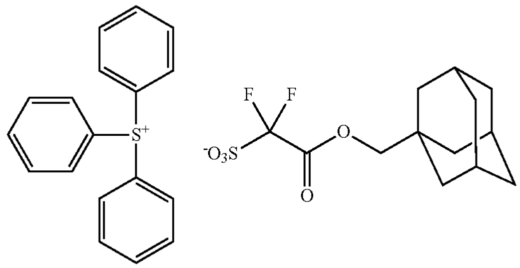
(B1-2)
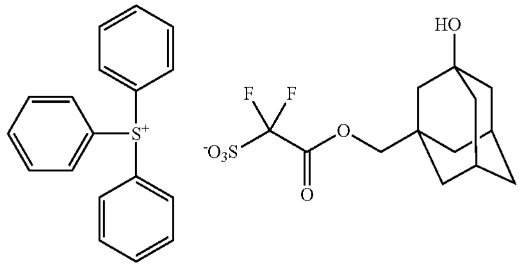
(B1-3)
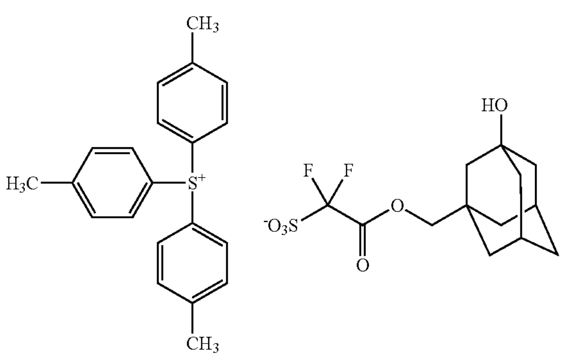
(B1-4)
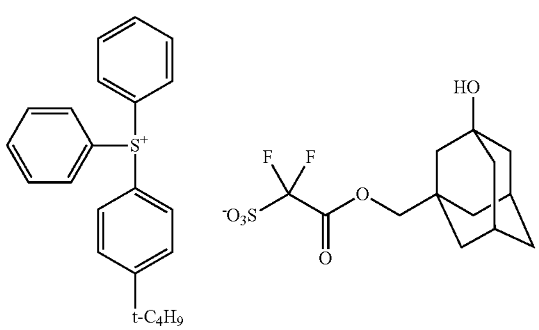
(B1-5)
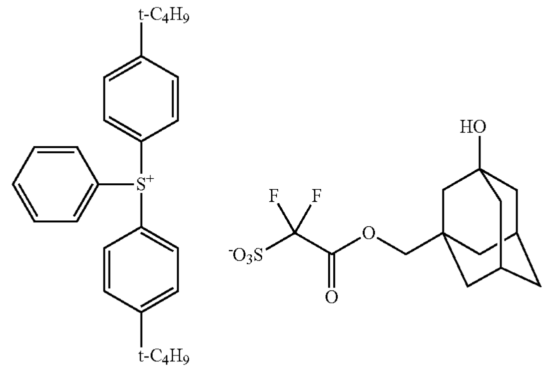
(B1-6)
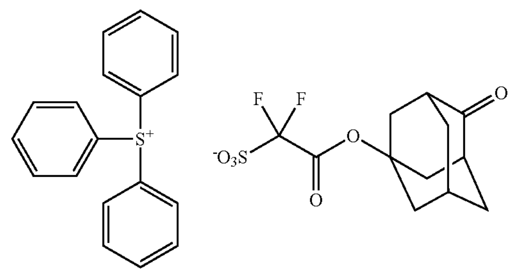
(B1-7)
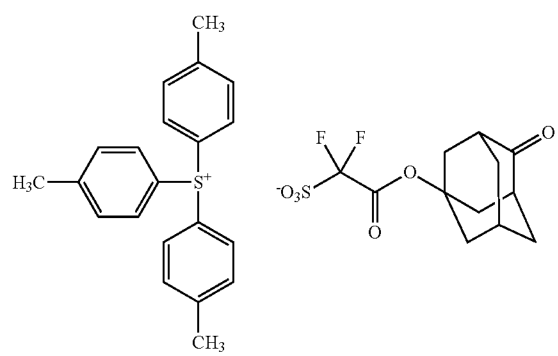
(B1-8)
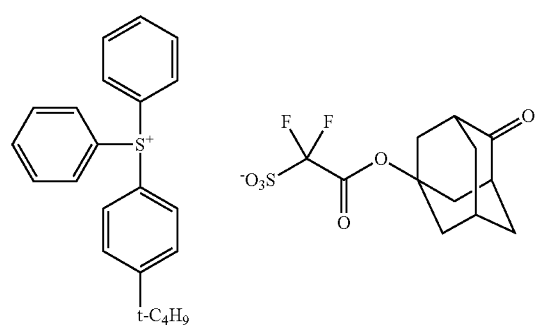

-continued (B1-9)

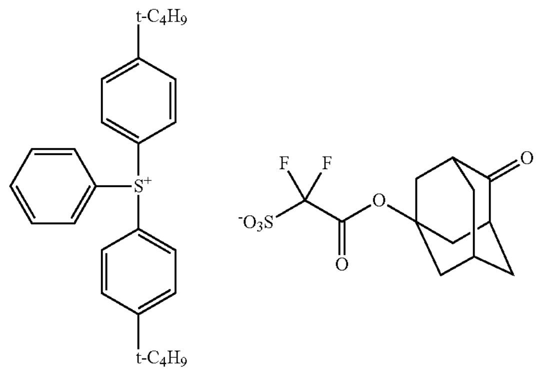

(B1-10)

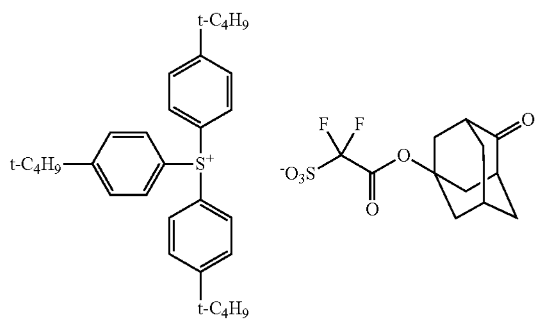

(B1-11)

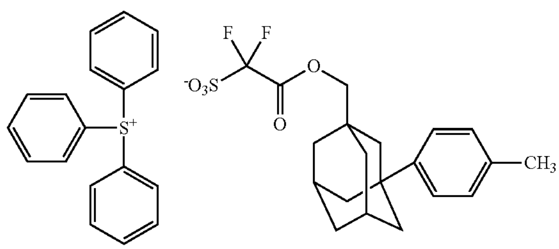

(B1-12)

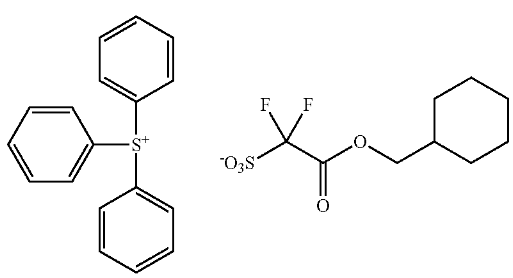

(B1-13)

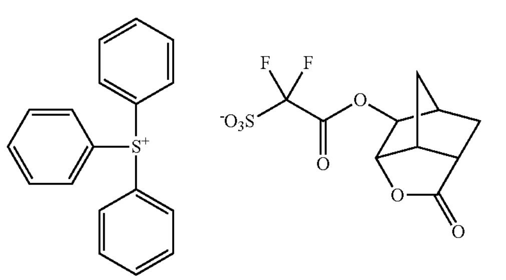

-continued (B1-14)

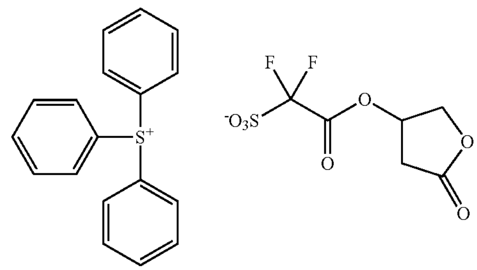

(B1-15)

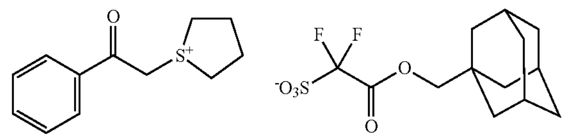

(B1-16)

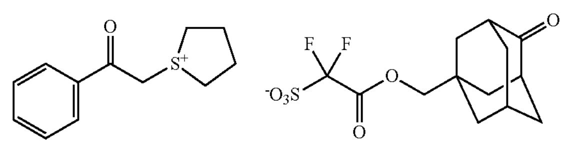

(B1-17)

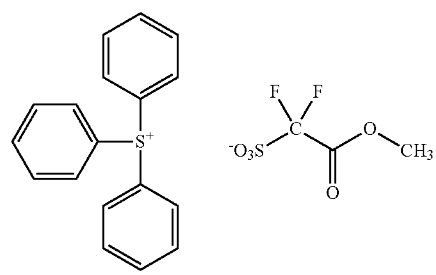

<Basic Compound (Hereinafter May be Referred to as "Basic Compound (C)">

The resist composition of the present invention may contain a basic compound (C). The basic compound (C) is a compound having a property to quench an acid generated from the acid generator, and called "quencher".

As the basic compounds (C), nitrogen-containing basic compounds (for example, amine and ammonium hydroxide) are preferable. The amine may be an aliphatic amine or an aromatic amine. The aliphatic amine includes any of a primary amine, secondary amine and tertiary amine. The aromatic amine includes an amine in which an amino group is bonded to an aromatic ring such as aniline, and an hetero-aromatic amine such as pyridine.

Preferred basic compounds (C) include an aromatic amine presented by the formula (C2), particularly an aromatic amine represented by the formula (C2-1).

(C2)

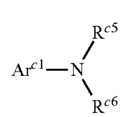

-continued (C2-1)

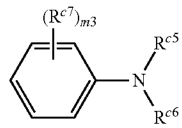

wherein $Ar^{c1}$ represents an aromatic hydrocarbon group;

$R^{c5}$ and $R^{c6}$ independently represent a hydrogen atom, an aliphatic hydrocarbon group (preferably a $C_1$ to $C_6$ chain aliphatic hydrocarbon group, i.e., alkyl group or $C_5$ to $C_{10}$ alicyclic hydrocarbon group, i.e., cycloalkyl group) or a aromatic hydrocarbon group, the hydrogen atom contained in the aliphatic hydrocarbon group, the alicyclic hydrocarbon group and the aromatic hydrocarbon group may be replaced by a hydroxy group, an amino group or a $C_1$ to $C_6$ alkoxyl group, the hydrogen atom contained in the amino group may be placed by a $C_1$ to $C_4$ alkyl group;

$R^{c7}$ in each occurrence independently represents a chain aliphatic hydrocarbon group (preferably a $C_1$ to $C_6$ alkyl), a $C_1$ to $C_6$ alkoxy group, an alicyclic hydrocarbon group (preferably a $C_5$ to $C_{10}$ alicyclic hydrocarbon group, and more preferably a $C_5$ to $C_{10}$ cycloalkyl) or a aromatic hydrocarbon group (preferably a $C_6$ to $C_{10}$ aromatic hydrocarbon group), the hydrogen atom contained in the aliphatic hydrocarbon group, the alkoxy group, the alicyclic hydrocarbon group and the aromatic hydrocarbon group may be replaced by a hydroxy group, an amino group or a $C_1$ to $C_6$ alkoxyl group, the hydrogen atom contained in the amino group may be placed by a $C_1$ to $C_4$ alkyl group;

m3 represents an integer of 0 to 3.

The aliphatic hydrocarbon group preferably has $C_1$ to $C_6$, the alicyclic hydrocarbon group preferably has $C_5$ to $C_{10}$, the aromatic hydrocarbon group preferably has $C_6$ to $C_{10}$; and the alkoxy group preferably has $C_1$ to $C_6$.

Specific examples of the aromatic amine represented by the formula ($C_2$) include 1-naphtylamine and 2-naphtylamine.

Specific examples of the aniline represented by the formula (C2-1) include aniline, diisopropylaniline, 2-, 3- or 4-methylaniline, 4-nitroaniline, N-methylaniline, N,N-dimethylaniline, and diphenylamine.

Also, examples of the basic compound (C) include compounds represented by the formula (C3) to the formula (C11);

(C3)

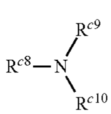

(C4)

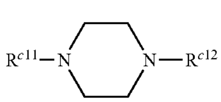

(C5)

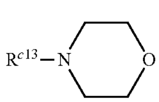

(C6)

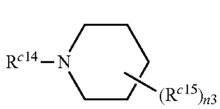

-continued (C7)

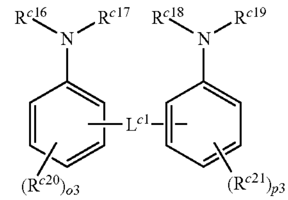

(C8)

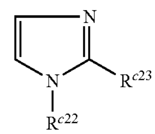

(C9)

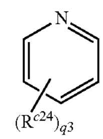

(C10)

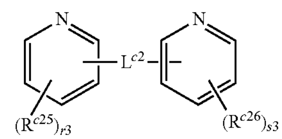

(C11)

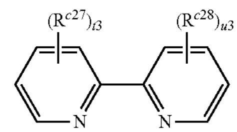

wherein $R^{c8}$, $R^{c20}$, $R^{c21}$, $R^{c23}$, $R^{c24}$, $R^{c25}$, $R^{c26}$, $R^{c27}$ and $R^{c28}$ independently represent any of the group as described in $R^{c7}$;

$R^{c9}$ to $R^{c14}$, $R^{c16}$ to $R^{c19}$ and $R^{c22}$ independently represent any of the group as described in $R^{c5}$ and $R^{c6}$;

$R^{c15}$ in each occurrence independently represents an aliphatic hydrocarbon group, an alicyclic hydrocarbon group or an alkanoyl group;

n3 represents an integer of 0 to 8;

o3 to u3 independently represent an integer of 0 to 3;

$L^{c1}$ and $L^{c2}$ independently represent a divalent aliphatic hydrocarbon group (preferably a $C_1$ to $C_6$ aliphatic hydrocarbon group, and more preferably a $C_1$ to $C_6$ alkanediyl group), —CO—, —C(═NH)—, —C(═$NR^{c3}$)—, —S—, —S—S— or a combination thereof;

$R^{c3}$ represents a $C_1$ to $C_4$ alkyl group.

The aliphatic hydrocarbon group of $R^{c15}$ is preferably a $C_1$ to $C_6$ aliphatic hydrocarbon group, the alicyclic hydrocarbon group is preferably a $C_3$ to $C_6$ alicyclic hydrocarbon group, and the alkanoyl group is preferably a $C_2$to $C_6$ alkanoyl group.

Example of the alkanoyl group include acetyl group, 2-methylacetyl group, 2,2-dimethylacetyl group, propionyl group, butyryl group, isobutyryl group, pentanoyl group, and 2,2-dimethylpropionyl group.

Specific examples of the compound represented by the formula (C3) include, for example, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributyiamine, tripentylamine, trihexylamine, triheptylamine, trioetylamine, trinonyiamaline, tridecylamine, methyldibutylamine, methyldipentylamine, methyldihexylamine, methyldicyclohexylamine, methyldiheptylarnine, methyldioctylamine, methyldinonylamine, methyldidecylamine, ethyldibutylamine, ethyldipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolarmine, ethylene diamine, tetramethylene diamine, hexamethylene diamine, 4,4'-diamino-1,2-diphenylethane, 4,4'-diamino-3,3'-dimethyldiphenylmethane and 4,4'-diamino-3,3'-diethyldiphenylmethane.

Specific examples of the compound represented by the formula (C4) include, for example, piperazine.

Specific examples of the compound represented by the formula (C5) include, for example, morpholine.

Specific examples of the compound represented by the formula (C6) include, for example, piperizine, a hindered amine compound having piperizine skeleton described in JP H11-52575-A.

Specific examples of the compound represented by the formula (C7) include, for example, 2,2'-methylenebisaniline.

Specific examples of the compound represented by the formula (C8) include, for example, imidazole and 4-methylimidazole.

Specific examples of the compound represented by the formula (C9) include, for example, pyrizine and 4-methylpyrizine.

Specific examples of the compound represented by the formula (C10) include, for example, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine and 2,2'-dipicolylamine.

Specific examples of the compound represented by the formula (C11) include, for example, bipyridine.

Examples of the ammonium hydroxide include tetramethylammonium hydroxide, tetraisopropylammonium hydroxide, tetrabutylammonium hydroxide, tetrahexylammonium hydroxide, tetraoctylammonium hydroxide, phenyltrimethyl ammonium hydroxide, 3-(trifluoromethyl)phenyltrimethylammonium hydroxide, tetra-n-butyl ammonium salicylate and choline.

Among these, diisopropylaniline (particularly 2,6-diisopropylaniline) is preferable as the basic compounds (C) contained in the present resist compound.

<Solvent (Hereinafter May be Referred to "Solvent (D)">

The resist composition of the present invention may include a solvent (D). The solvent (D) can be preferably selected depending on the kinds and an amount of the resin (A) having the structural unit derived from the compound (a), i.e., the resin (AA) or the resin (AB), and a kind and an amount of the acid generator from a viewpoint of good coating properties.

Examples of the solvent (D) include glycol ether esters such as ethylcellosolve acetate, methylcellosolve acetate and propylene glycol monomethyl ether acetate; ethers such as diethylene glycol dimethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents may be used as a single solvent or as a mixture of two or more solvents.

<Other Ingredient (Hereinafter May be Referred to "Other Ingredient (F)">

The resist composition can also include various additives as needed. Examples of the other ingredient (F) include sensitizers, dissolution inhibitors, surfactants, stabilizers and dyes.

<Preparing the Resist Composition>

The present resist composition can be prepared by mixing the resin (A) (in particular the resin (AA)) and the acid generator (B), or by mixing the resin (A) (in particular the resin (AA)), the acid generator (B1), and the basic compound (C), the solvent (D) and the other ingredient (F) as needed. There is no particular limitation to the order of mixing. The mixing may be performed in an arbitrary order. The temperature of mixing may be adjusted to an appropriate temperature within the range of 10 to 40° C., depending on the kinds of the resin having the structural unit derived from the compound (a) and solubility in the solvent (D) of the resin having the structural unit derived from the compound (a). The time of mixing may be adjusted to an appropriate time within the range of 0.5 to 24 hours, depending on the mixing temperature. There is no particular limitation to the tool for mixing. An agitation mixing may be adopted.

After mixing the above ingredients, the present resist compositions can be prepared by filtering the mixture through a filter having about 0.01 to 0.2 μm pore diameter.

The resist composition of the present invention preferably contains 80 weight % or more and 99 weight % or less of the resin (A) with respect to the total solid proportion of the resist composition, if the resin (AA) is used as the resin (A).

The resist composition of the present invention preferably contains 0.1 weight % or more and 10 weight % or less of the resin (A) with respect to the total solid proportion of the resist composition, if the resin (AB) is used as the resin (A).

In the specification, the term "solid proportion of the resist composition" means the entire proportion of all ingredients other than the solvent (D). For example, if the proportion of the solvent (D) is 90 weight %, the solid proportion of the resist composition is 10 weight %.

In the resist composition of the present invention, the proportion of the acid generator (B) is preferably 1 part by weight or more (and more preferably 3 parts by weight or more), and also preferably 30 parts by weight or less (and more preferably 25 parts by weight or less), with respect to 100 parts by weight of the resin (A).

The proportion of the acid generator (B) is preferably 1 part by weight or more (and more preferably 3 parts by weight or more), and also preferably 30 parts by weight or less (and more preferably 25 parts by weight or less), with respect to 100 parts by weight of the resin (X), if the resin (AB) and the resin (X) in stead of the resin (AA) are used as the resin (A).

When the resist composition includes the basic compound (C), the proportion thereof is preferably 0.01 to 1 weight % with respect to the total solid proportion of the resist composition.

The proportion of the solvent may be adjusted depending on the kinds of the resin (A), and it may be 90 weight % or more, preferably 92 weight % or more, and more preferably 94 weight % or more, and also preferably 99.9 weight % or less and more preferably 99 weight % or less. If the resist composition contains the solvent within such range, such resist composition is preferable for forming the thin resist film which can be used for producing a composition layer of 30 to 300 nm thick.

The proportion of the resin (A), the acid generator (B), the basic compound (C), and solvent (D) can be adjusted depending on each ingredient used during the preparation of the present resist composition, and can be measured with a known analytical method such as, for example, liquid chromatography and gas chromatography, after preparing the present resist composition.

If the other ingredient (F) is used in the present resist composition, the proportion thereof can also be adjusted depending on the kinds thereof.

<Method for Forming Resist Pattern>

The method for forming resist pattern of the present invention includes the steps of:

(1) applying the resist composition of the present invention onto a substrate;

(2) drying the applied composition to form a composition layer;

(3) exposing the composition layer using an exposure apparatus;

(4) heating the exposed composition layer, and (5) developing the heated composition layer using a developing apparatus.

Applying the resist composition onto the substrate can generally be carried out through the use of a resist application device, such as a spin coater known in the field of semiconductor microfabrication technique. The thickness of the applied resist composition layer can be adjusted by controlling the variable conditions of the resist application device. These conditions can be selected based on a pre-experiment carried out beforehand. The substrate can be selected from various substrates intended to be microfabricated. The substrate may be washed, and an organic antireflection film may be formed on the substrate by use of a commercially available antireflection composition, before the application of the resist composition.

Drying the applied composition layer, for example, can be carried out using a heating device such as a hotplate (so-called "prebake"), a decompression device, or a combination thereof. Thus, the solvent evaporates from the resist composition and a composition layer with the solvent removed is formed. The condition of the heating device or the decompression device can be adjusted depending on the kinds of the solvent used. The temperature in this case is generally within the range of 50 to 200° C. Moreover, the pressure is generally within the range of 1 to $1.0\times10^5$ Pa.

The composition layer thus obtained is generally exposed using an exposure apparatus or a liquid immersion exposure apparatus. The exposure is generally carried out through a mask that corresponds to the desired pattern. Various types of exposure light source can be used, such as irradiation with ultraviolet lasers such as KrF excimer laser (wavelength: 248 nm), ArF excimer laser (wavelength: 193 nm), $F_2$ excimer laser (wavelength: 157 nm), or irradiation with far-ultraviolet wavelength-converted laser light from a solid-state laser source (YAG or semiconductor laser or the like), or vacuum ultraviolet harmonic laser light or the like. Also, the exposure device may be one which irradiates electron beam or extreme-ultraviolet light (EUV).

The composition layer may be formed with an exposed portion and an unexposed portion by the above exposure carried out through the mask. In the exposed portion, acid is produced from the acid generator contained in the resist composition upon receiving the energy of the exposure. Thus, the acid-labile group contained in the resin (AA) or the resin (X) reacts with the acid to eliminate the protecting group. As the result, the resin in the exposed portion of the composition layer becomes soluble in an alkali aqueous solution. On the other hand, in the unexposed portion, the resin (AA) or the resin (X) remains insoluble or poorly soluble in an alkali aqueous solution because of the lack of exposure. In this way, the solubility in the alkali solution will be different between the composition layer in the exposed portion and the composition layer in the unexposed portion.

After exposure, the composition layer is subjected to a heat treatment (so-called "post-exposure bake") to promote the deprotection reaction. The heat treatment can be carried out using a heating device such as a hotplate. The heating temperature is generally in the range of 50 to 200° C., preferably in the range of 70 to 150° C.

The composition layer is developed after the heat treatment, generally with an alkaline developing solution and using a developing apparatus. The development here means to bring the composition layer after the heat treatment into contact with an alkaline solution. Thus, the exposed portion of the composition layer is dissolved by the alkaline solution and removed, and the unexposed portion of the composition layer remains on the substrate, whereby producing a resist pattern. Here, as the alkaline developing solution, various types of aqueous alkaline solutions used in this field can be used. Examples include aqueous solutions of tetramethylammonium hydroxide and (2-hydroxyethyl)trimethylammonium hydroxide (common name: choline).

After the development, it is preferable to rinse the substrate and the pattern with ultrapure water and to remove any residual water thereon.

According to the method for producing resist pattern of the present invention, it is possible to form a resist pattern with an excellent MEF and with few defects in the pattern.

<Application>

The resist composition of the present invention is useful as the resist composition for excimer laser lithography such as with ArF, KrF or the like, and the resist composition for electron beam (EB) exposure lithography and extreme-ultraviolet (EUV) exposure lithography, as well as liquid immersion exposure lithography.

The resist composition of the present invention can be used in semiconductor microfabrication and in manufacture of liquid crystals, thermal print heads for circuit boards and the like, and furthermore in other photofabrication processes, which can be suitably used in a wide range of applications.

EXAMPLES

The present invention will be described more specifically by way of examples, which are not construed to limit the scope of the present invention.

All percentages and parts expressing the proportion or amounts used in the Examples and Comparative Examples are based on weight, unless otherwise specified.

The structures of the compounds were verified by mass analysis (LC: Agilent 1100 type, MASS: Agilent LC/MSD type or LC/MSD TOF type).

The weight average molecular weight is a value determined by gel permeation chromatography using polystyrene as the standard product.

Column: TSKge1 Multipore HXL-Mx3 connecting+guardcolumn (Tosoh Co. ltd.)

Eluant: tetrahydrofuran

Flow rate: 1.0 mL/min

Detecting device: RI detector

Column temperature: 40° C.

Injection amount: 100 μL

Standard material for calculating molecular weight: standard polysthylene (Tosoh Co., ltd.)

Synthesis Example 1

Synthesis of Compound (I)

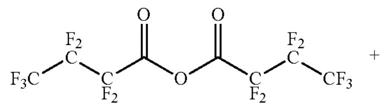

(I-1)

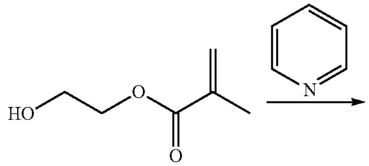

(I-2)

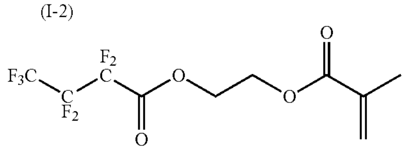

(I)

10.00 parts of a compound (I-2), 40.00 parts of tetrahydrofuran and 7.29 parts of pyridine were introduced into a reactor, and stirred for 30 minutes at 23° C. The obtained mixture was cooled to 0° C. To this mixture, 33.08 parts of a compound (I-1) was added over 1 hour while maintaining at the same temperature. The temperature of the mixture was then elevated to about 23° C., and the mixture was stirred for 3 hours at the same temperature. 361.51 parts of ethyl acetate and 20.19 parts of 5% hydrochloric acid solution were added to the obtained reactant, and stirred for 30 minutes at 23° C. Then, after allowed to stand, the obtained solution was separated to recover an organic layer. To the organic layer, 81.42 parts of a saturated sodium hydrogen carbonate was added, and the obtained solution was stirred for 30 minutes at 23° C., allowed to stand, and then separated to recover the organic layer. To the recovered organic layer, 90.38 parts of ion-exchanged water was added, and the obtained solution was stirred for 30 minutes at 23° C., allowed to stand, and then separated to wash the organic layer with water. The water washing operation was repeated for 5 times. The obtained organic layer was concentrated, resulting in 23.40 parts of the compound (I).

MS (mass spectroscopy): 326.0 (molecular ion peak)

Synthesis Example 2

Synthesis of Compound (J)

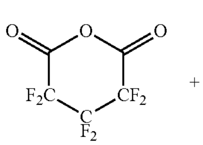

(J-1)

-continued

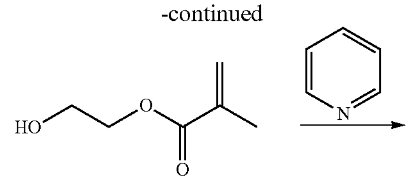

(J-2)

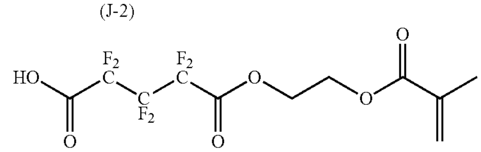

(J-3)

8.50 parts of a compound (J-2), 34.00 parts of tetrahydrofuran and 6.20 parts of pyridine were introduced into a reactor, and stirred for 30 minutes at 23° C. The obtained mixture was cooled to 0° C. To this mixture, 13.78 parts of a compound (J-1) was added over 1 hour while maintaining at the same temperature. The temperature of the mixture was then elevated to about 23° C., and the mixture was stirred for 3 hours at the same temperature. 249.91 parts of ethyl acetate and 17.16 parts of 5% hydrochloric acid were added to the obtained reactant, and stirred for 30 minutes at 23° C. Then, after allowed to stand, the obtained solution was separated to recover an organic layer. To the recovered organic layer, 62.62 parts of a saturated sodium hydrogen carbonate was added, and the obtained solution was stirred for 30 minutes at 23° C., allowed to stand, and then separated to recover the organic layer. To the recovered organic layer, 62.62 parts of ion-exchanged water was added, and the obtained solution was stirred for 30 minutes at 23° C., allowed to stand, and then separated to wash the organic layer with water. The water washing operation was repeated for 5 times. The obtained organic layer was concentrated, thus obtained concentrate was fractionated by a column (conditions: silica gel 60-200 mesh of a stationary bed manufactured by Merck, ethyl acetate of a developing solvent), resulting in 13.00 parts of the compound (J-3).

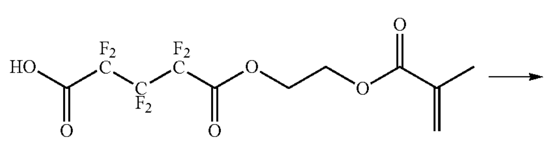

(J-3)

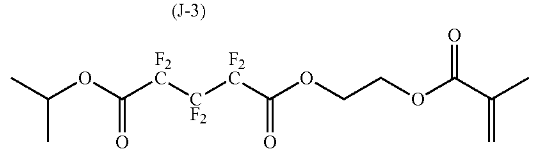

(J)

13.00 parts of a compound (J-3), 39.00 parts of isopropanol and 0.20 parts of sulfuric acid were introduced into a reactor, and stirred for 3 hours at 85° C. The obtained reactant was cooled to 23° C. To the obtained reactant was added 156.59 parts of ethyl acetate and 42.00 parts of saturated sodium hydrogen carbonate, and the obtained solution was stirred for 30 minutes at 23° C., allowed to stand, and then separated to recover an organic layer. To the recovered organic layer, 39.15 parts of ion-exchanged water was added, and the obtained solution was stirred for 30 minutes at 23° C., allowed to stand, and then separated to wash the organic layer with water. The water washing operation was repeated for 5 times. The obtained organic layer was concentrated, thus obtained concentrate was fractionated by a column (conditions: silica gel 60-200 mesh of a stationary bed manufactured by Merck, n-heptane/ethyl acetate=1/1 of a developing solvent), resulting in 11.64 parts of the compound (J).

MS (mass spectroscopy): 394.1 (molecular ion peak)

Synthesis Example 3

Synthesis of Compound (O)

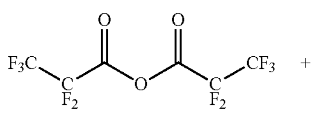

(O-1)

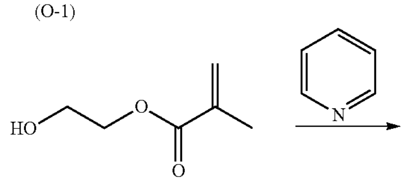

(O-2)

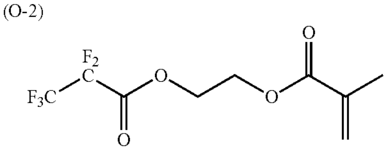

(O)

88.00 parts of a compound (O-2), 616.00 parts of methyl isobutyl ketone and 60.98 parts of pyridine were mixed while stirring for 30 minutes at 23° C. The obtained mixture cooled to 0° C. To this mixture, 199.17 parts of a compound (O-1) was added over 1 hour while maintaining at the same temperature. The temperature of the mixture was then elevated to about 10° C., and the mixture was stirred for 1 hour at the same temperature. Thus obtained reactant was added to 1446.22 parts of n-heptane and 703.41 parts of 2% of hydrochloric acid solution to obtain a mixture, the mixture was stirred for 30 minutes at 23° C. The obtained solution was allowed to stand, and then separated to recover an organic layer. To the organic layer 337.64 parts of 2% of hydrochloric acid solution was added, and the obtained solution was stirred for 30 minutes at 23° C., allowed to stand, and then separated to recover the organic layer. To the recovered organic layer, 361.56 parts of ion-exchanged water was added., and the obtained solution was stirred for 30 minutes at 23° C., allowed to stand, and then separated to wash the organic layer with water. To the organic layer, 443.92 parts of 10% of potassium carbonate aqueous solution was added, and the obtained solution was stirred for 30 minutes at 23° C., allowed to stand, and then separated to recover the organic layer. The operation was repeated the 2 times. To the recovered organic layer, 361.56 parts of ion-exchanged water was added, and the obtained solution was stirred for 30 minutes at 23° C., allowed to stand, and then separated to wash the organic layer with water. The water washing operation was repeated for 5 times. The obtained organic layer was concentrated, whereby resulting in 163.65 parts of the compound (O).

MS (mass spectroscopy): 276.0 (molecular ion peak)

Synthesis Example 4

Synthesis of Compound (P)

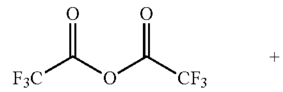

(P-1)

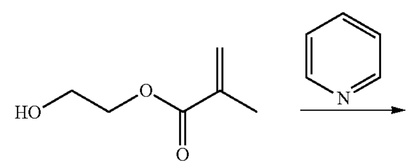

(P-2)

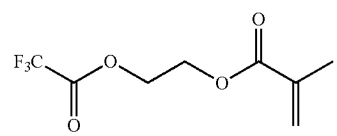

(P)

80.00 parts of a compound (P-2), 560.00 parts of methyl isobutyl ketone and 58.35 parts of pyridine were mixed while stirring for 30 minutes at 23° C. The obtained mixture was cooled to 0° C. To this mixture, 135.57 parts of a compound (P-1) was added over 1 hour while maintaining at the same temperature, elevated the temperature to about 10° C., and stirred for 1 hour at the same temperature. To the obtained reactant, 2084.79 parts of ethyl acetate, 323.10 parts of 5% of hydrochloric acid solution and 521.20 parts of ion-exchanged water were added, the mixture was stirred for 30 minutes at 23° C. The obtained solution was allowed to stand, and then separated to recover an organic layer. To the recovered organic layer, 521.20 parts of ion-exchanged water was added, and the obtained solution was stirred for 30 minutes at 23° C., allowed to stand, and then separated to wash the organic layer with water. To the washed organic layer, 267.63 parts of 10% of potassium carbonate aqueous solution was added, and the obtained solution was stirred for 30 minutes at 23° C., allowed to stand, and then separated to wash the organic layer. The washing operation was repeated for 2 times. To the recovered organic layer, 521.20 parts of ion-exchanged water was added, and the obtained solution was stirred for 30 minutes at 23° C., allowed to stand, and then separated to wash the organic layer with water. The water washing operation was repeated for 4 times. The obtained organic layer was concentrated, resulting in 130.40 parts of the compound (P).

MS (mass spectroscopy): 226.1 (molecular ion peak)

Synthesis Example 5

Synthesis of Compound (Q)

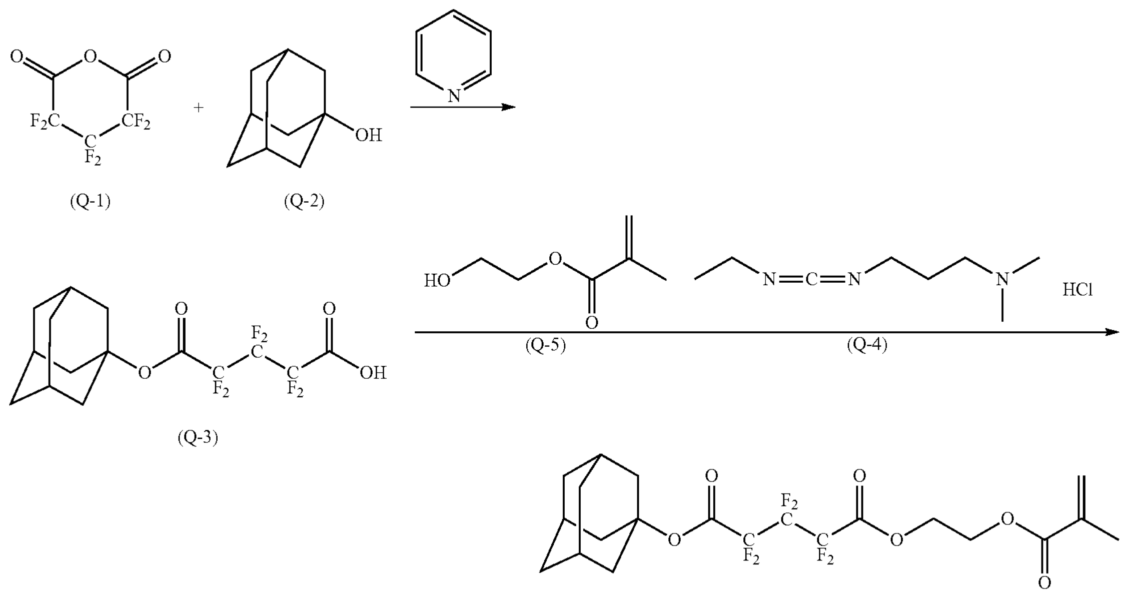

(Q)

9.60 parts of a compound (Q-2), 38.40 parts of tetrahydrofuran and 5.99 parts of pyridine were mixed, and stirred for 30 minutes at 23° C. The obtained mixture was cooled to 0° C. To this mixture, 14.00 parts of a compound (Q-1) was added over 1 hour while maintaining at the same temperature. The temperature of the mixture was then elevated to about 10° C., and stirred for 1 hour at the same temperature. To thus obtained reactant containing a compound (Q-3) was added 14.51 parts of a compound (Q-4) (1-(3-dimethylaminopropyl)-3-ethylcarbodiimide hydrochloride) and 8.20 parts of a compound (Q-5), and stirred for 3 hours at 23° C. 271.95 parts of ethyl acetate and 16.57 parts of 5% of hydrochloric acid solution were added to the obtained reactant solution, and stirred for 30 minutes at 23° C. Then, after allowed to stand, the obtained solution was separated to recover an organic layer. To the recovered organic layer, 63.64 parts of a saturated sodium hydrogen carbonate was added, and the obtained solution was stirred for 30 minutes at 23° C., allowed to stand, and then separated to wash the organic layer. The washing operation was repeated 2 times. To the washed organic layer, 67.99 parts of ion-exchanged water was added and the obtained solution was stirred for 30 minutes at 23° C., allowed to stand, and then separated to wash the organic layer with water. The water washing operation was repeated for 5 times. The obtained organic layer was concentrated, to thus obtained concentrate was added 107.71 parts of ethyl acetate, and stirred until being completely dissolved. After that, 646.26 parts of n-heptane was added thereto in the form of drops. Then, the obtained solution was stirred for 30 minutes at 23° C., and filtrated, resulting in 15.11 parts of the compound (Q).

MS (mass spectroscopy): 486.2 (molecular ion peak)

Synthesis Example 6

Synthesis of Compound (R)

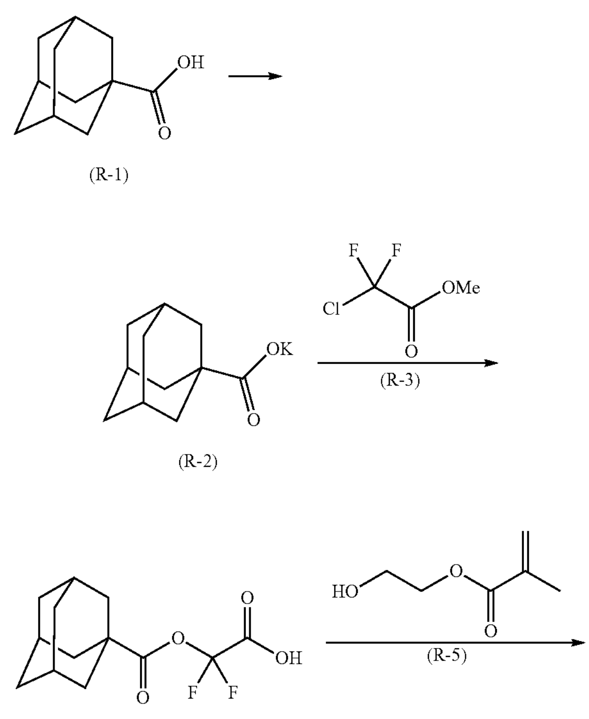

(R-4)

-continued

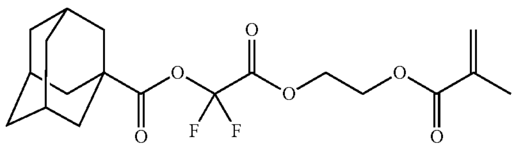

(R)

5.00 parts of a compound (R-1), 20.00 parts of dimethyl formamide and 2.30 parts potassium carbonate were mixed and stirred for 1 hour at 40° C. To thus obtained reactant mixture containing a compound (R-2) was added 6.59 parts of a compound (R-3), and the obtained mixture was stirred for 10 hours at 60° C. Thus obtained reactant solution was added to 100.00 parts of ethyl acetate and 24.30 parts of 5% of hydrochloric acid solution to obtain a mixture, the mixture was stirred for 30 minutes at 23° C., The obtained solution was allowed to stand and then separated to recover an organic layer. To the organic layer, 50.00 parts of ion-exchanged water was added, and the obtained solution was stirred for 30 minutes at 23° C., allowed to stand, and then separated to wash the organic layer with water. The water washing operation was repeated for 5 times. The obtained organic layer was concentrated, resulting in 5.70 parts of a compound (R-4).

5.70 parts of the obtained compound (R-4), 3.70 parts of a compound (R-5), 36.47 parts of toluene and 0.05 parts of sulfuric acid were mixed, and obtained mixture was thermal-dehydrated for 6 hours at 115° C. The obtained reactant solution was cooled, and 200.00 parts of ethyl acetate, 125.00 parts of ion-exchanged water and 3.00 parts of sodium hydrogen carbonate were added thereto, and the obtained solution was stirred for 30 minutes at 23° C., allowed to stand, and then separated to recover an organic layer. To the recovered organic 125.00 parts of ion-exchanged water was added and the obtained solution was stirred for 30 minutes at 23° C., allowed to stand, and then separated to wash the organic layer with water. The water washing operation was repeated for 5 times. The obtained organic layer was concentrated, thus obtained concentrate was fractionated by a column (conditions: silica gel 60-200 mesh of a stationary bed manufactured by Merck, ethyl acetate of a developing solvent), resulting in 4.82 parts of a compound (R).

MS (mass spectroscopy): 386.2 (molecular ion peak)

Synthesis Example 7

Synthesis of Compound (U)

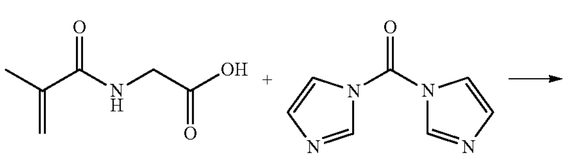

(U-1) (U-2)

-continued

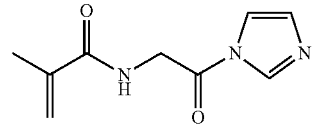

(U-3)

33.25 parts of a compound (U-1), 23.93 parts of dichlorohexyl carbodiimide and 40.00 parts of methylene chloride were introduced into a reactor and mixed. The obtained mixture was cooled to 0° C., and 18.83 parts of a compound (U-2) was added thereto. The mixture was stirred for 1 hour at 0° C. The temperature of the mixture was then elevated to about 23° C., and the mixture was stirred for 30 minutes. The mixture was filtrated to remove an insoluble matter, and the obtained filtrate was concentrated, resulting in 44.19 parts of a compound (U-3).

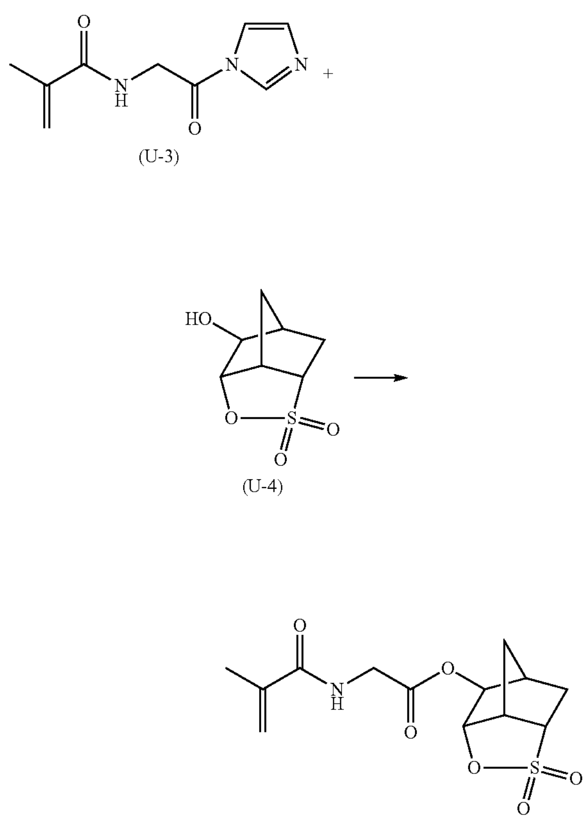

(U)

19.33 parts of the obtained compound (U-3), 19.02 parts of a compound (U-4) and 200 parts of acetonitrile were introduced into a reactor, mixed, and stirred for 3 hours at 50° C. The obtained mixture was concentrated, and 300 parts of chloroform and 150 parts of ion-exchanged water were added thereto. The obtained solution was separated to recover an organic layer. The recovered organic layer was washed by 150 parts of ion-exchanged water, and concentrated. The obtained concentrate was fractionated by a column (conditions: silica gel 60-200 mesh of a stationary phase manufactured by Merck, ethyl acetate of a developing solvent), resulting in 14.58 parts of the compound (U).

MS (mass spectroscopy): 315.1 (molecular ion peak)

Synthesis Example 8

Synthesis of Compound (X)

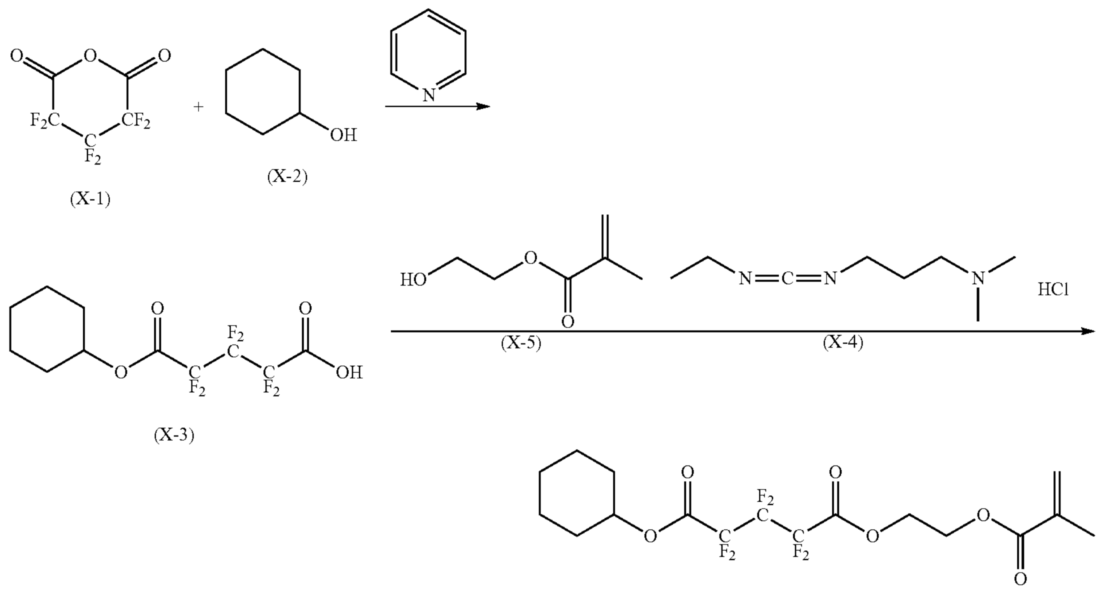

(X)

6.32 parts of a compound (X-2), 30.00 parts of tetrahydrofuran and 5.99 parts of pyridine were mixed while stirring for 30 minutes at 23° C. The obtained mixture was cooled to 0° C. To this mixture, 14.00 parts of a compound (X-1) was added over 1 hour while maintaining at the same temperature. The temperature of the mixture was then elevated to about 10° C., and the mixture was stirred for 1 hour at the same temperature. To thus obtained reactant containing a compound (X-3) was added 14.51 parts of a compound (X-4) (1-(3-dimethylaminopropyl)-3-ethylcarbodiimide hydrochloride) and 8.20 parts of a compound (X-5), and stirred for 3 hours at 23° C. 270 parts of ethyl acetate and 16.57 parts of 5% hydrochloric acid solution were added to the obtained reactant solution, and stirred for 30 minutes at 23° C. Then, after allowed to stand, the obtained solution was separated to recover an organic layer. To the recovered organic layer, 65 parts of a saturated sodium hydrogen carbonate was added, and the obtained solution was stirred for 30 minutes at 23° C., allowed to stand, and then separated to wash the organic layer. The washing operation was repeated for 2 times. To the washed organic layer, 65 parts of ion-exchanged water was added and the obtained solution was stirred for 30 minutes at 23° C., allowed to stand, and then separated to wash the organic layer with water. The water washing operation was repeated for 5 times. The obtained organic layer was concentrated, thus obtained concentrate was fractionated by a column (conditions: silica gel 60-200 mesh of a stationary phase manufactured by Merck, n-heptane/ethyl acetate of a developing solvent), resulting in 9.90 parts of the compound (X).

MS (mass spectroscopy): 434.1 (molecular ion peak)

Synthesis Example 9

Synthesis of Compound (Y)

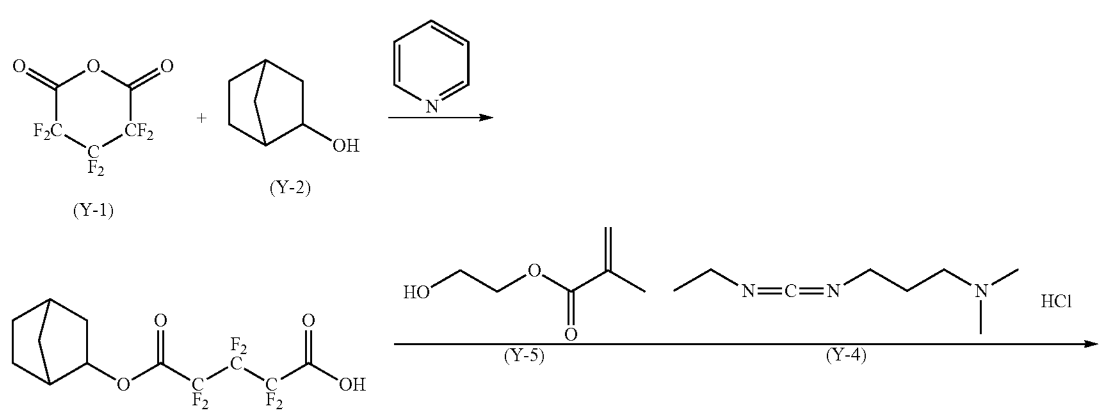

(Y-3)

-continued

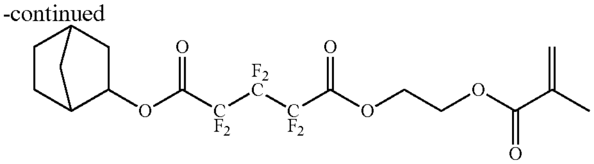

(Y)

7.08 parts of a compound (Y-2), 30.00 parts of tetrahydrofuran and 5.99 parts of pyridine were mixed while stirring for 30 minutes at 23° C. The obtained mixture was cooled to 0° C. To this mixture, 14.00 parts of a compound (Y-1) was added over 1 hour while maintaining at the same temperature. The temperature of the mixture was then elevated to about 10° C., and the mixture was stirred for 1 hour at the same temperature. To thus obtained reactant containing a compound (Y-3) was added 14.51 parts of a compound (Y-4) (1-(3-dimethylaminopropyl)-3-ethylcarbodiimide hydrochloride) and 8.20 parts of a compound (Y-5), and stirred for 3 hours at 23° C. 270 parts of ethyl acetate and 16.57 parts of 5% hydrochloric acid solution were added to the obtained reactant solution, and stirred for 30 minutes at 23° C. Then after allowed to stand, the obtained solution was separated to recover an organic layer. To the recovered organic layer, 65 parts of a saturated sodium hydrogen carbonate was added, and the obtained solution was stirred for 30 minutes at 23° C., allowed to stand, and then separated to wash the organic layer. The washing operation was repeated for 2 times. To the washed organic layer, 65 parts of ion-exchanged water was added and the obtained solution was stirred for 30 minutes at 23° C., allowed to stand, and then separated to wash the organic layer with water. The water washing operation was repeated for 5 times. The obtained organic layer was concentrated, thus obtained concentrate was fractionated by a column (conditions: silica gel 60-200 mesh of a stationary phase manufactured by Merck, n-heptane/ethyl acetate of a developing solvent), resulting in 10.24 parts of the compound (Y).

MS (mass spectroscopy): 446.1 (molecular ion peak)

Synthesis Example 10

Synthesis of Compound (Z)

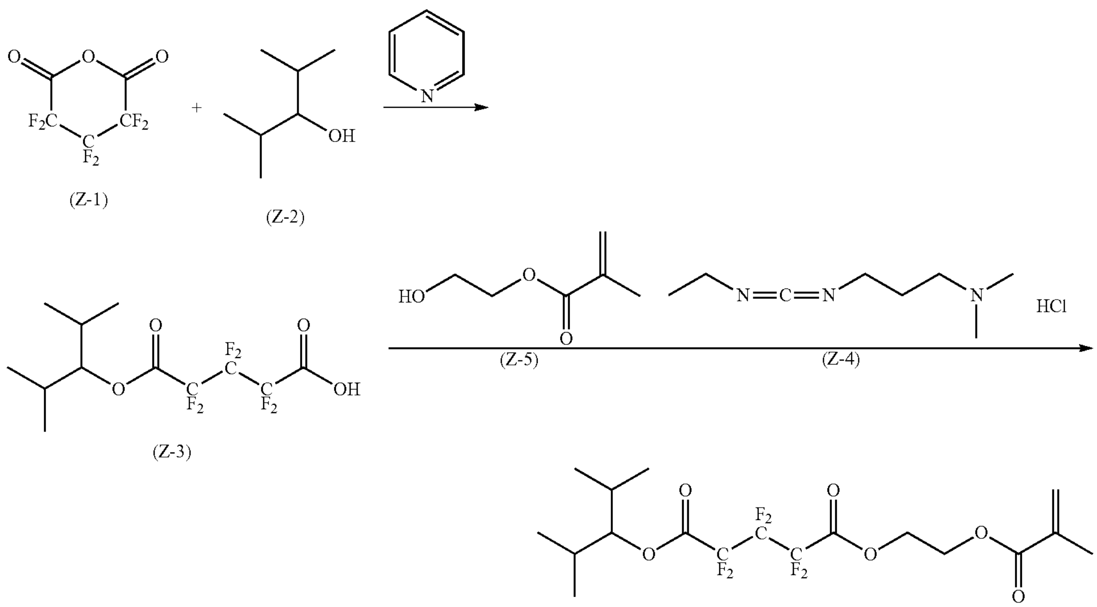

(Z)

7.33 parts of a compound (Z-2), 30.00 parts of tetrahydrofuran and 5.99 parts of pyridine were mixed while stirring for 30 minutes at 23° C. The obtained mixture was cooled to 0° C. To this mixture, 14.00 parts of a compound (Z-1) was added over 1 hour while maintaining at the same temperature. The temperature of the mixture was then elevated the temperature to about 10° C., and the mixture was stirred for 1 hour at the same temperature. To thus obtained reactant containing a compound (Z-3) was added 14.51 parts of a compound (Z-4) (1-(3-dimethylaminopropyl)-3-ethylcarbodiimide hydrochloride) and 8.20 parts of a compound (Z-5), and stirred for 3 hours at 23° C. 270 parts of ethyl acetate and 16.57 parts of 5% hydrochloric acid solution were added to the obtained reactant solution, and stirred for 30 minutes at 23° C. Then, after allowed to stand, the obtained solution was separated to recover an organic layer. To the recovered organic layer, 65 parts of a saturated sodium hydrogen carbonate was added, and the obtained solution was stirred for 30 minutes at 23° C., allowed to stand, and then separated to wash the organic layer. The washing operation was repeated for 2 times. To the washed organic layer, 65 parts of ion-exchanged water was added and the obtained solution was stirred for 30 minutes at 23° C., allowed to stand, and then separated to wash the organic layer with water. The water washing operation was repeated for 5 times. The obtained organic layer was concentrated, thus obtained concentrate was fractionated by a column (conditions: silica gel 60-200 mesh of a stationary phase manufactured by Merck, n-heptane/ethyl acetate of a developing solvent), resulting in 10.24 parts of the compound (Z).

MS (mass spectroscopy): 450.2 (molecular ion peak)

Synthesis Example 11

Synthesis of Compound (ZA)

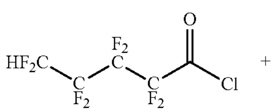

(ZA-1)

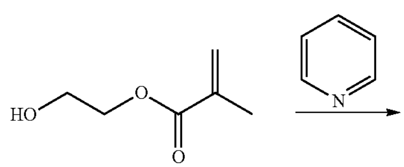

(ZA-2)

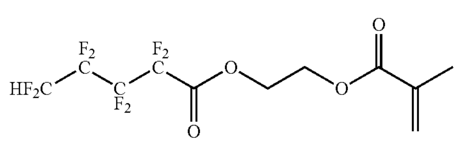

(ZA)

10.40 parts of a compound (ZA-2), 72.80 parts of methylisobutylketone and 7.21 parts of pyridine were mixed while stirring for 30 minutes at 23° C. The obtained mixture was cooled to 0° C. To this mixture, 20.08 parts of a compound (ZA-1) was added over 1 hour while maintaining at the same temperature. The temperature of the mixture was then elevated to about 10° C., and the mixture was stirred for 1 hour at the same temperature. Thus obtained reactant was added to 220.97 parts of n-heptane, 99.76 parts of 2% of hydrochloric acid solution to obtain a mixture, the mixture was stirred for 30 minutes at 23° C. The obtained solution was allowed to stand, and then separated to recover an organic layer. To the recovered organic layer, 39.90 parts of 5% hydrochloric acid solution was added, and the obtained solution was stirred for 30 minutes at 23° C., allowed to stand, and then separated to recover the organic layer. To the recovered organic layer, 55.34 parts of ion-exchanged water was added, and the obtained solution was stirred for 30 minutes at 23° C., allowed to stand, and then separated to wash the organic layer with water. To the washed organic layer, 73.45 parts of 10% of potassium carbonate aqueous solution was added, and the obtained solution was stirred for 30 minutes at 23° C., allowed to stand, and then separated to wash the organic layer. The operation was repeated for 2 times. To the washed organic layer, 110.68 parts of ion-exchanged water was added, and the obtained solution was stirred for 30 minutes at 23° C., allowed to stand, and then separated to wash the organic layer with water. The water washing operation was repeated for 4 times. The obtained organic layer was concentrated, resulting in 22.02 parts of the compound (ZA).

MS (mass spectroscopy): 358.1 (molecular ion peak)

Synthesis Example 12

Synthesis of Compound (ZB)

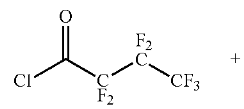

(ZB-1)

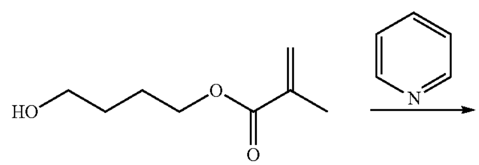

(ZB-2)

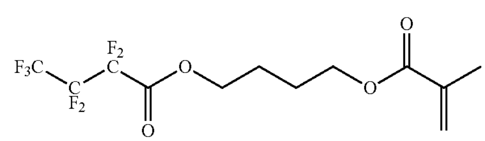

(ZB)

30.00 parts of a compound (ZB-2), 210.00 parts of methylisobutylketone and 18.00 parts of pyridine were mixed while stirring for 30 minutes at 23° C. The obtained mixture was cooled to 0° C. To this mixture, 48.50 parts of a compound (ZB-1) was added over 1 hour while maintaining at the same temperature. The temperature of the mixture was then elevated to about 5° C., and the mixture was stirred for 1 hour at the same temperature. Thus obtained reactant was added to 630 parts of ethyl acetate, 99.68 parts of 5% of hydrochloric acid solution and 126 parts of ion-exchanged water to obtain a mixture, the mixture was stirred for 30 minutes at 23° C. The obtained solution was allowed to stand, and then separated to recover an organic layer. To the recovered organic layer, 86.50 parts of 10% of potassium carbonate aqueous solution was added, and the obtained solution was stirred for 30 minutes at 23° C., allowed to stand, and then separated to wash the organic layer. The operation was repeated for 2 times. To the washed organic layer, 157.50 parts of ion-exchanged water was added, and the obtained solution was stirred for 30 minutes at 23° C., allowed to stand, and then separated to wash the organic layer with water. The water washing operation was repeated for 5 times. The obtained organic layer was concentrated, resulting in 27.61 parts of the compound (ZB).

MS (mass spectroscopy): 354.1 (molecular ion peak)

Synthesis Example 13

Synthesis of Compound (ZC)

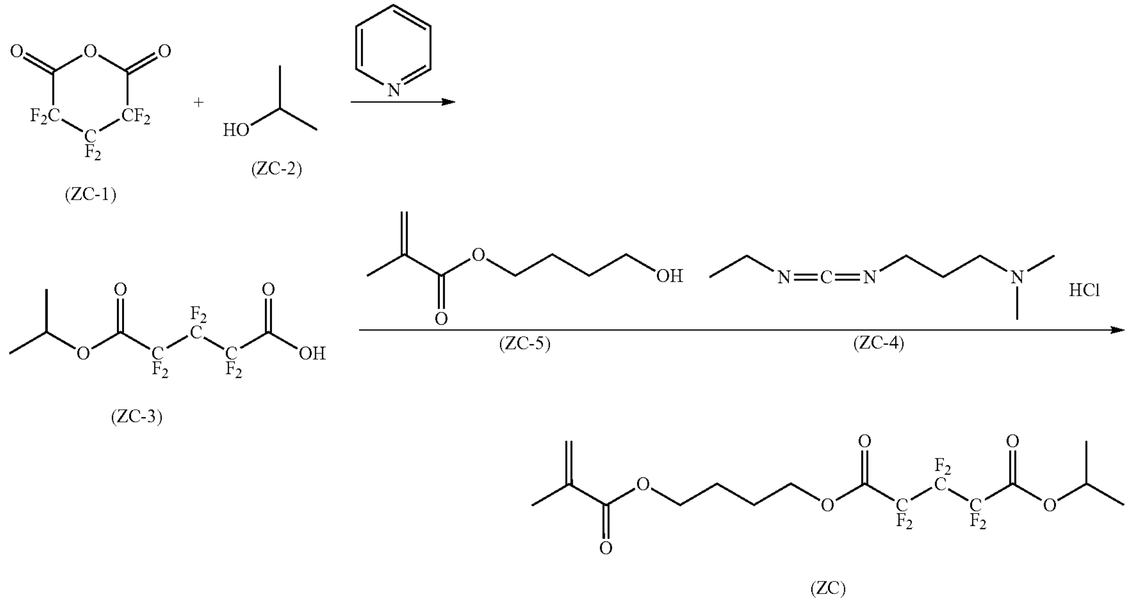

(ZC-1) (ZC-2) (ZC-3) (ZC-5) (ZC-4) (ZC)

3.79 parts of a compound (ZC-2), 20.00 parts of tetrahydrofuran and 5.99 parts of pyridine were mixed while stirring for 30 minutes at 23° C. The obtained mixture was cooled to 0° C. To this mixture, 14.00 parts of a compound (ZC-1) was added over 1 hour while maintaining at the same temperature. The temperature of the mixture was then elevated to about 10° C., and stirred for 1 hour at the same temperature. To thus obtained reactant containing a compound (ZC-3) was added 14.51 parts of a compound (ZC-4) (1-(3-dimethylaminopropyl)-3-ethylcarbodiimide hydrochloride) and 9.97 parts of a compound (ZC-5), and stirred for 3 hours at 23° C. 250 parts of ethyl acetate and 16.57 parts of 5% hydrochloric acid solution were added to the obtained reactant solution, and stirred for 30 minutes at 23° C. Then, after allowed to stand, the obtained solution was separated to recover an organic layer. To the recovered organic layer, 65 parts of a saturated sodium hydrogen carbonate was added, and the obtained solution was stirred for 30 minutes at 23° C., allowed to stand, and then separated to wash the organic layer. The washing operation was repeated for 2 times. To the washed organic layer, 100 parts of ion-exchanged water was added and the obtained solution was stirred for 30 minutes at 23° C., allowed to stand, and then separated to wash the organic layer with water. The water washing operation was repeated for 5 times. The obtained organic layer was concentrated, thus obtained concentrate was fractionated by a column (conditions: silica gel 60-200, mesh of a stationary phase manufactured by Merck, n-heptane/ethyl acetate of a developing solvent), resulting in 11.60 parts of the compound (ZC).

MS (mass spectroscopy): 422.1 (molecular ion peak)

Synthesis Example 14

Synthesis of Compound (ZD)

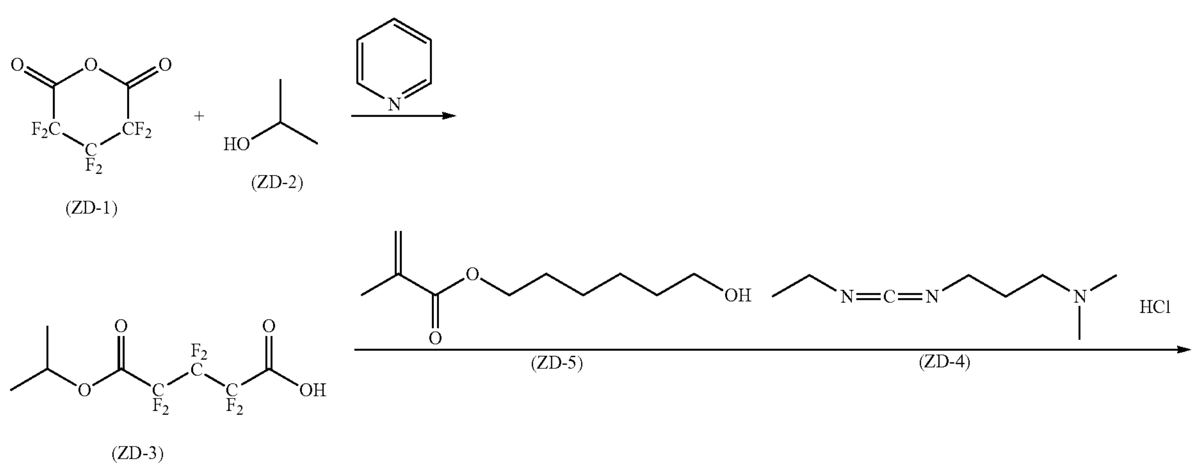

(ZD-1) (ZD-2) (ZD-3) (ZD-5) (ZD-4)

-continued

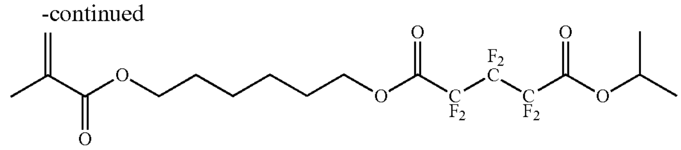

(ZD)

3.79 parts of a compound (ZD-2), 20.00 parts of tetrahydrofuran and 5.99 parts of pyridine were mixed while stirring for 30 minutes at 23° C. The obtained mixture was cooled to 0° C. To this mixture, 14.00 parts of a compound (ZD-1) was added over 1 hour while maintaining at the same temperature. The temperature of the mixture was then elevated to about 10° C., and the mixture was stirred for 1 hour at the same temperature. To thus obtained reactant containing a compound (ZD-3) was added 14.51 parts of a compound (ZD-4) (1-(3-dimethylaminopropyl)-3-ethylcarbodiimide hydrochloride) and 11.74 parts of a compound (ZD-5), and stirred for 3 hours at 23° C. 300 parts of ethyl acetate and 16.57 parts of 5% hydrochloric acid solution were added to the obtained reactant solution, and stirred for 30 minutes at 23° C. The obtained solution was allowed to stand, and then separated to recover an organic layer. To the recovered organic layer, 65 parts of a saturated sodium hydrogen carbonate was added, and the obtained solution was stirred for 30 minutes at 23° C., allowed to stand, and then separated to wash the organic layer. The washing operation was repeated for 2 times. To the washed organic layer, 100 parts of ion-exchanged water was added and the obtained solution was stirred for 30 minutes at 23° C., allowed to stand, and then separated to wash the organic layer with water. The water washing operation was repeated for 5 times. The obtained organic layer was concentrated, thus obtained concentrate was fractionated by a column (conditions: silica gel 60-200 mesh of a stationary phase manufactured by Merck, n-heptane/ethyl acetate of a developing solvent), resulting in 15.49 parts of the compound (ZD).

MS (mass spectroscopy): 450.2 (molecular ion peak)

Synthesis Example 15

Synthesis of Compound (ZE)

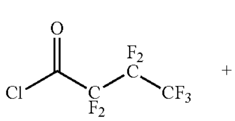

(ZE-1)

-continued

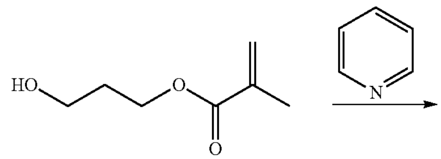

(ZE-2)

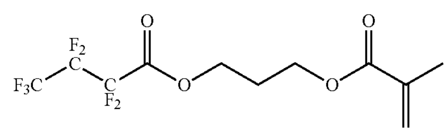

(ZE)

27.34 parts of a compound (ZE-2), 190.00 parts of methylisobutylketone and 18.00 parts of pyridine were mixed while stirring for 30 minutes at 23° C. The obtained mixture was cooled to 0° C. To this mixture was added 48.50 parts of a compound (ZE-1) over 1 hour while maintaining at the same temperature. The temperature of the mixture was then elevated to about 5° C., and the mixture was stirred for 1 hour at the same temperature. Thus obtained reactant was added to 570 parts of ethyl acetate, 99.68 parts of 5% of hydrochloric acid solution and 126 parts of ion-exchanged water to obtain a mixture, the mixture was stirred for 30 minutes at 23° C. The obtained solution was allowed to stand, and then separated to recover an organic layer. To the organic layer, 86.50 parts of 10% of potassium carbonate aqueous solution was added, and the obtained solution was stirred for 30 minutes at 23° C., allowed to stand, and then separated to wash the organic layer. The washing operation was repeated for 2 times. To the recovered organic layer, 157 parts of ion-exchanged water was added, and the obtained solution was stirred for 30 minutes at 23° C., allowed to stand, and then separated to wash the organic layer with water. The water washing operation was repeated for 5 times. The obtained organic layer was concentrated, resulting in 23.89 parts of a compound (ZE).

MS (mass spectroscopy): 340.1 (molecular ion peak)

Synthesis Example 16

Synthesis of Compound (ZF)

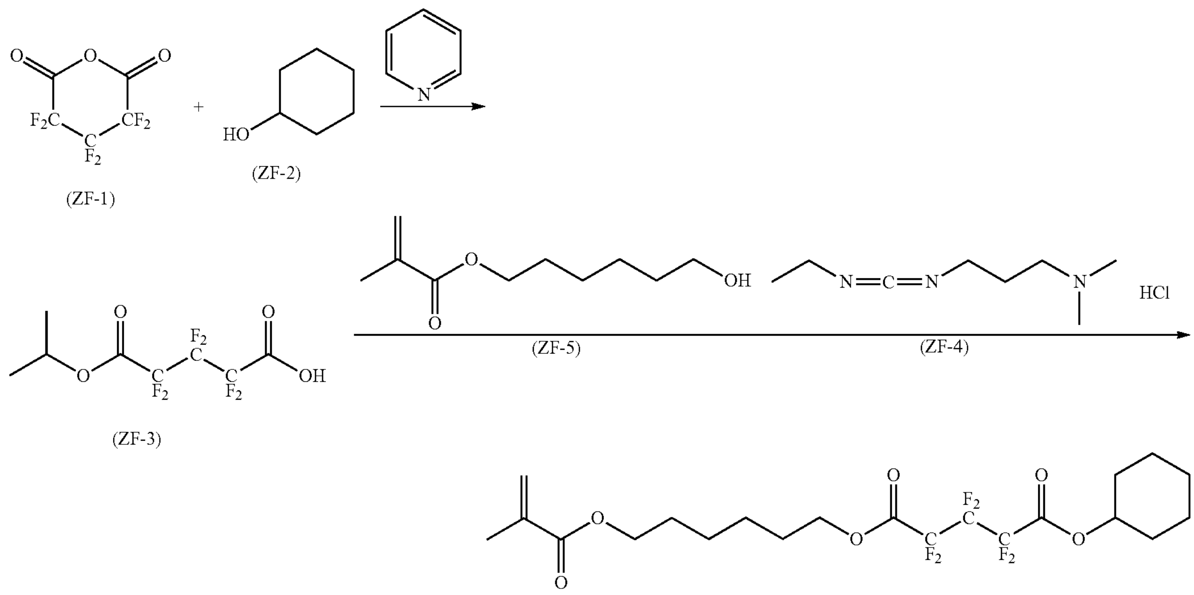

(ZF)

6.32 parts of a compound (ZF-2), 30.00 parts of tetrahydrofuran and 5.99 parts of pyridine were mixed while stirring for 30 minutes at 23° C. The obtained mixture was cooled to 0° C. To this mixture, 14.00 parts of a compound (ZF-1) was added over 1 hour while maintaining at the same temperature. The temperature of the mixture was then elevated to about 10° C., and the mixture was stirred for 1 hour at the same temperature. To thus obtained reactant containing a compound (ZF-3) was added 14.51 parts of a compound (ZF-4) (1-(3-dimethylaminopropyl)-3-ethylcarbodiimide hydrochloride) and 11.74 parts of a compound (ZF-5), and stirred for 3 hours at 23° C. 300 parts of ethyl acetate and 16.57 parts of 5% hydrochloric acid solution were added to the obtained reactant solution, and stirred for 30 minutes at 23° C. The obtained solution was allowed to stand, and then separated to recover an organic layer. To the recovered organic layer, 65 parts of a saturated sodium hydrogen carbonate was added, and the obtained solution was stirred for 30 minutes at 23° C., allowed to stand, and then separated to wash the organic layer. The washing operation was repeated for 2 times. To the washed organic layer, 100 parts of ion-exchanged water was added and the obtained solution was stirred for 30 minutes at 23° C., allowed to stand, and then separated to wash the organic layer with water. The water washing operation was repeated for 5 times. The obtained organic layer was concentrated, thus obtained concentrate was fractionated by a column (conditions: silica gel 60-200 mesh of a stationary phase manufactured by Merck, n-heptane/ethyl acetate of a developing solvent), resulting in 16.89 parts of the compound (ZF).

MS (mass spectroscopy): 490.2 (molecular ion peak)

Synthesis Example 17

Synthesis of Compound (ZG)

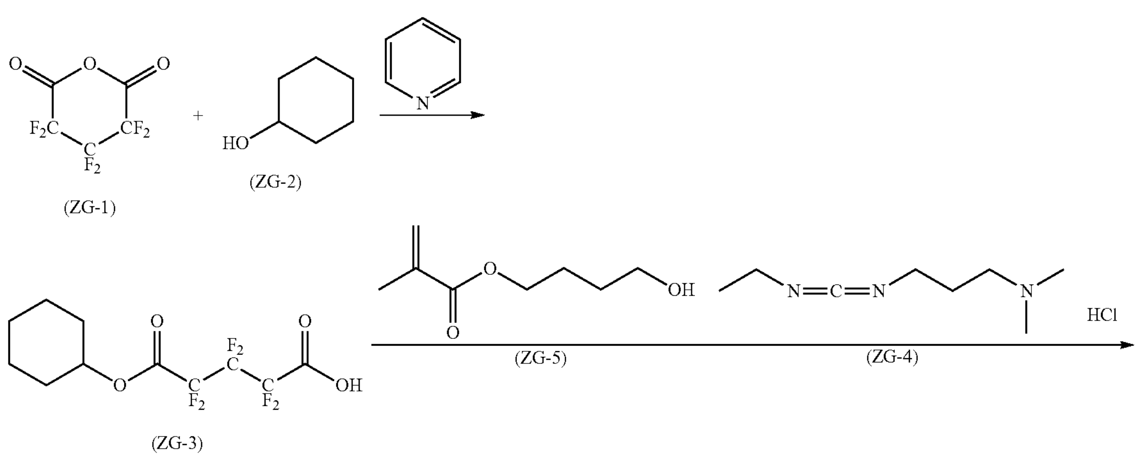

-continued

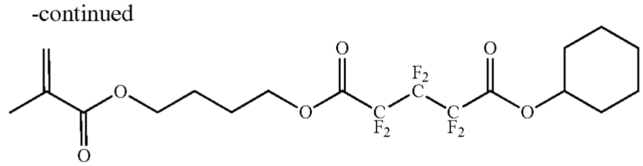

(ZG)

6.32 parts of a compound (ZF-2), 30.00 parts of tetrahydrofuran and 5.99 parts of pyridine were mixed while stirring at 23° C. for 30 minutes. The obtained mixture was cooled to 0° C. To this mixture, 14.00 parts of a compound (ZG-1) was added over 1 hour while maintaining at the same temperature. The temperature of the mixture was then elevated to about 10° C., and the mixture was stirred for 1 hour at the same temperature. To thus obtained reactant containing a compound (ZG-3) was added 14.51 parts of a compound (ZG-4) (1-(3-dimethylaminopropyl)-3-ethylcarbodiimide hydrochloride) and 9.97 parts of a compound (ZG-5), and stirred for 3 hours at 23° C. 300 parts of ethyl acetate and 16.57 parts of 5% hydrochloric acid solution were added to the obtained reactant solution, and stirred for 30 minutes at 23° C. The obtained solution was allowed to stand, and then separated to recover an organic layer. To the recovered organic layer, 65 parts of a saturated sodium hydrogen carbonate was added, and the obtained solution was stirred for 30 minutes at 23° C., allowed to stand and then separated to wash the organic layer. The washing operation was repeated for 2 times. To the washed organic layer, 100 parts of ion-exchanged water was added and the obtained solution was stirred for 30 minutes at 23° C., allowed to stand, and then separated to wash the organic layer with water. The water washing operation was repeated for 5 times. The obtained organic layer was concentrated, thus obtained concentrate was fractionated by a column (conditions: silica gel 60-200 mesh of a stationary phase manufactured by Merck, n-heptane/ethyl acetate of a developing solvent), resulting in 19.85 parts of the compound (ZG).

MS (mass spectroscopy): 462.2 (molecular ion peak)

Synthetic Example of the Resin

The monomers used the synthesis of the resin are shown below.

(A)

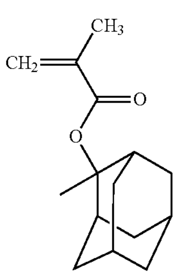

-continued (B)

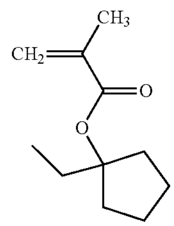

(C)

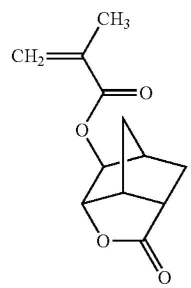

(D)

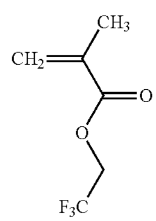

(E)

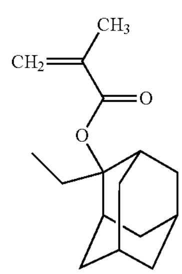

(F)

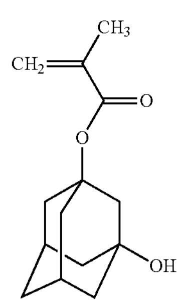

-continued
(G)
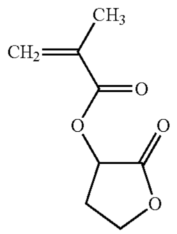
(H)
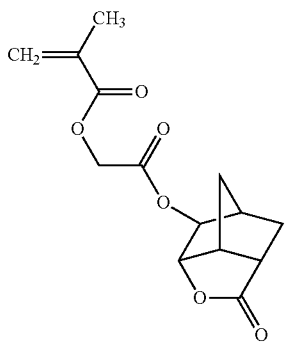
(I)
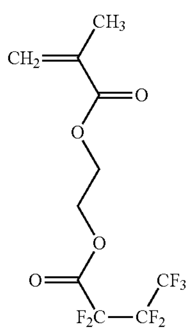
(J)
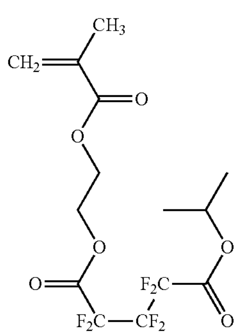
(K)
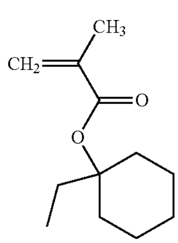
-continued
(L)
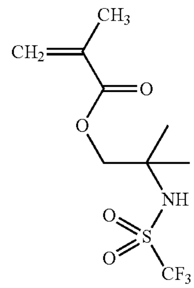
(M)
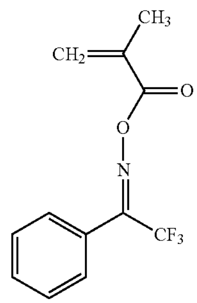
(N)
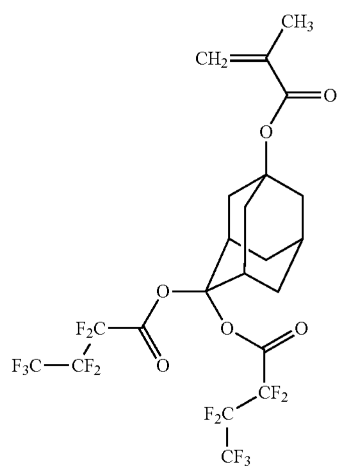
(O)
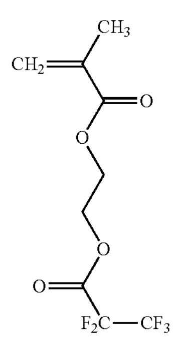

-continued
(P)
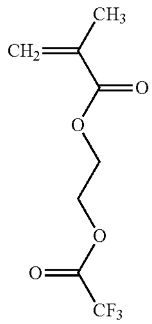
(Q)
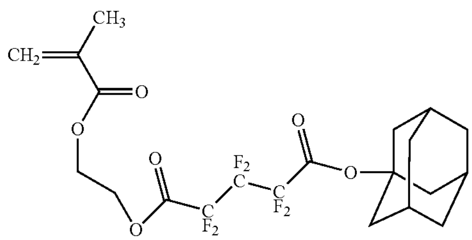
(R)
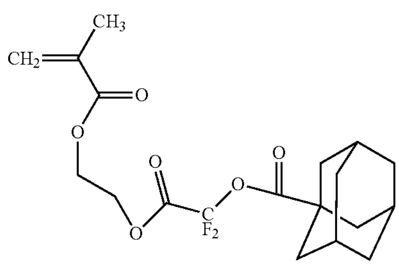
(S)
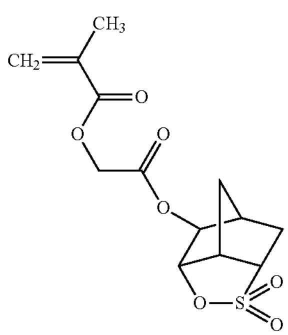
(T)
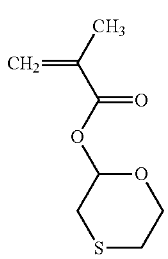
-continued
(U)
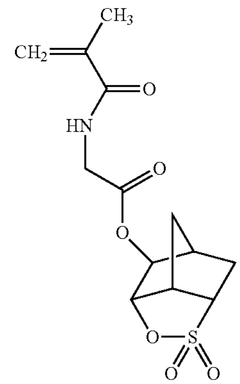
(V)
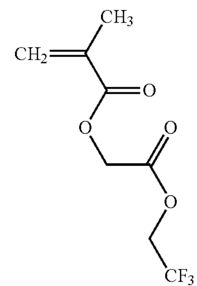
(W)
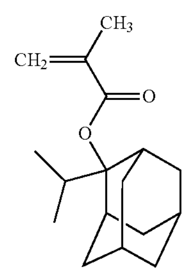
(X)
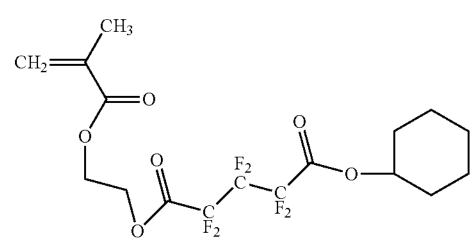
(Y)
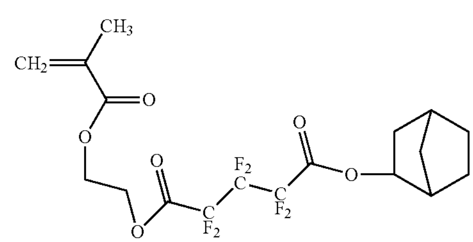

-continued
(Z)
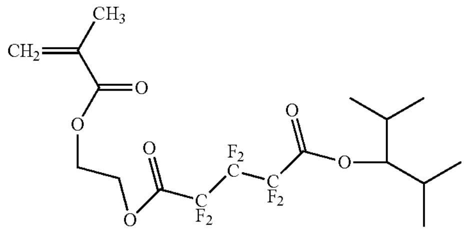
(ZA)
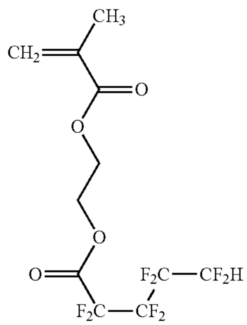
(ZB)
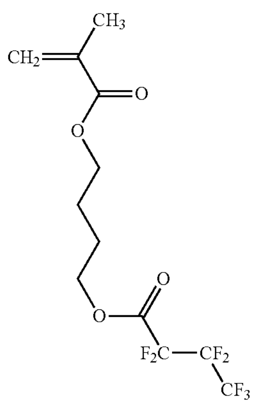
(ZC)
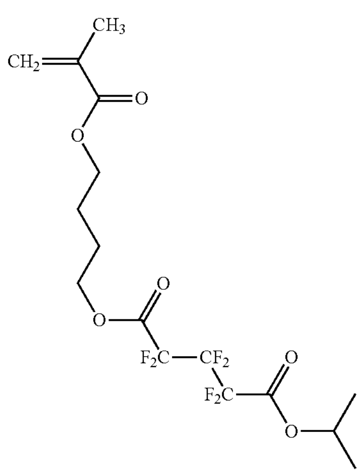
-continued
(ZD)
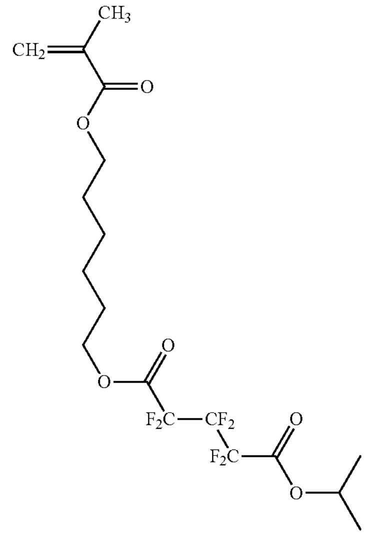
(ZE)
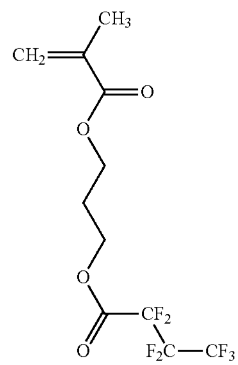
(ZF)
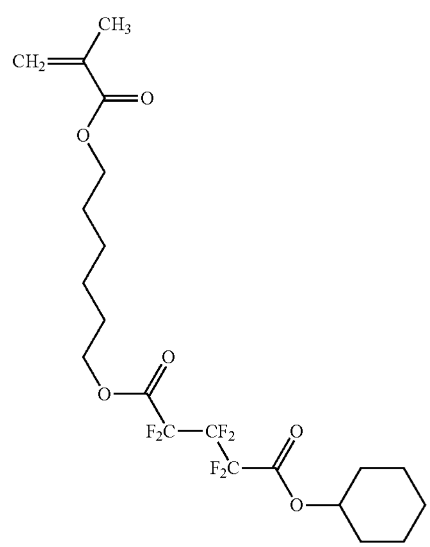

-continued (ZG)

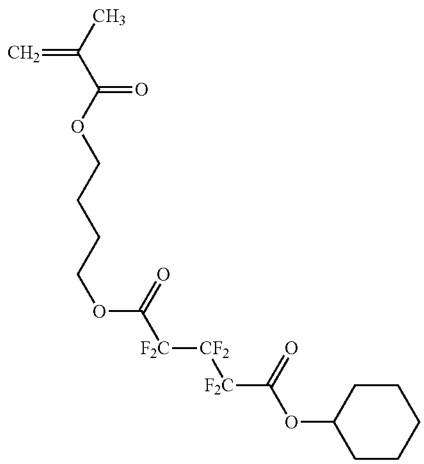

These monomers are referred to as “monomer (A)” to “monomer (Z)” and “monomer (ZA)” to “monomer (ZG)”.

Synthetic Example 18

Synthesis of Resin A1

Monomer (E), monomer (F), monomer (G), monomer (H) and monomer (I) were mixed together with a mole ratio of monomer (E):monomer (F):monomer (G):monomer (H): monomer (I)=40:10:17:30:3, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 1 mol % and 3 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and ion-exchanged water to precipitate a resin. The obtained resin was filtrated. These operations described in the last two sentences were repeated for 2 times, resulting in a 60% yield of copolymer having a weight average molecular weight of about 7700. This copolymer, which had the structural units derived from the monomers of the following formula, was referred to as Resin A1.

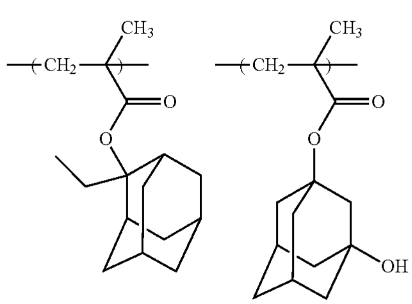

-continued

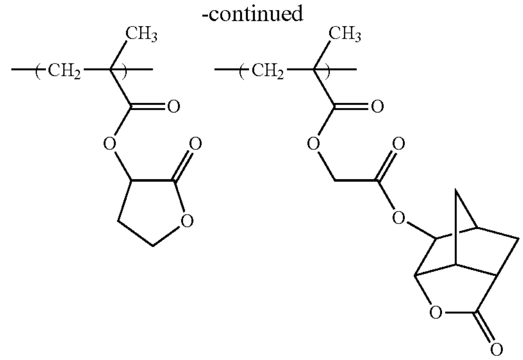

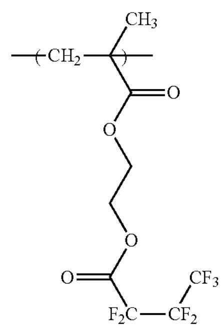

Synthetic Example 19

Synthesis of Resin A2

Monomer (E), monomer (F), monomer (G), monomer (H) and monomer (J) were mixed together with a mole ratio of monomer (E):monomer (F):monomer (G):monomer (H): monomer (J)=38:10:17:30:5, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 1 mol % and 3 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 59% yield of copolymer having a weight average molecular weight of about 8000. This copolymer, which had the structural units derived from the monomers of the following formula, was referred to as Resin A2.

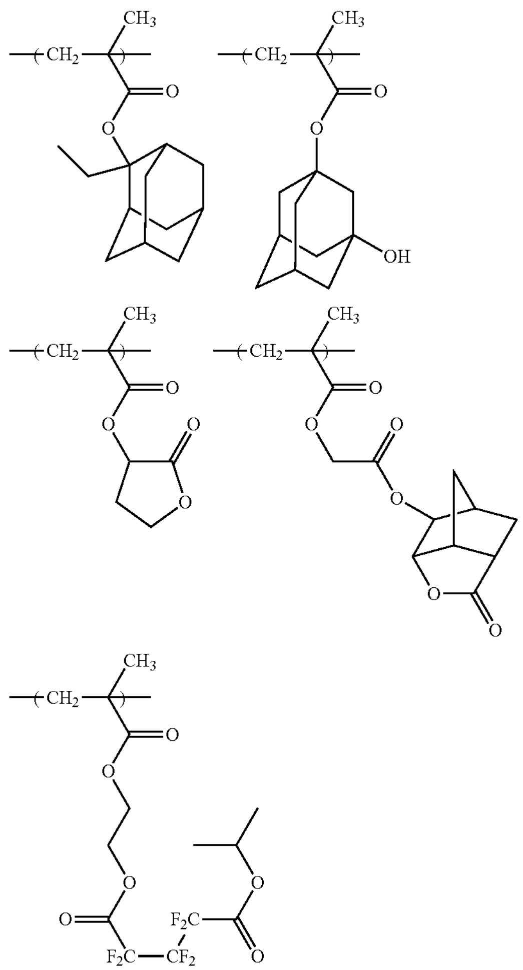

Synthetic Example 20

Synthesis of Resin A3

Monomer (I) and monomer (L) were mixed together with a mole ratio of monomer (I):monomer (L)=50:50, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 0.7 mol % and 2.1 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 68% yield of copolymer having a weight average molecular weight of about 16000. This copolymer, which had the structural units derived from the monomers of the following formula, was referred to as Resin A3.

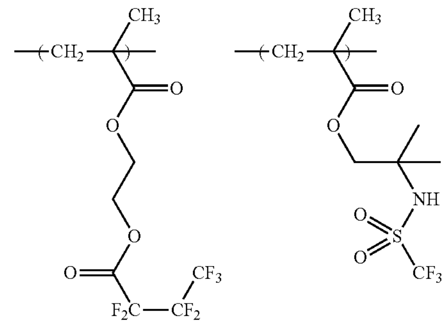

Synthetic Example 21

Synthesis of Resin A4

Monomer (I) and monomer (M) were mixed together with a mole ratio of monomer (I):monomer (M)=50:50, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 0.7 mol % and 2.1 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 68% yield of copolymer having a weight average molecular weight of about 17000. This copolymer, which had the structural units derived from the monomers of the following formula, was referred to as Resin A4.

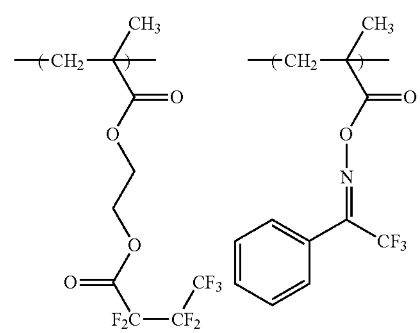

Synthetic Example 22

Synthesis of Resin A5

Monomer (I) and monomer (N) were mixed together with a mole ratio of monomer (I):monomer (N)=80:20, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 0.7 mol % and 2.1 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 62% yield of copolymer having a weight average molecular weight of about 17000. This copolymer, which had the structural units derived from the monomers of the following formula, was referred to as Resin A5.

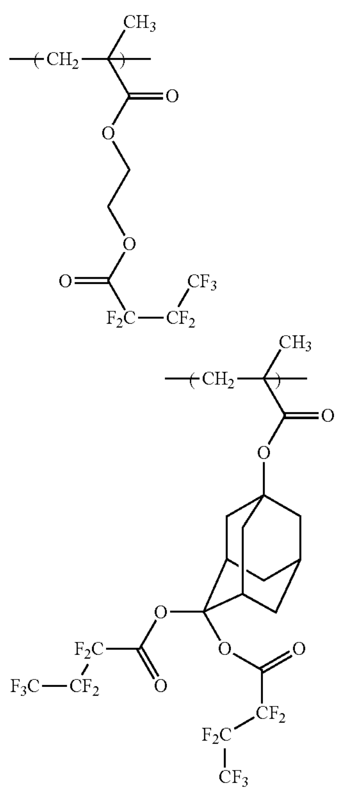

Synthetic Example 23

Synthesis of Resin A6

Monomer (E), monomer (K), monomer (F), monomer (H) and monomer (G) were mixed together with a mole ratio of monomer (E):monomer (K):monomer (F):monomer (H): monomer (G)=32:7:8:10:43, and dioxane was added thereto in an amount equal to 1.5 times by weight of the total amount of monomers so as to obtain a solution. Azobisisobutyronitrile and azobis(2,4-dimethylvaleronitrile) was added as an initiator thereto to the obtained solution, in an amount of 1 mol % and 3 mol % respectively with respect to the entire amount of monomers, and the resultant mixture was heated for about 5 hours at 73° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and ion-exchanged water to precipitate a resin. The obtained resin was filtrated. These operations described in the last two sentences were repeated for 2 times, resulting in a 78% yield of copolymer having a weight average molecular weight of about 8900. This copolymer, which had the structural units derived from the monomers of the following formula, was referred to as Resin A6.

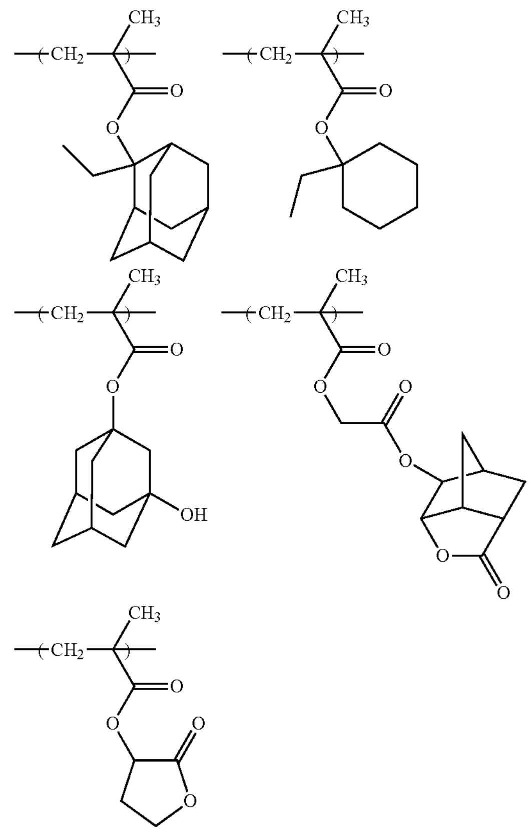

Synthetic Example 24

Synthesis of Resin A7

Monomer (A), monomer (B) and monomer (C) were mixed together with a mole ratio of monomer (A):monomer (B): monomer (C)=36:34:30, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 1.5 mol % and 4.5 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 48% yield of copolymer having a weight average molecular weight of about 5000. This copolymer, which had the structural units derived from the monomers of the following formula, was referred as to Resin A7.

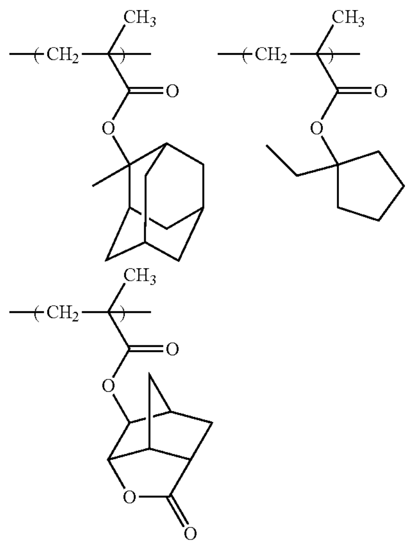

Synthetic Example 25

Synthesis of Resin A8

Monomer (B) and monomer (D) were mixed together with a mole ratio of monomer (B):monomer (D)=70:30, and dioxane was added thereto in an amount equal to 1.5 times by weight of the total amount of monomers to obtain a solution. Azobisisobutyronitrile and azobis(2,4-dimethylvaleronitrile) was added as an initiator to the obtained solution, in an amount of 1 mol % and 3 mol % respectively with respect to the entire amount of monomers, and the resultant mixture was heated for about 5 hours at 75° C. After that, the obtained reacted mixture was poured into a mixture of methanol and water in large amounts to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 58% yield of copolymer having a weight average molecular weight of about 6700. This copolymer, which had the structural units derived from the monomers of the following formula, was referred to as designated Resin A8.

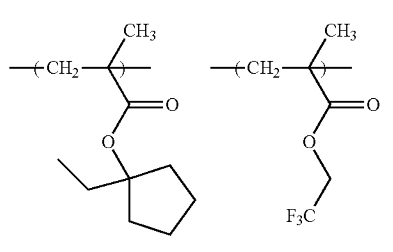

Synthetic Example 26

Synthesis of Resin A9

Monomer (O) and monomer (L) were mixed together with a mole ratio of monomer (O):monomer (L)=70:30, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 0.7 mol % and 2.1 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, thereby resulting in a 78% yield of copolymer having a weight average molecular weight of about 15000. This copolymer, which had the structural units derived from the monomers of the following formula, was referred to as Resin A9.

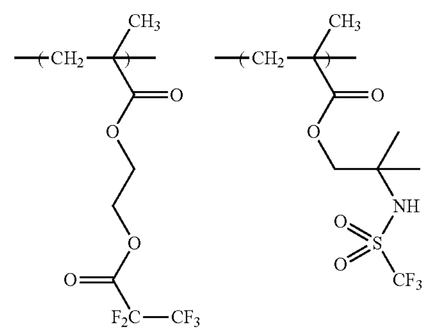

Synthetic Example 27

Synthesis of Resin A10

Monomer (P) and monomer (L) were mixed together with a mole ratio of monomer (P):monomer (L)=80:20, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 0.7 mol % and 2.1 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 82% yield of copolymer having a weight average molecular weight of about 16000. This copolymer, which had the structural units derived from the monomers of the following formula, was referred to as Resin A10.

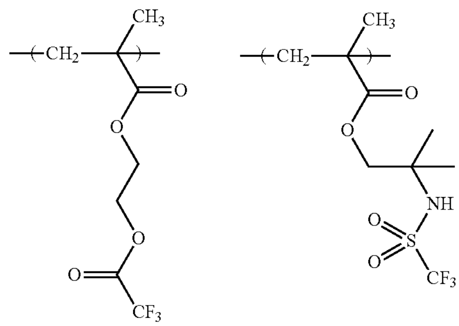

Synthetic Example 28

Synthesis of Resin A11

Monomer (O) was used, and dioxane was added thereto in an amount equal to 1.5 times by weight of the amount of monomer so as to obtain a solution. Azobisisobutyronitrile and azobis(2,4-dimethylvaleronitrile) was added as an initiator to the obtained solution, in an amount of 0.7 mol % and 2.1 mol % respectively with respect to the amount of monomer, and the resultant mixture was heated for about 5 hours at 75° C. After that, the obtained reacted mixture was poured into a large amount of mixture of methanol and ion-exchanged water to precipitate a resin. The obtained resin was filtrated. The obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 77% yield of polymer having a weight average molecular weight of about 18000. This polymer, which had the structural units derived from the monomer of the following formula, was referred to as Resin A11.

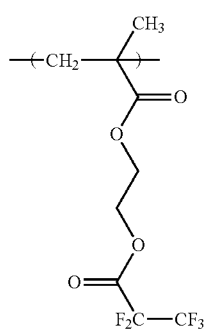

Synthetic Example 29

Synthesis of Resin A12

Monomer (I) and monomer (P) were mixed together with a mole ratio of monomer (I):monomer (P)=80:20, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 0.7 mol % and 2.1 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 85% yield of copolymer having a weight average molecular weight of about 15000. This copolymer, which had the structural units derived from the monomers of the following formula, was referred to as Resin A12.

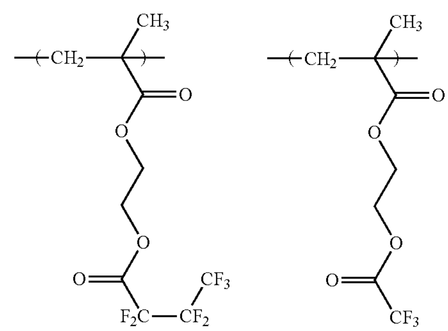

Synthetic Example 30

Synthesis of Resin A13

Monomer (O) and monomer (Q) were mixed together with a mole ratio of monomer (O):monomer (Q)=90:10, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 0.7 mol % and 2.1 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 82% yield of copolymer having a weight average molecular weight of about 17000. This copolymer, which had the structural units derived from the monomers of the following formula, was referred to as Resin A13.

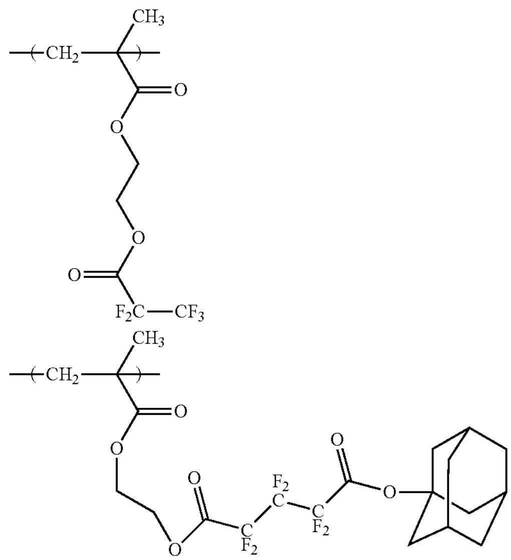

Synthetic Example 31

Synthesis of Resin A14

Monomer (O) and monomer (R) were mixed together with a mole ratio of monomer (O):monomer (R)=90:10, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 0.7 mol % and 2.1 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 80% yield of copolymer having a weight average molecular weight of about 17000. This copolymer, which had the structural units derived from the monomers of the following formula, was referred to as designated Resin A14.

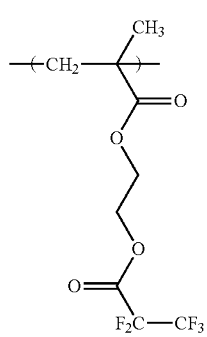

-continued

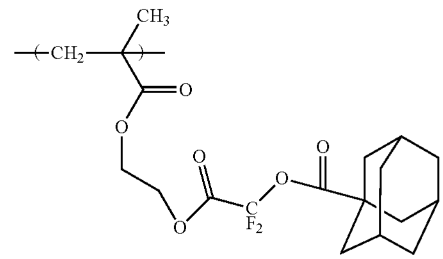

Synthetic Example 32

Synthesis of Resin A15

Monomer (E), monomer (K), monomer (F), monomer (S) and monomer (G) were mixed with mole ratio monomer (E):monomer (K):monomer (F):monomer (S):monomer (C)=32:7:8:10:43, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 1 mol % and 3 mol % respectively with respect to the entire amount of monomers, and the resultant mixture was heated for about 5 hours at 70° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 80% yield of copolymer having a weight average molecular weight of about 9000. This copolymer, which had the structural units derived from the monomers of the following formula, was referred to as Resin A15.

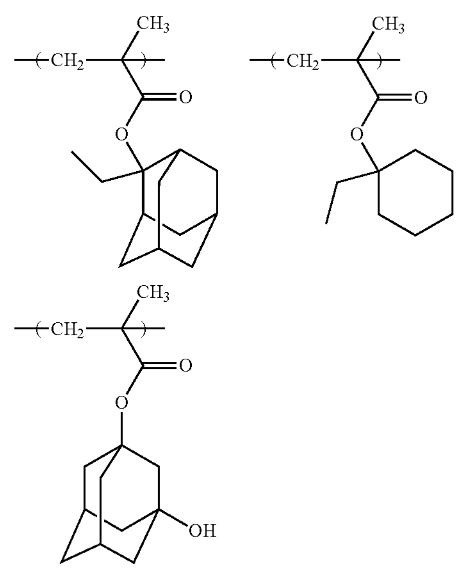

-continued

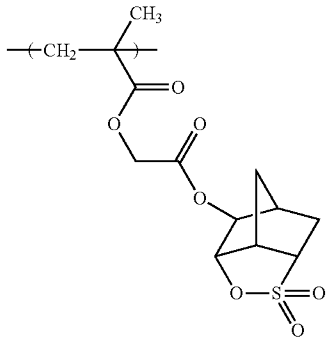

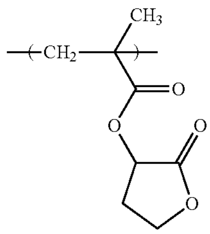

Synthetic Example 33

Synthesis of Resin A16

Monomer (E), monomer (T), monomer (F), monomer (S) and monomer (G) were together mixed with mole ratio monomer (E):monomer (T):monomer (F):monomer (S):monomer (G)=32:7:8:10:43, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 1 mol % and 3 mol % respectively with respect to the entire amount of monomers, and the resultant mixture was heated for about 5 hours at 70° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 76% yield of copolymer having a weight average molecular weight of about 8700. This copolymer, which had the structural units derived from the monomers of the following formula, was referred to as Resin A16.

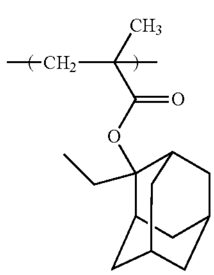

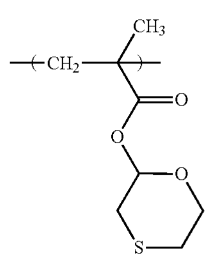

-continued

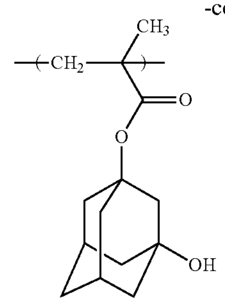

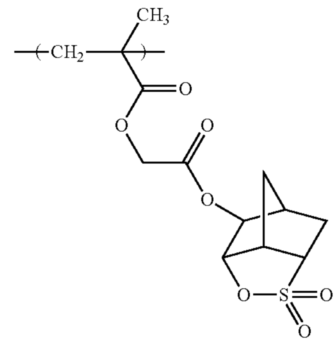

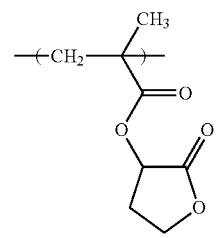

Synthetic Example 34

Synthesis of Resin A17

Monomer (W), monomer (K), monomer (F), monomer (G) and monomer (U) were mixed together with a mole ratio of monomer (W):monomer (K):monomer (F):monomer (G):monomer (U)=35:10:6:37:12, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 1 mol % and 3 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 65% yield of copolymer having a weight average molecular weight of about 7200. This copolymer, which had the structural units derived from the monomers of the following formula, was referred to as Resin A17.

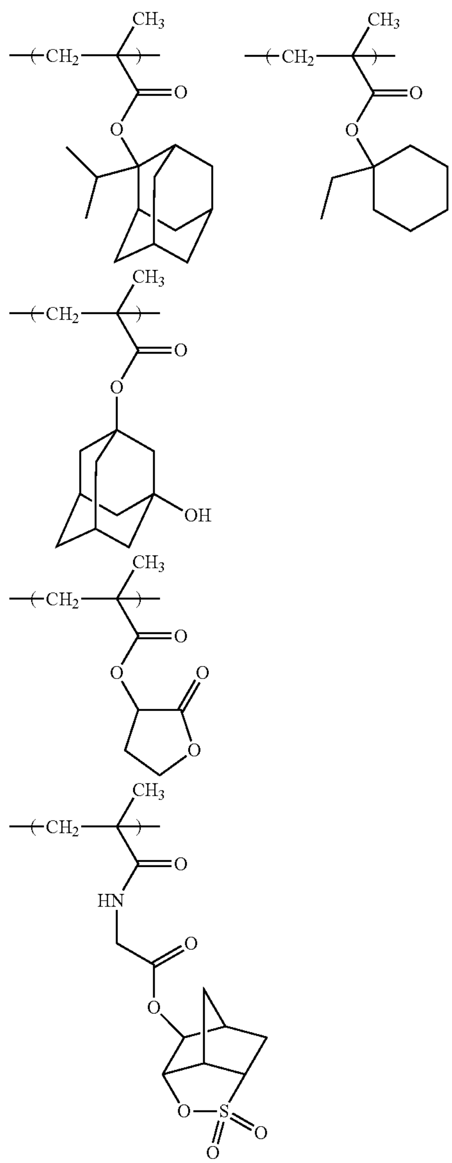

Synthetic Example 35

Synthesis of Resin A18

Monomer (W), monomer (K), monomer (F), monomer (H), monomer (G) and monomer (U) were mixed together with a mole ratio of monomer (W):monomer (K):monomer (F): monomer (H):monomer (G):monomer (U)=35:10:8:12:23:12, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 1 mol % and 3 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. Thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 66% yield of copolymer having a weight average molecular weight of about 7400. This copolymer, which had the structural units derived from the monomers of the following formula, was referred to as Resin A18.

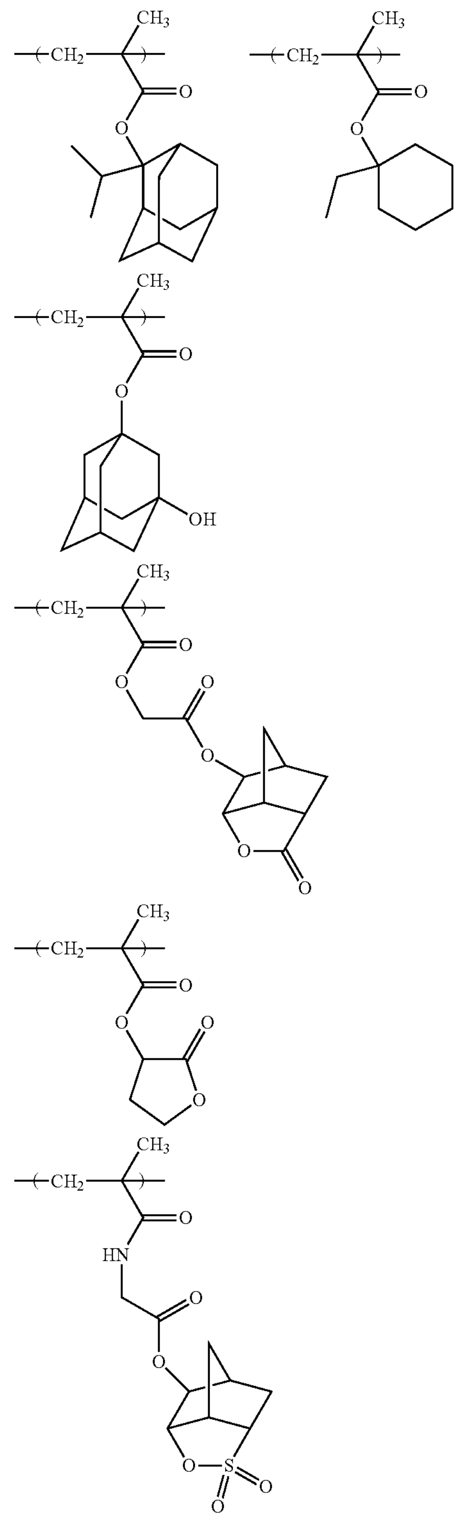

Synthetic Example 36

Synthesis of Resin A19

Monomer (E), monomer (K), monomer (F), monomer (G) and monomer (U) were mixed together with a mole ratio of monomer (E):monomer (K):monomer (F):monomer (G): monomer (U)=32:7:8:43:10, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 1 mol % and 3 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 78% yield of copolymer having a weight average molecular weight of about 7500. This copolymer, which had the structural units derived from the monomers of the following formula, was referred to as Resin A19.

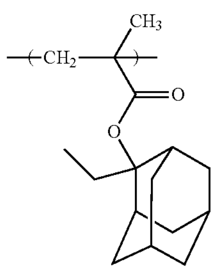

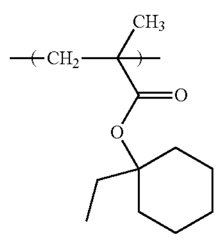

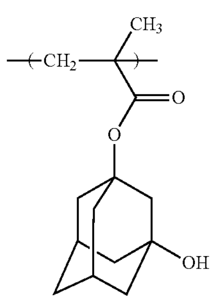

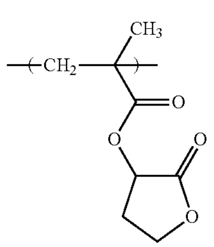

-continued

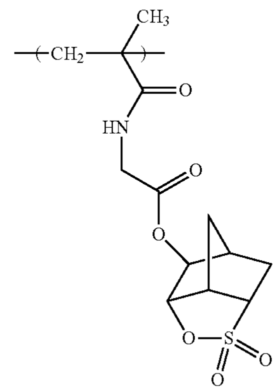

Synthetic Example 37

Synthesis of Resin A20

Monomer (A), monomer (G) and monomer (F) were mixed together with a mole ratio of monomer (A):monomer (G): monomer (F)=35:45:20, and dioxane was added thereto in an amount equal to 1.5 times by weight of the total amount of monomers to obtain a solution. Azobisisobutyronitrile and azobis(2,4-dimethylvaleronitrile) was added as an initiator to the obtained solution, in an amount of 1.5 mol % and 4.5 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in 75% yield of copolymer having a weight average molecular weight of about 7000. This copolymer, which had the structural units derived from the monomers of the following formula, was referred to as Resin A20.

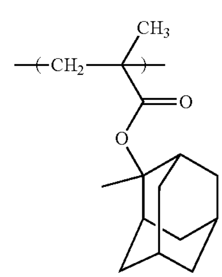

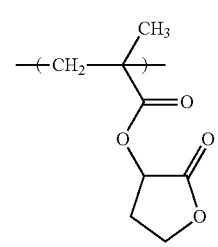

-continued

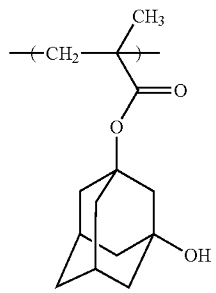

Synthetic Example 38

Synthesis of Resin A21

Monomer (V) and monomer (A) were mixed together with a mole ratio of monomer (V):monomer (A)=80:20, and dioxane was added thereto in an amount equal to 1.5 times by weight of the total amount of monomers to obtain a solution. Azobisisobutyronitrile and azobis(2,4-dimethylvaleronitrile) was added as an initiator to the obtained solution, in an amount of 0.5 mol % and 1.5 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations described in the last two sentences were repeated for 2 times, thereby resulting in a 70% yield of copolymer having a weight average molecular weight of about 28000. This copolymer, which had the structural units derived from the monomers of the following formula, was referred to as Resin A21.

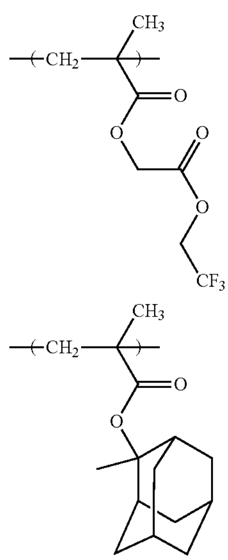

Synthetic Example 39

Synthesis of Resin A22

Monomer (W), monomer (F), monomer (G) and monomer (S) were mixed together with a mole ratio of monomer (W): monomer (F):monomer (G):monomer (S):=51.7:7.8:23.3:17.2, and dioxane was added thereto in an amount equal to 1.5 times by weight of the total amount of monomers so as to obtain a solution. Azobisisobutyronitrile and azobis(2,4-dimethylvaleronitrile) was added as an initiator thereto in an amount of 1 mol % and 3 mol % respectively with respect to the entire amount of monomers, and the resultant mixture was heated for about 5 hours at 75° C. After that, the obtained reaction mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, thereby resulting in a 64% yield of copolymer having a weight average molecular weight of about 7700. This copolymer, which had the structural units derived from the monomers of the following formula, was referred to as Resin A22.

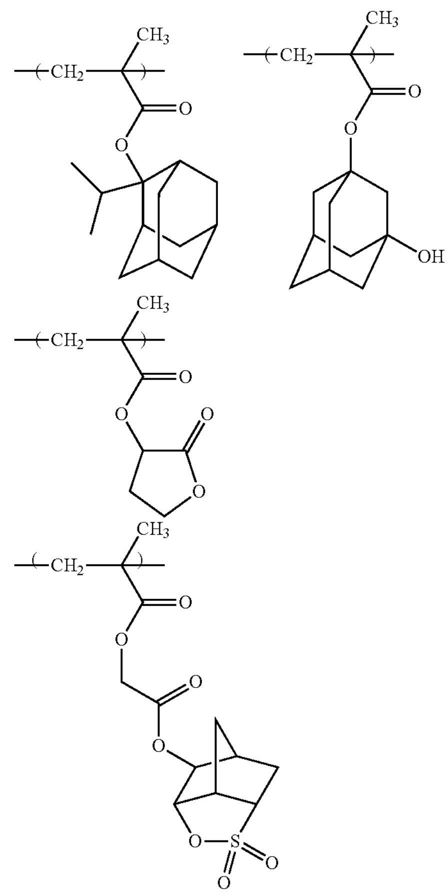

Synthetic Example 40

Synthesis of Resin A23

Monomer (I) was used, and dioxane was added thereto in an amount equal to 1.5 times by weight of the amount of monomer to obtain a solution. Azobisisobutyronitrile and azobis(2,4-dimethylvaleronitrile) was added as an initiator to the obtained solution in an amount of 0.7 mol % and 2.1 mol % respectively with respect to the amount of monomer, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 83% yield of polymer having a weight average molecular weight of about 19000. This polymer, which had the structural units derived from the monomer of the following formula, was referred to as Resin A23.

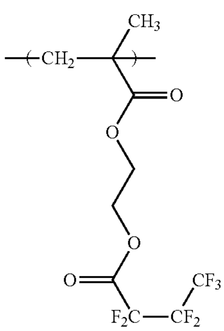

Synthetic Example 41

Synthesis of Resin A24

Monomer (X) was used, and dioxane was added thereto in an amount equal to 1.5 times by weight of the amount of monomer to obtain a solution. Azobisisobutyronitrile and azobis(2,4-dimethylvaleronitrile) was added as an initiator to the obtained solution, in an amount of 0.7 mol % and 2.1 mol % respectively with respect to the amount of monomer, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 85% yield of polymer having a weight average molecular weight of about 20000. This polymer, which had the structural units derived from the monomer of the following formula, was referred to as Resin A24.

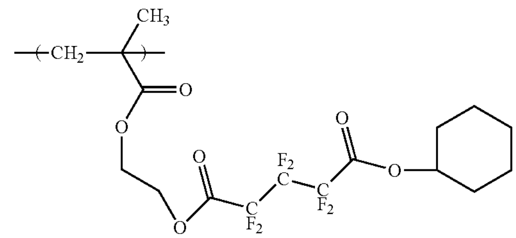

Synthetic Example 42

Synthesis of Resin A25

Monomer (Y) was used, and dioxane was added thereto in an amount equal to 1.5 times by weight of the amount of monomer to obtain a solution. Azobisisobutyronitrile and azobis(2,4-dimethylvaleronitrile) was added as an initiator thereto in an amount of 0.7 mol % and 2.1 mol % respectively with respect to the amount of monomer, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 83% yield of polymer having a weight average molecular weight of about 19000. This polymer, which had the structural units derived from the monomer of the following formula, was designated referred to as Resin A25.

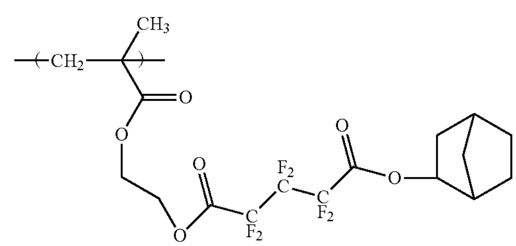

Synthetic Example 43

Synthesis of Resin A26

Monomer (Z) was used, and dioxane was added thereto in an amount equal to 1.5 times by weight of the amount of monomer to obtain a solution. Azobisisobutyronitrile and azobis(2,4-dimethylvaleronitrile) was added as an initiator thereto in an amount of 0.7 mol % and 2.1 mol % respectively with respect to the amount of monomer, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 81% yield of polymer having a weight average molecular weight of about 21000. This polymer, which had the structural units derived from the monomer of the following formula, was referred to as Resin A26.

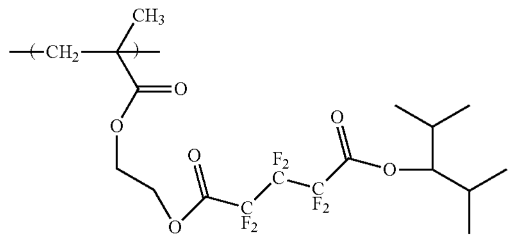

Synthetic Example 44

Synthesis of Resin A27

Monomer (ZA) was used, and dioxane was added thereto in an amount equal to 1.5 times by weight of the amount of monomer to obtain a solution. Azobisisobutyronitrile and azobis(2,4-dimethylvaleronitrile) was added as an initiator to the obtained solution, in an amount of 0.7 mol % and 2.1 mol % respectively with respect to the amount of monomer, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, thereby resulting in a 78% yield of polymer having a weight average molecular weight of about 18000. This polymer, which had the structural units derived from the monomer of the following formula, was referred to as Resin A27.

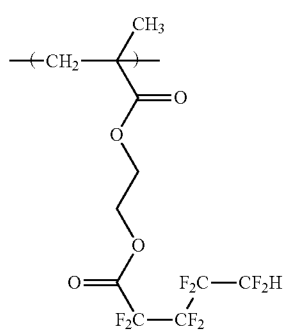

Synthetic Example 45

Synthesis of Resin A28

Monomer (ZB) was used, and dioxane was added thereto in an amount equal to 1.5 times by weight of the amount of monomer to obtain a solution. Azobisisobutyronitrile and azobis(2,4-dimethylvaleronitrile) was added as an initiator to the obtained solution in an amount of 0.7 mol % and 2.1 mol % respectively with respect to the amount of monomer, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, thereby resulting in a 73% yield of polymer having a weight average molecular weight of about 19000. This polymer, which had the structural units derived from the monomer of the following formula, was referred to as Resin A28.

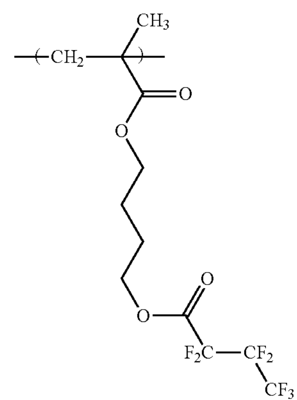

Synthetic Example 46

Synthesis of Resin A29

Monomer (ZC) was used, and dioxane was added thereto in an amount equal to 1.5 times by weight of the amount of monomer to obtain a solution. Azobisisobutyronitrile and azobis(2,4-dimethylvaleronitrile) was added as an initiator to the obtained solution in an amount of 0.7 mol % and 2.1 mol % respectively with respect to the amount of monomer, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 71% yield of polymer having a weight average molecular weight of about 16000. This polymer, which had the structural units derived from the monomer of the following formula, was referred to as Resin A29.

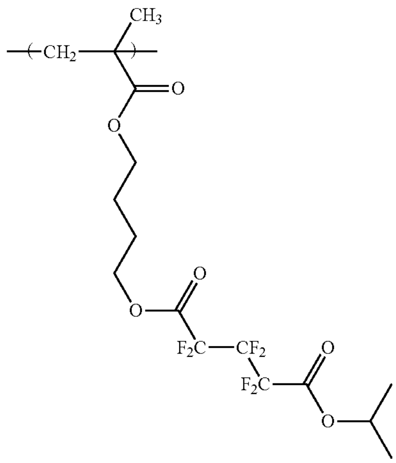

Synthetic Example 47

Synthesis of Resin A30

Monomer (ZD) was used, and dioxane was added thereto in an amount equal to 1.5 times by weight of the amount of monomer to obtain a solution. Azobisisobutyronitrile and azobis(2,4-dimethylvaleronitrile) was added as an initiator to the obtained solution, in an amount of 0.7 mol % and 2.1 mol % respectively with respect to the amount of monomer, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 69% yield of polymer having a weight average molecular weight of about 16000. This polymer, which had the structural units derived from the monomer of the following formula, was referred to as Resin A30.

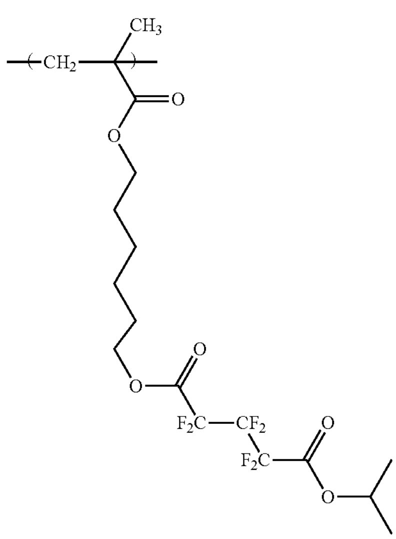

Synthetic Example 48

Synthesis of Resin A31

Monomer (ZE) was used, and dioxane was added thereto in an amount equal to 1.5 times by weight of the amount of monomer to obtain a solution. Azobisisobutyronitrile and azobis(2,4-dimethylvaleronitrile) was added as an initiator to the obtained solution, in an amount of 0.7 mol % and 2.1 mol % respectively with respect to the amount of monomer, and the resultant mixture was heated for about 5 hours at 75° C. After that, the obtained reaction mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 76% yield of polymer having a weight average molecular weight of about 18000. This polymer, which had the structural units derived from the monomer of the following formula, was referred to as Resin A31.

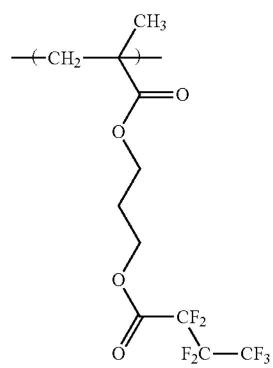

Synthetic Example 49

Synthesis of Resin A32

Monomer (ZF) was used, and dioxane was added thereto in an amount equal to 1.5 times by weight of the amount of monomer to obtain a solution. Azobisisobutyronitrile and azobis(2,4-dimethylvaleronitrile) was added as an initiator to the obtained solution, in an amount of 0.7 mol % and 2.1 mol % respectively with respect to the amount of monomer, and the resultant mixture was heated for about 5 hours at 75° C. After that, the obtained reacted mixture was poured into a large amount of mixture of methanol and ion-exchanged water to precipitate a resin. The obtained resin was filtrated. The thus obtained resin was dissolved in another dioxane to obtain a solution, and the solution was poured into a mixture of methanol and ion-exchanged water to precipitate a resin. The obtained resin was filtrated. These operations described in the two last sentences were repeated for 2 times, thereby resulting in a 70% yield of polymer having a weight average molecular weight of about 17000. This polymer, which had the structural units derived from the monomer of the following formula, was referred to as Resin A32.

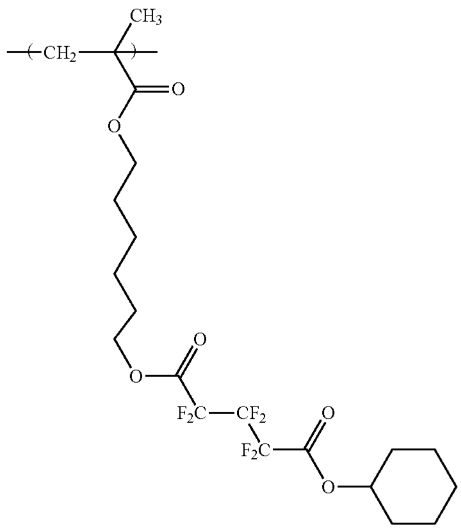

Synthetic Example 50

Synthesis of Resin A33

Monomer (ZG) was used, and dioxane was added thereto in an amount equal to 1.5 times by weight of the amount of monomer to obtain a solution. Azobisisobutyronitrile and azobis(2,4-dimethylvaleronitrile) was added as an initiator to the obtained solution, in an amount of 0.7 mol % and 2.1 mol % respectively with respect to the amount of monomer, and the resultant mixture was heated for about 5 hours at 75° C. After that, the obtained reacted mixture was poured into a large amount of mixture of methanol and ion-exchanged water to precipitate a resin. The obtained resin was filtrated. The thus obtained resin was dissolved in another dioxane to obtain a solution, and the solution was poured into a mixture of methanol and ion-exchanged water to precipitate a resin. The obtained resin was filtrated. These operations described in the last two sentences were repeated for 2 times, thereby resulting in a 76% yield of polymer having a weight average molecular weight of about 18000. This polymer, which had the structural units derived from the monomer of the following formula, was referred to as Resin A33.

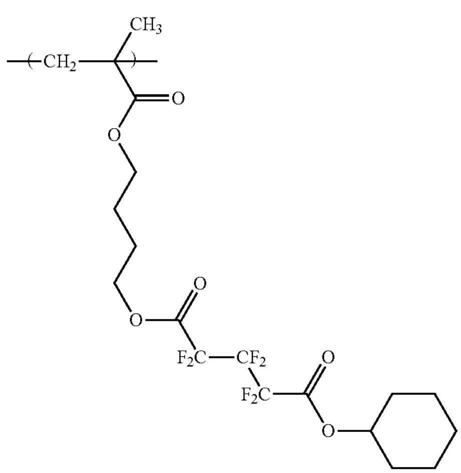

(Preparing Resist Composition)

Resist compositions were prepared by mixing and dissolving each of the components shown in Table 1, and then filtrating through a fluororesin filter having 0.2 μm pore diameter.

TABLE 1

| | Resin (parts) | Acid generator (parts) | Basic Comp. (parts) | PB/PEB (° C./° C.) |
|---|---|---|---|---|
| Ex. 1 | A1 = 10 | B1 = 1.00 | C1 = 0.07 | 110/105 |
| Ex. 2 | A2 = 10 | B1 = 1.00 | C1 = 0.07 | 110/105 |
| Ex. 3 | A3/A6 = 0.3/10 | B1 = 1.00 | C1 = 0.07 | 110/105 |
| Ex. 4 | A4/A6 = 0.3/10 | B1 = 1.00 | C1 = 0.07 | 110/105 |
| Ex. 5 | A5/A6 = 0.3/10 | B1 = 1.00 | C1 = 0.07 | 110/105 |
| Ex. 6 | A5/A7 = 0.3/10 | B1 = 1.00 | C1 = 0.07 | 115/110 |
| Ex. 7 | A3/A6 = 0.2/10 | B1 = 1.00 | C1 = 0.07 | 110/105 |
| Ex. 8 | A3/A6 = 0.1/10 | B1 = 1.00 | C1 = 0.07 | 110/105 |
| Ex. 9 | A9/A6 = 0.1/10 | B1 = 1.00 | C1 = 0.07 | 110/105 |
| Ex. 10 | A10/A6 = 0.1/10 | B1 = 1.00 | C1 = 0.07 | 110/105 |
| Ex. 11 | A11/A6 = 0.1/10 | B1 = 1.00 | C1 = 0.07 | 110/105 |
| Ex. 12 | A12/A6 = 0.1/10 | B1 = 1.00 | C1 = 0.07 | 110/105 |
| Ex. 13 | A13/A6 = 0.1/10 | B1 = 1.00 | C1 = 0.07 | 110/105 |
| Ex. 14 | A14/A6 = 0.1/10 | B1 = 1.00 | C1 = 0.07 | 110/105 |
| Ex. 15 | A11/A6 = 0.3/10 | B1 = 1.00 | C1 = 0.07 | 110/105 |
| Ex. 16 | A11/A6 = 0.5/10 | B1 = 1.00 | C1 = 0.07 | 110/105 |
| Ex. 17 | A11/A6 = 0.7/10 | B1 = 1.00 | C1 = 0.07 | 110/105 |
| Ex. 18 | A11/A15 = 0.7/10 | B1 = 1.00 | C1 = 0.07 | 110/105 |
| Ex. 19 | A11/A16 = 0.7/10 | B1 = 1.00 | C1 = 0.07 | 110/105 |
| Ex. 20 | A11/A17 = 0.7/10 | B1 = 1.10 | C1 = 0.07 | 95/85 |
| Ex. 21 | A11/A18 = 0.7/10 | B1 = 1.10 | C1 = 0.07 | 95/85 |
| Ex. 22 | A11/A19 = 0.7/10 | B1 = 1.10 | C1 = 0.07 | 110/105 |
| Ex. 23 | A11/A19 = 0.7/10 | B3/B4 = 1.0/0.1 | C1 = 0.07 | 110/105 |
| Ex. 24 | A23/A6 = 0.7/10 | B1 = 1.00 | C1 = 0.07 | 110/105 |
| Ex. 25 | A24/A6 = 0.7/10 | B1 = 1.00 | C1 = 0.07 | 110/105 |
| Ex. 26 | A25/A6 = 0.7/10 | B1 = 1.00 | C1 = 0.07 | 110/105 |
| Ex. 27 | A26/A6 = 0.7/10 | B1 = 1.00 | C1 = 0.07 | 110/105 |
| Ex. 28 | A27/A6 = 0.7/10 | B1 = 1.00 | C1 = 0.07 | 110/105 |
| Ex. 29 | A28/A6 = 0.7/10 | B1 = 1.00 | C1 = 0.07 | 110/105 |
| Ex. 30 | A29/A6 = 0.7/10 | B1 = 1.00 | C1 = 0.07 | 110/105 |
| Ex. 31 | A30/A6 = 0.7/10 | B1 = 1.00 | C1 = 0.07 | 110/105 |
| Ex. 32 | A31/A6 = 0.7/10 | B1 = 1.00 | C1 = 0.07 | 110/105 |
| Ex. 33 | A32/A6 = 0.7/10 | B1 = 1.00 | C1 = 0.07 | 110/105 |
| Ex. 34 | A33/A6 = 0.7/10 | B1 = 1.00 | C1 = 0.07 | 110/105 |
| Comp. Ex. 1 | A8/A7 = 0.3/10 | B2 = 1.00 | C1 = 0.07 | 115/110 |
| Comp. Ex. 2 | A21/A20 = 0.3/10 | B3/B4 = 1.0/0.1 | C1 = 0.07 | 110/105 |
| Comp. Ex. 3 | A22 = 10 | B5 = 1.10 | C1 = 0.07 | 95/85 |

<Resin>

A1 to A33: Resin A1 to Resin A33 prepared by the Synthetic Examples <Acid Generator>

Acid generator B1:

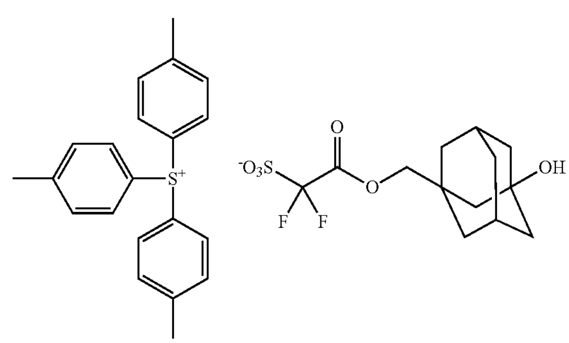

-continued

Acid generator B2:

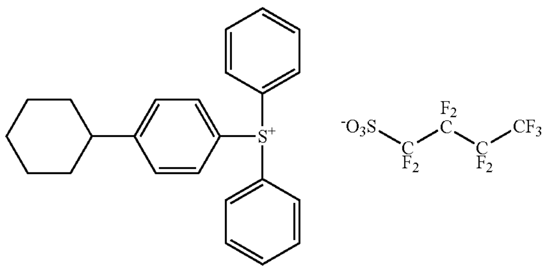

Acid generator B3:

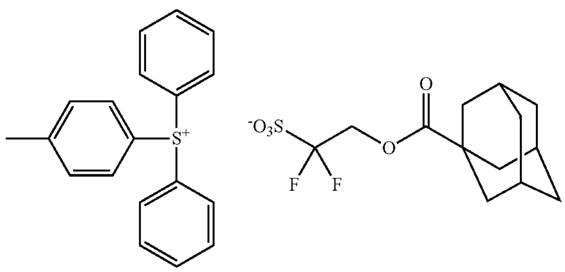

Acid generator B4:

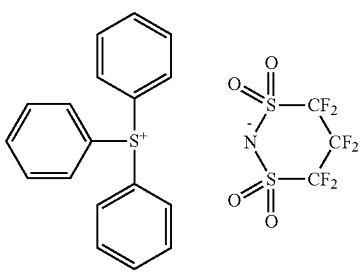

Acid generator B5:

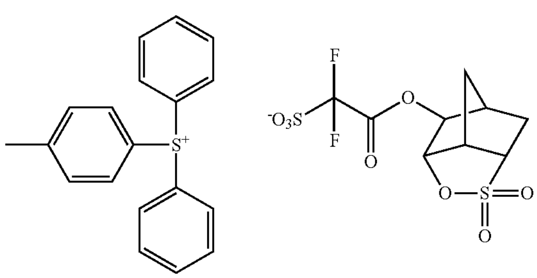

<Qencher>

C1: 2,6-diisopropylaniline,

<Solvent>

| | |
|---|---|
| Propylene glycol monomethyl ether acetate | 265.0 parts |
| Propylene glycol monomethyl ether | 20.0 parts |
| 2-Heptanone | 20.0 parts |
| γ-butyrolactone | 3.5 parts |

(Evaluation of Defects)

The above resist compositions were applied on each of the 12-inch-silicon wafers by spin coating so that the thickness of the resulting film became 150 nm after drying.

The obtained wafers were then pre-baked for 60 seconds on a direct hot plate at the temperatures given in the "PB" column in Table 1 to obtain a composition layer.

The thus obtained wafers with the produced composition layers are rinsed with water for 60 seconds using a developing apparatus (ACT-12, Tokyo electron Co. Ltd.).

Thereafter, the number of defects was counted using a defect inspection apparatus (KLA-2360, KLA-Tencor Co. Ltd.)

Table 2 shows the results thereof.

(Producing Resist Pattern 1)

A composition for an organic antireflective film ("ARC-29", by Nissan Chemical Co. Ltd.) was applied onto silicon wafers and baked for 60 seconds at 205° C. to form a 78 nm thick organic antirefective film on each of the silicon wafers.

The above resist compositions were then applied thereon by spin coating so that the thickness of the resulting composition layer became 85 nm after drying.

The obtained wafers were then pre-baked for 60 seconds on a direct hot plate at the temperatures given in the "PB" column in Table 1 to form a composition layer.

Contact hole patterns were then exposed using a mask pattern (hole pitch: 100 nm, hole diameter: 70 nm) through stepwise changes in exposure quantity using an Arf excimer laser stepper for immersion lithography ("XT: 1900Gi " by ASML Ltd.: NA=1.35, 3/42 annular X-Y polarization), on the wafers on which the composition layer had thus been formed. The ultrapure water was used as medium of immersion.

After the exposure, post-exposure baking was carried out for 60 seconds at the temperatures given in the "PEB" column in Table 1.

Then, paddle development was carried out with 2.38 wt % tetramethylammonium hydroxide aqueous solution for 60 seconds to obtain resist patterns.

(Mask Error Factor (MEF) Evaluation)

The resist patterns were formed using masks in which mask sizes of the line patterns are 48 nm, 50 nm, and 52 nm, respectively. The pitch width of the masks was 100 nm. The exposure amount was set at the extent that a line pattern of 50 nm-width was formed by the exposure using a line and space pattern of 1:1 (the size mask of a line pattern: 50 nm, a pitch width: 100 nm)

The obtained results are plotted with the mask size being set as the horizontal axis and the line width of the line pattern formed using the mask being set as the vertical axis, and the slope of a regression line obtained from each plot is measured as the MEF.

Table 2 shows the results thereof.

TABLE 2

| | Defects | MEF |
|---|---|---|
| Ex. 1 | 580 | 2.32 |
| Ex. 2 | 1800 | 2.48 |
| Ex. 3 | 320 | 2.18 |
| Ex. 4 | 480 | 2.35 |
| Ex. 5 | 280 | 2.24 |
| Ex. 6 | 720 | 2.74 |
| Ex. 7 | 360 | 2.08 |
| Ex. 8 | 380 | 2.06 |
| Ex. 9 | 390 | 2.04 |
| Ex. 10 | 400 | 2.08 |
| Ex. 11 | 380 | 2.06 |
| Ex. 12 | 350 | 2.08 |

TABLE 2-continued

| | Defects | MEF |
|---|---|---|
| Ex. 13 | 180 | 2.09 |
| Ex. 14 | 240 | 2.12 |
| Ex. 15 | 340 | 2.08 |
| Ex. 16 | 310 | 2.12 |
| Ex. 17 | 220 | 2.07 |
| Ex. 18 | 140 | 2.02 |
| Ex. 19 | 190 | 2.05 |
| Ex. 20 | 240 | 2.32 |
| Ex. 21 | 210 | 2.24 |
| Ex. 22 | 220 | 2.18 |
| Ex. 23 | 320 | 2.89 |
| Ex. 24 | 180 | 2.08 |
| Ex. 25 | 160 | 2.07 |
| Ex. 26 | 130 | 2.09 |
| Ex. 27 | 260 | 2.16 |
| Ex. 28 | 170 | 2.12 |
| Ex. 29 | 170 | 2.09 |
| Ex. 30 | 160 | 2.12 |
| Ex. 31 | 160 | 2.13 |
| Ex. 32 | 160 | 2.10 |
| Ex. 33 | 130 | 2.14 |
| Ex. 34 | 140 | 2.09 |
| Comp. Ex. 1 | 12500 | 3.45 |

The present resist composition (Examples 1 to 34) could be used to produce the resist patterns with less defects and it was possible to achieve an excellent MEF when producing the resist patterns.

Meanwhile, with the Comparative Example 1, there were numerous defects in the obtained resist pattern and a poor MEF when producing the resist pattern.

(Focus Margin (DOF) Evaluation)

Each resist pattern is produced based on the resist composition using the mask pattern (hole pitch: 100 nm, hole diameter: 70 nm). The exposure amount at which a 55 nm-hole diameter is achieved in the pattern is defined as the effective sensitivity.

The index (DOF) is measured as the focus range in which the hole diameter of the resist patterns was kept within 55 nm±5% (52.5 to 57.5 nm), where the resist patterns were formed based on the effective sensitivity while the focus was adjusted stepwise.

Table 3 shows the results thereof.

TABLE 3

| | DOF | Defect |
|---|---|---|
| Ex. 20 | 0.20 | 240 |
| Ex. 21 | 0.22 | 210 |
| Ex. 22 | 0.20 | 220 |
| Ex. 23 | 0.18 | 320 |
| Comp. Ex. 2 | 0.06 | 720 |
| Comp. Ex. 3 | 0.17 | 7200 |

According to the resist composition of the present invention, it is possible to produce a resist pattern with excellent DOF (wide DOF) and MEF when producing the resist pattern, and with few defects in the pattern. Therefore, the present resist composition can be used for semiconductor microfabrication.

What is claimed is:

1. A resist composition comprising;

a resin having a structural unit derived from a compound represented by he formula (a); and a fluorine-containing acid generator;

(a)

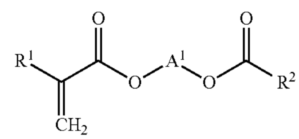

wherein $R^1$ represents a hydrogen atom or a methyl group;

$R^2$ represents an optionally substituted $C_1$ to $C_{18}$ aliphatic hydrocarbon group;

$A^1$ represents an optionally substituted $C_1$ to $C_6$ alkanediyl group or a group represented by the formula (a-g1);

$$—A^{10}\left(X^{10}—A^{11}\right)_s X^{11}—A^{12}— \quad \text{(a-g1)}$$

wherein s represents 0 or 1;

$A^{10}$and $A^{12}$ independently represent an optionally substituted $C_1$ to $C_5$ aliphatic hydrocarbon group;

$A^{11}$ represents a single bond or an optionally substituted $C_1$ to $C_5$ aliphatic hydrocarbon group;

$X^{10}$ and $X^{11}$ independently represents an oxygen atom, a carbonyl group, a carbonyloxy group or an oxycarbonyl group;

provided that a total number of the carbon atom of $A^{10}$, $A^{11}$, $A^{12}$, $X^{10}$ and $X^{11}$ *is* 6 or less.

2. The resist composition of claim 1, wherein further comprising a solvent.

3. A method for producing a resist pattern comprising steps of:

(1) applying the resist composition according to claim 1 onto a substrate;

(2) drying the applied composition to form a composition layer;

(3) exposing the composition layer using an exposure apparatus;

(4) heating the exposed composition layer; and (5) developing the heated composition layer using a developing apparatus.

* * * * *